US011463103B2

(12) United States Patent
Yamamoto et al.

(10) Patent No.: US 11,463,103 B2
(45) Date of Patent: Oct. 4, 2022

(54) TRANSMISSION DEVICE, TRANSMISSION METHOD, RECEPTION DEVICE, AND RECEPTION METHOD

(71) Applicant: SONY CORPORATION, Tokyo (JP)

(72) Inventors: Makiko Yamamoto, Tokyo (JP); Yuji Shinohara, Kanagawa (JP)

(73) Assignee: SONY CORPORATION, Tokyo (JP)

(*) Notice: Subject to any disclaimer, the term of this patent is extended or adjusted under 35 U.S.C. 154(b) by 166 days.

(21) Appl. No.: 16/606,893

(22) PCT Filed: May 17, 2018

(86) PCT No.: PCT/JP2018/019106
§ 371 (c)(1),
(2) Date: Oct. 21, 2019

(87) PCT Pub. No.: WO2018/221242
PCT Pub. Date: Dec. 6, 2018

(65) Prior Publication Data

US 2021/0281277 A1 Sep. 9, 2021

(30) Foreign Application Priority Data

May 31, 2017 (JP) ............................ JP2017-107533

(51) Int. Cl.
*H03M 13/03* (2006.01)
*H03M 13/11* (2006.01)
(Continued)

(52) U.S. Cl.
CPC ..... *H03M 13/036* (2013.01); *H03M 13/1165* (2013.01); *H03M 13/255* (2013.01);
(Continued)

(58) Field of Classification Search
CPC ............. H03M 13/255; H03M 13/271; H03M 13/118; H03M 13/1157; H03M 13/1177;
(Continued)

(56) References Cited

U.S. PATENT DOCUMENTS

2008/0184084 A1* 7/2008 Matsumoto .......... H03M 13/116 714/728
2015/0278008 A1* 10/2015 Ren ....................... H03M 13/09 714/776
(Continued)

FOREIGN PATENT DOCUMENTS

| | | |
|---|---|---|
| CN | 105103455 A | 11/2015 |
| CN | 110545109 A | 12/2019 |

(Continued)

OTHER PUBLICATIONS

"ATSC Standard: Physical Layer Protocol (A/322)", Advanced Television Systems Committee, Sep. 7, 2016, 258 pages.
(Continued)

*Primary Examiner* — April Y Blair
*Assistant Examiner* — Sazzad Hossain
(74) *Attorney, Agent, or Firm* — Chip Law Group

(57) ABSTRACT

The present technology relates to a transmission device, a transmission method, a reception device, and a reception method for securing good communication quality in data transmission using an LDPC code. LDPC coding for information bits with an information length K=N×r is performed on the basis of an extended parity check matrix having rows and columns extended by a predetermined puncture length L with respect to a parity check matrix of an LDPC code with a code length N of 69120 bits and a coding rate r of 14/16, so that an extended LDPC code having parity bits with a parity length M=N+L−K is generated. A head of the information bits of the extended LDPC code is punctured by L,
(Continued)

so that a punctured LDPC code with the code length N of 69120 bits and the coding rate r is generated. The extended parity check matrix includes an A matrix of M1 rows and K columns expressed by a predetermined value M1 and the information length K=N×r, a B matrix of M1 rows and M1 columns, a Z matrix of M1 rows and N+L−K−M1 columns, a C matrix of N+L−K−M1 rows and K+M1 columns, and a D matrix of N+L−K−M1 rows and N+L−K−M1 columns. The present technology can be applied to data transmission and the like using an LDPC code.

32 Claims, 116 Drawing Sheets

(51) Int. Cl.

| | |
|---|---|
| ***H03M 13/25*** | (2006.01) |
| ***H03M 13/27*** | (2006.01) |
| ***H03M 13/29*** | (2006.01) |
| *H03M 13/35* | (2006.01) |
| *H04L 1/00* | (2006.01) |
| *H03M 13/15* | (2006.01) |

(52) U.S. Cl.
CPC ..... *H03M 13/271* (2013.01); *H03M 13/2906* (2013.01); *H03M 13/118* (2013.01); *H03M 13/1157* (2013.01); *H03M 13/1177* (2013.01); *H03M 13/152* (2013.01); *H03M 13/356* (2013.01); *H04L 1/0057* (2013.01); *H04L 1/0071* (2013.01)

(58) Field of Classification Search
CPC ........... H03M 13/036; H03M 13/1165; H03M 13/152; H03M 13/2906; H03M 13/356; H04L 1/0057; H04L 1/0071
See application file for complete search history.

(56) References Cited

U.S. PATENT DOCUMENTS

| | | | |
|---|---|---|---|
| 2016/0043740 | A1 | 2/2016 | Ikegaya et al. |
| 2016/0164540 | A1 | 6/2016 | Shinohara et al. |
| 2016/0345028 | A1 | 11/2016 | Kim et al. |

FOREIGN PATENT DOCUMENTS

| | | | |
|---|---|---|---|
| EP | 3110010 | A1 | 12/2016 |
| EP | 3148090 | A1 | 3/2017 |
| EP | 3633859 | A1 | 4/2020 |
| JP | 2012-054681 | A | 3/2012 |
| JP | 2015-156530 | A | 8/2015 |
| JP | 2018-207199 | A | 12/2018 |
| KR | 10-2016-0122627 | A | 10/2016 |
| MX | 349019 | B | 7/2017 |
| WO | 2015/125612 | A1 | 8/2015 |
| WO | 2015/178216 | A1 | 11/2015 |
| WO | 2016/114156 | A1 | 7/2016 |
| WO | 2018/221243 | A1 | 12/2018 |

OTHER PUBLICATIONS

Kim, et al., "Low-Density Parity-Check Codes for ATSC 3.0", IEEE Transaction on Broadcasting, vol. 62, No. 1, Feb. 24, 2016, pp. 189-196.
"Frame structure channel coding and modulation for a second generation digital terrestrial television broadcasting system", Digital Video Broadcasting (DVB•T2), European Standard Telecommunications series, ETSI EN 302 755 V1.3.1, Apr. 2012, 18 pages.
Xu, et al., "Improved Shortening Algorithm for Irregular QC-LDPC Codes Using Known Bits", IEEE Transactions on Consumer Electronics, vol. 57, No. 3, Sep. 15, 2011, pp. 1057-1063.
Jayasooriya, et al., "A New Density Evolution Approximation for LDPC and Multi-Edge Type LDPC Codes", IEEE Transactions on Communications, vol. 64, No. 10, Aug. 16, 2016, pp. 4044-4056.
Zhang, et al., "Progressive Matrix Growth Algorithm for Constructing Rate-Compatible Length-Scalable Raptor-Like Quasi-Cyclic LDPC Codes", IEEE Transactions on Broadcasting, vol. 64, No. 10, Jan. 23, 2018, pp. 816-829.
"Physical Layer Protocol", Advanced Television Systems Committee (ATSC Standard), Document: A/322:2016, Sep. 7, 2016, 258 pages.
Zahang, et al., "Progressive Matrix Growth Algorithm for Constructing Rate-Compatible Length-Scalable Raptor-Like Quasi-Cyclic LDPC Codes", IEEE Transactions on Broadcasting, vol. 64, No. 10, Jan. 23, 2018, pp. 816-829.
Partial Supplementary European Search Report of EP Application No. 18810621.5, dated Apr. 29, 2020, 21 pages.
"ATSC Standard: Physical Layer Protocol (A/322)", Advanced Television System Committee, ATSC AB22:2016, XP55405794, Sep. 7, 2016, 152 pages.
"1.9 broadcasting transmission technology, Annual report 2017", NHK Science & Technology Research, XP055624975, Jan. 2017, pp. 12-13.
"Frame structure channel coding and modulation for a second generation digital terrestrial television broadcasting system", Digital Video Broadcasting (DVB-T2), European Standard Telecommunications series, ETSI EN 302 755 V1.3.1, Apr. 2012, 188 pages.
International Search Report and Written Opinion of PCT Application No. PCT/JP2018/019106, dated Aug. 7, 2018, 09 pages of ISRWO.
"LDPC Codes Design for eMBB data channel", LG Electronics, 3GPP TSG RAN WG1 NR ad-hoc, R1-1700518, Spokane, USA, Jan. 16-20, 2017, 06 pages.
"LDPC rate compatible design", Qualcomm Incorporated, 3GPP TSG-RAN WG1 NR Ad Hoc, R1-1700830, Spokane, USA, Jan. 16-20, 2017, 19 pages.
"Digital Video Broadcasting (DVB); Frame structure channel coding and modulation for a second generation digital terrestrial television broadcasting system (DVB-T2)", ETSI, EN 302 755, V1.4.1, Jul. 2015, 20 pages.
Office Action for JP Patent Application No. 2021-106270, dated May 24, 2022, 02 pages of English Translation and 03 pages of Office Action.

* cited by examiner

FIG. 3

$$H=\begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 13

NUMBER OF COLUMNS OF EACH COLUMN WEIGHT

| | N=64800 | | | | N=16200 | | | |
|---|---|---|---|---|---|---|---|---|
| Nominal CODING RATE | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | - | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | ---- | ---- | ---- | ---- |

STEP STRUCTURE OF
PARITY MATRIX

STEP STRUCTURE PORTION
OF Tanner Graph r1/4 16K 6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

FIG. 21

ROW NUMBER OF PARITY CHECK MATRIX (INFORMATION MATRIX $H_A$) OF EVERY OTHER 360 COLUMNS FROM FIRST COLUMN IS DISPLAYED

ROW NUMBER OF PARITY CHECK MATRIX →

1ST COLUMN OF $H_A$ → 0 2084 1613 1548 1286 1460 3196 4297 2481 3369 3451 4620 2622
361ST COLUMN OF $H_A$ → 1 122 1516 3448 2880 1407 1847 3799 3529 373 971 4358 3108
721ST COLUMN OF $H_A$ → 2 259 3399 929 2650 864 3996 3833 107 5287 164 3125 2350
1081ST COLUMN OF $H_A$ → 3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

$h_{3,5}$ (boxed entry: 2650)

PARITY CHECK MATRIX INITIAL VALUE TABLE 2 6 18
2 10 19
22
19
15

FIG. 32

| Input Data Cell y | Constellation Point $z_s$ |
|---|---|
| 00 | $(1+j1)/\sqrt{2}$ |
| 01 | $(-1+j1)/\sqrt{2}$ |
| 10 | $(+1-j1)/\sqrt{2}$ |
| 11 | $(-1-j1)/\sqrt{2}$ |

FIG. 33

| w/CR | 2/15 | 3/15 | 4/15 | 5/15 | 6/15 | 7/15 |
|---|---|---|---|---|---|---|
| w0 | 0. 7062+j0. 7075 | 0. 3620+j0. 5534 | 0. 3412+j0. 5241 | 0. 3192+j0. 5011 | 0. 5115+j1. 2092 | 0. 2592+j0. 4888 |
| w1 | 0. 7075+j0. 7062 | 0. 5534+j0. 3620 | 0. 5241+j0. 3412 | 0. 5011+j0. 3192 | 1. 2092+j0. 5115 | 0. 4888+j0. 2592 |
| w2 | 0. 7072+j0. 7077 | 0. 5940+j1. 1000 | 0. 5797+j1. 1282 | 0. 5575+j1. 1559 | 0. 2663+j0. 4530 | 0. 5072+j1. 1980 |
| w3 | 0. 7077+j0. 7072 | 1. 1000+j0. 5940 | 1. 1282+j0. 5797 | 1. 1559+j0. 5575 | 0. 4530+j0. 2663 | 1. 1980+j0. 5072 |

| w/CR | 8/15 | 9/15 | 10/15 | 11/15 | 12/15 | 13/15 |
|---|---|---|---|---|---|---|
| w0 | 0. 2535+j0. 4923 | 0. 2386+j0. 5296 | 0. 4487+j1. 1657 | 0. 9342+j0. 9847 | 0. 9555+j0. 9555 | 0. 9517+j0. 9511 |
| w1 | 0. 4923+j0. 2535 | 0. 5296+j0. 2386 | 1. 2080+j0. 5377 | 0. 9866+j0. 2903 | 0. 9555+j0. 2949 | 0. 9524+j0. 3061 |
| w2 | 0. 4927+j1. 2044 | 0. 4882+j1. 1934 | 0. 2213+j0. 4416 | 0. 2716+j0. 9325 | 0. 2949+j0. 9555 | 0. 3067+j0. 9524 |
| w3 | 1. 2044+j0. 4927 | 1. 1934+j0. 4882 | 0. 6186+j0. 2544 | 0. 2901+j0. 2695 | 0. 2949+j0. 2949 | 0. 3061+j0. 3067 |

FIG. 34

| u/CR | 2/15 | 3/15 | 4/15 | 5/15 | 6/15 | 7/15 |
|---|---|---|---|---|---|---|
| u0 | 0.3317 | 0.2382 | 0.1924 | 0.1313 | 0.1275 | 0.0951 |
| u1 | 0.3321 | 0.2556 | 0.1940 | 0.1311 | 0.1276 | 0.0949 |
| u2 | 0.3322 | 0.2749 | 0.2070 | 0.1269 | 0.1294 | 0.1319 |
| u3 | 0.3321 | 0.2558 | 0.2050 | 0.1271 | 0.1295 | 0.1322 |
| u4 | 0.3327 | 0.2748 | 0.3056 | 0.3516 | 0.3424 | 0.3170 |
| u5 | 0.3328 | 0.2949 | 0.3096 | 0.3504 | 0.3431 | 0.3174 |
| u6 | 0.3322 | 0.2749 | 0.2890 | 0.3569 | 0.3675 | 0.3936 |
| u7 | 0.3322 | 0.2558 | 0.2854 | 0.3581 | 0.3666 | 0.3921 |
| u8 | 0.9369 | 0.9486 | 0.7167 | 0.6295 | 0.6097 | 0.5786 |
| u9 | 0.9418 | 0.8348 | 0.7362 | 0.6301 | 0.6072 | 0.5789 |
| u10 | 0.9514 | 0.7810 | 0.7500 | 0.6953 | 0.7113 | 0.7205 |
| u11 | 0.9471 | 0.8348 | 0.7326 | 0.6903 | 0.7196 | 0.7456 |
| u12 | 0.9448 | 0.9463 | 0.9667 | 0.9753 | 0.9418 | 0.9299 |
| u13 | 0.9492 | 0.8336 | 0.9665 | 1.0185 | 1.0048 | 1.0084 |
| u14 | 0.9394 | 0.9459 | 1.1332 | 1.2021 | 1.2286 | 1.2349 |
| u15 | 0.9349 | 1.4299 | 1.4761 | 1.4981 | 1.5031 | 1.5118 |

| u/CR | 8/15 | 9/15 | 10/15 | 11/15 | 12/15 | 13/15 |
|---|---|---|---|---|---|---|
| u0 | 0.0773 | 0.0638 | 0.0592 | 0.0502 | 0.0354 | 0.0325 |
| u1 | 0.0773 | 0.0638 | 0.0594 | 0.0637 | 0.0921 | 0.0967 |
| u2 | 0.1614 | 0.1757 | 0.1780 | 0.1615 | 0.1602 | 0.1623 |
| u3 | 0.1614 | 0.1756 | 0.1790 | 0.1842 | 0.2185 | 0.2280 |
| u4 | 0.3086 | 0.3069 | 0.2996 | 0.2760 | 0.2910 | 0.2957 |
| u5 | 0.3085 | 0.3067 | 0.3041 | 0.3178 | 0.3530 | 0.3645 |
| u6 | 0.4159 | 0.4333 | 0.4241 | 0.4040 | 0.4264 | 0.4361 |
| u7 | 0.4163 | 0.4343 | 0.4404 | 0.4686 | 0.4947 | 0.5100 |
| u8 | 0.5810 | 0.5765 | 0.5561 | 0.5535 | 0.5763 | 0.5878 |
| u9 | 0.5872 | 0.5862 | 0.6008 | 0.6362 | 0.6531 | 0.6696 |
| u10 | 0.7213 | 0.7282 | 0.7141 | 0.7293 | 0.7417 | 0.7566 |
| u11 | 0.7604 | 0.7705 | 0.8043 | 0.8302 | 0.8324 | 0.8497 |
| u12 | 0.9212 | 0.9218 | 0.9261 | 0.9432 | 0.9386 | 0.9498 |
| u13 | 1.0349 | 1.0364 | 1.0639 | 1.0704 | 1.0529 | 1.0588 |
| u14 | 1.2281 | 1.2234 | 1.2285 | 1.2158 | 1.1917 | 1.1795 |
| u15 | 1.4800 | 1.4646 | 1.4309 | 1.3884 | 1.3675 | 1.3184 |

FIG. 35A

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 1 | 1 | 1 | 1 | 1 | 1 | 1 | 1 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 0 | 0 | 0 | 0 | 0 | 0 | 0 | 0 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Re(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 35B

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 1 | 1 | 1 | 1 | 1 | 1 | 1 | 1 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 0 | 0 | 0 | 0 | 0 | 0 | 0 | 0 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Im(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 36

| | | |
|---|---|---|
| $y_{0,q}$ | 1 | 0 |
| $Re(z_q)$ | −1 | 1 |

FIG. 37

| | | |
|---|---|---|
| $y_{1,q}$ | 1 | 0 |
| $Im(z_q)$ | −1 | 1 |

FIG. 38

| | | | | |
|---|---|---|---|---|
| $y_{0,q}$<br>$y_{2,q}$ | 1<br>0 | 1<br>1 | 0<br>1 | 0<br>0 |
| $Re(z_q)$ | −3 | −1 | 1 | 3 |

FIG. 39

| | | | | |
|---|---|---|---|---|
| $y_{1,q}$<br>$y_{3,q}$ | 1<br>0 | 1<br>1 | 0<br>1 | 0<br>0 |
| $Im(z_q)$ | −3 | −1 | 1 | 3 |

FIG. 40

| | | | | | | | | |
|---|---|---|---|---|---|---|---|---|
| $y_{0,q}$ | 1 | 1 | 1 | 1 | 0 | 0 | 0 | 0 |
| $y_{2,q}$ | 0 | 0 | 1 | 1 | 1 | 1 | 0 | 0 |
| $y_{4,q}$ | 0 | 1 | 1 | 0 | 0 | 1 | 1 | 0 |
| $Re(z_q)$ | −7 | −5 | −3 | −1 | 1 | 3 | 5 | 7 |

FIG. 41

| | | | | | | | | |
|---|---|---|---|---|---|---|---|---|
| $y_{1,q}$ | 1 | 1 | 1 | 1 | 0 | 0 | 0 | 0 |
| $y_{3,q}$ | 0 | 0 | 1 | 1 | 1 | 1 | 0 | 0 |
| $y_{5,q}$ | 0 | 1 | 1 | 0 | 0 | 1 | 1 | 0 |
| $Im(z_q)$ | −7 | −5 | −3 | −1 | 1 | 3 | 5 | 7 |

FIG. 42

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 0 | 0 | 0 | 0 | 0 | 0 | 0 | 0 |
| $y_{2,q}$ | 0 | 0 | 0 | 0 | 1 | 1 | 1 | 1 | 1 | 1 | 1 | 1 | 0 | 0 | 0 | 0 |
| $y_{4,q}$ | 0 | 0 | 1 | 1 | 1 | 1 | 0 | 0 | 0 | 0 | 1 | 1 | 1 | 1 | 0 | 0 |
| $y_{6,q}$ | 0 | 1 | 1 | 0 | 0 | 1 | 1 | 0 | 0 | 1 | 1 | 0 | 0 | 1 | 1 | 0 |
| $Re(z_q)$ | −15 | −13 | −11 | −9 | −7 | −5 | −3 | −1 | 1 | 3 | 5 | 7 | 9 | 11 | 13 | 15 |

FIG. 43

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 0 | 0 | 0 | 0 | 0 | 0 | 0 | 0 |
| $y_{3,q}$ | 0 | 0 | 0 | 0 | 1 | 1 | 1 | 1 | 1 | 1 | 1 | 1 | 0 | 0 | 0 | 0 |
| $y_{5,q}$ | 0 | 0 | 1 | 1 | 1 | 1 | 0 | 0 | 0 | 0 | 1 | 1 | 1 | 1 | 0 | 0 |
| $y_{7,q}$ | 0 | 1 | 1 | 0 | 0 | 1 | 1 | 0 | 0 | 1 | 1 | 0 | 0 | 1 | 1 | 0 |
| $Im(z_q)$ | −15 | −13 | −11 | −9 | −7 | −5 | −3 | −1 | 1 | 3 | 5 | 7 | 9 | 11 | 13 | 15 |

FIG. 44

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | −31 | −29 | −27 | −25 | −23 | −21 | −19 | −17 | −15 | −13 | −11 | −9 | −7 | −5 | −3 | −1 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |

FIG. 45

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | −31 | −29 | −27 | −25 | −23 | −21 | −19 | −17 | −15 | −13 | −11 | −9 | −7 | −5 | −3 | −1 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |

FIG. 46

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | −63 | −61 | −59 | −57 | −55 | −53 | −51 | −49 | −47 | −45 | −43 | −41 | −39 | −37 | −35 | −33 |

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | −31 | −29 | −27 | −25 | −23 | −21 | −19 | −17 | −15 | −13 | −11 | −9 | −7 | −5 | −3 | −1 |

| | | | | | | | | | | | | | | | | |
|---|---|---|---|---|---|---|---|---|---|---|---|---|---|---|---|---|
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |

| | | | | | | | | | | | | | | | | |
|---|---|---|---|---|---|---|---|---|---|---|---|---|---|---|---|---|
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 33 | 35 | 37 | 39 | 41 | 43 | 45 | 47 | 49 | 51 | 53 | 55 | 57 | 59 | 61 | 63 |

FIG. 47

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | −63 | −61 | −59 | −57 | −55 | −53 | −51 | −49 | −47 | −45 | −43 | −41 | −39 | −37 | −35 | −33 |

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | −31 | −29 | −27 | −25 | −23 | −21 | −19 | −17 | −15 | −13 | −11 | −9 | −7 | −5 | −3 | −1 |

| | | | | | | | | | | | | | | | | |
|---|---|---|---|---|---|---|---|---|---|---|---|---|---|---|---|---|
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |

| | | | | | | | | | | | | | | | | |
|---|---|---|---|---|---|---|---|---|---|---|---|---|---|---|---|---|
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 33 | 35 | 37 | 39 | 41 | 43 | 45 | 47 | 49 | 51 | 53 | 55 | 57 | 59 | 61 | 63 |

FIG. 48

| w/CR | 2/16 | 4/16 | 6/16 | 8/16 | 10/16 | 12/16 | 14/16 |
|---|---|---|---|---|---|---|---|
| w0 | 0.707107+j0.707107 | 0.707107+j0.707107 | 0.483340+j0.284181 | 0.457029+j0.264235 | 0.493628+j0.253004 | 0.418917+j0.217283 | 0.297592+j0.297592 |
| w1 | 0.707107+j0.707107 | 0.707107+j0.707107 | 0.284181+j0.483340 | 0.284235+j0.457029 | 0.253004+j0.493628 | 0.267090+j0.657759 | 0.297592+j0.954893 |
| w2 | 0.707107+j0.707107 | 0.707107+j0.707107 | 1.182750+j0.530940 | 1.210202+j0.506871 | 1.204042+j0.492548 | 1.144505+j0.432808 | 0.954893+j0.297592 |
| w3 | 0.707107+j0.707107 | 0.707107+j0.707107 | 0.530940+j1.182750 | 0.506871+j1.210202 | 0.492548+j1.204042 | 0.565917+j1.208927 | 0.954893+j0.954893 |

FIG. 49

| w/CR | 3/16 | 5/16 | 7/16 | 9/16 | 11/16 | 13/16 |
|---|---|---|---|---|---|---|
| w0 | 0.587870+j0.405339 | 0.453023+j0.266260 | 0.541390+j0.300280 | 0.609686+j0.348004 | 0.611105+j0.349327 | 0.700327+j0.329907 |
| w1 | 0.587870+j0.405339 | 0.453023+j0.266260 | 0.559688+j0.242973 | 0.673707+j0.186861 | 0.675806+j0.148761 | 0.889256+j0.139511 |
| w2 | 0.587870+j0.405339 | 0.453023+j0.266260 | 0.357657+j0.209444 | 0.301149+j0.189680 | 0.258639+j0.153788 | 0.447469+j0.131847 |
| w3 | 0.587870+j0.405339 | 0.453023+j0.266260 | 0.356682+j0.194677 | 0.302029+j0.151421 | 0.251152+j0.128725 | 0.136015+j0.101209 |
| w4 | 0.405339+j0.587870 | 0.266260+j0.453023 | 0.300280+j0.541390 | 0.348004+j0.609686 | 0.416770+j0.616005 | 0.448992+j0.566092 |
| w5 | 0.405339+j0.587870 | 0.266260+j0.453023 | 0.242973+j0.559688 | 0.186861+j0.673707 | 0.174987+j0.744087 | 0.142883+j0.969940 |
| w6 | 0.405339+j0.587870 | 0.266260+j0.453023 | 0.209444+j0.357657 | 0.189680+j0.301149 | 0.183356+j0.382221 | 0.343126+j0.358344 |
| w7 | 0.405339+j0.587870 | 0.266260+j0.453023 | 0.194677+j0.356682 | 0.151421+j0.302029 | 0.129870+j0.410674 | 0.121210+j0.383416 |
| w8 | 1.056554+j0.611394 | 1.209224+j0.511520 | 0.949854+j0.564434 | 0.885139+j0.582962 | 0.890898+j0.557418 | 0.889124+j0.802821 |
| w9 | 1.056554+j0.611394 | 1.209224+j0.511520 | 1.087076+j0.274652 | 1.018339+j0.225537 | 1.029824+j0.193509 | 1.233619+j0.212709 |
| w10 | 1.056554+j0.611394 | 1.209224+j0.511520 | 1.265348+j0.819022 | 1.259403+j0.843530 | 1.248720+j0.812443 | 1.067496+j0.982512 |
| w11 | 1.056554+j0.611394 | 1.209224+j0.511520 | 1.452799+j0.300863 | 1.486685+j0.292085 | 1.462453+j0.283108 | 1.394097+j0.591166 |
| w12 | 0.611394+j1.056554 | 0.511520+j1.209224 | 0.564434+j0.949854 | 0.582962+j0.885139 | 0.617897+j0.860530 | 0.563858+j0.843483 |
| w13 | 0.611394+j1.056554 | 0.511520+j1.209224 | 0.274652+j1.087076 | 0.225537+j1.018339 | 0.218891+j1.046861 | 0.194790+j0.974535 |
| w14 | 0.611394+j1.056554 | 0.511520+j1.209224 | 0.819022+j1.265348 | 0.843530+j1.259403 | 0.842216+j1.227794 | 0.873475+j1.229631 |
| w15 | 0.611394+j1.056554 | 0.511520+j1.209224 | 0.300863+j1.452799 | 0.292085+j1.486685 | 0.289603+j1.462746 | 0.230654+j1.362914 |

FIG. 50

| w/CR | 2/16 | 4/16 | 6/16 | 8/16 | 10/16 | 12/16 | 14/16 |
|---|---|---|---|---|---|---|---|
| w0 | 0.690825+j0.585349 | 0.457028+j0.264235 | 0.585930+j0.319930 | 0.581805+j0.334988 | 0.560392+j0.290156 | 0.578970+j0.309447 | 0.556205+j0.306313 |
| w1 | 0.690825+j0.585350 | 0.457028+j0.264235 | 0.579831+j0.315654 | 0.585635+j0.330968 | 0.681112+j0.358142 | 0.721702+j0.383465 | 0.698107+j0.381975 |
| w2 | 0.690827+j0.585349 | 0.457029+j0.264235 | 0.629024+j0.217617 | 0.639661+j0.165525 | 0.601303+j0.115763 | 0.660123+j0.174184 | 0.603112+j0.185592 |
| w3 | 0.690823+j0.585349 | 0.457029+j0.264235 | 0.621533+j0.216858 | 0.643156+j0.166568 | 0.768180+j0.154657 | 0.789367+j0.241027 | 0.740611+j0.219107 |
| w4 | 0.690825+j0.585350 | 0.457028+j0.264235 | 0.579831+j0.315654 | 0.592963+j0.340165 | 0.544097+j0.308193 | 0.528085+j0.389822 | 0.497423+j0.421234 |
| w5 | 0.690825+j0.585350 | 0.457028+j0.264235 | 0.574244+j0.311784 | 0.586528+j0.335691 | 0.649301+j0.400611 | 0.630503+j0.500103 | 0.632312+j0.499021 |
| w6 | 0.690827+j0.585349 | 0.457029+j0.264235 | 0.621593+j0.216858 | 0.641671+j0.154211 | 0.602332+j0.106468 | 0.685472+j0.083624 | 0.805376+j0.061670 |
| w7 | 0.690827+j0.585350 | 0.457029+j0.264235 | 0.614830+j0.216139 | 0.645866+j0.155219 | 0.779701+j0.111926 | 0.936926+j0.086747 | 0.761043+j0.074016 |
| w8 | 0.690824+j0.585350 | 0.457028+j0.264235 | 0.319736+j0.177294 | 0.256324+j0.154712 | 0.363588+j0.173948 | 0.421081+j0.169169 | 0.372292+j0.238687 |
| w9 | 0.690824+j0.585350 | 0.457028+j0.264235 | 0.314239+j0.177470 | 0.257740+j0.165003 | 0.142216+j0.108587 | 0.254056+j0.081408 | 0.234548+j0.177704 |
| w10 | 0.690823+j0.585350 | 0.457028+j0.264235 | 0.314479+j0.163373 | 0.253905+j0.133141 | 0.383183+j0.095256 | 0.508228+j0.088452 | 0.436984+j0.152224 |
| w11 | 0.690825+j0.585350 | 0.457028+j0.264235 | 0.314933+j0.163511 | 0.255481+j0.133228 | 0.131151+j0.092101 | 0.086721+j0.072310 | 0.071834+j0.148278 |
| w12 | 0.690825+j0.585350 | 0.457028+j0.264235 | 0.314239+j0.177479 | 0.257989+j0.155669 | 0.359498+j0.175656 | 0.411013+j0.203430 | 0.378135+j0.354399 |
| w13 | 0.690824+j0.585350 | 0.457029+j0.264235 | 0.314645+j0.177662 | 0.259423+j0.156052 | 0.141590+j0.108762 | 0.254446+j0.094768 | 0.234014+j0.058219 |
| w14 | 0.690826+j0.585350 | 0.457028+j0.264235 | 0.314933+j0.163511 | 0.255597+j0.133615 | 0.382409+j0.095066 | 0.515559+j0.071508 | 0.440779+j0.051628 |
| w15 | 0.690823+j0.585350 | 0.457028+j0.264235 | 0.316531+j0.163646 | 0.257175+j0.133701 | 0.130510+j0.092363 | 0.086440+j0.072876 | 0.084467+j0.052398 |
| w16 | 0.585350+j0.690826 | 0.264235+j0.457029 | 0.319930+j0.585930 | 0.379008+j0.600742 | 0.388353+j0.640097 | 0.327555+j0.525962 | 0.336331+j0.660786 |
| w17 | 0.585350+j0.690826 | 0.264235+j0.457028 | 0.315654+j0.579831 | 0.375622+j0.606499 | 0.419487+j0.605548 | 0.382772+j0.675704 | 0.418845+j0.776409 |
| w18 | 0.585351+j0.690825 | 0.264235+j0.457029 | 0.217617+j0.629024 | 0.168779+j0.701292 | 0.183561+j0.653534 | 0.175986+j0.592218 | 0.206352+j0.743684 |
| w19 | 0.585351+j0.690825 | 0.264235+j0.457029 | 0.216858+j0.621593 | 0.176024+j0.703042 | 0.192718+j0.682799 | 0.231337+j0.737121 | 0.276826+j0.886705 |
| w20 | 0.585350+j0.690826 | 0.264235+j0.457029 | 0.315654+j0.579831 | 0.381824+j0.601641 | 0.420548+j0.516710 | 0.406824+j0.473369 | 0.439185+j0.546796 |
| w21 | 0.585350+j0.690826 | 0.264235+j0.457029 | 0.311784+j0.574244 | 0.377986+j0.607168 | 0.478320+j0.674186 | 0.507078+j0.802570 | 0.542835+j0.632044 |
| w22 | 0.585351+j0.690826 | 0.264235+j0.457028 | 0.216858+j0.621583 | 0.162548+j0.708528 | 0.130081+j0.671538 | 0.081174+j0.613265 | 0.066805+j0.768425 |
| w23 | 0.585351+j0.690826 | 0.264235+j0.457029 | 0.216139+j0.614800 | 0.169976+j0.709409 | 0.130331+j0.694278 | 0.083021+j0.767826 | 0.080272+j0.923832 |
| w24 | 0.585349+j0.690826 | 0.264235+j0.457029 | 0.177234+j0.313766 | 0.164033+j0.346721 | 0.264460+j0.368220 | 0.269365+j0.373217 | 0.263830+j0.564022 |
| w25 | 0.585349+j0.690826 | 0.264235+j0.457029 | 0.177479+j0.314209 | 0.164869+j0.347827 | 0.149136+j0.318482 | 0.200539+j0.250430 | 0.176737+j0.283231 |
| w26 | 0.585350+j0.690826 | 0.264235+j0.457028 | 0.163373+j0.314479 | 0.128348+j0.362615 | 0.141502+j0.436873 | 0.109576+j0.442010 | 0.168460+j0.607067 |
| w27 | 0.585350+j0.690826 | 0.264235+j0.457029 | 0.163511+j0.314993 | 0.128793+j0.363810 | 0.099783+j0.370718 | 0.075319+j0.256488 | 0.059053+j0.271040 |
| w28 | 0.585350+j0.690826 | 0.264235+j0.457029 | 0.177479+j0.314209 | 0.165196+j0.349449 | 0.256302+j0.364280 | 0.299438+j0.350712 | 0.295727+j0.446405 |
| w29 | 0.585349+j0.690827 | 0.264235+j0.457029 | 0.177632+j0.314845 | 0.166055+j0.360585 | 0.145729+j0.314336 | 0.205632+j0.245812 | 0.182567+j0.384902 |
| w30 | 0.585351+j0.690826 | 0.264235+j0.457029 | 0.163511+j0.314983 | 0.128552+j0.366268 | 0.131228+j0.437877 | 0.076874+j0.448861 | 0.068840+j0.576445 |
| w31 | 0.585350+j0.690826 | 0.264235+j0.457029 | 0.163846+j0.315501 | 0.129002+j0.367499 | 0.095984+j0.371670 | 0.072444+j0.254864 | 0.061187+j0.420342 |
| w32 | 0.837320+j0.692111 | 1.210202+j0.506671 | 0.915434+j0.562969 | 0.876123+j0.641294 | 1.016975+j0.644514 | 1.010495+j0.558365 | 1.003447+j0.483696 |

FIG. 51

| | | | | | | | |
|---|---|---|---|---|---|---|---|
| w33 | 0.837320+j0.692111 | 1.210202+j0.506671 | 0.899640+j0.548599 | 0.857263+j0.493460 | 0.865222+j0.447394 | 0.861166+j0.469956 | 0.845525+j0.420972 |
| w34 | 0.837322+j0.692111 | 1.210202+j0.506671 | 1.041431+j0.244937 | 1.005452+j0.192113 | 1.128584+j0.334833 | 1.108180+j0.346451 | 1.062454+j0.293134 |
| w35 | 0.837322+j0.692111 | 1.210202+j0.506671 | 1.020138+j0.244325 | 0.969325+j0.208138 | 0.956929+j0.243315 | 0.844982+j0.285063 | 0.896494+j0.265193 |
| w36 | 0.837321+j0.692112 | 1.210202+j0.506871 | 0.899640+j0.548598 | 0.835073+j0.646548 | 0.880528+j0.690980 | 0.875494+j0.737255 | 0.813205+j0.665202 |
| w37 | 0.837320+j0.692112 | 1.210202+j0.506671 | 0.883121+j0.533505 | 0.820362+j0.497932 | 0.787015+j0.549425 | 0.746110+j0.618549 | 0.767362+j0.579003 |
| w38 | 0.837323+j0.692111 | 1.210202+j0.506671 | 1.020130+j0.244325 | 0.970090+j0.164900 | 1.176544+j0.123217 | 1.156123+j0.117057 | 1.090971+j0.090120 |
| w39 | 0.837322+j0.692112 | 1.210202+j0.506671 | 0.997836+j0.243471 | 0.934836+j0.182858 | 0.984649+j0.117137 | 0.989358+j0.099869 | 0.921093+j0.086383 |
| w40 | 0.837313+j0.692112 | 1.210202+j0.506671 | 1.151606+j0.765662 | 1.146306+j0.718300 | 1.215599+j0.699359 | 1.191952+j0.658826 | 1.167342+j0.536796 |
| w41 | 0.837319+j0.692112 | 1.210202+j0.506671 | 1.216021+j0.808778 | 1.291524+j0.653771 | 1.470503+j0.909385 | 1.428402+j0.781660 | 1.372867+j0.669123 |
| w42 | 0.837321+j0.692111 | 1.210202+j0.506671 | 1.352932+j0.268569 | 1.384471+j0.242989 | 1.345613+j0.437140 | 1.302908+j0.407817 | 1.261173+j0.323729 |
| w43 | 0.837320+j0.692112 | 1.210202+j0.506671 | 1.427958+j0.282898 | 1.395846+j0.389207 | 1.641491+j0.562622 | 1.558455+j0.483525 | 1.461132+j0.407370 |
| w44 | 0.837320+j0.692112 | 1.210202+j0.506671 | 1.216021+j0.808778 | 1.124863+j0.844081 | 1.036455+j0.904332 | 1.034030+j0.874562 | 1.066040+j0.742804 |
| w45 | 0.837313+j0.692113 | 1.210202+j0.506671 | 1.479922+j0.969013 | 1.534980+j0.961645 | 1.216171+j1.212947 | 1.241676+j1.044629 | 1.239054+j0.916396 |
| w46 | 0.837322+j0.692112 | 1.210202+j0.506671 | 1.427958+j0.282998 | 1.404319+j0.139223 | 1.412229+j0.146603 | 1.360208+j0.138182 | 1.281447+j0.108014 |
| w47 | 0.837321+j0.692112 | 1.210202+j0.506671 | 1.747630+j0.343683 | 1.784855+j0.324115 | 1.729269+j0.190765 | 1.625172+j0.163628 | 1.504307+j0.136707 |
| w48 | 0.692112+j0.837321 | 0.506671+j1.210202 | 0.562939+j0.915494 | 0.608985+j0.850637 | 0.520270+j0.894598 | 0.523910+j0.993510 | 0.639937+j0.977245 |
| w49 | 0.692111+j0.837321 | 0.506671+j1.210202 | 0.548539+j0.899640 | 0.551777+j0.870592 | 0.483940+j0.649821 | 0.446217+j0.929659 | 0.537002+j0.852344 |
| w50 | 0.692113+j0.837320 | 0.506671+j1.210202 | 0.244937+j1.041461 | 0.190487+j1.082774 | 0.232928+j0.985823 | 0.321209+j1.087223 | 0.455568+j1.065457 |
| w51 | 0.692113+j0.837321 | 0.506671+j1.210202 | 0.244326+j1.020188 | 0.244861+j1.048792 | 0.267181+j0.985389 | 0.276744+j0.983825 | 0.281384+j1.059641 |
| w52 | 0.692112+j0.837321 | 0.506671+j1.210202 | 0.548539+j0.899840 | 0.610962+j0.803882 | 0.694953+j0.796701 | 0.710545+j0.883461 | 0.792733+j0.832292 |
| w53 | 0.692112+j0.837322 | 0.506671+j1.210202 | 0.533508+j0.883121 | 0.565010+j0.811974 | 0.623283+j0.720032 | 0.605158+j0.733060 | 0.662410+j0.724582 |
| w54 | 0.692114+j0.837321 | 0.506671+j1.210202 | 0.244325+j1.020188 | 0.168637+j1.002744 | 0.107976+j0.949083 | 0.108348+j1.104517 | 0.105874+j1.274300 |
| w55 | 0.692113+j0.837321 | 0.506671+j1.210202 | 0.243471+j0.997066 | 0.205601+j0.980010 | 0.122236+j0.924513 | 0.083597+j0.827020 | 0.098152+j1.000642 |
| w56 | 0.692111+j0.837322 | 0.506671+j1.210202 | 0.765652+j1.151606 | 0.811671+j1.077059 | 0.834215+j1.095182 | 0.616510+j1.165736 | 0.775759+j1.106874 |
| w57 | 0.692110+j0.837322 | 0.506671+j1.210202 | 0.808778+j1.216021 | 0.708577+j1.212442 | 0.565938+j1.212930 | 0.741499+j1.425720 | 0.816189+j1.333815 |
| w58 | 0.692112+j0.837321 | 0.506671+j1.210202 | 0.268539+j1.352982 | 0.232236+j1.415900 | 0.134887+j1.326783 | 0.378428+j1.273867 | 0.549851+j1.233699 |
| w59 | 0.692112+j0.837321 | 0.506671+j1.210202 | 0.282938+j1.427968 | 0.447381+j1.368136 | 0.343747+j1.293003 | 0.452484+j1.534368 | 0.549193+j1.472736 |
| w60 | 0.692111+j0.837322 | 0.506671+j1.210202 | 0.808778+j1.216021 | 0.945797+j1.067632 | 0.842609+j1.028273 | 0.838816+j1.052224 | 0.962209+j0.936182 |
| w61 | 0.692111+j0.837322 | 0.506671+j1.210202 | 0.969012+j1.479922 | 1.098653+j1.408274 | 0.967471+j1.398566 | 1.008823+j1.261597 | 1.056456+j1.143504 |
| w62 | 0.692113+j0.837322 | 0.506671+j1.210202 | 0.282938+j1.427958 | 0.166563+j1.727023 | 0.174737+j1.671315 | 0.126520+j1.317668 | 0.318114+j1.324413 |
| w63 | 0.692113+j0.837322 | 0.506671+j1.210202 | 0.343833+j1.747630 | 0.867638+j1.731517 | 0.546701+j1.623153 | 0.151986+j1.598069 | 0.161901+j1.531081 |

FIG. 52

| u/CR | 3/16 | 5/16 | 7/16 | 9/16 | 11/16 | 13/16 |
|---|---|---|---|---|---|---|
| u0 | 0.964850 | 0.746358 | 0.682758 | 0.720492 | 0.718420 | 0.741203 |
| u1 | 0.964851 | 0.724327 | 0.689494 | 0.745635 | 0.785950 | 0.837561 |
| u2 | 0.964850 | 0.701244 | 0.614079 | 0.578601 | 0.566863 | 0.571567 |
| u3 | 0.964851 | 0.724852 | 0.608604 | 0.578878 | 0.591711 | 0.652725 |
| u4 | 0.964851 | 1.089143 | 1.229555 | 1.234916 | 1.228615 | 1.196834 |
| u5 | 0.964851 | 1.487807 | 1.519290 | 1.511816 | 1.446265 | 1.354509 |
| u6 | 0.964851 | 1.016430 | 0.952184 | 0.929933 | 0.919117 | 0.944049 |
| u7 | 0.964851 | 0.981269 | 1.010198 | 1.008385 | 1.055715 | 1.062656 |
| u8 | 0.262799 | 0.188668 | 0.119570 | 0.131917 | 0.179189 | 0.158838 |
| u9 | 0.262799 | 0.187756 | 0.119309 | 0.132245 | 0.179229 | 0.216557 |
| u10 | 0.262799 | 0.183302 | 0.122704 | 0.095129 | 0.060071 | 0.034740 |
| u11 | 0.262799 | 0.184133 | 0.122986 | 0.094858 | 0.060040 | 0.089245 |
| u12 | 0.262799 | 0.299163 | 0.361306 | 0.393581 | 0.431407 | 0.422770 |
| u13 | 0.262799 | 0.295502 | 0.360929 | 0.392102 | 0.437930 | 0.493766 |
| u14 | 0.262799 | 0.306233 | 0.349187 | 0.316988 | 0.303511 | 0.286845 |
| u15 | 0.262799 | 0.310441 | 0.349698 | 0.317410 | 0.304552 | 0.350258 |

FIG. 53A

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 1 | 1 | 1 | 1 | 1 | 1 | 1 | 1 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 0 | 0 | 0 | 0 | 0 | 0 | 0 | 0 |
| $y_{4,s}$ | 0 | 0 | 0 | 0 | 1 | 1 | 1 | 1 | 1 | 1 | 1 | 1 | 0 | 0 | 0 | 0 |
| $y_{6,s}$ | 0 | 0 | 1 | 1 | 1 | 1 | 0 | 0 | 0 | 0 | 1 | 1 | 1 | 1 | 0 | 0 |
| $y_{8,s}$ | 0 | 1 | 1 | 0 | 0 | 1 | 1 | 0 | 0 | 1 | 1 | 0 | 0 | 1 | 1 | 0 |
| $Re(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 53B

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 1 | 1 | 1 | 1 | 1 | 1 | 1 | 1 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-u_0$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 0 | 0 | 0 | 0 | 0 | 0 | 0 | 0 |
| $y_{5,s}$ | 0 | 0 | 0 | 0 | 1 | 1 | 1 | 1 | 1 | 1 | 1 | 1 | 0 | 0 | 0 | 0 |
| $y_{7,s}$ | 0 | 0 | 1 | 1 | 1 | 1 | 0 | 0 | 0 | 0 | 1 | 1 | 1 | 1 | 0 | 0 |
| $y_{9,s}$ | 0 | 1 | 1 | 0 | 0 | 1 | 1 | 0 | 0 | 1 | 1 | 0 | 0 | 1 | 1 | 0 |
| $Im(z_s)$ | $u_0$ | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 54

| u/CR | 2/16 | 4/16 | 6/16 | 8/16 | 10/16 | 12/16 | 14/16 |
|---|---|---|---|---|---|---|---|
| u0 | 0.951821 | 0.772242 | 0.670816 | 0.720040 | 0.687860 | 0.725026 | 0.776914 |
| u1 | 0.951821 | 0.755105 | 0.671187 | 0.717092 | 0.687453 | 0.682522 | 0.731844 |
| u2 | 0.951821 | 0.733323 | 0.684394 | 0.742371 | 0.784311 | 0.833407 | 0.872060 |
| u3 | 0.951821 | 0.748492 | 0.683930 | 0.746130 | 0.778844 | 0.779595 | 0.823606 |
| u4 | 0.951821 | 0.762565 | 0.601258 | 0.568017 | 0.529234 | 0.542187 | 0.605096 |
| u5 | 0.951821 | 0.741006 | 0.601273 | 0.568434 | 0.529245 | 0.530376 | 0.565319 |
| u6 | 0.951821 | 0.771170 | 0.594244 | 0.571550 | 0.587945 | 0.627093 | 0.688256 |
| u7 | 0.951821 | 0.797312 | 0.594239 | 0.571162 | 0.588065 | 0.601059 | 0.646057 |
| u8 | 0.951821 | 1.144458 | 1.253351 | 1.234492 | 1.288591 | 1.273237 | 1.213263 |
| u9 | 0.951821 | 1.153922 | 1.197825 | 1.174495 | 1.172818 | 1.182640 | 1.148415 |
| u10 | 0.951821 | 1.658369 | 1.695168 | 1.675628 | 1.610570 | 1.491684 | 1.361829 |
| u11 | 0.951821 | 1.306308 | 1.431932 | 1.433385 | 1.432017 | 1.374447 | 1.283388 |
| u12 | 0.951821 | 0.910861 | 0.932278 | 0.907903 | 0.905961 | 0.956192 | 0.974968 |
| u13 | 0.951821 | 0.864684 | 0.935172 | 0.914425 | 0.885027 | 0.892801 | 0.922447 |
| u14 | 0.951821 | 0.903549 | 0.990523 | 1.005079 | 1.064442 | 1.100380 | 1.087536 |
| u15 | 0.951821 | 0.940034 | 0.989938 | 0.980523 | 1.006622 | 1.025215 | 1.029882 |
| u16 | 0.306654 | 0.215961 | 0.115733 | 0.153556 | 0.169392 | 0.148680 | 0.177357 |
| u17 | 0.306654 | 0.220732 | 0.115734 | 0.153554 | 0.169393 | 0.148677 | 0.145054 |
| u18 | 0.306654 | 0.224176 | 0.115606 | 0.153573 | 0.172311 | 0.209035 | 0.243373 |
| u19 | 0.306654 | 0.219360 | 0.115605 | 0.153576 | 0.172310 | 0.209018 | 0.210474 |
| u20 | 0.306654 | 0.196638 | 0.116628 | 0.075094 | 0.056177 | 0.029660 | 0.047926 |
| u21 | 0.306654 | 0.200750 | 0.116629 | 0.075095 | 0.056177 | 0.029660 | 0.016211 |
| u22 | 0.306654 | 0.197697 | 0.116766 | 0.075098 | 0.057134 | 0.088798 | 0.112331 |
| u23 | 0.306654 | 0.193649 | 0.116765 | 0.075098 | 0.057134 | 0.088798 | 0.080421 |
| u24 | 0.306654 | 0.263498 | 0.361114 | 0.411488 | 0.400665 | 0.399082 | 0.451783 |
| u25 | 0.306654 | 0.268956 | 0.361058 | 0.411542 | 0.400670 | 0.397734 | 0.415679 |
| u26 | 0.306654 | 0.272340 | 0.359367 | 0.411127 | 0.427709 | 0.467702 | 0.526543 |
| u27 | 0.306654 | 0.266958 | 0.359424 | 0.411075 | 0.427698 | 0.463378 | 0.488786 |
| u28 | 0.306654 | 0.299845 | 0.342823 | 0.304005 | 0.283846 | 0.270711 | 0.310792 |
| u29 | 0.306654 | 0.305269 | 0.342769 | 0.303985 | 0.283843 | 0.270625 | 0.277078 |
| u30 | 0.306654 | 0.302366 | 0.344552 | 0.303827 | 0.293434 | 0.333743 | 0.380080 |
| u31 | 0.306654 | 0.296777 | 0.344606 | 0.303847 | 0.293437 | 0.333375 | 0.345309 |

FIG. 55

| | | | | | | | | | | | | | | | | |
|---|---|---|---|---|---|---|---|---|---|---|---|---|---|---|---|---|
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 0 | 0 | 0 | 0 | 0 | 0 | 0 | 0 | 0 | 0 | 0 | 0 | 0 | 0 | 0 | 0 |
| $y_{4,s}$ | 0 | 0 | 0 | 0 | 0 | 0 | 0 | 0 | 1 | 1 | 1 | 1 | 1 | 1 | 1 | 1 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{0,s}$ | 1 | 1 | 1 | 1 | 1 | 1 | 1 | 1 | 1 | 1 | 1 | 1 | 1 | 1 | 1 | 1 |
| $y_{2,s}$ | 1 | 1 | 1 | 1 | 1 | 1 | 1 | 1 | 1 | 1 | 1 | 1 | 1 | 1 | 1 | 1 |
| $y_{4,s}$ | 1 | 1 | 1 | 1 | 1 | 1 | 1 | 1 | 0 | 0 | 0 | 0 | 0 | 0 | 0 | 0 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-u_{0}$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 1 | 1 | 1 | 1 | 1 | 1 | 1 | 1 | 1 | 1 | 1 | 1 | 1 | 1 | 1 | 1 |
| $y_{4,s}$ | 0 | 0 | 0 | 0 | 0 | 0 | 0 | 0 | 1 | 1 | 1 | 1 | 1 | 1 | 1 | 1 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $u_{0}$ | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{0,s}$ | 0 | 0 | 0 | 0 | 0 | 0 | 0 | 0 | 0 | 0 | 0 | 0 | 0 | 0 | 0 | 0 |
| $y_{2,s}$ | 0 | 0 | 0 | 0 | 0 | 0 | 0 | 0 | 0 | 0 | 0 | 0 | 0 | 0 | 0 | 0 |
| $y_{4,s}$ | 1 | 1 | 1 | 1 | 1 | 1 | 1 | 1 | 0 | 0 | 0 | 0 | 0 | 0 | 0 | 0 |
| $y_{6,s}$ | 0 | 0 | 0 | 0 | 1 | 1 | 1 | 1 | 1 | 1 | 1 | 1 | 0 | 0 | 0 | 0 |
| $y_{8,s}$ | 0 | 0 | 1 | 1 | 1 | 1 | 0 | 0 | 0 | 0 | 1 | 1 | 1 | 1 | 0 | 0 |
| $y_{10,s}$ | 0 | 1 | 1 | 0 | 0 | 1 | 1 | 0 | 0 | 1 | 1 | 0 | 0 | 1 | 1 | 0 |
| $Re(z_s)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 56

| | | | | | | | | | | | | | | | | |
|---|---|---|---|---|---|---|---|---|---|---|---|---|---|---|---|---|
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 0 | 0 | 0 | 0 | 0 | 0 | 0 | 0 | 0 | 0 | 0 | 0 | 0 | 0 | 0 | 0 |
| $y_{5,s}$ | 0 | 0 | 0 | 0 | 0 | 0 | 0 | 0 | 1 | 1 | 1 | 1 | 1 | 1 | 1 | 1 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ |
| $y_{1,s}$ | 1 | 1 | 1 | 1 | 1 | 1 | 1 | 1 | 1 | 1 | 1 | 1 | 1 | 1 | 1 | 1 |
| $y_{3,s}$ | 1 | 1 | 1 | 1 | 1 | 1 | 1 | 1 | 1 | 1 | 1 | 1 | 1 | 1 | 1 | 1 |
| $y_{5,s}$ | 1 | 1 | 1 | 1 | 1 | 1 | 1 | 1 | 0 | 0 | 0 | 0 | 0 | 0 | 0 | 0 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $-u_{15}$ | $-u_{14}$ | $-u_{13}$ | $-u_{12}$ | $-u_{11}$ | $-u_{10}$ | $-u_{9}$ | $-u_{8}$ | $-u_{7}$ | $-u_{6}$ | $-u_{5}$ | $-u_{4}$ | $-u_{3}$ | $-u_{2}$ | $-u_{1}$ | $-u_{0}$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 1 | 1 | 1 | 1 | 1 | 1 | 1 | 1 | 1 | 1 | 1 | 1 | 1 | 1 | 1 | 1 |
| $y_{5,s}$ | 0 | 0 | 0 | 0 | 0 | 0 | 0 | 0 | 1 | 1 | 1 | 1 | 1 | 1 | 1 | 1 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $u_{0}$ | $u_{1}$ | $u_{2}$ | $u_{3}$ | $u_{4}$ | $u_{5}$ | $u_{6}$ | $u_{7}$ | $u_{8}$ | $u_{9}$ | $u_{10}$ | $u_{11}$ | $u_{12}$ | $u_{13}$ | $u_{14}$ | $u_{15}$ |
| $y_{1,s}$ | 0 | 0 | 0 | 0 | 0 | 0 | 0 | 0 | 0 | 0 | 0 | 0 | 0 | 0 | 0 | 0 |
| $y_{3,s}$ | 0 | 0 | 0 | 0 | 0 | 0 | 0 | 0 | 0 | 0 | 0 | 0 | 0 | 0 | 0 | 0 |
| $y_{5,s}$ | 1 | 1 | 1 | 1 | 1 | 1 | 1 | 1 | 0 | 0 | 0 | 0 | 0 | 0 | 0 | 0 |
| $y_{7,s}$ | 0 | 0 | 0 | 0 | 1 | 1 | 1 | 1 | 1 | 1 | 1 | 1 | 0 | 0 | 0 | 0 |
| $y_{9,s}$ | 0 | 0 | 1 | 1 | 1 | 1 | 0 | 0 | 0 | 0 | 1 | 1 | 1 | 1 | 0 | 0 |
| $y_{11,s}$ | 0 | 1 | 1 | 0 | 0 | 1 | 1 | 0 | 0 | 1 | 1 | 0 | 0 | 1 | 1 | 0 |
| $Im(z_s)$ | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ |

FIG. 58

| Modulation | Rows in Part 1 $N_{part1}$ | Rows in Part 2 $N_{part2}$ | Columns m |
|---|---|---|---|
| QPSK | 69120 | 0 | 2 |
| 16QAM | 69120 | 0 | 4 |
| 64QAM | 69120 | 0 | 6 |
| 256QAM | 69120 | 0 | 8 |
| 1024QAM | 68400 | 720 | 10 |
| 4096QAM | 69120 | 0 | 12 |

FIG. 60

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 | | | | | | |

⇕

| | | | | | | | | | | | | | | | | | | | | | |
|---|---|---|---|---|---|---|---|---|---|---|---|---|---|---|---|---|---|---|---|---|---|
| 12 | 8 | 132 | 26 | 3 | 18 | 19 | 98 | 37 | 190 | 123 | 81 | 95 | 167 | 76 | 66 | 27 | 46 | 105 | 28 | 29 | 170 |
| 20 | 96 | 35 | 177 | 24 | 86 | 114 | 63 | 52 | 80 | 119 | 153 | 121 | 107 | 97 | 129 | 57 | 38 | 15 | 91 | 122 | 14 |
| 104 | 175 | 150 | 1 | 124 | 72 | 90 | 32 | 161 | 78 | 44 | 73 | 134 | 162 | 5 | 11 | 179 | 93 | 6 | 152 | 180 | 68 |
| 36 | 103 | 160 | 100 | 138 | 146 | 9 | 82 | 187 | 147 | 7 | 87 | 17 | 102 | 69 | 110 | 130 | 42 | 16 | 71 | 2 | 169 |
| 58 | 33 | 136 | 106 | 140 | 84 | 79 | 143 | 156 | 139 | 55 | 116 | 4 | 21 | 144 | 64 | 70 | 158 | 48 | 118 | 184 | 50 |
| 181 | 120 | 174 | 133 | 115 | 53 | 127 | 74 | 25 | 49 | 88 | 22 | 89 | 34 | 126 | 61 | 94 | 172 | 131 | 39 | 99 | 183 |
| 163 | 111 | 155 | 51 | 191 | 31 | 128 | 149 | 56 | 85 | 109 | 10 | 151 | 188 | 40 | 83 | 41 | 47 | 178 | 186 | 43 | 54 |
| 164 | 13 | 142 | 117 | 92 | 113 | 182 | 168 | 165 | 101 | 171 | 159 | 60 | 166 | 77 | 30 | 67 | 23 | 0 | 65 | 141 | 185 |
| 112 | 145 | 135 | 108 | 176 | 45 | 148 | 137 | 125 | 62 | 75 | 189 | 59 | 173 | 154 | 157 | | | | | | |

Rate 2/16 69k CODE TABLE (PUNCTURE LENGTH 0):

Rate 3/16 69k CODE TABLE (PUNCTURE LENGTH 0):

Rate 4/16 69k CODE TABLE (PUNCTURE LENGTH 0):

Rate 5/16 69k CODE TABLE (PUNCTURE LENGTH 1800):

Rate 6/16 69k CODE TABLE (PUNCTURE LENGTH 1800):

Rate 7/16 69k CODE TABLE (PUNCTURE LENGTH 2160):

Rate 8/16 69k CODE TABLE (PUNCTURE LENGTH 2520):

Rate 9/16 69k CODE TABLE (PUNCTURE LENGTH 1800):

Rate 9/16 69k CODE TABLE (PUNCTURE LENGTH 1080):

Rate 10/16 69k CODE TABLE (PUNCTURE LENGTH 360):

Rate 11/16 69k CODE TABLE (PUNCTURE LENGTH 1440):

Rate 12/16 69k CODE TABLE (PUNCTURE LENGTH 1440):

Rate 13/16 69k CODE TABLE (PUNCTURE LENGTH 720):

Rate 14/16 69k CODE TABLE (PUNCTURE LENGTH 720):

| Rate | INFORMATION LENGTH K | PUNCTURE LENGTH L | (X1, K1) | (X2, K2) | (X3, K3) | (X4, K4) | (X5, K5) | XM1 | M1 | M2 |
|---|---|---|---|---|---|---|---|---|---|---|
| 2/16 | 8640 | 0 | (21, 1440) | (20, 7200) | (0, 0) | (0, 0) | (0, 0) | 16 | 1800 | 58680 |
| 3/16 | 12960 | 0 | (16, 11520) | (15, 1440) | (0, 0) | (0, 0) | (0, 0) | 11 | 1800 | 54360 |
| 4/16 | 17280 | 0 | (13, 16200) | (12, 720) | (45, 360) | (0, 0) | (0, 0) | 9 | 1800 | 50040 |
| 5/16 | 21600 | 1800 | (28, 720) | (27, 1080) | (9, 7560) | (8, 3960) | (10, 8280) | 4 | 3600 | 45720 |
| 6/16 | 25920 | 1800 | (25, 1800) | (9, 13680) | (8, 8640) | (10, 1800) | (0, 0) | 2 | 3600 | 41400 |
| 7/16 | 30240 | 2160 | (19, 2160) | (8, 26280) | (7, 360) | (3, 1440) | (0, 0) | 2 | 3960 | 37080 |
| 8/16 | 34560 | 2520 | (15, 1800) | (14, 720) | (8, 20880) | (7, 5040) | (4, 6120) | 1 | 5040 | 32040 |
| 9/16 | 38880 | 1800 | (18, 1440) | (17, 360) | (10, 3240) | (9, 12240) | (4, 21600) | 1 | 9000 | 23040 |

FIG. 125

| Rate | INFORMATION LENGTH K | PUNCTURE LENGTH L | X1 | KX1 | X2 | KX2 | X3 | KX3 | Y1 | KY1 | M |
|---|---|---|---|---|---|---|---|---|---|---|---|
| 9/16 | 38880 | 1080 | 29 | 1080 | 17 | 3240 | 12 | 3240 | 3 | 31320 | 31320 |
| 10/16 | 43200 | 360 | 73 | 360 | 38 | 360 | 14 | 8280 | 3 | 34200 | 26280 |
| 11/16 | 47520 | 1440 | 29 | 1440 | 8 | 1800 | 9 | 5760 | 3 | 38520 | 23040 |
| 12/16 | 51840 | 1440 | 24 | 1440 | 9 | 4680 | 8 | 1440 | 3 | 44280 | 18720 |
| 13/16 | 56160 | 720 | 34 | 720 | 10 | 3600 | 11 | 4320 | 3 | 47520 | 13680 |
| 14/16 | 60480 | 720 | 24 | 720 | 12 | 1080 | 10 | 4680 | 3 | 54000 | 9360 |

TRANSMISSION DEVICE, TRANSMISSION METHOD, RECEPTION DEVICE, AND RECEPTION METHOD

CROSS REFERENCE TO RELATED APPLICATIONS

This application is a U.S. National Phase of International Patent Application No. PCT/JP2018/019106 filed on May 17, 2018, which claims priority benefit of Japanese Patent Application No. JP 2017-107533 filed in the Japan Patent Office on May 31, 2017. Each of the above-referenced applications is hereby incorporated herein by reference in its entirety.

TECHNICAL FIELD

The present technology relates to a transmission device, a transmission method, a reception device, and a reception method, and more particularly to, for example, a transmission device, a transmission method, a reception device, and a reception method for securing favorable communication quality in data transmission using an LDPC code.

BACKGROUND ART

Low density parity check (LDPC) codes have high error correction capability and are in recent years widely adopted in transmission systems for digital broadcasting, such as the digital video broadcasting (DVB)-S.2 in Europe and the like, DVB-T.2, DVB-C2, and the advanced television systems committee (ATSC) 3.0 in the United States, and the like, for example (see, for example, Non-Patent Document 1).

With recent researches, it has been found that the LDPC codes are able to obtain performance close to the Shannon limit as the code length is increased, similar to turbo codes and the like. Furthermore, the LDPC codes have a property that the minimum distance is proportional to the code length and thus have a good block error probability characteristic, as characteristics. Moreover, a so-called error floor phenomenon observed in decoding characteristics of turbo codes and the like hardly occur, which is also an advantage.

CITATION LIST

Non-Patent Document

Non-Patent Document 1: ATSC Standard: Physical Layer Protocol (A/322), 7 Sep. 2016

SUMMARY OF THE INVENTION

Problems to be Solved by the Invention

In data transmission using an LDPC code, for example, the LDPC code is symbols (symbolized) of quadrature modulation (digital modulation) such as quadrature phase shift keying (QPSK), and the symbols are mapped at signal points of the quadrature modulation and are sent.

The data transmission using an LDPC code is spreading worldwide and is required to secure favorable communication (transmission) quality.

The present technology has been made in view of such a situation, and aims to secure favorable communication quality in data transmission using an LDPC code.

Solutions to Problems

A first transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 2/16, and puncture a head of the information bits of the extended LDPC code by the puncture length L to generate a punctured LDPC code with the code length N of 69120 bits and the coding rate r of 2/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 0, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is 1444 1737 1780 9182 9748 9954 11859 23510 36957 41211 41804 41857 42268 42854 45152 46217 46448 52760 57528 59998 60168

281 1279 1468 9650 11337 15973 21859 24346 25864 28317 33522 35344 40280 43576 43942 50851 53221 57076 57561 59922 59962

132 758 1470 2901 2957 3365 4567 7062 10939 12288 20818 35122 39299 41903 43394 44289 49129 51394 53222 53899 56037

9 756 1510 3127 4867 15380 16575 17906 19275 20944 25462 27021 31939 34367 36491 39391 45013 45505 47768 50626 51547

188 252 1181 2939 4132 7944 12352 15443 17831 18785 18904 22672 23400 30518 30652 45102 51500 52032 52868 60341

496 564 1527 2708 2751 3658 6451 8212 11654 17193 21558 23963 28394 30554 30628 35052 44835 45090 49804 52979

793 858 1710 3561 10566 11369 17707 20970 22329 22383 24607 31237 38613 42719 43867 45715 50453 51882 55535 60316

689 980 1657 2690 4633 11070 16939 18443 20748 21753 25742 30361 31544 31693 33019 40842 47042 48850 52130 56606

198 281 1664 3384 12801 17438 24093 29656 30578 31929 35921 38919 38984 40957 43262 48155 50743 56398 56427 59215

457 1065 1196 2861 12717 15390 16655 17899 18300 22233 31560 32716 34991 43324 46709 51328 52891 54292 56334 59229

1307 1481 1599 13551 21460 22804 23439 32551 32671 35941 36329 40096 41474 45156 50568 55578 55667 56581 59061 60009

99 485 708 4043 5527 5824 7489 8809 15871 17753 18297 18507 19070 22839 28023 41124 43165 50873 51968 57000

188 412 1641 1833 5707 7556 10610 12636 14533 26728 27604 31757 32972 34677 36279 38315 42252 43155 53121 57503

300 794 1153 6459 7063 13526 17788 18308 21233 21439 22250 28514 32042 32160 36140 44273 49289 50434 51163 56471

757 1336 1440 5560 6283 10080 10986 13051 17638 22870 31581 35463 41212 42195 43305 46746 49564 56412 58207 59477

106 1195 1474 6273 14321 14746 16496 17016 17214 19472 27450 33489 40638 42896 43150 47624 51106 51339 53730 55816

98 1002 1336 2076 9328 10989 13413 13916 14455 17863 19776 24981 31172 39450 40385 43348 44833 46967 52917 58029

262 1363 1605 4715 8438 8794 12188 18208 19803 28570 36281 38576 39120 40344 44994 45827 46559 49914 50771 56658

870 1743 1764 5521 8695 11745 15888 16359 16412 33151 37033 38281 38499 39026 41174 44818 53168 56178 58405 60285

861 1142 1169 2232 4370 9265 10442 15376 15947 19420 24577 29045 36440 38242 41035 47841 49589 50529 52662 59907

231 913 1440 2695 6369 7938 8296 12107 14329 19324 25096 26108 35369 38516 41289 43604 52617 57130 59909 60020

214 667 762 3988 6762 14360 15257 18298 18943 19364 29813 33804 35106 36373 39451 39478 45683 47618 48539 59814

1144 1150 1746 1800 7038 11454 18376 18819 21869 26781 33351 35591 46571 49235 49956 50749 51642 53390 56404 58103

308 317 1510 5176 12653 13311 15884 18075 22371 26021 27004 29283 30382 32114 32978 35790 47224 48249 51701 57840

2786 5188 6809 7110 7138 7167 8042 12569 15301 27503 27894 32875 35277 48267 49051 57363

6186 6554 12052 14220 15013 15388 22130 27207 30084 30620 31562 36834 38446 52593 56791 60017

8810 12703 21600 21640 22233 26157 27268 27384 33020 39679 49298 51854 52364 53298 55215 59802

2670 6309 10054 11421 11750 11901 12053 12752 17466 28571 29910 32369 34446 38373 49448 51729

11357 12810 13252 14755 22824 30867 32868 33512 34862 35560 38704 41861 42805 43103 48692 55234.

A first reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 2/16, and puncturing a head of the information bits of the extended LDPC code by the puncture length L to generate the punctured LDPC code with the code length N of 69120 bits and the coding rate r of 2/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 0, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is 1444 1737 1780 9182 9748 9954 11859 23510 36957 41211 41804 41857 42268 42854 45152 46217 46448 52760 57528 59998 60168

281 1279 1468 9650 11337 15973 21859 24346 25864 28317 33522 35344 40280 43576 43942 50851 53221 57076 57561 59922 59962

132 758 1470 2901 2957 3365 4567 7062 10939 12288 20818 35122 39299 41903 43394 44289 49129 51394 53222 53899 56037

9 756 1510 3127 4867 15380 16575 17906 19275 20944 25462 27021 31939 34367 36491 39391 45013 45505 47768 50626 51547

188 252 1181 2939 4132 7944 12352 15443 17831 18785 18904 22672 23400 30518 30652 45102 51500 52032 52868 60341

496 564 1527 2708 2751 3658 6451 8212 11654 17193 21558 23963 28394 30554 30628 35052 44835 45090 49804 52979

793 858 1710 3561 10566 11369 17707 20970 22329 22383 24607 31237 38613 42719 43867 45715 50453 51882 55535 60316

689 980 1657 2690 4633 11070 16939 18443 20748 21753 25742 30361 31544 31693 33019 40842 47042 48850 52130 56606

198 281 1664 3384 12801 17438 24093 29656 30578 31929 35921 38919 38984 40957 43262 48155 50743 56398 56427 59215

457 1065 1196 2861 12717 15390 16655 17899 18300 22233 31560 32716 34991 43324 46709 51328 52891 54292 56334 59229

1307 1481 1599 13551 21460 22804 23439 32551 32671 35941 36329 40096 41474 45156 50568 55578 55667 56581 59061 60009

99 485 708 4043 5527 5824 7489 8809 15871 17753 18297 18507 19070 22839 28023 41124 43165 50873 51968 57000

188 412 1641 1833 5707 7556 10610 12636 14533 26728 27604 31757 32972 34677 36279 38315 42252 43155 53121 57503

300 794 1153 6459 7063 13526 17788 18308 21233 21439 22250 28514 32042 32160 36140 44273 49289 50434 51163 56471

757 1336 1440 5560 6283 10080 10986 13051 17638 22870 31581 35463 41212 42195 43305 46746 49564 56412 58207 59477

106 1195 1474 6273 14321 14746 16496 17016 17214 19472 27450 33489 40638 42896 43150 47624 51106 51339 53730 55816

98 1002 1336 2076 9328 10989 13413 13916 14455 17863 19776 24981 31172 39450 40385 43348 44833 46967 52917 58029

262 1363 1605 4715 8438 8794 12188 18208 19803 28570 36281 38576 39120 40344 44994 45827 46559 49914 50771 56658

870 1743 1764 5521 8695 11745 15888 16359 16412 33151 37033 38281 38499 39026 41174 44818 53168 56178 58405 60285

861 1142 1169 2232 4370 9265 10442 15376 15947 19420 24577 29045 36440 38242 41035 47841 49589 50529 52662 59907

231 913 1440 2695 6369 7938 8296 12107 14329 19324 25096 26108 35369 38516 41289 43604 52617 57130 59909 60020

214 667 762 3988 6762 14360 15257 18298 18943 19364 29813 33804 35106 36373 39451 39478 45683 47618 48539 59814

1144 1150 1746 1800 7038 11454 18376 18819 21869 26781 33351 35591 46571 49235 49956 50749 51642 53390 56404 58103

308 317 1510 5176 12653 13311 15884 18075 22371 26021 27004 29283 30382 32114 32978 35790 47224 48249 51701 57840

2786 5188 6809 7110 7138 7167 8042 12569 15301 27503 27894 32875 35277 48267 49051 57363

6186 6554 12052 14220 15013 15388 22130 27207 30084 30620 31562 36834 38446 52593 56791 60017

8810 12703 21600 21640 22233 26157 27268 27384 33020 39679 49298 51854 52364 53298 55215 59802

2670 6309 10054 11421 11750 11901 12053 12752 17466 28571 29910 32369 34446 38373 49448 51729

11357 12810 13252 14755 22824 30867 32868 33512 34862 35560 38704 41861 42805 43103 48692 55234.

A second transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 3/16, and puncture a head of the information bits of the extended LDPC code by the puncture length L to generate a punctured LDPC code with the code length N of 69120 bits and the coding rate r of 3/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 0, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is 853 875 1192 2465 3004 4879 9062 21593 24043 26616 30909 32017 35006 42135 44268 56020

161 519 1556 3317 6015 14909 15760 21148 30072 32655 33940 34834 43430 44798 51284 52169

177 999 1683 6976 17610 18152 19591 22312 25036 27303 28584 47608 47749 50216 52322 54007

981 1000 1625 1630 6933 13217 13956 15319 22642 29483 31921 35465 43602 44250 46505 55678

1204 1242 1653 3066 6095 16862 20154 21430 23418 26408 30979 34093 41103 48385 54547 55093

316 1355 1562 2665 5222 6575 18299 19639 24268 30959 37721 47966 48255 51808 53697 56010

183 219 615 2859 6967 8044 13949 22294 28922 29355 32175 32276 33861 49675 52583 53512

263 342 1684 7426 14417 20396 27461 30075 33740 36812 38204 38420 41612 43083 45914 56035

256 870 921 3023 4662 5225 5276 19284 26034 35397 38524 44936 45178 46351 50860 51813

289 898 1442 9135 10774 13951 14133 19070 21192 27854 32118 43657 43859 43934 52772 53659

256 690 1324 3582 7066 8507 26854 34507 40768 44943 47952 50512 52080 52872 53733 53773

238 1037 1388 1929 6395 10653 21299 23085 26467 26836 27834 44924 47310 49393 53742 55883

976 1217 1469 7718 16449 19465 19983 22386 24762 28308 32395 33589 35997 41034 42118 43799

265 368 1365 1375 1808 7556 14593 15079 19648 36077 40397 41971 44940 47570 52522 55839

802 1656 1689 5554 6787 11067 15764 19656 31740 31762 36046 42258 45165 49245 52732 53420

265 307 1299 2775 6738 22483 26322 27615 30628 34194 38024 38787 46089 48680 49115 51063

698 747 1241 2898 5218 7964 15358 17928 28069 29537 33641 36103 40207 40701 42823 42929

70 293 799 16494 16696 20008 21050 23735 34060 34555 35068 37664 45312 47748 50957 52382

1151 1163 1751 7025 10775 15100 22260 24718 28905 30853 33020 43261 46849 48258 54212 56122

279 457 775 8025 13383 16978 19254 23110 28197 31454 33060 38532 41429 41621 42149 54927

494 1130 1351 18525 22446 31344 31582 38324 42396 46010 48804 49241 49379 51987 52296 53133

177 508 1032 3547 8103 13357 14344 15876 20386 22050 23593 35305 47409 53297 55610 56093

988 1091 1785 3400 5144 7245 10179 12918 32871 33462 34484 38318 43410 44103 44267 52837

520 564 1757 12204 16894 17249 21480 21541 23760 28325 36266 40606 46094 48779 55501 56065

914 943 1111 3641 4232 10215 14134 16582 23445 28767 28862 32260 35952 39907 41846 47553

466 554 1697 4921 6953 7034 7052 10648 11628 19174 27830 29210 31722 32281 52559 55802

1135 1273 1408 2599 3618 4903 7210 17368 21014 21287 21926 24070 27741 29801 36137 44272

524 801 1767 4093 9721 12200 19463 29280 31587 33577 39747 43688 46627 49807 51345 55969

489 1390 1756 3050 12113 20477 21376 26797 27049 28907 31534 32746 33345 40582 41970 55911

432 1520 1598 9292 11552 16985 18417 21847 21960 24287 25489 34478 40990 44004 47573 53982

301 592 849 1944 4128 8341 16783 19249 24983 43892 44041 44474 44942 44959 50738 54935

118 558 1470 4368 10132 11791 16523 22408 23766 25111 25426 25779 35005 42742 46197 53118

310 1059 1322 3609 7107 10048 13161 32141 33369 35206 36131 38746 44545 47963 48414

256 346 845 7363 10375 12492 13091 27987 32113 34846 36223 39863 44450 46526 49216

607 683 954 5473 10617 18484 20018 26971 28190 37592 39069 39740 43575 45676 48149

244 635 1208 5450 8082 25030 25149 28411 29333 31324 36972 42071 43401 47088 52085

2841 5514 16122 18061 18199 20340 22525 25022 29914 31732 46415

7567 22860 23157 24194 24622 29643 31255 32355 36379 38228 51173

24002 24459 25897 26955 31168 31630 39183 46791 47323 51503 55241

4817 8291 10219 13991 14318 28549 28836 30491 36884 46310 54625

8275 9585 11678 37216 38932 45186 46287 48023 48862 53636 56067.

A second reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 3/16, and puncturing a head of the information bits of the extended LDPC code by the puncture length L to generate the punctured LDPC code with the code length N of 69120 bits and the coding rate r of 3/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 0, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is 853 875 1192 2465 3004 4879 9062 21593 24043 26616 30909 32017 35006 42135 44268 56020

161 519 1556 3317 6015 14909 15760 21148 30072 32655 33940 34834 43430 44798 51284 52169

177 999 1683 6976 17610 18152 19591 22312 25036 27303 28584 47608 47749 50216 52322 54007

981 1000 1625 1630 6933 13217 13956 15319 22642 29483 31921 35465 43602 44250 46505 55678

1204 1242 1653 3066 6095 16862 20154 21430 23418 26408 30979 34093 41103 48385 54547 55093

316 1355 1562 2665 5222 6575 18299 19639 24268 30959 37721 47966 48255 51808 53697 56010

183 219 615 2859 6967 8044 13949 22294 28922 29355 32175 32276 33861 49675 52583 53512

263 342 1684 7426 14417 20396 27461 30075 33740 36812 38204 38420 41612 43083 45914 56035

256 870 921 3023 4662 5225 5276 19284 26034 35397 38524 44936 45178 46351 50860 51813

289 898 1442 9135 10774 13951 14133 19070 21192 27854 32118 43657 43859 43934 52772 53659

256 690 1324 3582 7066 8507 26854 34507 40768 44943 47952 50512 52080 52872 53733 53773

238 1037 1388 1929 6395 10653 21299 23085 26467 26836 27834 44924 47310 49393 53742 55883

976 1217 1469 7718 16449 19465 19983 22386 24762 28308 32395 33589 35997 41034 42118 43799

265 368 1365 1375 1808 7556 14593 15079 19648 36077 40397 41971 44940 47570 52522 55839

802 1656 1689 5554 6787 11067 15764 19656 31740 31762 36046 42258 45165 49245 52732 53420

265 307 1299 2775 6738 22483 26322 27615 30628 34194 38024 38787 46089 48680 49115 51063

698 747 1241 2898 5218 7964 15358 17928 28069 29537 33641 36103 40207 40701 42823 42929

70 293 799 16494 16696 20008 21050 23735 34060 34555 35068 37664 45312 47748 50957 52382

1151 1163 1751 7025 10775 15100 22260 24718 28905 30853 33020 43261 46849 48258 54212 56122

279 457 775 8025 13383 16978 19254 23110 28197 31454 33060 38532 41429 41621 42149 54927

494 1130 1351 18525 22446 31344 31582 38324 42396 46010 48804 49241 49379 51987 52296 53133

177 508 1032 3547 8103 13357 14344 15876 20386 22050 23593 35305 47409 53297 55610 56093

988 1091 1785 3400 5144 7245 10179 12918 32871 33462 34484 38318 43410 44103 44267 52837

520 564 1757 12204 16894 17249 21480 21541 23760 28325 36266 40606 46094 48779 55501 56065

914 943 1111 3641 4232 10215 14134 16582 23445 28767 28862 32260 35952 39907 41846 47553

466 554 1697 4921 6953 7034 7052 10648 11628 19174 27830 29210 31722 32281 52559 55802

1135 1273 1408 2599 3618 4903 7210 17368 21014 21287 21926 24070 27741 29801 36137 44272

524 801 1767 4093 9721 12200 19463 29280 31587 33577 39747 43688 46627 49807 51345 55969

489 1390 1756 3050 12113 20477 21376 26797 27049 28907 31534 32746 33345 40582 41970 55911

432 1520 1598 9292 11552 16985 18417 21847 21960 24287 25489 34478 40990 44004 47573 53982

301 592 849 1944 4128 8341 16783 19249 24983 43892 44041 44474 44942 44959 50738 54935

118 558 1470 4368 10132 11791 16523 22408 23766 25111 25426 25779 35005 42742 46197 53118

310 1059 1322 3609 7107 10048 13161 32141 33369 35206 36131 38746 44545 47963 48414

256 346 845 7363 10375 12492 13091 27987 32113 34846 36223 39863 44450 46526 49216

607 683 954 5473 10617 18484 20018 26971 28190 37592 39069 39740 43575 45676 48149

244 635 1208 5450 8082 25030 25149 28411 29333 31324 36972 42071 43401 47088 52085

2841 5514 16122 18061 18199 20340 22525 25022 29914 31732 46415

7567 22860 23157 24194 24622 29643 31255 32355 36379 38228 51173

24002 24459 25897 26955 31168 31630 39183 46791 47323 51503 55241

4817 8291 10219 13991 14318 28549 28836 30491 36884 46310 54625

8275 9585 11678 37216 38932 45186 46287 48023 48862 53636 56067.

A third transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 4/16, and puncture a head of the information bits of the extended LDPC code by the puncture length L to generate a punctured LDPC code with the code length N of 69120 bits and the coding rate r of 4/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 0, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is 797 853 885 2412 8763 16966 18074 21725 21923 22276 32414 49532 51711

39 1096 1305 6276 13449 16227 24628 29368 31384 32207 45115 47748 51161

44 427 1193 4543 10898 29586 34143 40123 44170 46228 47353 48962 49856

541 736 844 4479 7200 16262 18160 24649 29159 42952 43829 47067 48307

95 1342 1783 9131 12031 12989 13202 14244 27356 29527 32789 36795 38709

494 1203 1652 5475 16812 21005 24490 28736 31487 37840 39565 50301 50448

1532 1581 1705 10606 12678 17526 28502 35833 44124 47833 49541 51702 51831

96 185 1188 2754 2775 5499 6292 6895 9799 27158 28509 39985 48544

749 1007 1624 9110 12545 20317 27165 31146 36658 40218 45870 48593 49397

1163 1355 1556 4652 6091 6978 8979 14330 25366 27509 27927 33954 51511

1168 1311 1320 2096 3187 5119 20693 29188 35325 36538 41740 44821 47836

288 1399 1422 10030 12443 15396 19379 26774 30623 40397 40494 47324 48652

570 809 1622 8966 13182 24760 25846 37786 38499 41477 47218 49514 51673

44 208 811 3742 8390 20577 24033 26195 29483 39222 40429 45529 45643

97 1161 1310 2693 19471 21117 24844 29355 37875 38827 42599 46927 51585

620 1416 1679 12977 15285 17224 20748 22381 25697 28626 33138 37912 39470

368 1367 1465 11725 13919 13945 33353 37326 38778 40727 40875 48487 51103

1427 1519 1736 6497 10328 15345 17776 24008 29435 47926 48682 48686 49250

23 1169 1460 5251 10379 24722 25285 32822 35089 37814 44950 45474 47146

32 681 1568 6384 9728 21530 22557 24432 31527 33435 36375 37151 39510

918 1286 1362 2738 2808 5037 7483 16549 20933 31061 33375 39562 50975

844 925 1507 8014 14804 15472 22057 31449 32226 32974 34809 41852 50676

1104 1753 1780 6605 22820 24244 26745 28587 30929 33797 34123 42029 43723

296 351 1799 9595 9770 15297 17910 19571 20521 35468 38937 48238 50795

638 760 1027 15495 15806 27803 29165 32046 34804 38592 38949 39457 47996

676 1548 1687 15931 17206 27071 28999 29312 30437 39081 44646 46366 48245

164 1436 1470 3335 8452 10611 14735 17314 17457 21853 32068 49268 51360

673 987 1570 3322 4946 6830 12027 22997 28126 30952 31702 32262 40857

773 1139 1404 9840 16019 16640 18064 24251 25181 42571 46539 50656 51750

726 730 1282 9539 10718 15690 27181 28022 29831 32767 40892 45045 51229

178 355 896 3493 13148 14855 15297 17187 20332 26479 36876 38772 41342

174 909 992 4685 6611 6649 9973 10846 18348 21866 29851 48524 51503

256 1273 1407 4650 6765 16547 19484 19834 20323 22294 27570 33457 40893

27 60 100 1530 9640 11387 12526 16343 17977 24156 29307 43317 51005

908 1009 1256 15318 24411 27373 28956 29096 37447 40401 45949 47505 50608

871 1022 1050 2987 11235 11367 14631 18902 19810 40712 41044 44083 50666

322 663 669 8710 10150 15826 17085 22493 31938 37858 40689 44018 49689

589 846 1413 2627 4519 7841 15480 24061 40839 41475 41591 46883 50613

963 1135 1395 1610 5107 10991 17300 20822 21073 23236 30712 39982 42668

729 792 1696 3391 4018 6677 15323 31211 32245 38603 39662 44737 48810

274 376 1003 8907 11493 11611 25418 25885 33368 36485 41225 44260 45485

1174 1245 1412 3510 9590 17010 20708 25956 28271 29603 33362 37097 42952

813 1030 1452 5147 9859 19468 34863 35407 36002 36716 40288 42835 44337

211 230 1694 5157 23173 23285 26293 27140 29110 34165 38861 40227 43477

537 933 1476 2748 5211 5376 14853 16889 18857 20875 22806 29035 29444

697 709 765 6009 27426 29923 33631 35433 36206 43172 47174 50955

833 1096 1648 4459 13016 22371 22757 23977 26422 28211 29254 43701

214 521 895 2147 3200 3525 3561 6699 7730 7845 9000 9570 11204 11446 11570 12462 13469 14396 15475 17540 18804 18944 19321 19550 20001 25062 25567 26342 26709 27146 27392 27428 30782 32176 32956 33240 34420 35150 35263 35879 36407 37210 37393 37420 38892 40202 40583 40665 41816 42558 42720 43063 43442 44348 44378 45052 47033 49514 49845 50084 51647

7599 9277 13898 16320 19617 28012 30567 42423 43056

15934 20819 25195 28421 31073 31750 33551 35982 37823

5377 13795 16639 20686 22150 32586 33922 40431 42255

3368 14716 15016 20925 23397 25910 28917 36663 40946

3478 4545 5802 12334 27955 29363 42818 48135 48995.

A third reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 4/16, and puncturing a head of the information bits of the extended LDPC code by the puncture length L to generate the punctured LDPC code with the code length N of 69120 bits and the coding rate r of 4/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 0, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is 797 853 885 2412 8763 16966 18074 21725 21923 22276 32414 49532 51711

39 1096 1305 6276 13449 16227 24628 29368 31384 32207 45115 47748 51161

44 427 1193 4543 10898 29586 34143 40123 44170 46228 47353 48962 49856

541 736 844 4479 7200 16262 18160 24649 29159 42952 43829 47067 48307

95 1342 1783 9131 12031 12989 13202 14244 27356 29527 32789 36795 38709

494 1203 1652 5475 16812 21005 24490 28736 31487 37840 39565 50301 50448

1532 1581 1705 10606 12678 17526 28502 35833 44124 47833 49541 51702 51831

96 185 1188 2754 2775 5499 6292 6895 9799 27158 28509 39985 48544

749 1007 1624 9110 12545 20317 27165 31146 36658 40218 45870 48593 49397

1163 1355 1556 4652 6091 6978 8979 14330 25366 27509 27927 33954 51511

1168 1311 1320 2096 3187 5119 20693 29188 35325 36538 41740 44821 47836

288 1399 1422 10030 12443 15396 19379 26774 30623 40397 40494 47324 48652

570 809 1622 8966 13182 24760 25846 37786 38499 41477 47218 49514 51673

44 208 811 3742 8390 20577 24033 26195 29483 39222 40429 45529 45643

97 1161 1310 2693 19471 21117 24844 29355 37875 38827 42599 46927 51585

620 1416 1679 12977 15285 17224 20748 22381 25697 28626 33138 37912 39470

368 1367 1465 11725 13919 13945 33353 37326 38778 40727 40875 48487 51103

1427 1519 1736 6497 10328 15345 17776 24008 29435 47926 48682 48686 49250

23 1169 1460 5251 10379 24722 25285 32822 35089 37814 44950 45474 47146

32 681 1568 6384 9728 21530 22557 24432 31527 33435 36375 37151 39510

918 1286 1362 2738 2808 5037 7483 16549 20933 31061 33375 39562 50975

844 925 1507 8014 14804 15472 22057 31449 32226 32974 34809 41852 50676

1104 1753 1780 6605 22820 24244 26745 28587 30929 33797 34123 42029 43723

296 351 1799 9595 9770 15297 17910 19571 20521 35468 38937 48238 50795

638 760 1027 15495 15806 27803 29165 32046 34804 38592 38949 39457 47996

676 1548 1687 15931 17206 27071 28999 29312 30437 39081 44646 46366 48245

164 1436 1470 3335 8452 10611 14735 17314 17457 21853 32068 49268 51360

673 987 1570 3322 4946 6830 12027 22997 28126 30952 31702 32262 40857

773 1139 1404 9840 16019 16640 18064 24251 25181 42571 46539 50656 51750

726 730 1282 9539 10718 15690 27181 28022 29831 32767 40892 45045 51229

178 355 896 3493 13148 14855 15297 17187 20332 26479 36876 38772 41342

174 909 992 4685 6611 6649 9973 10846 18348 21866 29851 48524 51503

256 1273 1407 4650 6765 16547 19484 19834 20323 22294 27570 33457 40893

27 60 100 1530 9640 11387 12526 16343 17977 24156 29307 43317 51005

908 1009 1256 15318 24411 27373 28956 29096 37447 40401 45949 47505 50608

871 1022 1050 2987 11235 11367 14631 18902 19810 40712 41044 44083 50666

322 663 669 8710 10150 15826 17085 22493 31938 37858 40689 44018 49689

589 846 1413 2627 4519 7841 15480 24061 40839 41475 41591 46883 50613

963 1135 1395 1610 5107 10991 17300 20822 21073 23236 30712 39982 42668

729 792 1696 3391 4018 6677 15323 31211 32245 38603 39662 44737 48810

274 376 1003 8907 11493 11611 25418 25885 33368 36485 41225 44260 45485

1174 1245 1412 3510 9590 17010 20708 25956 28271 29603 33362 37097 42952

813 1030 1452 5147 9859 19468 34863 35407 36002 36716 40288 42835 44337

211 230 1694 5157 23173 23285 26293 27140 29110 34165 38861 40227 43477

537 933 1476 2748 5211 5376 14853 16889 18857 20875 22806 29035 29444

697 709 765 6009 27426 29923 33631 35433 36206 43172 47174 50955

833 1096 1648 4459 13016 22371 22757 23977 26422 28211 29254 43701

214 521 895 2147 3200 3525 3561 6699 7730 7845 9000 9570 11204 11446 11570 12462 13469 14396 15475 17540 18804 18944 19321 19550 20001 25062 25567 26342 26709 27146 27392 27428 30782 32176 32956 33240 34420 35150 35263 35879 36407 37210 37393 37420 38892 40202 40583 40665 41816 42558 42720 43063 43442 44348 44378 45052 47033 49514 49845 50084 51647

7599 9277 13898 16320 19617 28012 30567 42423 43056

15934 20819 25195 28421 31073 31750 33551 35982 37823

5377 13795 16639 20686 22150 32586 33922 40431 42255

3368 14716 15016 20925 23397 25910 28917 36663 40946

3478 4545 5802 12334 27955 29363 42818 48135 48995.

A fourth transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 5/16, and puncture a head of the information bits of the extended LDPC code by the puncture length L to generate a punctured LDPC code with the code length N of 69120 bits and the coding rate r of 5/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 1800, the predetermined value M1 is 3600, the A matrix and the C matrix are represented by a parity check matrix initial value table, and the parity check matrix initial value table is a table representing positions of elements of 1 of the A matrix and the C matrix for every 360 columns, and is 1500 1594 4158 4611 4621 9708 14082 14260 16777 17457 21985 22308 23963 24554 25344 27485 27516 28008 30174 30625 31378 31525 35873 36202 45585 47150 47845 49311

851 2755 5753 8521 10162 12036 16914 17857 18538 22342 24470 28199 33144 34233 35459 35506 38894 39300 41198 41995 42243 43310 44187 44969 46306 46719 47907 48844

803 828 7874 8667 12187 15086 16097 20436 21143 22142 27188 29052 30895 30927 30963 31563 34591 35419 36521 38142 38825 42538 43514 44432 45634 47807 47953

3442 3596 4211 4790 5276 5379 6950 8256 10939 13398 13563 13720 18074 22070 22760 26767 27057 28054 29148 33155 33760 38500 42760 44861 45653 46507 48695

1337 3179 3936 4019 4207 4915 5953 6200 7596 10085 10241 15048 16788 25083 27412 27478 28623 33014 33168 33296 34087 35922 36818 38225 40169 41762 46370

230 2417 2466 10915 19279 39243 39762 42664 45750

595 1792 2788 16000 19698 28701 38882 45250 46449

764 1619 2243 10130 25528 38421 44789 45032 48064

779 1651 3431 4707 8887 24180 36687 37770 39583

136 1352 3105 9580 25493 28929 29003 43731 44941

0 2147 3434 4402 19742 21221 37419 46590 49082

1658 1953 2935 17606 21613 29311 33878 46163 47126

804 1362 2596 15920 25368 28032 32218 37251 38385

733 3180 3549 12710 14684 32429 36039 39164 47531

807 2668 2811 23227 39984 42091 45708 46426 47788

1142 3373 3414 4219 7793 11379 15389 28832 32362

246 2670 3141 11465 24513 25038 31936 36501 45021

1365 2399 3107 4460 24713 30758 32422 38041 43379

323 578 1392 22591 26966 35332 35884 36454 38254

24 78 229 8741 17149 21008 30309 32441 38141

587 1595 3531 9258 15476 30673 33744 41847 44930

980 2136 2883 18306 22032 31618 33154 45208 48127

1518 1796 2304 7939 24330 29552 33426 39907 41568

599 681 3597 10689 10811 19776 20651 34661 46473

970 1152 2675 13311 15762 16363 26575 37047 48249

1872 1968 2620 16207 31197 33577 37990 42868 45881

1105 1351 3374 28454 28667 37692 42083 46115

1019 1816 3153 7354 14190 15535 29787 40081

114 1127 3412 17706 21953 31166 48855 49247

411 1346 2860 6474 12912 28627 30225 31396

109 1895 2803 8192 22957 30924 32515 39258

1067 1547 3218 10928 18459 24102 24958 48228

1022 2939 3593 16210 20143 22128 36148 48748

1826 2281 3110 10706 11745 27544 29705 32385

165 1794 3038 13953 15929 20587 35639 37360

122 1107 1776 7992 15442 26707 28761 39718

344 1449 2018 7930 11023 11967 18210 48998

203 2541 3360 6249 8145 10115 16796 19830 39389 39409

1333 1476 1855 4261 5127 16893 20060 23938 25433 32522

1972 3154 3539 10244 10601 12317 18404 29191 35539 41261

1621 1817 3280 15943 26444 28455 28595 29822 38852 48190

2048 2565 2660 4707 12386 15311 19315 20091 24908 37754

2825 3043 3516 9940 11806 11981 20375 20597 22471 31060

2597 2792 3444 11226 16387 17531 18473 25142 39461 42139

439 2788 3511 3684 5549 16067 23077 39829 39920 44862

1076 2271 2797 6573 12043 17816 20967 21726 23200 38056

553 2080 2948 5535 16026 22119 23794 37157 46602 46720

112 2115 3084 8090 10494 13165 29078 31417 33314 39595

2275 2449 3058 10121 12474 12563 25072 25610 39483 43489

741 2186 2270 5146 10831 17517 20875 29107 35695 41244

1693 1902 2907 6756 10924 18965 24040 33793 41089 42464

2469 2514 2769 6664 8813 8938 19741 23113 34293 45892

1761 2326 2998 17255 23220 26747 28416 37450 38574 41110

1083 1375 1867 4468 6706 6899 15494 19170 28463 28858

1394 1412 1510 7439 27005 29288 32683 34307 34607 45091

2477 2978 3539 22378 23848 24738 28734 31460 41873 45398

191 803 1500 9030 14071 26093 26432 27827 35890 47458

556 2942 3114 10130 11981 33368 34732 42472 47188 47655

425 2875 2946 16084 19184 26801 27069 27090 31317 34103
121 1674 3258 5208 13340 26019 37492 38723 40779 49200
3968 7741 12550 32061
17972 19666 20231 33590
9086 34375 41691 42567
12168 14189 15095 49129
19291 26450 29950 39068
19852 25195 35124 36192
10447 32405 36184 40786
8911 19949 27496 41273
14679 16883 20951 29727
30296 32681 34757 36501.

A fourth reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 5/16, and puncturing a head of the information bits of the extended LDPC code by the puncture length L to generate the punctured LDPC code with the code length N of 69120 bits and the coding rate r of 5/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 1800, the predetermined value M1 is 3600, the A matrix and the C matrix are represented by a parity check matrix initial value table, and the parity check matrix initial value table is a table representing positions of elements of 1 of the A matrix and the C matrix for every 360 columns, and is 1500 1594 4158 4611 4621 9708 14082 14260 16777 17457 21985 22308 23963 24554 25344 27485 27516 28008 30174 30625 31378 31525 35873 36202 45585 47150 47845 49311
851 2755 5753 8521 10162 12036 16914 17857 18538 22342 24470 28199 33144 34233 35459 35506 38894 39300 41198 41995 42243 43310 44187 44969 46306 46719 47907 48844
803 828 7874 8667 12187 15086 16097 20436 21143 22142 27188 29052 30895 30927 30963 31563 34591 35419 36521 38142 38825 42538 43514 44432 45634 47807 47953
3442 3596 4211 4790 5276 5379 6950 8256 10939 13398 13563 13720 18074 22070 22760 26767 27057 28054 29148 33155 33760 38500 42760 44861 45653 46507 48695
1337 3179 3936 4019 4207 4915 5953 6200 7596 10085 10241 15048 16788 25083 27412 27478 28623 33014 33168 33296 34087 35922 36818 38225 40169 41762 46370
230 2417 2466 10915 19279 39243 39762 42664 45750
595 1792 2788 16000 19698 28701 38882 45250 46449
764 1619 2243 10130 25528 38421 44789 45032 48064
779 1651 3431 4707 8887 24180 36687 37770 39583
136 1352 3105 9580 25493 28929 29003 43731 44941
0 2147 3434 4402 19742 21221 37419 46590 49082
1658 1953 2935 17606 21613 29311 33878 46163 47126
804 1362 2596 15920 25368 28032 32218 37251 38385
733 3180 3549 12710 14684 32429 36039 39164 47531
807 2668 2811 23227 39984 42091 45708 46426 47788
1142 3373 3414 4219 7793 11379 15389 28832 32362
246 2670 3141 11465 24513 25038 31936 36501 45021
1365 2399 3107 4460 24713 30758 32422 38041 43379
323 578 1392 22591 26966 35332 35884 36454 38254
24 78 229 8741 17149 21008 30309 32441 38141
587 1595 3531 9258 15476 30673 33744 41847 44930
980 2136 2883 18306 22032 31618 33154 45208 48127
1518 1796 2304 7939 24330 29552 33426 39907 41568
599 681 3597 10689 10811 19776 20651 34661 46473
970 1152 2675 13311 15762 16363 26575 37047 48249
1872 1968 2620 16207 31197 33577 37990 42868 45881
1105 1351 3374 28454 28667 37692 42083 46115
1019 1816 3153 7354 14190 15535 29787 40081
114 1127 3412 17706 21953 31166 48855 49247
411 1346 2860 6474 12912 28627 30225 31396
109 1895 2803 8192 22957 30924 32515 39258
1067 1547 3218 10928 18459 24102 24958 48228
1022 2939 3593 16210 20143 22128 36148 48748
1826 2281 3110 10706 11745 27544 29705 32385
165 1794 3038 13953 15929 20587 35639 37360
122 1107 1776 7992 15442 26707 28761 39718
344 1449 2018 7930 11023 11967 18210 48998
203 2541 3360 6249 8145 10115 16796 19830 39389 39409
1333 1476 1855 4261 5127 16893 20060 23938 25433 32522
1972 3154 3539 10244 10601 12317 18404 29191 35539 41261
1621 1817 3280 15943 26444 28455 28595 29822 38852 48190
2048 2565 2660 4707 12386 15311 19315 20091 24908 37754
2825 3043 3516 9940 11806 11981 20375 20597 22471 31060
2597 2792 3444 11226 16387 17531 18473 25142 39461 42139
439 2788 3511 3684 5549 16067 23077 39829 39920 44862
1076 2271 2797 6573 12043 17816 20967 21726 23200 38056
553 2080 2948 5535 16026 22119 23794 37157 46602 46720
112 2115 3084 8090 10494 13165 29078 31417 33314 39595
2275 2449 3058 10121 12474 12563 25072 25610 39483 43489
741 2186 2270 5146 10831 17517 20875 29107 35695 41244
1693 1902 2907 6756 10924 18965 24040 33793 41089 42464
2469 2514 2769 6664 8813 8938 19741 23113 34293 45892
1761 2326 2998 17255 23220 26747 28416 37450 38574 41110
1083 1375 1867 4468 6706 6899 15494 19170 28463 28858

1394 1412 1510 7439 27005 29288 32683 34307 34607 45091

2477 2978 3539 22378 23848 24738 28734 31460 41873 45398

191 803 1500 9030 14071 26093 26432 27827 35890 47458

556 2942 3114 10130 11981 33368 34732 42472 47188 47655

425 2875 2946 16084 19184 26801 27069 27090 31317 34103

121 1674 3258 5208 13340 26019 37492 38723 40779 49200

3968 7741 12550 32061

17972 19666 20231 33590

9086 34375 41691 42567

12168 14189 15095 49129

19291 26450 29950 39068

19852 25195 35124 36192

10447 32405 36184 40786

8911 19949 27496 41273

14679 16883 20951 29727

30296 32681 34757 36501.

A fifth transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 6/16, and puncture a head of the information bits of the extended LDPC code by the puncture length L to generate a punctured LDPC code with the code length N of 69120 bits and the coding rate r of 6/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 1800, the predetermined value M1 is 3600, the A matrix and the C matrix are represented by a parity check matrix initial value table, and the parity check matrix initial value table is a table representing positions of elements of 1 of the A matrix and the C matrix for every 360 columns, and is 1594 1610 4443 4633 4971 5913 7301 7706 13474 16147 16681 17638 20084 20205 20247 20540 22484 27085 28185 29116 31096 33068 41272 41610 43034

1883 2386 4525 5861 6762 8505 10987 11467 13389 15284 15934 22445 22893 24837 26162 26697 29883 30925 35299 38596 38645 41614 42730 43699 44169

1048 1205 7615 12049 12746 13032 13602 14263 14911 15606 21519 26057 26528 28217 28266 29323 31302 32457 32579 34903 35105 36007 40006 43828 44649

1621 1937 3806 4192 4345 4436 4464 5013 7744 9969 10235 10276 10910 12816 16020 17524 20323 30904 31663 35163 35398 35957 39093 42657 44993

49 1822 3711 3892 4990 10239 12492 18990 19520 21406 24318 24612 25751 26767 30148 31680 32384 33296 34983 35934 38715 40286 42291 42485 42998

220 302 3574 5681 9506 24907 31216 34098 36706

26 88 1979 6254 17793 31399 31963 38968 41759

571 2797 2843 10391 18284 24224 26323 35575 43222

2778 2865 3374 13146 22196 23479 29472 40894 43961

513 2641 3267 12546 22339 22592 33324 37388 43058

89 416 2750 8737 9111 19495 26529 35507 39319

1522 1795 3155 3952 19544 28293 40910 43137 44782

68 1271 2663 22635 26043 31010 37397 42214 42940

1102 1410 2026 14095 14851 19343 23303 25716 33443

2257 2649 2734 13712 40173 42230 42240 43221 44414

714 2565 2880 4450 12908 34192 35997 36455 40728

1546 3319 3372 7492 10636 16725 26425 42426 42880

41 927 2263 6416 10637 22272 29323 34364 39763

1681 2598 3263 4337 19277 28170 31112 39274 39685

1624 2266 2712 7713 10204 19680 20781 32234 32824

1839 2578 2725 4403 4475 6187 8251 15794 34791

1372 2107 2310 8695 10370 22033 31001 38223 44215

1045 2138 3259 14898 16935 20360 28114 30232 36792

2326 3271 3510 21052 22158 24249 25709 30136 35176

347 2043 2984 10440 10461 11558 18257 42040 44932

562 1425 2428 12400 14792 16918 24373 34372 44049

959 1004 2630 14983 26147 28239 28571 33730 34758

2366 3093 3321 16340 19265 26290 28817 42082 42430

1812 2687 3030 7047 13181 15320 27308 36719 39868

118 933 1127 16601 20206 28560 42837 44651 44924

411 1346 2869 4816 6186 12098 26338 28747 28842

1985 2151 2804 7754 21167 21405 29764 35907 40584

1067 1689 3513 10225 15350 17157 22215 37316 44909

1306 1452 2564 15049 24636 29181 29918 39466 44466

558 640 2085 5522 9131 12991 24658 28599 38510

971 1333 2524 5076 14312 16292 23989 28218 37668

345 1819 2012 7598 7602 10348 11079 16828 20223

206 3490 3577 7652 9484 15485 18215 32891 36012

207 2085 2818 4223 4981 18437 18907 20797 29779

1043 1602 1711 17049 26349 37701 37805 39929 44226

528 686 2519 22288 24424 26040 27266 35523 44395

974 2063 3540 23885 24211 26226 27093 33120 34243

84 689 1292 14234 17834 34458 36109 38609 44075

656 1321 1335 9564 11031 20663 28540 33454

2798 3040 3447 10523 15178 16147 17112 23143

2785 2827 3514 3648 5406 8631 21247 36454

983 2859 3241 6313 15981 16459 29725 35759

662 1428 2716 9984 19352 21403 27521 37417

1460 1582 3397 5327 14857 27868 34040 42479

116 353 3081 9834 12252 26703 28884 30421

2275 2449 2838 9493 11608 23271 38776 39806

704 1750 2835 10462 12221 28740 29710 37673

121 2008 2529 16240 19331 23089 25481 36984

1207 1650 2956 6464 10252 30913 31894 38888

1272 2513 2764 6370 8377 8517 31368 41960

1538 1761 2999 21345 26055 30346 34230 35254

1125 1822 2953 6588 14341 16087 19369 25097

60 246 1224 19668 19837 21037 26085 26484

2023 2447 3295 7065 24779 29935 31328 32089

2977 3291 3536 20569 22895 26291 28856 38257

198 1500 1594 8474 12821 24065 24273 25489

829 2542 3457 9560 9981 11130 37448 39505

2452 3433 3465 8505 30616 36656 37451 38882

1828 2189 2401 5065 14917 17648 24809 24869

1674 1760 3256 5017 12401 34198 35372 44967

329 2242 2945 3841 11713 18179 18567 30756

1134 2993 3068 8595 13252 14014 31475 44841

671 1250 2076 18266 23182 24268 32218 33106 33153 35797

532 2267 2927 8343 13630 15565 18426 25262 27191 37728

1363 2100 2454 15244 19187 23000 25655 28410 29916 33402

251 1469 2315 13593 15859 19414 26073 29034 35496 37152

112 1736 2508 5876 14259 14532 21456 35968 37533 42515

25233 26394

5080 6930

12302 41997

27483 36076

5116 36815

11841 28243

18326 37978

22431 36141

35950 40525

41824 42674.

A fifth reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 6/16, and puncturing a head of the information bits of the extended LDPC code by the puncture length L to generate the punctured LDPC code with the code length N of 69120 bits and the coding rate r of 6/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 1800, the predetermined value M1 is 3600, the A matrix and the C matrix are represented by a parity check matrix initial value table, and the parity check matrix initial value table is a table representing positions of elements of 1 of the A matrix and the C matrix for every 360 columns, and is 1594 1610 4443 4633 4971 5913 7301 7706 13474 16147 16681 17638 20084 20205 20247 20540 22484 27085 28185 29116 31096 33068 41272 41610 43034

1883 2386 4525 5861 6762 8505 10987 11467 13389 15284 15934 22445 22893 24837 26162 26697 29883 30925 35299 38596 38645 41614 42730 43699 44169

1048 1205 7615 12049 12746 13032 13602 14263 14911 15606 21519 26057 26528 28217 28266 29323 31302 32457 32579 34903 35105 36007 40006 43828 44649

1621 1937 3806 4192 4345 4436 4464 5013 7744 9969 10235 10276 10910 12816 16020 17524 20323 30904 31663 35163 35398 35957 39093 42657 44993

49 1822 3711 3892 4990 10239 12492 18990 19520 21406 24318 24612 25751 26767 30148 31680 32384 33296 34983 35934 38715 40286 42291 42485 42998

220 302 3574 5681 9506 24907 31216 34098 36706

26 88 1979 6254 17793 31399 31963 38968 41759

571 2797 2843 10391 18284 24224 26323 35575 43222

2778 2865 3374 13146 22196 23479 29472 40894 43961

513 2641 3267 12546 22339 22592 33324 37388 43058

89 416 2750 8737 9111 19495 26529 35507 39319

1522 1795 3155 3952 19544 28293 40910 43137 44782

68 1271 2663 22635 26043 31010 37397 42214 42940

1102 1410 2026 14095 14851 19343 23303 25716 33443

2257 2649 2734 13712 40173 42230 42240 43221 44414

714 2565 2880 4450 12908 34192 35997 36455 40728

1546 3319 3372 7492 10636 16725 26425 42426 42880

41 927 2263 6416 10637 22272 29323 34364 39763

1681 2598 3263 4337 19277 28170 31112 39274 39685

1624 2266 2712 7713 10204 19680 20781 32234 32824

1839 2578 2725 4403 4475 6187 8251 15794 34791

1372 2107 2310 8695 10370 22033 31001 38223 44215

1045 2138 3259 14898 16935 20360 28114 30232 36792

2326 3271 3510 21052 22158 24249 25709 30136 35176

347 2043 2984 10440 10461 11558 18257 42040 44932

562 1425 2428 12400 14792 16918 24373 34372 44049

959 1004 2630 14983 26147 28239 28571 33730 34758

2366 3093 3321 16340 19265 26290 28817 42082 42430

1812 2687 3030 7047 13181 15320 27308 36719 39868

118 933 1127 16601 20206 28560 42837 44651 44924

411 1346 2869 4816 6186 12098 26338 28747 28842

1985 2151 2804 7754 21167 21405 29764 35907 40584

1067 1689 3513 10225 15350 17157 22215 37316 44909

1306 1452 2564 15049 24636 29181 29918 39466 44466

558 640 2085 5522 9131 12991 24658 28599 38510

971 1333 2524 5076 14312 16292 23989 28218 37668

345 1819 2012 7598 7602 10348 11079 16828 20223

206 3490 3577 7652 9484 15485 18215 32891 36012

207 2085 2818 4223 4981 18437 18907 20797 29779

1043 1602 1711 17049 26349 37701 37805 39929 44226

528 686 2519 22288 24424 26040 27266 35523 44395

974 2063 3540 23885 24211 26226 27093 33120 34243

84 689 1292 14234 17834 34458 36109 38609 44075

656 1321 1335 9564 11031 20663 28540 33454

2798 3040 3447 10523 15178 16147 17112 23143

2785 2827 3514 3648 5406 8631 21247 36454

983 2859 3241 6313 15981 16459 29725 35759

662 1428 2716 9984 19352 21403 27521 37417

1460 1582 3397 5327 14857 27868 34040 42479

116 353 3081 9834 12252 26703 28884 30421

2275 2449 2838 9493 11608 23271 38776 39806

704 1750 2835 10462 12221 28740 29710 37673

121 2008 2529 16240 19331 23089 25481 36984

1207 1650 2956 6464 10252 30913 31894 38888

1272 2513 2764 6370 8377 8517 31368 41960

1538 1761 2999 21345 26055 30346 34230 35254

1125 1822 2953 6588 14341 16087 19369 25097

60 246 1224 19668 19837 21037 26085 26484

2023 2447 3295 7065 24779 29935 31328 32089

2977 3291 3536 20569 22895 26291 28856 38257

198 1500 1594 8474 12821 24065 24273 25489

829 2542 3457 9560 9981 11130 37448 39505

2452 3433 3465 8505 30616 36656 37451 38882

1828 2189 2401 5065 14917 17648 24809 24869

1674 1760 3256 5017 12401 34198 35372 44967

329 2242 2945 3841 11713 18179 18567 30756

1134 2993 3068 8595 13252 14014 31475 44841

671 1250 2076 18266 23182 24268 32218 33106 33153 35797

532 2267 2927 8343 13630 15565 18426 25262 27191 37728

1363 2100 2454 15244 19187 23000 25655 28410 29916 33402

251 1469 2315 13593 15859 19414 26073 29034 35496 37152
112 1736 2508 5876 14259 14532 21456 35968 37533 42515
25233 26394
5080 6930
12302 41997
27483 36076
5116 36815
11841 28243
18326 37978
22431 36141
35950 40525
41824 42674.

A sixth transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 7/16, and puncture a head of the information bits of the extended LDPC code by the puncture length L to generate a punctured LDPC code with the code length N of 69120 bits and the coding rate r of 7/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 2160, the predetermined value M1 is 3960, the A matrix and the C matrix are represented by a parity check matrix initial value table, and the parity check matrix initial value table is a table representing positions of elements of 1 of the A matrix and the C matrix for every 360 columns, and is 1764 2277 5400 7275 7702 16018 16086 17361 18724 18869 19132 20243 21595 25512 26606 30134 36052 39329 41031
181 1916 4788 5993 10696 12604 13012 24557 24787 25876 26693 28545 32349 33375 35357 36872 37706 38697 40205
1627 3867 5245 5631 6206 7958 12408 14675 15078 16069 20924 24234 29887 31630 32133 34527 34618 35147 37843
1103 2230 7388 9550 10439 11627 13165 14144 18256 22833 26008 26531 28108 28741 29963 31479 31923 39255 39995
1285 2355 4577 6689 10485 12036 16455 18963 19252 23741 30895 31196 35315 36358 36604 38535 39352 40937 40994
3065 4434 5307 7286 7705 9549 9848 11017 11901 12627 17746 21303 23749 24143 25301 25977 32801 37365 38172
434 2357 3026 7873 22006 27928 31085 34076
1003 2078 2558 6023 7076 9453 23248 40783
275 2594 2879 4212 4816 24471 29358 33606
304 2655 3449 9926 16670 32754 33277 38132
657 1983 3058 14006 17331 24307 37692 38764
865 1808 3134 21758 27257 31888 37426 40019
562 1861 3800 12068 20650 30577 33391 39300
97 459 2970 5360 8808 17885 24492 36388
1655 1901 3486 3965 18266 21707 26083 39858
106 2971 3601 4603 17049 21044 24058 34168
105 2632 3687 12222 15389 17985 18580 24844
1067 1887 3012 11816 23805 27159 31152 32102
412 3506 3688 11340 12998 28025 30295 32802
884 2933 3112 19905 33377 35257 38730 39998
3709 3756 3774 7360 10333 13454 15712 24711
58 2494 2959 6474 10296 20685 26935 36360
1854 2850 3654 4678 18001 28593 35963 36270
1830 2363 2518 7949 10035 18345 29534 31920
1646 2020 2811 4203 4779 6289 30475 32063
465 1178 2986 18151 20386 25654 27386 40357
640 2615 3354 8542 14478 25967 25995 37471
1082 1285 3179 18952 26721 27915 37670 40010
1737 1976 2546 7547 20613 23824 25055 32654
741 1013 3328 9668 9749 17082 38386 40974
1268 1476 2671 11835 14049 22600 31513 40179
1045 1108 2992 14156 23244 24154 31043 31798
2421 2602 3798 15389 17884 24140 35871 38752
819 2169 2955 14408 22625 25191 35170 36437
334 922 3167 5119 13570 15530 39099 41014
1221 1589 2395 8195 17835 24255 33626 40708
860 2308 2450 5038 6315 23489 26114 32851
406 1679 3105 14968 19909 27383 37072 40206
633 1863 1959 14480 16090 18913 34193 41012
1488 1699 2837 14716 22731 26859 27454 35998
700 1266 2120 5664 24568 24724 31262 35236
900 1067 2778 5274 15361 17755 22211 33252
1025 2008 2182 7489 7536 15899 18803 24702
383 648 716 5156 6037 9277 30214 38571
389 1155 2887 6102 17079 19192 23080 32918
1471 1635 2511 4547 5272 14725 20498 21659
2171 3539 3896 9346 9694 10999 15963 34494
1994 2216 2771 20692 24115 32560 37794 40140
1080 2162 2696 21197 22485 25015 30419 31363
97 755 1419 13499 16636 31603 35313 40181
1469 1655 3110 9088 10592 17584 19236 26283
2952 3076 3849 10157 14317 15196 16053 35195
1861 3105 3862 3994 5564 6074 8451 19756
3145 3155 3597 14101 15059 15459 27355 32750
259 873 3006 18016 18676 19887 25385 34337
613 1595 3868 5572 14023 20249 31223 38780
200 3129 3397 7639 9614 11741 26530 28039
2223 2694 3117 9231 11140 21370 27439 35476
779 1905 3630 11778 26510 27390 33035 34468
137 624 2206 15239 18045 21398 23580 29951
1327 1763 3312 6477 9861 28455 34353 35567
2717 2763 3044 8185 8380 17045 28844 38259
265 1105 3295 22148 24070 27939 31377 32371
1785 2042 3249 6558 15036 15184 18135 23151
271 1032 1352 4622 18315 19571 24142 24376
2392 2686 3656 7062 22999 24868 27626 28882
2726 3295 3893 19111 21109 26599 35039 37863
1650 1757 2170 5928 12800 22404 22521 23554
474 912 2810 9299 9649 34316 36020 39568
721 3776 3815 8297 28150 29224 33574 35496
2009 2400 3282 14124 16587 22933 22980 28722
132 1845 3587 11790 22121 31459 32442 40951
142 361 1061 4265 11230 16948 17367 27128
1250 2600 3374 8456 12596 28890 34813 40879
738 1025 1617 17079 22449 25340 30369 32737
1876 2731 2841 9438 17215 23350 27295 34083
453 1144 3263 12936 18049 25084 25595 29278

2369 2850 2997 6628 14441 17901 21329 23717
1671 2580 3055 12903 14917 24143 26800 33983
1516 1907 2756 5106 13479 13748 32931
1708 3245 3727
216 2078 2179
137 316 3665
834 2278 3108
5345 33686
11281 26022
17244 34746
20829 33069
32952 37029
38235 38952
12779 36842
5081 34190
8352 9285
37937 39131
21873 26915.

A sixth reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 7/16, and puncturing a head of the information bits of the extended LDPC code by the puncture length L to generate the punctured LDPC code with the code length N of 69120 bits and the coding rate r of 7/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 2160, the predetermined value M1 is 3960, the A matrix and the C matrix are represented by a parity check matrix initial value table, and the parity check matrix initial value table is a table representing positions of elements of 1 of the A matrix and the C matrix for every 360 columns, and is 1764 2277 5400 7275 7702 16018 16086 17361 18724 18869 19132 20243 21595 25512 26606 30134 36052 39329 41031

181 1916 4788 5993 10696 12604 13012 24557 24787 25876 26693 28545 32349 33375 35357 36872 37706 38697 40205

1627 3867 5245 5631 6206 7958 12408 14675 15078 16069 20924 24234 29887 31630 32133 34527 34618 35147 37843

1103 2230 7388 9550 10439 11627 13165 14144 18256 22833 26008 26531 28108 28741 29963 31479 31923 39255 39995

1285 2355 4577 6689 10485 12036 16455 18963 19252 23741 30895 31196 35315 36358 36604 38535 39352 40937 40994

3065 4434 5307 7286 7705 9549 9848 11017 11901 12627 17746 21303 23749 24143 25301 25977 32801 37365 38172

434 2357 3026 7873 22006 27928 31085 34076
1003 2078 2558 6023 7076 9453 23248 40783
275 2594 2879 4212 4816 24471 29358 33606
304 2655 3449 9926 16670 32754 33277 38132
657 1983 3058 14006 17331 24307 37692 38764
865 1808 3134 21758 27257 31888 37426 40019
562 1861 3800 12068 20650 30577 33391 39300
97 459 2970 5360 8808 17885 24492 36388
1655 1901 3486 3965 18266 21707 26083 39858
106 2971 3601 4603 17049 21044 24058 34168
105 2632 3687 12222 15389 17985 18580 24844
1067 1887 3012 11816 23805 27159 31152 32102
412 3506 3688 11340 12998 28025 30295 32802
884 2933 3112 19905 33377 35257 38730 39998
3709 3756 3774 7360 10333 13454 15712 24711
58 2494 2959 6474 10296 20685 26935 36360
1854 2850 3654 4678 18001 28593 35963 36270
1830 2363 2518 7949 10035 18345 29534 31920
1646 2020 2811 4203 4779 6289 30475 32063
465 1178 2986 18151 20386 25654 27386 40357
640 2615 3354 8542 14478 25967 25995 37471
1082 1285 3179 18952 26721 27915 37670 40010
1737 1976 2546 7547 20613 23824 25055 32654
741 1013 3328 9668 9749 17082 38386 40974
1268 1476 2671 11835 14049 22600 31513 40179
1045 1108 2992 14156 23244 24154 31043 31798
2421 2602 3798 15389 17884 24140 35871 38752
819 2169 2955 14408 22625 25191 35170 36437
334 922 3167 5119 13570 15530 39099 41014
1221 1589 2395 8195 17835 24255 33626 40708
860 2308 2450 5038 6315 23489 26114 32851
406 1679 3105 14968 19909 27383 37072 40206
633 1863 1959 14480 16090 18913 34193 41012
1488 1699 2837 14716 22731 26859 27454 35998
700 1266 2120 5664 24568 24724 31262 35236
900 1067 2778 5274 15361 17755 22211 33252
1025 2008 2182 7489 7536 15899 18803 24702
383 648 716 5156 6037 9277 30214 38571
389 1155 2887 6102 17079 19192 23080 32918
1471 1635 2511 4547 5272 14725 20498 21659
2171 3539 3896 9346 9694 10999 15963 34494
1994 2216 2771 20692 24115 32560 37794 40140
1080 2162 2696 21197 22485 25015 30419 31363
97 755 1419 13499 16636 31603 35313 40181
1469 1655 3110 9088 10592 17584 19236 26283
2952 3076 3849 10157 14317 15196 16053 35195
1861 3105 3862 3994 5564 6074 8451 19756
3145 3155 3597 14101 15059 15459 27355 32750
259 873 3006 18016 18676 19887 25385 34337
613 1595 3868 5572 14023 20249 31223 38780
200 3129 3397 7639 9614 11741 26530 28039
2223 2694 3117 9231 11140 21370 27439 35476
779 1905 3630 11778 26510 27390 33035 34468
137 624 2206 15239 18045 21398 23580 29951
1327 1763 3312 6477 9861 28455 34353 35567
2717 2763 3044 8185 8380 17045 28844 38259
265 1105 3295 22148 24070 27939 31377 32371
1785 2042 3249 6558 15036 15184 18135 23151
271 1032 1352 4622 18315 19571 24142 24376
2392 2686 3656 7062 22999 24868 27626 28882
2726 3295 3893 19111 21109 26599 35039 37863
1650 1757 2170 5928 12800 22404 22521 23554
474 912 2810 9299 9649 34316 36020 39568
721 3776 3815 8297 28150 29224 33574 35496

2009 2400 3282 14124 16587 22933 22980 28722
132 1845 3587 11790 22121 31459 32442 40951
142 361 1061 4265 11230 16948 17367 27128
1250 2600 3374 8456 12596 28890 34813 40879
738 1025 1617 17079 22449 25340 30369 32737
1876 2731 2841 9438 17215 23350 27295 34083
453 1144 3263 12936 18049 25084 25595 29278
2369 2850 2997 6628 14441 17901 21329 23717
1671 2580 3055 12903 14917 24143 26800 33983
1516 1907 2756 5106 13479 13748 32931
1708 3245 3727
216 2078 2179
137 316 3665
834 2278 3108
5345 33686
11281 26022
17244 34746
20829 33069
32952 37029
38235 38952
12779 36842
5081 34190
8352 9285
37937 39131
21873 26915.

A seventh transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 8/16, and puncture a head of the information bits of the extended LDPC code by the puncture length L to generate a punctured LDPC code with the code length N of 69120 bits and the coding rate r of 8/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 2520, the predetermined value M1 is 5040, the A matrix and the C matrix are represented by a parity check matrix initial value table, and the parity check matrix initial value table is a table representing positions of elements of 1 of the A matrix and the C matrix for every 360 columns, and is 2184 2245 5483 5692 9320 18011 18064 18150 20189 23469 23662 25407 28189 35779 37071

1855 3613 5755 7904 12491 14272 19654 22065 22316 23975 24503 26458 29567 34455 35556

928 4740 6537 8736 9455 16185 18167 22537 22768 26005 32031 32179 33566 34966 35808

3986 4696 5295 8034 12188 12339 14298 19661 22499 22837 28343 29201 30056 36868 36872

1049 2606 9166 13000 17407 22535 24035 24090 26423 27147 28104 29196 34765 36183 36195

2475 2705 6586 10659 14652 15858 18555 22635 25610 26796 32144 33131 35581 37072

1339 1594 5556 5731 5735 7423 7924 8287 10173 21406 26174 26965 30831 35028

2095 2692 4542 11957 16923 21339 22995 35510
753 3913 4481 24115 25745 28475 29334 34983
531 2404 4091 6823 7730 13085 21741 25943
764 2602 5000 5777 6649 28284 28457 30648
173 2884 3453 7716 16017 26720 33781 34558
804 3989 4026 10353 16302 20995 22614 29946
1369 1438 4721 11804 19454 24989 29745 33895
2413 3865 4900 9605 12227 19796 34068 35639
2280 3614 3994 5794 8725 17288 29042 32667
189 729 2807 18569 20422 29775 33106 35601
13 1942 3075 5647 16437 28792 33944 36951
2322 2774 4133 14911 23058 26276 35482 36145
1156 1915 1988 13753 20275 22750 28129 28615
1027 3254 3826 12792 25306 33398 34900 36579
1000 3662 3934 12247 28784 30051 30448 34971
2208 4777 4895 7995 15270 34546 35050 35465
865 1301 2776 5447 7236 25204 28825 33009
931 2280 3123 18312 20000 26379 29091 35547
161 313 1976 10118 19510 24067 25236 29200
495 2033 3478 18349 21388 27692 27945 29298
40 123 466 8627 14489 23804 25266 29217
1919 2239 5036 9020 10230 13401 26202 31868
2984 2990 4559 13817 15317 17982 24664 30694
4263 4578 4900 18514 19432 21056 22195 25540
486 2865 4044 10378 16367 19558 31611 37057
773 785 4692 13690 15318 17028 26614 28889
1128 2525 4918 13514 14018 21695 28403 28447
1378 2785 3945 19557 24360 26125 32618 35109
1622 2734 4728 21208 22587 28908 32086 34795
1490 2885 4429 7668 12440 13368 15096 30591
157 4782 5028 7007 8693 14921 17912 24354
1887 2821 4004 5990 7023 11617 23891 31527
2659 3026 3929 8247 18589 18766 25496 30000
1493 4505 4919 10166 15487 19375 20018 37009
1459 2038 4184 13922 16641 25405 27889 36692
2552 3118 4424 10018 10774 20992 21805 22999
1575 3751 4248 12315 13683 16910 20849 27503
169 1552 4011 8140 13348 21198 22677 22961
485 1610 2021 6883 8078 10259 10833 36872
717 3562 4705 8210 14216 16365 30074 30100
284 2060 2603 5600 6111 16526 16904 25280
1464 2306 2405 15402 22597 31453 33154 36507
793 858 958 19518 21177 22969 27465 34316
2755 4039 4916 13740 21014 22548 23393 27868
2346 2859 3724 5804 11163 13257 16059 16537
3034 3827 4257 10753 10848 16863 17910 30215
699 2077 3036 14789 28159 29959 32060 35741
842 1479 1651 8903 20126 29843 30172 36359
60 216 2154 13804 29952 30425 30451 33882
1561 2138 3179 7117 10997 17696 18819 29502
1929 2926 4119 6462 9997 17945 19143 35222
1408 3721 4733 6077 8220 23897 24532 32454
758 1062 3265 22844 25290 26795 30309 32198
723 974 2366 11325 11639 20444 30190 33000
3057 3184 4157 6124 10032 14829 22920 27535
1908 2681 3314 10175 15746 19286 30891 31312
337 3329 4284 16428 26550 26938 27394 29675
601 626 4671 7188 18716 20787 25752 31716
2736 3729 3853 14610 18790 21261 31327
1514 1926 2616 7216 7346 13375 15951
385 2731 2776 17442 17618 18488 26842
2847 3447 4837 7730 21494 25421 27060
4167 4675 4950 18125 19852 24594 31885

2100 2258 2839 6788 12190 20838 22037
598 1160 2512 9977 27667 31266 35818
726 918 4356 25915 26856 35644 35900
603 4023 4286 21322 24461 26414 31230
1378 1712 2601 6187 19972 21466 33990
2477 3873 5026 6147 11847 28736 31098
458 983 3395 5246 16300 16685 26054
1591 4194 4296 8941 12584 26579 36950
956 1266 1722 21007 23498 27878 29947
1791 2382 3477 27827
753 1172 3171 21799
577 1793 4156 14329
1221 1909 2872 23737
3201 3437 3627 24180
1422 2384 2680 17127
350 2057 3244 29775
1494 3096 4085 12712
1925 2736 3505 20471
167 1300 1330 30100
2178 4141 4741 6802
169 2635 2776 7608
1061 3955 4667 23473
185 995 4044 24130
1792 2284 4178 30200
3947 4503 4756 34653
1198 4107 4470 5969
9656
8810
34388
35438
20498
24839
23256
9966
25861
11305
7639
21600
13763
25619.

A seventh reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 8/16, and puncturing a head of the information bits of the extended LDPC code by the puncture length L to generate the punctured LDPC code with the code length N of 69120 bits and the coding rate r of 8/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 2520, the predetermined value M1 is 5040, the A matrix and the C matrix are represented by a parity check matrix initial value table, and the parity check matrix initial value table is a table representing positions of elements of 1 of the A matrix and the C matrix for every 360 columns, and is 2184 2245 5483 5692 9320 18011 18064 18150 20189 23469 23662 25407 28189 35779 37071
1855 3613 5755 7904 12491 14272 19654 22065 22316 23975 24503 26458 29567 34455 35556
928 4740 6537 8736 9455 16185 18167 22537 22768 26005 32031 32179 33566 34966 35808
3986 4696 5295 8034 12188 12339 14298 19661 22499 22837 28343 29201 30056 36868 36872
1049 2606 9166 13000 17407 22535 24035 24090 26423 27147 28104 29196 34765 36183 36195
2475 2705 6586 10659 14652 15858 18555 22635 25610 26796 32144 33131 35581 37072
1339 1594 5556 5731 5735 7423 7924 8287 10173 21406 26174 26965 30831 35028
2095 2692 4542 11957 16923 21339 22995 35510
753 3913 4481 24115 25745 28475 29334 34983
531 2404 4091 6823 7730 13085 21741 25943
764 2602 5000 5777 6649 28284 28457 30648
173 2884 3453 7716 16017 26720 33781 34558
804 3989 4026 10353 16302 20995 22614 29946
1369 1438 4721 11804 19454 24989 29745 33895
2413 3865 4900 9605 12227 19796 34068 35639
2280 3614 3994 5794 8725 17288 29042 32667
189 729 2807 18569 20422 29775 33106 35601
13 1942 3075 5647 16437 28792 33944 36951
2322 2774 4133 14911 23058 26276 35482 36145
1156 1915 1988 13753 20275 22750 28129 28615
1027 3254 3826 12792 25306 33398 34900 36579
1000 3662 3934 12247 28784 30051 30448 34971
2208 4777 4895 7995 15270 34546 35050 35465
865 1301 2776 5447 7236 25204 28825 33009
931 2280 3123 18312 20000 26379 29091 35547
161 313 1976 10118 19510 24067 25236 29200
495 2033 3478 18349 21388 27692 27945 29298
40 123 466 8627 14489 23804 25266 29217
1919 2239 5036 9020 10230 13401 26202 31868
2984 2990 4559 13817 15317 17982 24664 30694
4263 4578 4900 18514 19432 21056 22195 25540
486 2865 4044 10378 16367 19558 31611 37057
773 785 4692 13690 15318 17028 26614 28889
1128 2525 4918 13514 14018 21695 28403 28447
1378 2785 3945 19557 24360 26125 32618 35109
1622 2734 4728 21208 22587 28908 32086 34795
1490 2885 4429 7668 12440 13368 15096 30591
157 4782 5028 7007 8693 14921 17912 24354
1887 2821 4004 5990 7023 11617 23891 31527
2659 3026 3929 8247 18589 18766 25496 30000
1493 4505 4919 10166 15487 19375 20018 37009
1459 2038 4184 13922 16641 25405 27889 36692
2552 3118 4424 10018 10774 20992 21805 22999
1575 3751 4248 12315 13683 16910 20849 27503
169 1552 4011 8140 13348 21198 22677 22961
485 1610 2021 6883 8078 10259 10833 36872
717 3562 4705 8210 14216 16365 30074 30100
284 2060 2603 5600 6111 16526 16904 25280
1464 2306 2405 15402 22597 31453 33154 36507
793 858 958 19518 21177 22969 27465 34316
2755 4039 4916 13740 21014 22548 23393 27868
2346 2859 3724 5804 11163 13257 16059 16537
3034 3827 4257 10753 10848 16863 17910 30215
699 2077 3036 14789 28159 29959 32060 35741

842 1479 1651 8903 20126 29843 30172 36359
60 216 2154 13804 29952 30425 30451 33882
1561 2138 3179 7117 10997 17696 18819 29502
1929 2926 4119 6462 9997 17945 19143 35222
1408 3721 4733 6077 8220 23897 24532 32454
758 1062 3265 22844 25290 26795 30309 32198
723 974 2366 11325 11639 20444 30190 33000
3057 3184 4157 6124 10032 14829 22920 27535
1908 2681 3314 10175 15746 19286 30891 31312
337 3329 4284 16428 26550 26938 27394 29675
601 626 4671 7188 18716 20787 25752 31716
2736 3729 3853 14610 18790 21261 31327
1514 1926 2616 7216 7346 13375 15951
385 2731 2776 17442 17618 18488 26842
2847 3447 4837 7730 21494 25421 27060
4167 4675 4950 18125 19852 24594 31885
2100 2258 2839 6788 12190 20838 22037
598 1160 2512 9977 27667 31266 35818
726 918 4356 25915 26856 35644 35900
603 4023 4286 21322 24461 26414 31230
1378 1712 2601 6187 19972 21466 33990
2477 3873 5026 6147 11847 28736 31098
458 983 3395 5246 16300 16685 26054
1591 4194 4296 8941 12584 26579 36950
956 1266 1722 21007 23498 27878 29947
1791 2382 3477 27827
753 1172 3171 21799
577 1793 4156 14329
1221 1909 2872 23737
3201 3437 3627 24180
1422 2384 2680 17127
350 2057 3244 29775
1494 3096 4085 12712
1925 2736 3505 20471
167 1300 1330 30100
2178 4141 4741 6802
169 2635 2776 7608
1061 3955 4667 23473
185 995 4044 24130
1792 2284 4178 30200
3947 4503 4756 34653
1198 4107 4470 5969
9656
8810
34388
35438
20498
24839
23256
9966
25861
11305
7639
21600
13763
25619.

An eighth transmission device/method according to the present technology is a transmission device/method including an encoding unit/step configured to perform LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 9/16, and puncture a head of the information bits of the extended LDPC code by the puncture length L to generate a punctured LDPC code with the code length N of 69120 bits and the coding rate r of 9/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 1800, the predetermined value M1 is 9000, the A matrix and the C matrix are represented by a parity check matrix initial value table, and the parity check matrix initial value table is a table representing positions of elements of 1 of the A matrix and the C matrix for every 360 columns, and is 3681 3750 3985 4255 8583 9468 12078 12353 15700 16492 17127 18174 18264 22392 23070 25263 29195 32034
804 4119 5315 5489 8261 9514 10099 10268 14359 16861 21050 21439 23880 24274 26637 30518 30944 31195
3684 4224 4412 7772 8017 10100 12529 15888 16518 18089 19685 28054 28297 28345 28897 29827 30402 31794
2013 2073 4993 6278 6716 10271 13971 14141 14727 17892 21649 22734 24394 25979 26485 30156 30617 31322
671 4057 4827 6795 8726 11791 15912 16773 16823 21296 24678 28589 29419 30212 30976 31701 32035
2831 3625 4812 9421 10678 11313 11919 13859 24185 26543
105 197 4569 12767 18835 20708 21307 21922 29762 30542
1939 3334 7927 12368 22520 24007 25355 26414 27639 30526
935 4228 7324 10281 10930 14811 20832 21012 24721 31868
451 1279 6541 9174 9524 23917 24447 24765 27400 30105
596 3093 7695 12690 12805 20513 26844 26874 27238 30238
3165 4948 8257 13864 15261 19334 23340 27303 29834 30592
4311 6608 8867 12314 17011 19562 29621 29653 29867 31831
246 1043 4063 9880 12133 14403 17673 21772 26756 28865
3800 4310 7891 9005 17892 22752 29776 30960 31922
169 3202 6707 9267 19608 21494 24264 27783 30896
2756 3526 5061 14144 15208 17722 19974 23683 25622
5640 6672 8062 10253 14587 17029 23586 29354 30935
1780 6399 7013 13407 14129 26025 27047 27302 28430
3867 8295 8448 11173 12961 16355 23417 30645 30840
114 2303 5658 10578 12954 19396 23278 26133 29150
4205 6484 8154 9468 9855 17738 25225 28855 29327
4064 5671 6785 11073 12684 17900 18543 24915 25278
4591 6432 6812 9172 9497 10443 11612 15805 26385
3429 5317 5699 11875 12763 19252 24194 28715 31645
2334 5348 8140 15322 16398 18377 22674 23119 27452
5806 8178 8750 18695 19361 20500 21337 23747 26594
868 5108 7470 12695 12827 13362 17150 30388 32036

1401 3377 6069 13887 15223 16423 20548 26114 31525
2388 2511 6647 15288 20979 21546 22893 25768 26293
5918 7740 8309 16069 17648 21533 21638 30421 30592
4531 6710 7575 10870 14321 15801 22289 27422 29206
282 2349 2823 16122 18235 22889 30845 31790 32028
1028 3364 7170 9696 10463 13676 21633 22408 22987
4747 5376 7037 11344 18790 18904 23562 26963 29547
2666 4221 8779 12684 15548 16845 19631 27773 32000
3277 3636 6417 15359 20686 23258 23607 28911 31760
1394 1613 4705 10030 14240 20469 21907 25971 28392
2428 3334 6308 9823 14969 16081 20361 21680 27204
870 4539 5033 11210 11227 12757 13164 16363 18278
519 8424 8966 11266 12282 15631 17138 25283 27009
562 4648 7031 9367 9769 17258 17524 18469 23544
2607 4017 4276 12525 16477 21617 28004 29179 31638
1311 1705 6279 19425 20643 21524 21927 26759 30022
2440 5160 8827 19724 20470 21579 22088 25426 26076
247 1718 3238 15685 16926 26381 27070 28504 31522
1646 3308 3325 12196 13145 18495 22879 25613 31074
2777 6991 7582 12852 15441 16518 19845 27107 31491
24 1098 6964 10014
3834 7138 8104 27290
2467 2695 6985 23538
597 1655 2786 26365
3412 3568 3869 22313
1378 3631 7350 30759
396 2426 3965 30636
294 5276 6622 28723
889 5479 5831 13814
1355 5011 7082 24636
1737 5683 7638 12279
4248 4328 7871 13506
1867 5466 7068 23531
1400 5020 7410 9775
2727 3409 6324 21177
4027 4240 7262 16737
1442 7380 7650 24201
601 6169 6278 26698
1070 3198 6038 11626
616 3835 8339 28168
4424 5809 6656 26638
3857 4561 4879 27896
2696 2722 4665 17776
643 2333 3072 10579
232 4876 4956 18710
3486 3535 6104 29906
774 5073 6030 23656
4617 6194 7445 31653
4163 5489 8227 28295
3675 3991 4940 18635
496 2003 4758 20333
1062 2059 4493 25301
1380 7374 8642 28926
1294 1639 8662 30961
5866 6147 7653 11713
5458 7184 7361 20695
2463 4602 6018 16857
320 4682 8140 19724
4410 6923 8975 26037
306 1921 7301 11104
57 1768 5604 17338
2839 3153 5912 28608
1091 6051 7495 31918
1681 2099 2259 16924
4490 5186 6994 25446
3188 4252 6208 25437
1342 5660 7305 21071
1048 3204 7421 15675
2197 3412 5125 22484
5721 6143 6479 22800
2531 4216 4794 17691
628 3665 5783 26756
2660 5527 7289 14552
3432 4895 6255 20101
288 2324 2375 27024
3898 7386 8459 10265
301 4717 4972 10844
1895 7065 8334 22255
331 1779 7214 22726
3202 4096 7467 27090
27017
29554
30755
30289
14496
29460
27770
9663
12310
11707
30095
30852
20107
23269
22090
12537
23969
13527
10911
20907
15272
23822
31661
13732
21787.

An eighth reception device/method according to the present technology is a reception device/method including a decoding unit/step configured to decode a punctured LDPC code obtained from data transmitted by a transmission method including an encoding step of performing LDPC coding for information bits with an information length K=N×r to generate an extended LDPC code having parity bits with a parity length M=N+L−K on the basis of an extended parity check matrix having rows and columns each extended by a predetermined puncture length L with respect to a parity check matrix of an LDPC code with a code length N of 69120 bits and a coding rate r of 9/16, and puncturing a head of the information bits of the extended LDPC code by the puncture length L to generate the punctured LDPC code with the code length N of 69120 bits and the coding rate r of 9/16, in which the extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, the B matrix having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 1800, the predetermined value M1 is 9000, the A matrix and the C matrix are represented by a parity check matrix initial value table, and the parity check matrix initial value table is a table representing positions of elements of 1 of the A matrix and the C matrix for every 360 columns, and is 3681 3750 3985 4255 8583 9468 12078 12353 15700 16492 17127 18174 18264 22392 23070 25263 29195 32034
804 4119 5315 5489 8261 9514 10099 10268 14359 16861 21050 21439 23880 24274 26637 30518 30944 31195
3684 4224 4412 7772 8017 10100 12529 15888 16518 18089 19685 28054 28297 28345 28897 29827 30402 31794
2013 2073 4993 6278 6716 10271 13971 14141 14727 17892 21649 22734 24394 25979 26485 30156 30617 31322
671 4057 4827 6795 8726 11791 15912 16773 16823 21296 24678 28589 29419 30212 30976 31701 32035
2831 3625 4812 9421 10678 11313 11919 13859 24185 26543
105 197 4569 12767 18835 20708 21307 21922 29762 30542
1939 3334 7927 12368 22520 24007 25355 26414 27639 30526
935 4228 7324 10281 10930 14811 20832 21012 24721 31868
451 1279 6541 9174 9524 23917 24447 24765 27400 30105
596 3093 7695 12690 12805 20513 26844 26874 27238 30238
3165 4948 8257 13864 15261 19334 23340 27303 29834 30592
4311 6608 8867 12314 17011 19562 29621 29653 29867 31831
246 1043 4063 9880 12133 14403 17673 21772 26756 28865
3800 4310 7891 9005 17892 22752 29776 30960 31922
169 3202 6707 9267 19608 21494 24264 27783 30896
2756 3526 5061 14144 15208 17722 19974 23683 25622
5640 6672 8062 10253 14587 17029 23586 29354 30935
1780 6399 7013 13407 14129 26025 27047 27302 28430
3867 8295 8448 11173 12961 16355 23417 30645 30840
114 2303 5658 10578 12954 19396 23278 26133 29150
4205 6484 8154 9468 9855 17738 25225 28855 29327
4064 5671 6785 11073 12684 17900 18543 24915 25278
4591 6432 6812 9172 9497 10443 11612 15805 26385
3429 5317 5699 11875 12763 19252 24194 28715 31645
2334 5348 8140 15322 16398 18377 22674 23119 27452
5806 8178 8750 18695 19361 20500 21337 23747 26594
868 5108 7470 12695 12827 13362 17150 30388 32036
1401 3377 6069 13887 15223 16423 20548 26114 31525
2388 2511 6647 15288 20979 21546 22893 25768 26293
5918 7740 8309 16069 17648 21533 21638 30421 30592
4531 6710 7575 10870 14321 15801 22289 27422 29206
282 2349 2823 16122 18235 22889 30845 31790 32028
1028 3364 7170 9696 10463 13676 21633 22408 22987
4747 5376 7037 11344 18790 18904 23562 26963 29547
2666 4221 8779 12684 15548 16845 19631 27773 32000
3277 3636 6417 15359 20686 23258 23607 28911 31760
1394 1613 4705 10030 14240 20469 21907 25971 28392
2428 3334 6308 9823 14969 16081 20361 21680 27204
870 4539 5033 11210 11227 12757 13164 16363 18278
519 8424 8966 11266 12282 15631 17138 25283 27009
562 4648 7031 9367 9769 17258 17524 18469 23544
2607 4017 4276 12525 16477 21617 28004 29179 31638
1311 1705 6279 19425 20643 21524 21927 26759 30022
2440 5160 8827 19724 20470 21579 22088 25426 26076
247 1718 3238 15685 16926 26381 27070 28504 31522
1646 3308 3325 12196 13145 18495 22879 25613 31074
2777 6991 7582 12852 15441 16518 19845 27107 31491
24 1098 6964 10014
3834 7138 8104 27290
2467 2695 6985 23538
597 1655 2786 26365
3412 3568 3869 22313
1378 3631 7350 30759
396 2426 3965 30636
294 5276 6622 28723
889 5479 5831 13814
1355 5011 7082 24636
1737 5683 7638 12279
4248 4328 7871 13506
1867 5466 7068 23531
1400 5020 7410 9775
2727 3409 6324 21177
4027 4240 7262 16737
1442 7380 7650 24201
601 6169 6278 26698
1070 3198 6038 11626
616 3835 8339 28168
4424 5809 6656 26638
3857 4561 4879 27896
2696 2722 4665 17776
643 2333 3072 10579
232 4876 4956 18710
3486 3535 6104 29906
774 5073 6030 23656
4617 6194 7445 31653
4163 5489 8227 28295
3675 3991 4940 18635
496 2003 4758 20333
1062 2059 4493 25301
1380 7374 8642 28926
1294 1639 8662 30961
5866 6147 7653 11713
5458 7184 7361 20695
2463 4602 6018 16857
320 4682 8140 19724
4410 6923 8975 26037
306 1921 7301 11104
57 1768 5604 17338
2839 3153 5912 28608
1091 6051 7495 31918
1681 2099 2259 16924
4490 5186 6994 25446
3188 4252 6208 25437
1342 5660 7305 21071
1048 3204 7421 15675
2197 3412 5125 22484
5721 6143 6479 22800
2531 4216 4794 17691
628 3665 5783 26756
2660 5527 7289 14552
3432 4895 6255 20101
288 2324 2375 27024
3898 7386 8459 10265
301 4717 4972 10844
1895 7065 8334 22255
331 1779 7214 22726
3202 4096 7467 27090
27017
29554
30755
30289

14496
29460
27770
9663
12310
11707
30095
30852
20107
23269
22090
12537
23969
13527
10911
20907
15272
23822
31661
13732
21787.

In the first transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 2/16. Moreover, the head of the information bits of the extended LDPC code is punctured by the puncture length L, and the punctured LDPC code with the code length N of 69120 bits and the coding rate r of 2/16 is generated. The extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 0, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is 1444 1737 1780 9182 9748 9954 11859 23510 36957 41211 41804 41857 42268 42854 45152 46217 46448 52760 57528 59998 60168

281 1279 1468 9650 11337 15973 21859 24346 25864 28317 33522 35344 40280 43576 43942 50851 53221 57076 57561 59922 59962

132 758 1470 2901 2957 3365 4567 7062 10939 12288 20818 35122 39299 41903 43394 44289 49129 51394 53222 53899 56037

9 756 1510 3127 4867 15380 16575 17906 19275 20944 25462 27021 31939 34367 36491 39391 45013 45505 47768 50626 51547

188 252 1181 2939 4132 7944 12352 15443 17831 18785 18904 22672 23400 30518 30652 45102 51500 52032 52868 60341

496 564 1527 2708 2751 3658 6451 8212 11654 17193 21558 23963 28394 30554 30628 35052 44835 45090 49804 52979

793 858 1710 3561 10566 11369 17707 20970 22329 22383 24607 31237 38613 42719 43867 45715 50453 51882 55535 60316

689 980 1657 2690 4633 11070 16939 18443 20748 21753 25742 30361 31544 31693 33019 40842 47042 48850 52130 56606

198 281 1664 3384 12801 17438 24093 29656 30578 31929 35921 38919 38984 40957 43262 48155 50743 56398 56427 59215

457 1065 1196 2861 12717 15390 16655 17899 18300 22233 31560 32716 34991 43324 46709 51328 52891 54292 56334 59229

1307 1481 1599 13551 21460 22804 23439 32551 32671 35941 36329 40096 41474 45156 50568 55578 55667 56581 59061 60009

99 485 708 4043 5527 5824 7489 8809 15871 17753 18297 18507 19070 22839 28023 41124 43165 50873 51968 57000

188 412 1641 1833 5707 7556 10610 12636 14533 26728 27604 31757 32972 34677 36279 38315 42252 43155 53121 57503

300 794 1153 6459 7063 13526 17788 18308 21233 21439 22250 28514 32042 32160 36140 44273 49289 50434 51163 56471

757 1336 1440 5560 6283 10080 10986 13051 17638 22870 31581 35463 41212 42195 43305 46746 49564 56412 58207 59477

106 1195 1474 6273 14321 14746 16496 17016 17214 19472 27450 33489 40638 42896 43150 47624 51106 51339 53730 55816

98 1002 1336 2076 9328 10989 13413 13916 14455 17863 19776 24981 31172 39450 40385 43348 44833 46967 52917 58029

262 1363 1605 4715 8438 8794 12188 18208 19803 28570 36281 38576 39120 40344 44994 45827 46559 49914 50771 56658

870 1743 1764 5521 8695 11745 15888 16359 16412 33151 37033 38281 38499 39026 41174 44818 53168 56178 58405 60285

861 1142 1169 2232 4370 9265 10442 15376 15947 19420 24577 29045 36440 38242 41035 47841 49589 50529 52662 59907

231 913 1440 2695 6369 7938 8296 12107 14329 19324 25096 26108 35369 38516 41289 43604 52617 57130 59909 60020

214 667 762 3988 6762 14360 15257 18298 18943 19364 29813 33804 35106 36373 39451 39478 45683 47618 48539 59814

1144 1150 1746 1800 7038 11454 18376 18819 21869 26781 33351 35591 46571 49235 49956 50749 51642 53390 56404 58103

308 317 1510 5176 12653 13311 15884 18075 22371 26021 27004 29283 30382 32114 32978 35790 47224 48249 51701 57840

2786 5188 6809 7110 7138 7167 8042 12569 15301 27503 27894 32875 35277 48267 49051 57363

6186 6554 12052 14220 15013 15388 22130 27207 30084 30620 31562 36834 38446 52593 56791 60017

8810 12703 21600 21640 22233 26157 27268 27384 33020 39679 49298 51854 52364 53298 55215 59802

2670 6309 10054 11421 11750 11901 12053 12752 17466 28571 29910 32369 34446 38373 49448 51729

11357 12810 13252 14755 22824 30867 32868 33512 34862 35560 38704 41861 42805 43103 48692 55234.

In the first reception device/method according to the present technology, the punctured LDPC code obtained from the data transmitted by the first transmission method is decoded.

In the second transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 3/16. Moreover, the head of the information bits of the extended LDPC code is punctured by the puncture length L, and the punctured LDPC code with the code length N of 69120 bits and the coding rate r of 3/16 is generated. The extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 0, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is 853 875 1192 2465 3004 4879 9062 21593 24043 26616 30909 32017 35006 42135 44268 56020

161 519 1556 3317 6015 14909 15760 21148 30072 32655 33940 34834 43430 44798 51284 52169

177 999 1683 6976 17610 18152 19591 22312 25036 27303 28584 47608 47749 50216 52322 54007

981 1000 1625 1630 6933 13217 13956 15319 22642 29483 31921 35465 43602 44250 46505 55678

1204 1242 1653 3066 6095 16862 20154 21430 23418 26408 30979 34093 41103 48385 54547 55093

316 1355 1562 2665 5222 6575 18299 19639 24268 30959 37721 47966 48255 51808 53697 56010

183 219 615 2859 6967 8044 13949 22294 28922 29355 32175 32276 33861 49675 52583 53512

263 342 1684 7426 14417 20396 27461 30075 33740 36812 38204 38420 41612 43083 45914 56035

256 870 921 3023 4662 5225 5276 19284 26034 35397 38524 44936 45178 46351 50860 51813

289 898 1442 9135 10774 13951 14133 19070 21192 27854 32118 43657 43859 43934 52772 53659

256 690 1324 3582 7066 8507 26854 34507 40768 44943 47952 50512 52080 52872 53733 53773

238 1037 1388 1929 6395 10653 21299 23085 26467 26836 27834 44924 47310 49393 53742 55883

976 1217 1469 7718 16449 19465 19983 22386 24762 28308 32395 33589 35997 41034 42118 43799

265 368 1365 1375 1808 7556 14593 15079 19648 36077 40397 41971 44940 47570 52522 55839

802 1656 1689 5554 6787 11067 15764 19656 31740 31762 36046 42258 45165 49245 52732 53420

265 307 1299 2775 6738 22483 26322 27615 30628 34194 38024 38787 46089 48680 49115 51063

698 747 1241 2898 5218 7964 15358 17928 28069 29537 33641 36103 40207 40701 42823 42929

70 293 799 16494 16696 20008 21050 23735 34060 34555 35068 37664 45312 47748 50957 52382

1151 1163 1751 7025 10775 15100 22260 24718 28905 30853 33020 43261 46849 48258 54212 56122

279 457 775 8025 13383 16978 19254 23110 28197 31454 33060 38532 41429 41621 42149 54927

494 1130 1351 18525 22446 31344 31582 38324 42396 46010 48804 49241 49379 51987 52296 53133

177 508 1032 3547 8103 13357 14344 15876 20386 22050 23593 35305 47409 53297 55610 56093

988 1091 1785 3400 5144 7245 10179 12918 32871 33462 34484 38318 43410 44103 44267 52837

520 564 1757 12204 16894 17249 21480 21541 23760 28325 36266 40606 46094 48779 55501 56065

914 943 1111 3641 4232 10215 14134 16582 23445 28767 28862 32260 35952 39907 41846 47553

466 554 1697 4921 6953 7034 7052 10648 11628 19174 27830 29210 31722 32281 52559 55802

1135 1273 1408 2599 3618 4903 7210 17368 21014 21287 21926 24070 27741 29801 36137 44272

524 801 1767 4093 9721 12200 19463 29280 31587 33577 39747 43688 46627 49807 51345 55969

489 1390 1756 3050 12113 20477 21376 26797 27049 28907 31534 32746 33345 40582 41970 55911

432 1520 1598 9292 11552 16985 18417 21847 21960 24287 25489 34478 40990 44004 47573 53982

301 592 849 1944 4128 8341 16783 19249 24983 43892 44041 44474 44942 44959 50738 54935

118 558 1470 4368 10132 11791 16523 22408 23766 25111 25426 25779 35005 42742 46197 53118

310 1059 1322 3609 7107 10048 13161 32141 33369 35206 36131 38746 44545 47963 48414

256 346 845 7363 10375 12492 13091 27987 32113 34846 36223 39863 44450 46526 49216

607 683 954 5473 10617 18484 20018 26971 28190 37592 39069 39740 43575 45676 48149

244 635 1208 5450 8082 25030 25149 28411 29333 31324 36972 42071 43401 47088 52085

2841 5514 16122 18061 18199 20340 22525 25022 29914 31732 46415

7567 22860 23157 24194 24622 29643 31255 32355 36379 38228 51173

24002 24459 25897 26955 31168 31630 39183 46791 47323 51503 55241

4817 8291 10219 13991 14318 28549 28836 30491 36884 46310 54625

8275 9585 11678 37216 38932 45186 46287 48023 48862 53636 56067.

In the second reception device/method according to the present technology, the punctured LDPC code obtained from the data transmitted by the second transmission method is decoded.

In the third transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 4/16. Moreover, the head of the information bits of the extended LDPC code is punctured by the puncture length L, and the punctured LDPC code with the code length N of 69120 bits and the coding rate r of 4/16 is generated. The extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 0, the predetermined value M1 is 1800, the A matrix and the C matrix are represented by a parity check matrix initial value table, and the parity check matrix initial value table is a table representing positions of elements of 1 of the A matrix and the C matrix for every 360 columns, and is 797 853 885 2412 8763 16966 18074 21725 21923 22276 32414 49532 51711

39 1096 1305 6276 13449 16227 24628 29368 31384 32207 45115 47748 51161

44 427 1193 4543 10898 29586 34143 40123 44170 46228 47353 48962 49856

541 736 844 4479 7200 16262 18160 24649 29159 42952 43829 47067 48307

95 1342 1783 9131 12031 12989 13202 14244 27356 29527 32789 36795 38709

494 1203 1652 5475 16812 21005 24490 28736 31487 37840 39565 50301 50448

1532 1581 1705 10606 12678 17526 28502 35833 44124 47833 49541 51702 51831

96 185 1188 2754 2775 5499 6292 6895 9799 27158 28509 39985 48544

749 1007 1624 9110 12545 20317 27165 31146 36658 40218 45870 48593 49397

1163 1355 1556 4652 6091 6978 8979 14330 25366 27509 27927 33954 51511

1168 1311 1320 2096 3187 5119 20693 29188 35325 36538 41740 44821 47836

288 1399 1422 10030 12443 15396 19379 26774 30623 40397 40494 47324 48652

570 809 1622 8966 13182 24760 25846 37786 38499 41477 47218 49514 51673

44 208 811 3742 8390 20577 24033 26195 29483 39222 40429 45529 45643

97 1161 1310 2693 19471 21117 24844 29355 37875 38827 42599 46927 51585

620 1416 1679 12977 15285 17224 20748 22381 25697 28626 33138 37912 39470

368 1367 1465 11725 13919 13945 33353 37326 38778 40727 40875 48487 51103

1427 1519 1736 6497 10328 15345 17776 24008 29435 47926 48682 48686 49250

23 1169 1460 5251 10379 24722 25285 32822 35089 37814 44950 45474 47146

32 681 1568 6384 9728 21530 22557 24432 31527 33435 36375 37151 39510

918 1286 1362 2738 2808 5037 7483 16549 20933 31061 33375 39562 50975

844 925 1507 8014 14804 15472 22057 31449 32226 32974 34809 41852 50676

1104 1753 1780 6605 22820 24244 26745 28587 30929 33797 34123 42029 43723

296 351 1799 9595 9770 15297 17910 19571 20521 35468 38937 48238 50795

638 760 1027 15495 15806 27803 29165 32046 34804 38592 38949 39457 47996

676 1548 1687 15931 17206 27071 28999 29312 30437 39081 44646 46366 48245

164 1436 1470 3335 8452 10611 14735 17314 17457 21853 32068 49268 51360

673 987 1570 3322 4946 6830 12027 22997 28126 30952 31702 32262 40857

773 1139 1404 9840 16019 16640 18064 24251 25181 42571 46539 50656 51750

726 730 1282 9539 10718 15690 27181 28022 29831 32767 40892 45045 51229

178 355 896 3493 13148 14855 15297 17187 20332 26479 36876 38772 41342

174 909 992 4685 6611 6649 9973 10846 18348 21866 29851 48524 51503

256 1273 1407 4650 6765 16547 19484 19834 20323 22294 27570 33457 40893

27 60 100 1530 9640 11387 12526 16343 17977 24156 29307 43317 51005

908 1009 1256 15318 24411 27373 28956 29096 37447 40401 45949 47505 50608

871 1022 1050 2987 11235 11367 14631 18902 19810 40712 41044 44083 50666

322 663 669 8710 10150 15826 17085 22493 31938 37858 40689 44018 49689

589 846 1413 2627 4519 7841 15480 24061 40839 41475 41591 46883 50613

963 1135 1395 1610 5107 10991 17300 20822 21073 23236 30712 39982 42668

729 792 1696 3391 4018 6677 15323 31211 32245 38603 39662 44737 48810

274 376 1003 8907 11493 11611 25418 25885 33368 36485 41225 44260 45485

1174 1245 1412 3510 9590 17010 20708 25956 28271 29603 33362 37097 42952

813 1030 1452 5147 9859 19468 34863 35407 36002 36716 40288 42835 44337

211 230 1694 5157 23173 23285 26293 27140 29110 34165 38861 40227 43477

537 933 1476 2748 5211 5376 14853 16889 18857 20875 22806 29035 29444

697 709 765 6009 27426 29923 33631 35433 36206 43172 47174 50955

833 1096 1648 4459 13016 22371 22757 23977 26422 28211 29254 43701

214 521 895 2147 3200 3525 3561 6699 7730 7845 9000 9570 11204 11446 11570 12462 13469 14396 15475 17540 18804 18944 19321 19550 20001 25062 25567 26342 26709 27146 27392 27428 30782 32176 32956 33240 34420 35150 35263 35879 36407 37210 37393 37420 38892 40202 40583 40665 41816 42558 42720 43063 43442 44348 44378 45052 47033 49514 49845 50084 51647

7599 9277 13898 16320 19617 28012 30567 42423 43056

15934 20819 25195 28421 31073 31750 33551 35982 37823

5377 13795 16639 20686 22150 32586 33922 40431 42255

3368 14716 15016 20925 23397 25910 28917 36663 40946

3478 4545 5802 12334 27955 29363 42818 48135 48995.

In the third reception device/method according to the present technology, the punctured LDPC code obtained from the data transmitted by the third transmission method is decoded.

In the fourth transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 5/16. Moreover, the head of the information bits of the extended LDPC code is punctured by the puncture length L, and the punctured LDPC code with the code length N of 69120 bits and the coding rate r of 5/16 is generated. The extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 1800, the predetermined value M1 is 3600, the A matrix and the C matrix are represented by a parity check matrix initial value table, and the parity check matrix initial value table is a table representing positions of elements of 1 of the A matrix and the C matrix for every 360 columns, and is 1500 1594 4158 4611 4621 9708 14082 14260 16777 17457 21985 22308 23963 24554 25344 27485 27516 28008 30174 30625 31378 31525 35873 36202 45585 47150 47845 49311

851 2755 5753 8521 10162 12036 16914 17857 18538 22342 24470 28199 33144 34233 35459 35506 38894 39300 41198 41995 42243 43310 44187 44969 46306 46719 47907 48844

803 828 7874 8667 12187 15086 16097 20436 21143 22142 27188 29052 30895 30927 30963 31563 34591 35419 36521 38142 38825 42538 43514 44432 45634 47807 47953

3442 3596 4211 4790 5276 5379 6950 8256 10939 13398 13563 13720 18074 22070 22760 26767 27057 28054 29148 33155 33760 38500 42760 44861 45653 46507 48695

1337 3179 3936 4019 4207 4915 5953 6200 7596 10085 10241 15048 16788 25083 27412 27478 28623 33014 33168 33296 34087 35922 36818 38225 40169 41762 46370

230 2417 2466 10915 19279 39243 39762 42664 45750

595 1792 2788 16000 19698 28701 38882 45250 46449

764 1619 2243 10130 25528 38421 44789 45032 48064

779 1651 3431 4707 8887 24180 36687 37770 39583

136 1352 3105 9580 25493 28929 29003 43731 44941

0 2147 3434 4402 19742 21221 37419 46590 49082

1658 1953 2935 17606 21613 29311 33878 46163 47126

804 1362 2596 15920 25368 28032 32218 37251 38385

733 3180 3549 12710 14684 32429 36039 39164 47531

807 2668 2811 23227 39984 42091 45708 46426 47788

1142 3373 3414 4219 7793 11379 15389 28832 32362

246 2670 3141 11465 24513 25038 31936 36501 45021

1365 2399 3107 4460 24713 30758 32422 38041 43379

323 578 1392 22591 26966 35332 35884 36454 38254

24 78 229 8741 17149 21008 30309 32441 38141

587 1595 3531 9258 15476 30673 33744 41847 44930

980 2136 2883 18306 22032 31618 33154 45208 48127

1518 1796 2304 7939 24330 29552 33426 39907 41568

599 681 3597 10689 10811 19776 20651 34661 46473

970 1152 2675 13311 15762 16363 26575 37047 48249

1872 1968 2620 16207 31197 33577 37990 42868 45881

1105 1351 3374 28454 28667 37692 42083 46115

1019 1816 3153 7354 14190 15535 29787 40081

114 1127 3412 17706 21953 31166 48855 49247

411 1346 2860 6474 12912 28627 30225 31396

109 1895 2803 8192 22957 30924 32515 39258

1067 1547 3218 10928 18459 24102 24958 48228

1022 2939 3593 16210 20143 22128 36148 48748

1826 2281 3110 10706 11745 27544 29705 32385

165 1794 3038 13953 15929 20587 35639 37360

122 1107 1776 7992 15442 26707 28761 39718

344 1449 2018 7930 11023 11967 18210 48998

203 2541 3360 6249 8145 10115 16796 19830 39389 39409

1333 1476 1855 4261 5127 16893 20060 23938 25433 32522

1972 3154 3539 10244 10601 12317 18404 29191 35539 41261

1621 1817 3280 15943 26444 28455 28595 29822 38852 48190

2048 2565 2660 4707 12386 15311 19315 20091 24908 37754

2825 3043 3516 9940 11806 11981 20375 20597 22471 31060

2597 2792 3444 11226 16387 17531 18473 25142 39461 42139

439 2788 3511 3684 5549 16067 23077 39829 39920 44862

1076 2271 2797 6573 12043 17816 20967 21726 23200 38056

553 2080 2948 5535 16026 22119 23794 37157 46602 46720

112 2115 3084 8090 10494 13165 29078 31417 33314 39595

2275 2449 3058 10121 12474 12563 25072 25610 39483 43489

741 2186 2270 5146 10831 17517 20875 29107 35695 41244

1693 1902 2907 6756 10924 18965 24040 33793 41089 42464

2469 2514 2769 6664 8813 8938 19741 23113 34293 45892

1761 2326 2998 17255 23220 26747 28416 37450 38574 41110

1083 1375 1867 4468 6706 6899 15494 19170 28463 28858

1394 1412 1510 7439 27005 29288 32683 34307 34607 45091

2477 2978 3539 22378 23848 24738 28734 31460 41873 45398

191 803 1500 9030 14071 26093 26432 27827 35890 47458

556 2942 3114 10130 11981 33368 34732 42472 47188 47655

425 2875 2946 16084 19184 26801 27069 27090 31317 34103

121 1674 3258 5208 13340 26019 37492 38723 40779 49200

3968 7741 12550 32061

17972 19666 20231 33590

9086 34375 41691 42567

12168 14189 15095 49129

19291 26450 29950 39068

19852 25195 35124 36192

10447 32405 36184 40786

8911 19949 27496 41273

14679 16883 20951 29727
30296 32681 34757 36501.

In the fourth reception device/method according to the present technology, the punctured LDPC code obtained from the data transmitted by the fourth transmission method is decoded.

In the fifth transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 6/16. Moreover, the head of the information bits of the extended LDPC code is punctured by the puncture length L, and the punctured LDPC code with the code length N of 69120 bits and the coding rate r of 6/16 is generated. The extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 1800, the predetermined value M1 is 3600, the A matrix and the C matrix are represented by a parity check matrix initial value table, and the parity check matrix initial value table is a table representing positions of elements of 1 of the A matrix and the C matrix for every 360 columns, and is 1594 1610 4443 4633 4971 5913 7301 7706 13474 16147 16681 17638 20084 20205 20247 20540 22484 27085 28185 29116 31096 33068 41272 41610 43034

1883 2386 4525 5861 6762 8505 10987 11467 13389 15284 15934 22445 22893 24837 26162 26697 29883 30925 35299 38596 38645 41614 42730 43699 44169

1048 1205 7615 12049 12746 13032 13602 14263 14911 15606 21519 26057 26528 28217 28266 29323 31302 32457 32579 34903 35105 36007 40006 43828 44649

1621 1937 3806 4192 4345 4436 4464 5013 7744 9969 10235 10276 10910 12816 16020 17524 20323 30904 31663 35163 35398 35957 39093 42657 44993

49 1822 3711 3892 4990 10239 12492 18990 19520 21406 24318 24612 25751 26767 30148 31680 32384 33296 34983 35934 38715 40286 42291 42485 42998

220 302 3574 5681 9506 24907 31216 34098 36706
26 88 1979 6254 17793 31399 31963 38968 41759
571 2797 2843 10391 18284 24224 26323 35575 43222
2778 2865 3374 13146 22196 23479 29472 40894 43961
513 2641 3267 12546 22339 22592 33324 37388 43058
89 416 2750 8737 9111 19495 26529 35507 39319
1522 1795 3155 3952 19544 28293 40910 43137 44782
68 1271 2663 22635 26043 31010 37397 42214 42940
1102 1410 2026 14095 14851 19343 23303 25716 33443
2257 2649 2734 13712 40173 42230 42240 43221 44414
714 2565 2880 4450 12908 34192 35997 36455 40728
1546 3319 3372 7492 10636 16725 26425 42426 42880
41 927 2263 6416 10637 22272 29323 34364 39763
1681 2598 3263 4337 19277 28170 31112 39274 39685
1624 2266 2712 7713 10204 19680 20781 32234 32824
1839 2578 2725 4403 4475 6187 8251 15794 34791
1372 2107 2310 8695 10370 22033 31001 38223 44215
1045 2138 3259 14898 16935 20360 28114 30232 36792
2326 3271 3510 21052 22158 24249 25709 30136 35176
347 2043 2984 10440 10461 11558 18257 42040 44932
562 1425 2428 12400 14792 16918 24373 34372 44049
959 1004 2630 14983 26147 28239 28571 33730 34758
2366 3093 3321 16340 19265 26290 28817 42082 42430
1812 2687 3030 7047 13181 15320 27308 36719 39868
118 933 1127 16601 20206 28560 42837 44651 44924
411 1346 2869 4816 6186 12098 26338 28747 28842
1985 2151 2804 7754 21167 21405 29764 35907 40584
1067 1689 3513 10225 15350 17157 22215 37316 44909
1306 1452 2564 15049 24636 29181 29918 39466 44466
558 640 2085 5522 9131 12991 24658 28599 38510
971 1333 2524 5076 14312 16292 23989 28218 37668
345 1819 2012 7598 7602 10348 11079 16828 20223
206 3490 3577 7652 9484 15485 18215 32891 36012
207 2085 2818 4223 4981 18437 18907 20797 29779
1043 1602 1711 17049 26349 37701 37805 39929 44226
528 686 2519 22288 24424 26040 27266 35523 44395
974 2063 3540 23885 24211 26226 27093 33120 34243
84 689 1292 14234 17834 34458 36109 38609 44075
656 1321 1335 9564 11031 20663 28540 33454
2798 3040 3447 10523 15178 16147 17112 23143
2785 2827 3514 3648 5406 8631 21247 36454
983 2859 3241 6313 15981 16459 29725 35759
662 1428 2716 9984 19352 21403 27521 37417
1460 1582 3397 5327 14857 27868 34040 42479
116 353 3081 9834 12252 26703 28884 30421
2275 2449 2838 9493 11608 23271 38776 39806
704 1750 2835 10462 12221 28740 29710 37673
121 2008 2529 16240 19331 23089 25481 36984
1207 1650 2956 6464 10252 30913 31894 38888
1272 2513 2764 6370 8377 8517 31368 41960
1538 1761 2999 21345 26055 30346 34230 35254
1125 1822 2953 6588 14341 16087 19369 25097
60 246 1224 19668 19837 21037 26085 26484
2023 2447 3295 7065 24779 29935 31328 32089
2977 3291 3536 20569 22895 26291 28856 38257
198 1500 1594 8474 12821 24065 24273 25489
829 2542 3457 9560 9981 11130 37448 39505
2452 3433 3465 8505 30616 36656 37451 38882
1828 2189 2401 5065 14917 17648 24809 24869
1674 1760 3256 5017 12401 34198 35372 44967
329 2242 2945 3841 11713 18179 18567 30756
1134 2993 3068 8595 13252 14014 31475 44841

671 1250 2076 18266 23182 24268 32218 33106 33153 35797

532 2267 2927 8343 13630 15565 18426 25262 27191 37728

1363 2100 2454 15244 19187 23000 25655 28410 29916 33402

251 1469 2315 13593 15859 19414 26073 29034 35496 37152

112 1736 2508 5876 14259 14532 21456 35968 37533 42515

25233 26394
5080 6930
12302 41997
27483 36076
5116 36815
11841 28243
18326 37978
22431 36141
35950 40525
41824 42674.

In the fifth reception device/method according to the present technology, the punctured LDPC code obtained from the data transmitted by the fifth transmission method is decoded.

In the sixth transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 7/16. Moreover, the head of the information bits of the extended LDPC code is punctured by the puncture length L, and the punctured LDPC code with the code length N of 69120 bits and the coding rate r of 7/16 is generated. The extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 2160, the predetermined value M1 is 3960, the A matrix and the C matrix are represented by a parity check matrix initial value table, and the parity check matrix initial value table is a table representing positions of elements of 1 of the A matrix and the C matrix for every 360 columns, and is 1764 2277 5400 7275 7702 16018 16086 17361 18724 18869 19132 20243 21595 25512 26606 30134 36052 39329 41031

181 1916 4788 5993 10696 12604 13012 24557 24787 25876 26693 28545 32349 33375 35357 36872 37706 38697 40205

1627 3867 5245 5631 6206 7958 12408 14675 15078 16069 20924 24234 29887 31630 32133 34527 34618 35147 37843

1103 2230 7388 9550 10439 11627 13165 14144 18256 22833 26008 26531 28108 28741 29963 31479 31923 39255 39995

1285 2355 4577 6689 10485 12036 16455 18963 19252 23741 30895 31196 35315 36358 36604 38535 39352 40937 40994

3065 4434 5307 7286 7705 9549 9848 11017 11901 12627 17746 21303 23749 24143 25301 25977 32801 37365 38172

434 2357 3026 7873 22006 27928 31085 34076
1003 2078 2558 6023 7076 9453 23248 40783
275 2594 2879 4212 4816 24471 29358 33606
304 2655 3449 9926 16670 32754 33277 38132
657 1983 3058 14006 17331 24307 37692 38764
865 1808 3134 21758 27257 31888 37426 40019
562 1861 3800 12068 20650 30577 33391 39300
97 459 2970 5360 8808 17885 24492 36388
1655 1901 3486 3965 18266 21707 26083 39858
106 2971 3601 4603 17049 21044 24058 34168
105 2632 3687 12222 15389 17985 18580 24844
1067 1887 3012 11816 23805 27159 31152 32102
412 3506 3688 11340 12998 28025 30295 32802
884 2933 3112 19905 33377 35257 38730 39998
3709 3756 3774 7360 10333 13454 15712 24711
58 2494 2959 6474 10296 20685 26935 36360
1854 2850 3654 4678 18001 28593 35963 36270
1830 2363 2518 7949 10035 18345 29534 31920
1646 2020 2811 4203 4779 6289 30475 32063
465 1178 2986 18151 20386 25654 27386 40357
640 2615 3354 8542 14478 25967 25995 37471
1082 1285 3179 18952 26721 27915 37670 40010
1737 1976 2546 7547 20613 23824 25055 32654
741 1013 3328 9668 9749 17082 38386 40974
1268 1476 2671 11835 14049 22600 31513 40179
1045 1108 2992 14156 23244 24154 31043 31798
2421 2602 3798 15389 17884 24140 35871 38752
819 2169 2955 14408 22625 25191 35170 36437
334 922 3167 5119 13570 15530 39099 41014
1221 1589 2395 8195 17835 24255 33626 40708
860 2308 2450 5038 6315 23489 26114 32851
406 1679 3105 14968 19909 27383 37072 40206
633 1863 1959 14480 16090 18913 34193 41012
1488 1699 2837 14716 22731 26859 27454 35998
700 1266 2120 5664 24568 24724 31262 35236
900 1067 2778 5274 15361 17755 22211 33252
1025 2008 2182 7489 7536 15899 18803 24702
383 648 716 5156 6037 9277 30214 38571
389 1155 2887 6102 17079 19192 23080 32918
1471 1635 2511 4547 5272 14725 20498 21659
2171 3539 3896 9346 9694 10999 15963 34494
1994 2216 2771 20692 24115 32560 37794 40140
1080 2162 2696 21197 22485 25015 30419 31363
97 755 1419 13499 16636 31603 35313 40181
1469 1655 3110 9088 10592 17584 19236 26283
2952 3076 3849 10157 14317 15196 16053 35195
1861 3105 3862 3994 5564 6074 8451 19756
3145 3155 3597 14101 15059 15459 27355 32750
259 873 3006 18016 18676 19887 25385 34337
613 1595 3868 5572 14023 20249 31223 38780
200 3129 3397 7639 9614 11741 26530 28039
2223 2694 3117 9231 11140 21370 27439 35476
779 1905 3630 11778 26510 27390 33035 34468
137 624 2206 15239 18045 21398 23580 29951
1327 1763 3312 6477 9861 28455 34353 35567
2717 2763 3044 8185 8380 17045 28844 38259
265 1105 3295 22148 24070 27939 31377 32371
1785 2042 3249 6558 15036 15184 18135 23151
271 1032 1352 4622 18315 19571 24142 24376
2392 2686 3656 7062 22999 24868 27626 28882
2726 3295 3893 19111 21109 26599 35039 37863
1650 1757 2170 5928 12800 22404 22521 23554
474 912 2810 9299 9649 34316 36020 39568
721 3776 3815 8297 28150 29224 33574 35496
2009 2400 3282 14124 16587 22933 22980 28722
132 1845 3587 11790 22121 31459 32442 40951
142 361 1061 4265 11230 16948 17367 27128
1250 2600 3374 8456 12596 28890 34813 40879
738 1025 1617 17079 22449 25340 30369 32737
1876 2731 2841 9438 17215 23350 27295 34083
453 1144 3263 12936 18049 25084 25595 29278
2369 2850 2997 6628 14441 17901 21329 23717
1671 2580 3055 12903 14917 24143 26800 33983
1516 1907 2756 5106 13479 13748 32931
1708 3245 3727
216 2078 2179
137 316 3665
834 2278 3108
5345 33686
11281 26022
17244 34746
20829 33069

32952 37029
38235 38952
12779 36842
5081 34190
8352 9285
37937 39131
21873 26915.

In the sixth reception device/method according to the present technology, the punctured LDPC code obtained from the data transmitted by the sixth transmission method is decoded.

In the seventh transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 8/16. Moreover, the head of the information bits of the extended LDPC code is punctured by the puncture length L, and the punctured LDPC code with the code length N of 69120 bits and the coding rate r of 8/16 is generated. The extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 2520, the predetermined value M1 is 5040, the A matrix and the C matrix are represented by a parity check matrix initial value table, and the parity check matrix initial value table is a table representing positions of elements of 1 of the A matrix and the C matrix for every 360 columns, and is 2184 2245 5483 5692 9320 18011 18064 18150 20189 23469 23662 25407 28189 35779 37071
1855 3613 5755 7904 12491 14272 19654 22065 22316 23975 24503 26458 29567 34455 35556
928 4740 6537 8736 9455 16185 18167 22537 22768 26005 32031 32179 33566 34966 35808
3986 4696 5295 8034 12188 12339 14298 19661 22499 22837 28343 29201 30056 36868 36872
1049 2606 9166 13000 17407 22535 24035 24090 26423 27147 28104 29196 34765 36183 36195
2475 2705 6586 10659 14652 15858 18555 22635 25610 26796 32144 33131 35581 37072
1339 1594 5556 5731 5735 7423 7924 8287 10173 21406 26174 26965 30831 35028
2095 2692 4542 11957 16923 21339 22995 35510
753 3913 4481 24115 25745 28475 29334 34983
531 2404 4091 6823 7730 13085 21741 25943
764 2602 5000 5777 6649 28284 28457 30648
173 2884 3453 7716 16017 26720 33781 34558
804 3989 4026 10353 16302 20995 22614 29946
1369 1438 4721 11804 19454 24989 29745 33895
2413 3865 4900 9605 12227 19796 34068 35639
2280 3614 3994 5794 8725 17288 29042 32667
189 729 2807 18569 20422 29775 33106 35601
13 1942 3075 5647 16437 28792 33944 36951
2322 2774 4133 14911 23058 26276 35482 36145
1156 1915 1988 13753 20275 22750 28129 28615
1027 3254 3826 12792 25306 33398 34900 36579
1000 3662 3934 12247 28784 30051 30448 34971
2208 4777 4895 7995 15270 34546 35050 35465
865 1301 2776 5447 7236 25204 28825 33009
931 2280 3123 18312 20000 26379 29091 35547
161 313 1976 10118 19510 24067 25236 29200
495 2033 3478 18349 21388 27692 27945 29298
40 123 466 8627 14489 23804 25266 29217
1919 2239 5036 9020 10230 13401 26202 31868
2984 2990 4559 13817 15317 17982 24664 30694
4263 4578 4900 18514 19432 21056 22195 25540
486 2865 4044 10378 16367 19558 31611 37057
773 785 4692 13690 15318 17028 26614 28889
1128 2525 4918 13514 14018 21695 28403 28447
1378 2785 3945 19557 24360 26125 32618 35109
1622 2734 4728 21208 22587 28908 32086 34795
1490 2885 4429 7668 12440 13368 15096 30591
157 4782 5028 7007 8693 14921 17912 24354
1887 2821 4004 5990 7023 11617 23891 31527
2659 3026 3929 8247 18589 18766 25496 30000
1493 4505 4919 10166 15487 19375 20018 37009
1459 2038 4184 13922 16641 25405 27889 36692
2552 3118 4424 10018 10774 20992 21805 22999
1575 3751 4248 12315 13683 16910 20849 27503
169 1552 4011 8140 13348 21198 22677 22961
485 1610 2021 6883 8078 10259 10833 36872
717 3562 4705 8210 14216 16365 30074 30100
284 2060 2603 5600 6111 16526 16904 25280
1464 2306 2405 15402 22597 31453 33154 36507
793 858 958 19518 21177 22969 27465 34316
2755 4039 4916 13740 21014 22548 23393 27868
2346 2859 3724 5804 11163 13257 16059 16537
3034 3827 4257 10753 10848 16863 17910 30215
699 2077 3036 14789 28159 29959 32060 35741
842 1479 1651 8903 20126 29843 30172 36359
60 216 2154 13804 29952 30425 30451 33882
1561 2138 3179 7117 10997 17696 18819 29502
1929 2926 4119 6462 9997 17945 19143 35222
1408 3721 4733 6077 8220 23897 24532 32454
758 1062 3265 22844 25290 26795 30309 32198
723 974 2366 11325 11639 20444 30190 33000
3057 3184 4157 6124 10032 14829 22920 27535
1908 2681 3314 10175 15746 19286 30891 31312
337 3329 4284 16428 26550 26938 27394 29675
601 626 4671 7188 18716 20787 25752 31716
2736 3729 3853 14610 18790 21261 31327
1514 1926 2616 7216 7346 13375 15951
385 2731 2776 17442 17618 18488 26842
2847 3447 4837 7730 21494 25421 27060
4167 4675 4950 18125 19852 24594 31885
2100 2258 2839 6788 12190 20838 22037
598 1160 2512 9977 27667 31266 35818
726 918 4356 25915 26856 35644 35900
603 4023 4286 21322 24461 26414 31230
1378 1712 2601 6187 19972 21466 33990
2477 3873 5026 6147 11847 28736 31098
458 983 3395 5246 16300 16685 26054
1591 4194 4296 8941 12584 26579 36950
956 1266 1722 21007 23498 27878 29947
1791 2382 3477 27827
753 1172 3171 21799
577 1793 4156 14329
1221 1909 2872 23737
3201 3437 3627 24180
1422 2384 2680 17127
350 2057 3244 29775

1494 3096 4085 12712
1925 2736 3505 20471
167 1300 1330 30100
2178 4141 4741 6802
169 2635 2776 7608
1061 3955 4667 23473
185 995 4044 24130
1792 2284 4178 30200
3947 4503 4756 34653
1198 4107 4470 5969
9656
8810
34388
35438
20498
24839
23256
9966
25861
11305
7639
21600
13763
25619.

In the seventh reception device/method according to the present technology, the punctured LDPC code obtained from the data transmitted by the seventh transmission method is decoded.

In the eighth transmission device/method according to the present technology, the LDPC coding for information bits with an information length K=N×r is performed and the extended LDPC code having parity bits with a parity length M=N+L−K is generated on the basis of an extended parity check matrix having rows and columns each extended by a predetermined puncture length L with respect to a parity check matrix of an LDPC code with a code length N of 69120 bits and a coding rate r of 9/16. Moreover, the head of the information bits of the extended LDPC code is punctured by the puncture length L, and the punctured LDPC code with the code length N of 69120 bits and the coding rate r of 9/16 is generated. The extended parity check matrix includes an A matrix of M1 rows and K columns expressed by a predetermined value M1 and the information length K=N×r, the A matrix being an upper left matrix of the extended parity check matrix, a B matrix of M1 rows and M1 columns, having a step structure adjacent to right of the A matrix, a Z matrix of M1 rows and N+L−K−M1 columns, the Z matrix being a zero matrix adjacent to right of the B matrix, a C matrix of N+L−K−M1 rows and K+M1 columns, adjacent to below the A matrix and the B matrix, and a D matrix of N+L−K−M1 rows and N+L−K−M1 columns, the D matrix being an identity matrix adjacent to right of the C matrix, the puncture length L is 1800, the predetermined value M1 is 9000, the A matrix and the C matrix are represented by a parity check matrix initial value table, and the parity check matrix initial value table is a table representing positions of elements of 1 of the A matrix and the C matrix for every 360 columns, and is 3681 3750 3985 4255 8583 9468 12078 12353 15700 16492 17127 18174 18264 22392 23070 25263 29195 32034
804 4119 5315 5489 8261 9514 10099 10268 14359 16861 21050 21439 23880 24274 26637 30518 30944 31195
3684 4224 4412 7772 8017 10100 12529 15888 16518 18089 19685 28054 28297 28345 28897 29827 30402 31794
2013 2073 4993 6278 6716 10271 13971 14141 14727 17892 21649 22734 24394 25979 26485 30156 30617 31322
671 4057 4827 6795 8726 11791 15912 16773 16823 21296 24678 28589 29419 30212 30976 31701 32035
2831 3625 4812 9421 10678 11313 11919 13859 24185 26543
105 197 4569 12767 18835 20708 21307 21922 29762 30542
1939 3334 7927 12368 22520 24007 25355 26414 27639 30526
935 4228 7324 10281 10930 14811 20832 21012 24721 31868
451 1279 6541 9174 9524 23917 24447 24765 27400 30105
596 3093 7695 12690 12805 20513 26844 26874 27238 30238
3165 4948 8257 13864 15261 19334 23340 27303 29834 30592
4311 6608 8867 12314 17011 19562 29621 29653 29867 31831
246 1043 4063 9880 12133 14403 17673 21772 26756 28865
3800 4310 7891 9005 17892 22752 29776 30960 31922
169 3202 6707 9267 19608 21494 24264 27783 30896
2756 3526 5061 14144 15208 17722 19974 23683 25622
5640 6672 8062 10253 14587 17029 23586 29354 30935
1780 6399 7013 13407 14129 26025 27047 27302 28430
3867 8295 8448 11173 12961 16355 23417 30645 30840
114 2303 5658 10578 12954 19396 23278 26133 29150
4205 6484 8154 9468 9855 17738 25225 28855 29327
4064 5671 6785 11073 12684 17900 18543 24915 25278
4591 6432 6812 9172 9497 10443 11612 15805 26385
3429 5317 5699 11875 12763 19252 24194 28715 31645
2334 5348 8140 15322 16398 18377 22674 23119 27452
5806 8178 8750 18695 19361 20500 21337 23747 26594
868 5108 7470 12695 12827 13362 17150 30388 32036
1401 3377 6069 13887 15223 16423 20548 26114 31525
2388 2511 6647 15288 20979 21546 22893 25768 26293
5918 7740 8309 16069 17648 21533 21638 30421 30592
4531 6710 7575 10870 14321 15801 22289 27422 29206
282 2349 2823 16122 18235 22889 30845 31790 32028
1028 3364 7170 9696 10463 13676 21633 22408 22987
4747 5376 7037 11344 18790 18904 23562 26963 29547
2666 4221 8779 12684 15548 16845 19631 27773 32000
3277 3636 6417 15359 20686 23258 23607 28911 31760
1394 1613 4705 10030 14240 20469 21907 25971 28392
2428 3334 6308 9823 14969 16081 20361 21680 27204
870 4539 5033 11210 11227 12757 13164 16363 18278
519 8424 8966 11266 12282 15631 17138 25283 27009
562 4648 7031 9367 9769 17258 17524 18469 23544
2607 4017 4276 12525 16477 21617 28004 29179 31638
1311 1705 6279 19425 20643 21524 21927 26759 30022
2440 5160 8827 19724 20470 21579 22088 25426 26076
247 1718 3238 15685 16926 26381 27070 28504 31522
1646 3308 3325 12196 13145 18495 22879 25613 31074
2777 6991 7582 12852 15441 16518 19845 27107 31491
24 1098 6964 10014
3834 7138 8104 27290
2467 2695 6985 23538
597 1655 2786 26365
3412 3568 3869 22313
1378 3631 7350 30759
396 2426 3965 30636
294 5276 6622 28723
889 5479 5831 13814
1355 5011 7082 24636

1737 5683 7638 12279
4248 4328 7871 13506
1867 5466 7068 23531
1400 5020 7410 9775
2727 3409 6324 21177
4027 4240 7262 16737
1442 7380 7650 24201
601 6169 6278 26698
1070 3198 6038 11626
616 3835 8339 28168
4424 5809 6656 26638
3857 4561 4879 27896
2696 2722 4665 17776
643 2333 3072 10579
232 4876 4956 18710
3486 3535 6104 29906
774 5073 6030 23656
4617 6194 7445 31653
4163 5489 8227 28295
3675 3991 4940 18635
496 2003 4758 20333
1062 2059 4493 25301
1380 7374 8642 28926
1294 1639 8662 30961
5866 6147 7653 11713
5458 7184 7361 20695
2463 4602 6018 16857
320 4682 8140 19724
4410 6923 8975 26037
306 1921 7301 11104
57 1768 5604 17338
2839 3153 5912 28608
1091 6051 7495 31918
1681 2099 2259 16924
4490 5186 6994 25446
3188 4252 6208 25437
1342 5660 7305 21071
1048 3204 7421 15675
2197 3412 5125 22484
5721 6143 6479 22800
2531 4216 4794 17691
628 3665 5783 26756
2660 5527 7289 14552
3432 4895 6255 20101
288 2324 2375 27024
3898 7386 8459 10265
301 4717 4972 10844
1895 7065 8334 22255
331 1779 7214 22726
3202 4096 7467 27090
27017
29554
30755
30289
14496
29460
27770
9663
12310
11707
30095
30852
20107
23269
22090
12537
23969
13527
10911
20907
15272
23822
31661
13732
21787.

In the eighth reception device/method according to the present technology, the punctured LDPC code obtained from the data transmitted by the eighth transmission method is decoded.

Note that the transmission device and the reception device may be independent devices or may be internal blocks configuring one device.

Effects of the Invention

According to the present technology, good communication quality can be secured in data transmission using an LDPC code.

Note that effects described here are not necessarily limited, and any of effects described in the present disclosure may be exhibited.

BRIEF DESCRIPTION OF DRAWINGS

FIG. 3 is a diagram illustrating an example of a parity check matrix of an LDPC code.

FIG. 13 is a diagram for describing a parity check matrix of an LDPC code defined in the standard of DVB-T.2.

FIG. 21 is a diagram for describing a method of obtaining the parity check matrix H from the parity check matrix initial value table.

FIG. 32 is a diagram illustrating examples of a coordinate of a signal point of UC in a case where a modulation method is QPSK.

FIG. 33 is a diagram illustrating examples of a coordinate of a signal point of 2D-NUC in a case where the modulation method is 16QAM.

FIG. 34 is a diagram illustrating examples of a coordinate of a signal point of 1D-NUC in a case where the modulation method is 1024QAM.

FIGS. 35A and 35B are diagrams illustrating a relationship between a symbol y of 1024QAM and a position vector u.

FIG. 36 is a diagram illustrating examples of a coordinate zq of a signal point of QPSK-UC.

FIG. 37 is a diagram illustrating examples of a coordinate zq of a signal point of QPSK-UC.

FIG. 38 is a diagram illustrating examples of a coordinate zq of a signal point of 16QAM-UC.

FIG. 39 is a diagram illustrating examples of a coordinate zq of a signal point of 16QAM-UC.

FIG. 40 is a diagram illustrating examples of a coordinate zq of a signal point of 64QAM-UC.

FIG. 41 is a diagram illustrating examples of a coordinate zq of a signal point of 64QAM-UC.

FIG. 42 is a diagram illustrating examples of a coordinate zq of a signal point of 256QAM-UC.

FIG. 43 is a diagram illustrating examples of a coordinate zq of a signal point of 256QAM-UC.

FIG. 44 is a diagram illustrating examples of a coordinate zq of a signal point of 1024QAM-UC.

FIG. 45 is a diagram illustrating examples of a coordinate zq of a signal point of 1024QAM-UC.

FIG. 46 is a diagram illustrating examples of a coordinate zq of a signal point of 4096QAM-UC.

FIG. 47 is a diagram illustrating examples of a coordinate zq of a signal point of 4096QAM-UC.

FIG. 48 is a diagram illustrating examples of a coordinate zs of a signal point of 16QAM-2D-NUC.

FIG. 49 is a diagram illustrating examples of a coordinate zs of a signal point of 64QAM-2D-NUC.

FIG. 50 is a diagram illustrating examples of a coordinate zs of a signal point of 256QAM-2D-NUC.

FIG. 51 is a diagram illustrating examples of a coordinate zs of a signal point of 256QAM-2D-NUC.

FIG. 52 is a diagram illustrating examples of a coordinate zs of a signal point of 1024QAM-1D-NUC.

FIGS. 53A and 53B are diagrams illustrating a relationship between a symbol y of 1024QAM and a position vector u.

FIG. 54 is a diagram illustrating examples of a coordinate zs of a signal point of 4096QAM-1D-NUC.

FIG. 55 is a diagram illustrating a relationship between a symbol y of 4096QAM and a position vector u.

FIG. 56 is a diagram illustrating a relationship between a symbol y of 4096QAM and a position vector u.

FIG. 58 is a diagram for describing the block interleaving performed by the block interleaver 25.

FIG. 60 is a diagram illustrating an example of a GW pattern for an LDPC code with a code length N of 69120 bits.

FIG. 79 is a diagram illustrating an example of a parity check matrix initial value table representing a type A extended parity check matrix of a type A extended LDPC code for (69 k, 2/16).

FIG. 80 is a diagram illustrating an example of a parity check matrix initial value table representing a type A extended parity check matrix of a type A extended LDPC code for (69 k, 2/16).

FIG. 81 is a diagram illustrating an example of a parity check matrix initial value table representing a type A extended parity check matrix of a type A extended LDPC code for (69 k, 3/16).

FIG. 82 is a diagram illustrating an example of a parity check matrix initial value table representing a type A extended parity check matrix of a type A extended LDPC code for (69 k, 3/16).

FIG. 83 is a diagram illustrating an example of a parity check matrix initial value table representing a type A extended parity check matrix of a type A extended LDPC code for (69 k, 4/16).

FIG. 84 is a diagram illustrating an example of a parity check matrix initial value table representing a type A extended parity check matrix of a type A extended LDPC code for (69 k, 4/16).

FIG. 85 is a diagram illustrating an example of a parity check matrix initial value table representing a type A extended parity check matrix of a type A extended LDPC code for (69 k, 5/16).

FIG. 86 is a diagram illustrating an example of a parity check matrix initial value table representing a type A extended parity check matrix of a type A extended LDPC code for (69 k, 5/16).

FIG. 87 is a diagram illustrating an example of a parity check matrix initial value table representing a type A extended parity check matrix of a type A extended LDPC code for (69 k, 6/16).

FIG. 88 is a diagram illustrating an example of a parity check matrix initial value table representing a type A extended parity check matrix of a type A extended LDPC code for (69 k, 6/16).

FIG. 89 is a diagram illustrating an example of a parity check matrix initial value table representing a type A extended parity check matrix of a type A extended LDPC code for (69 k, 7/16).

FIG. 90 is a diagram illustrating an example of a parity check matrix initial value table representing a type A extended parity check matrix of a type A extended LDPC code for (69 k, 7/16).

FIG. 91 is a diagram illustrating an example of a parity check matrix initial value table representing a type A extended parity check matrix of a type A extended LDPC code for (69 k, 7/16).

FIG. 92 is a diagram illustrating an example of a parity check matrix initial value table representing a type A extended parity check matrix of a type A extended LDPC code for (69 k, 8/16).

FIG. 93 is a diagram illustrating an example of a parity check matrix initial value table representing a type A extended parity check matrix of a type A extended LDPC code for (69 k, 8/16).

FIG. 94 is a diagram illustrating an example of a parity check matrix initial value table representing a type A extended parity check matrix of a type A extended LDPC code for (69 k, 8/16).

FIG. 95 is a diagram illustrating an example of a parity check matrix initial value table representing a type A extended parity check matrix of a type A extended LDPC code for (69 k, 9/16).

FIG. 96 is a diagram illustrating an example of a parity check matrix initial value table representing a type A extended parity check matrix of a type A extended LDPC code for (69 k, 9/16).

FIG. 97 is a diagram illustrating an example of a parity check matrix initial value table representing a type A extended parity check matrix of a type A extended LDPC code for (69 k, 9/16).

FIG. 99 is a diagram illustrating an example of a parity check matrix initial value table representing a type B extended parity check matrix of a type B extended LDPC code for (69 k, 9/16).

FIG. 100 is a diagram illustrating an example of a parity check matrix initial value table representing a type B extended parity check matrix of a type B extended LDPC code for (69 k, 9/16).

FIG. 101 is a diagram illustrating an example of a parity check matrix initial value table representing a type B extended parity check matrix of a type B extended LDPC code for (69 k, 9/16).

FIG. 102 is a diagram illustrating an example of a parity check matrix initial value table representing a type B extended parity check matrix of a type B extended LDPC code for (69 k, 10/16).

FIG. 103 is a diagram illustrating an example of a parity check matrix initial value table representing a type B extended parity check matrix of a type B extended LDPC code for (69 k, 10/16).

FIG. 104 is a diagram illustrating an example of a parity check matrix initial value table representing a type B extended parity check matrix of a type B extended LDPC code for (69 k, 10/16).

FIG. 105 is a diagram illustrating an example of a parity check matrix initial value table representing a type B extended parity check matrix of a type B extended LDPC code for (69 k, 10/16).

FIG. 106 is a diagram illustrating an example of a parity check matrix initial value table representing a type B extended parity check matrix of a type B extended LDPC code for (69 k, 11/16).

FIG. 107 is a diagram illustrating an example of a parity check matrix initial value table representing a type B extended parity check matrix of a type B extended LDPC code for (69 k, 11/16).

FIG. 108 is a diagram illustrating an example of a parity check matrix initial value table representing a type B extended parity check matrix of a type B extended LDPC code for (69 k, 11/16).

FIG. 109 is a diagram illustrating an example of a parity check matrix initial value table representing a type B extended parity check matrix of a type B extended LDPC code for (69 k, 11/16).

FIG. 110 is a diagram illustrating an example of a parity check matrix initial value table representing a type B extended parity check matrix of a type B extended LDPC code for (69 k, 12/16).

FIG. 111 is a diagram illustrating an example of a parity check matrix initial value table representing a type B extended parity check matrix of a type B extended LDPC code for (69 k, 12/16).

FIG. 112 is a diagram illustrating an example of a parity check matrix initial value table representing a type B extended parity check matrix of a type B extended LDPC code for (69 k, 12/16).

FIG. 113 is a diagram illustrating an example of a parity check matrix initial value table representing a type B extended parity check matrix of a type B extended LDPC code for (69 k, 12/16).

FIG. 114 is a diagram illustrating an example of a parity check matrix initial value table representing a type B extended parity check matrix of a type B extended LDPC code for (69 k, 13/16).

FIG. 115 is a diagram illustrating an example of a parity check matrix initial value table representing a type B extended parity check matrix of a type B extended LDPC code for (69 k, 13/16).

FIG. 116 is a diagram illustrating an example of a parity check matrix initial value table representing a type B extended parity check matrix of a type B extended LDPC code for (69 k, 13/16).

FIG. 117 is a diagram illustrating an example of a parity check matrix initial value table representing a type B extended parity check matrix of a type B extended LDPC code for (69 k, 13/16).

FIG. 118 is a diagram illustrating an example of a parity check matrix initial value table representing a type B extended parity check matrix of a type B extended LDPC code for (69 k, 14/16).

FIG. 119 is a diagram illustrating an example of a parity check matrix initial value table representing a type B extended parity check matrix of a type B extended LDPC code for (69 k, 14/16).

FIG. 120 is a diagram illustrating an example of a parity check matrix initial value table representing a type B extended parity check matrix of a type B extended LDPC code for (69 k, 14/16).

FIG. 121 is a diagram illustrating an example of a parity check matrix initial value table representing a type B extended parity check matrix of a type B extended LDPC code for (69 k, 14/16).

FIG. 122 is a diagram for describing column weights of a type A extended parity check matrix represented by a parity check matrix initial value table of the type A method.

FIG. 123 is a diagram for describing parameters of the type A extended parity check matrix represented by the parity check matrix initial value table of the type A method.

FIG. 124 is a diagram for describing a column weight of a type B extended parity check matrix represented by a parity check matrix initial value table of the type B method.

FIG. 125 is a diagram for describing parameters of the type B extended parity check matrix represented by the parity check matrix initial value table of the type B method.

FIG. 126 is a block diagram illustrating a configuration example of an embodiment of a computer to which the present technology is applied.

MODE FOR CARRYING OUT THE INVENTION

Hereinafter, an embodiment of the present technology will be described. Before the description of the embodiment, an LDPC code will be described.

<LDPC Code>

Note that the LDPC code is a linear code and is not necessarily binary. However, description will be given on the assumption that the LDPC code is binary.

An LDPC code is most characterized in that a parity check matrix defining the LDPC code is sparse. Here, a sparse matrix is a matrix in which the number of "1"s of" matrix elements is very small (a matrix in which most elements are 0).

Figure 1:
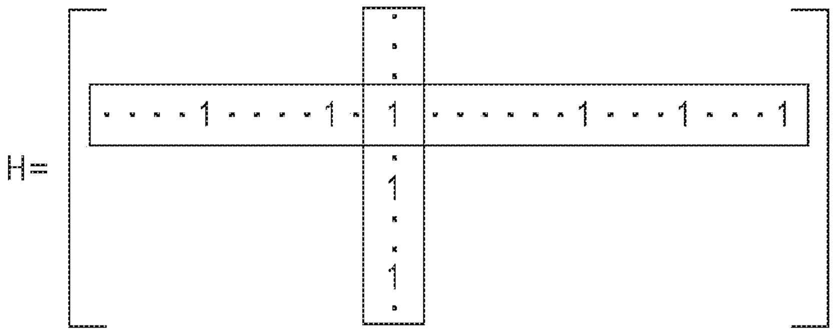
FIG. 1 is a diagram for describing a parity check matrix H of an LDPC code.

FIG. 1 is a diagram illustrating a parity check matrix H of the LDPC code.

In the parity check matrix H in FIG. 1, a weight of each column (column weight) (the number of "1" s) (weight) is "3", and a weight of each row (row weight) is "6".

In coding with an LDPC code (LDPC coding), a codeword (LDPC code) is generated by generating a generator matrix G on the basis of the parity check matrix H and multiplying binary information bits by the generator matrix G.

Specifically, a coding device for performing the LDPC coding first calculates the generator matrix G that holds an expression $GH^T=0$ with a transposed matrix $H^T$ of the parity check matrix H. Here, in a case where the generator matrix G is a K×N matrix, the coding device multiplies the generator matrix G by a bit string (vector u) of information bits including K bits and generates a codeword c (=uG) including N bits. The codeword (LDPC code) generated by the coding device is received at a reception side via a predetermined communication path.

Decoding of the LDPC code can be performed by an algorithm called probabilistic decoding proposed by Gallager, which is a message passing algorithm according to belief propagation on a so-called Tanner graph including a variable node (also called message node) and a check node. Here, as appropriate, the variable node and the check node are hereinafter also simply referred to as nodes.

Figure 2:
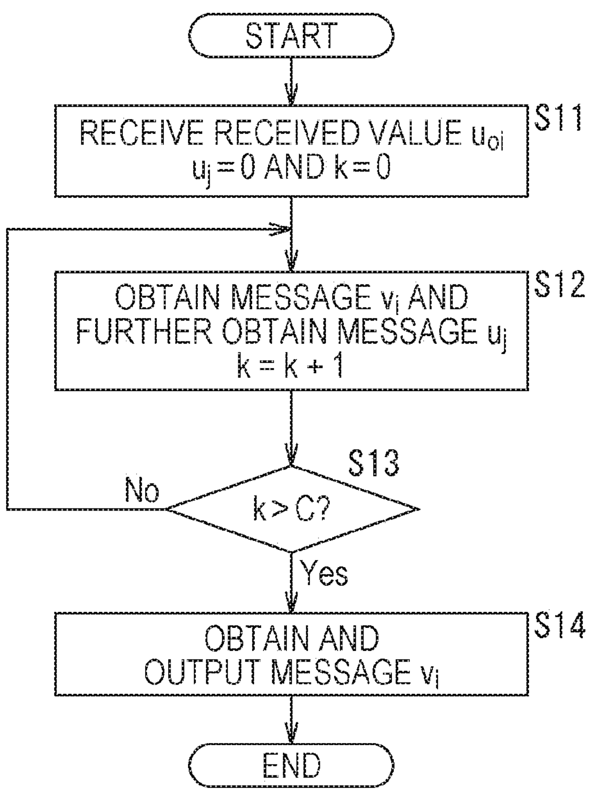
FIG. 2 is a flowchart for describing a procedure of decoding an LDPC code.

FIG. 2 is a flowchart illustrating a procedure of decoding an LDPC code.

Note that, hereinafter, a real value (received LLR) expressing "0" likeliness of a value of an i-th code bit of the LDPC code (1 codeword) received on the reception side, using a log likelihood ratio, is also referred to as a received value $u_{0i}$ as appropriate. Furthermore, a message output from the check node is $u_j$ and a message output from the variable node is $v_i$.

First, in decoding the LDPC code, as illustrated in FIG. 2, in step S11, the LDPC code is received, a message (check node message) $u_j$ is initialized to "0", a variable k that is an integer as a counter for repeated processing is initialized to "0", and the processing proceeds to step S12. In step S12, a message (variable node message) $v_i$ is obtained by performing an operation (variable node operation) illustrated in the expression (1) on the basis of the received value $u_{0i}$ obtained by receiving the LDPC code, and moreover, the message $u_j$ is obtained by performing an operation (check node operation) illustrated in the expression (2) on the basis of the message $v_i$.

[Math. 1]

$$v_i = u_{0i} + \sum_{j=1}^{d_v-1} u_j \tag{1}$$

[Math. 2]

$$\tanh\left(\frac{u_j}{2}\right) = \prod_{i=1}^{d_c-1} \tanh\left(\frac{v_i}{2}\right) \tag{2}$$

Here, $d_v$ and $d_c$ in the expressions (1) and (2) are arbitrarily selectable parameters respectively indicating the numbers of "1"s in a vertical direction (column) and a cross direction (row) of the parity check matrix H. For example, in the case of the LDPC code ((3, 6) LDPC code) for the parity check matrix H with the column weight of 3 and the row weight of 6 as illustrated in FIG. 1, $d_v=3$ and $d_c=6$.

Note that, in each of the variable node operation in the expression (1) and the check node operation in the expression (2), a message input from an edge (a line connecting the variable node and the check node) that is about to output a message is not an object for the operation. Therefore, an operation range is 1 to $d_v-1$ or 1 to $d_c-1$. Furthermore, the check node operation in the expression (2) is performed by, in practice, creating a table of a function R ($v_1$, $v_2$) illustrated in the expression (3) defined by one output for two inputs $v_1$ and $v_2$, in advance, and continuously (recursively) using the table as illustrated in the expression (4).

[Math. 3]

$$x=2\tanh^{-1}\{\tanh(v_1/2)\tanh(v_2/2)\}=R(v_1,v_2) \tag{3}$$

[Math. 4]

$$u_j=R(v_1,R(v_2,R(v_3, \ldots R(v_{d_c-2},v_{d_c-1})))) \tag{4}$$

In step S12, the variable k is further incremented by "1", and the processing proceeds to step S13. In step S13, whether or not the variable k is larger than a predetermined number of repetitive decoding times C is determined. In a case where the variable k is determined not to be larger than C in step S13, the processing returns to step S12 and hereinafter similar processing is repeated.

Furthermore, in a case where the variable k is determined to be larger than C in step S13, the processing proceeds to step S14, the operation illustrated in the expression (5) is performed to obtain the message $v_i$ as a decoding result to be finally output and the message $v_i$ is output, and the decoding processing for the LDPC code is terminated.

[Math. 5]

$$v_i = u_{0i} + \sum_{j=1}^{d_v} u_j \tag{5}$$

Here, the operation in the expression (5) is performed using messages $u_j$ from all the edges connected to the variable node, different from the variable node operation in the expression (1).

FIG. 3 is a diagram illustrating an example of the parity check matrix H of a (3, 6) LDPC code (a coding rate of 1/2 and a code length of 12).

In the parity check matrix H in FIG. 3, as in FIG. 1, the column weight is 3 and the row weight is 6.

Figure 4:
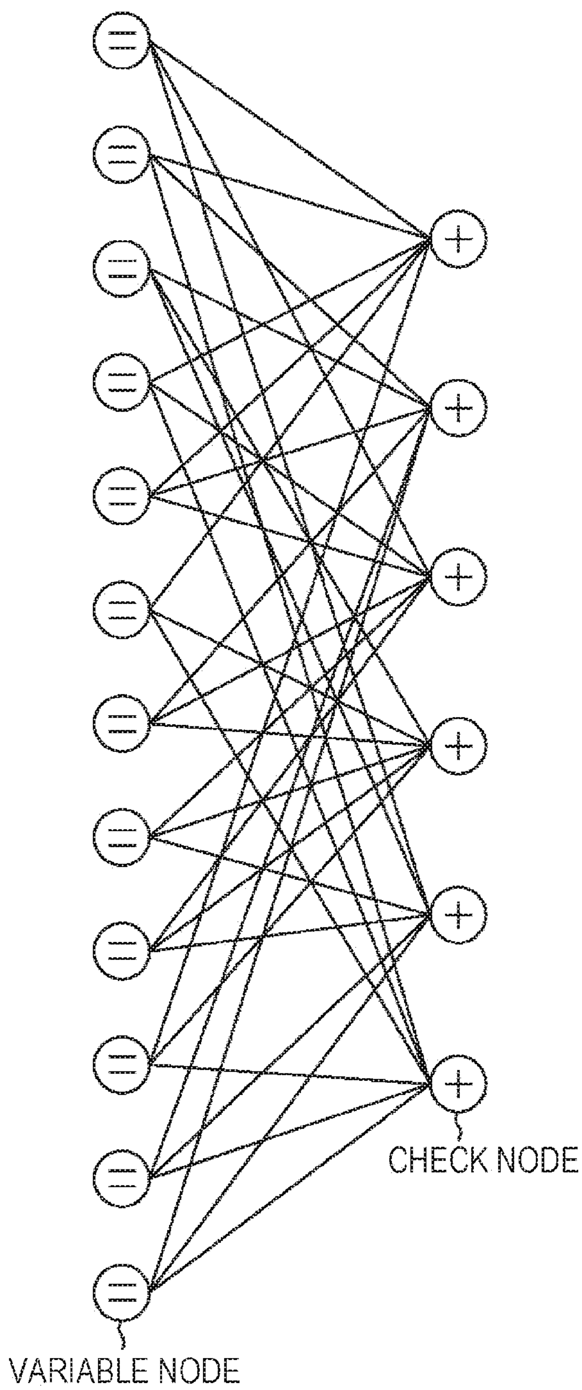
FIG. 4 is a diagram illustrating an example of a Tanner graph of the parity check matrix H.

FIG. 4 is a diagram illustrating a Tanner graph of the parity check matrix H in FIG. 3.

Here, in FIG. 4, the check node is represented by plus "+", and the variable node is represented by equal "=". The check node and variable node correspond to a row and a column of the parity check matrix H, respectively. A connection between the check node and the variable node is an edge and corresponds to "1" of an element of the parity check matrix.

In other words, in a case where an element of the j-th row and the i-th column of the parity check matrix is 1, the i-th variable node from the top ("=" node) and the j-th check node from the top ("+" node) are connected by an edge in FIG. 4. The edge indicates that a code bit corresponding to the variable node has a constraint corresponding to the check node.

In a sum product algorithm that is a decoding method of an LDPC code, the variable node operation and the check node operation are repeatedly performed.

Figure 5:
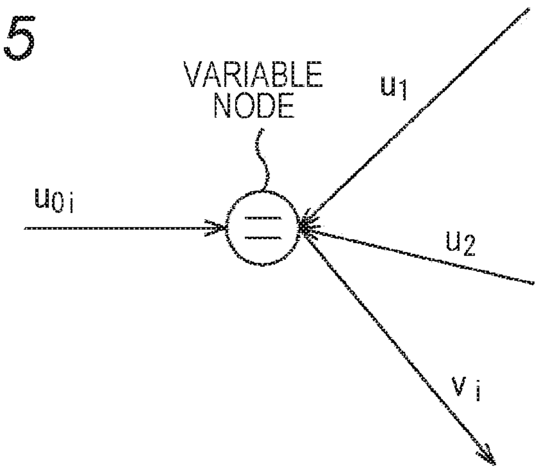
FIG. 5 is a diagram illustrating an example of a variable node.

FIG. 5 is a diagram illustrating the variable node operation performed in the variable node.

In the variable node, the message $v_i$ corresponding to the edge to be calculated is obtained by the variable node operation in the expression (1) using messages $u_1$ and $u_2$ from the remaining edges connected to the variable node and the received value $u_{0i}$. Messages corresponding to other edges are similarly obtained.

Figure 6:
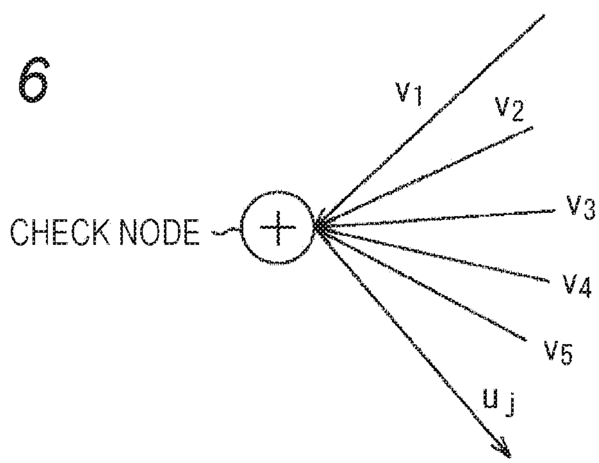
FIG. 6 is a diagram illustrating an example of a check node.

FIG. 6 is a diagram illustrating the check node operation performed in the check node.

Here, the check node operation in the expression (2) can be rewritten to the expression (6), using a relationship of an expression $a \times b = \exp\{\ln(|a|)+\ln(|b|)\} \times \text{sign}(a) \times \text{sign}(b)$. Note that sign (x) is 1 when $x \geq 0$ and $-1$ when $x<0$.

[Math. 6]

$$\begin{aligned} u_j &= 2\tanh^{-1}\left(\prod_{i=1}^{d_c-1} \tanh\left(\frac{v_i}{2}\right)\right) = \\ &2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right] = \\ &2\tanh^{-1}\left[\exp\left\{-\left(\sum_{i=1}^{d_c-1} -\ln\left(\tanh\left(\frac{|v_i|}{2}\right)\right)\right)\right\}\right] \times \prod_{i=1}^{d_c-1} \text{sign}(v_i) \end{aligned} \tag{6}$$

When the function $\varphi(x)$ is defined as an expression $\varphi(x)=\ln(\tanh(x/2))$ when $x \geq 0$, an expression $\varphi^{-1}(x)=2\tanh^{-1}(e^{-x})$ holds and thus the expression (6) can be deformed into the expression (7).

[Math. 7]

$$u_j = \phi^{-1}\left(\sum_{1=1}^{d_c-1} \phi(|v_i|)\right) \times \prod_{i=1}^{d_c-1} \text{sign}(v_i) \tag{7}$$

In the check node, the check node operation in the expression (2) is performed according to the expression (7).

In other words, in the check node, the message $u_j$ corresponding to the edge to be calculated is obtained by the check node operation in the expression (7) using messages $v_1$, $v_2$, $v_3$, $v_4$, and $v_5$ from the remaining edges connected to the check node, as illustrated in FIG. 6. Messages corresponding to other edges are similarly obtained.

Note that the function φ(x) in the expression (7) can be expressed by the expression $\varphi(x)=\ln((e^x+1)/(e^x-1))$, and $\varphi(x)=\varphi^{-1}(x)$ holds when x>0. When the functions φ(x) and $\varphi^{-1}(x)$ are implemented in hardware, the functions may be implemented using look up tables (LUTs), and the LUTs are the same.

Figure 7:
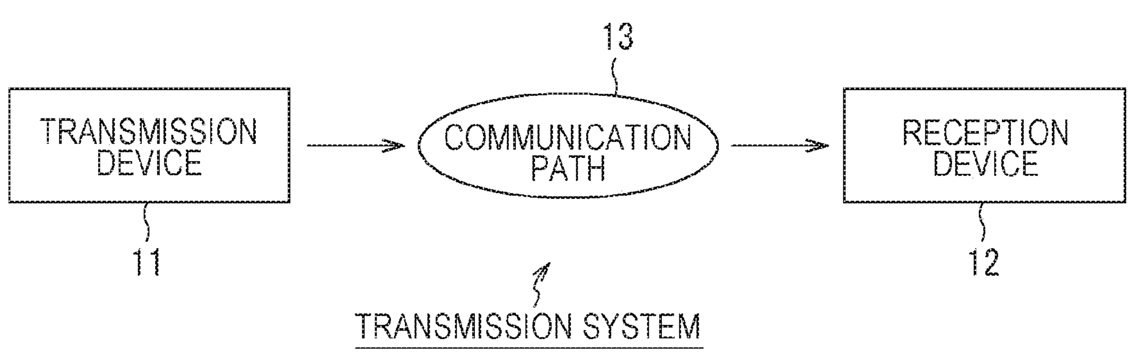
FIG. 7 is a diagram illustrating a configuration example of an embodiment of a transmission system to which the present technology is applied.

Configuration Example of Transmission System to which Present Technology is Applied FIG. 7 is a diagram illustrating a configuration example of an embodiment of a transmission system (a system refers to a group of a plurality of logically gathered devices, and whether or not the devices of configurations are in the same casing is irrelevant) to which the present technology is applied.

The transmission system in FIG. 7 is configured by a transmission device 11 and a reception device 12.

The transmission device 11 performs transmission (broadcasting) of, for example, a television broadcast program or the like. In other words, the transmission device 11 encodes target data to be transmitted, such as image data and audio data as a program, into an LDPC code, and transmits the LDPC code via a communication path 13 such as a satellite line, a ground wave, or a cable (wired line), for example.

The reception device 12 receives the LDPC code transmitted from the transmission device 11 via the communication path 13, decodes the LDPC code to the target data, and outputs the target data.

Here, it is known that the LDPC code used in the transmission system in FIG. 7 exhibits extremely high capability in an additive white Gaussian noise (AWGN) communication path.

Meanwhile, in the communication path 13, burst errors and erasures may occur. For example, in particular, in a case where the communication path 13 is a ground wave, power of a certain symbol becomes zero (erasure) in some cases according to a delay of an echo (a path other than a main path) in a multipath environment where a desired to undesired ratio (D/U) is 0 dB (power of undesired=echo is equal to power of desired=main path) in an orthogonal frequency division multiplexing (OFDM) system.

Furthermore, power of the entire symbols of OFDM at a specific time may become zero (erasure) due to a Doppler frequency in the case where D/U is 0 db even in a flutter (a communication path in which a delay is 0 and to which an echo with Doppler frequency is added).

Moreover, a burst error may occur due to a wiring condition from a receiving unit (not illustrated) on the reception device 12 side such as an antenna that receives a signal from the transmission device 11 to the reception device 12, or power supply instability of the reception device 12.

Meanwhile, in decoding the LDPC code, the variable node operation in the expression (1) with addition of (the received value $u_{0i}$) of the code bit of the LDPC code is performed, as illustrated in FIG. 5, at a column of the parity check matrix H and thus at the variable node corresponding to the code bit of the LDPC code. Therefore, if an error occurs in the code bit used in the variable node operation, the accuracy of an obtained message decreases.

Then, in decoding the LDPC code, the check node operation in the expression (7) is performed in the check node using the messages obtained at the variable nodes connected to the check node. Therefore, if the number of check nodes in which (the code bits of the LDPC codes corresponding to) a plurality of connected variable nodes become error (including erasure) at the same time is large, the performance of the decoding deteriorates.

In other words, for example, if two or more of the variable nodes connected to the check node become erasures at the same time, for example, the check node returns a message informing that a probability of a value being 0 and a probability of a value being 1 are equal to all the variable nodes. In this case, the check node returning the equal probability message will not contribute to one decoding processing (a set of the variable node operation and the check node operation). As a result, a large number of repetitions of the decoding processing is required, resulting in deterioration of the performance of the decoding and an increase in the power consumption of the reception device 12 for decoding the LDPC code.

Therefore, in the transmission system in FIG. 7, improvement of resistance to burst errors and erasure is possible while maintaining the performance in the AWGN communication path (AWGN channel).

Configuration Example of Transmission Device 11

Figure 8:
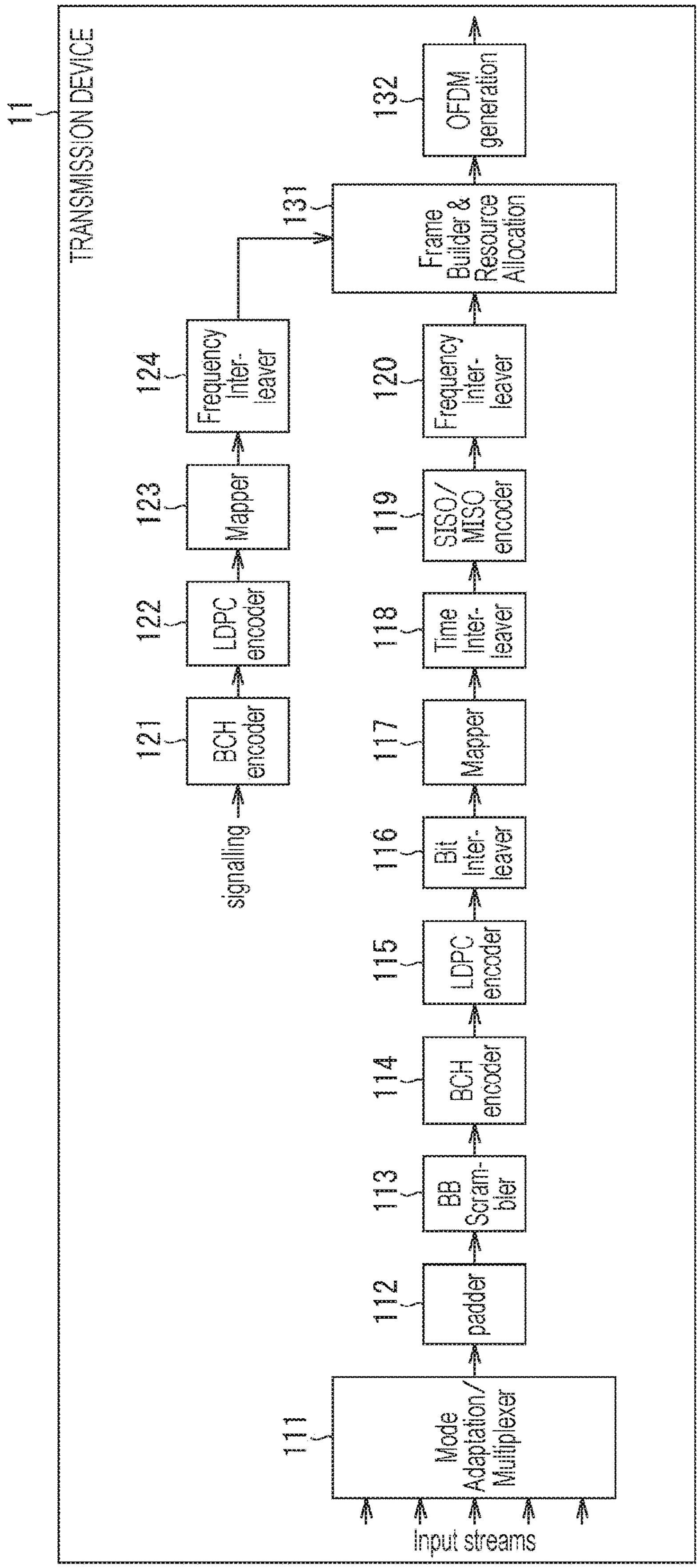
FIG. 8 is a block diagram illustrating a configuration example of a transmission device 11.

FIG. 8 is a block diagram illustrating a configuration example of the transmission device 11 in FIG. 7.

In the transmission device 11, one or more input streams as the target data are supplied to a mode adaptation/multiplexer 111.

The mode adaptation/multiplexer 111 performs processing such as mode selection and multiplexing of the one or more input streams supplied thereto as necessary, and supplies resulting data to a padder 112.

The padder 112 performs necessary zero padding (insertion of null) to the data from the mode adaptation/multiplexer 111, and supplies resulting data to a base band (BB) scrambler 113.

The BB scrambler 113 applies BB scramble to the data from the padder 112, and supplies resulting data to a BCH encoder 114.

The BCH encoder 114 performs BCH coding for the data from the BB scrambler 113, and supplies resultant data to an LDPC encoder 115 as LDPC target data to be LDPC encoded.

The LDPC encoder 115 performs, for the LDPC target data from the BCH encoder 114, LDPC coding according to a parity check matrix in which a parity matrix that is a portion corresponding to a parity bit of the LDPC code has a step (dual diagonal) structure, and outputs an LDPC code having the LDPC target data as information bits.

In other words, the LDPC encoder 115 performs LDPC coding for coding the LDPC target data to an LDPC code (corresponding to the parity check matrix) defined in a predetermined standard such as DVB-S.2, DVB-T.2, DVB-C.2, or ATSC 3.0 or to another LDPC code, and outputs a resulting LDPC code.

Here, the LDPC code defined in the standard of DVB-S.2 or ATSC 3.0 and the LDPC code to be adopted in ASC 3.0 is an irregular repeat accumulate (IRA) code, and (a part or all of) the parity matrix in the parity check matrix of the LDPC code has a step structure. The parity matrix and the step structure will be described below. Furthermore, the IRA code is described in, for example, "Irregular Repeat-Accumulate Codes", H. Jin, A. Khandekar, and R. J. McEliece, in Proceedings of 2nd International Symposium on Turbo codes and Related Topics, pp. 1-8, September 2000.

The LDPC code output by the LDPC encoder 115 is supplied to a bit interleaver 116.

The bit interleaver 116 performs bit interleaving described below for the LDPC code from the LDPC encoder 115, and supplies the LDPC code after the bit interleaving to a mapper (Mapper) 117.

The mapper 117 maps the LDPC code from the bit interleaver 116 to a signal point representing one symbol of quadrature modulation in units of code bits of one bit or more (in units of symbols) of the LDPC code and performs quadrature modulation (multiple value modulation).

In other words, the mapper 117 maps the LDPC code from the bit interleaver 116 into signal points determined by a modulation method for performing the quadrature modulation of an LDPC code, on a constellation that is an IQ plane defined with an I axis representing an I component in phase with a carrier and a Q axis representing a Q component orthogonal to the carrier, and performs the quadrature modulation.

In a case where the number of constellation signal points used in the modulation method of the quadrature modulation performed by the mapper 117 is $2^m$, the mapper 117 maps the LDPC code from the bit interleaver 116 into signal points representing symbols, of $2^m$ signal points, in units of symbols, where m-bit code bits of the LDPC code are a symbol (one symbol).

Here, examples of the modulation method of the quadrature modulation performed by the mapper 117 include the modulation method defined in the standard such as DVB-S.2 or ATSC 3.0, and other modulation methods, in other words, for example, binary phase shift keying (BPSK), quadrature phase shift keying (QPSK), phase-shift keying (8PSK), amplitude phase-shift keying (16APSK), 32APSK, quadrature amplitude modulation (16QAM), 16QAM, 64QAM, 256QAM, 1024QAM, 4096QAM, and pulse amplitude modulation (4PAM). Which modulation method of the quadrature modulation is used in the mapper 117 is set in advance according to an operation of an operator of the transmission device 11, for example.

Data obtained by the processing in the mapper 117 (the mapping result of mapped symbols at the signal points) is supplied to a time interleaver 118.

The time interleaver 118 performs time interleaving (interleaving in a time direction) in units of symbols, for the data from the mapper 117, and supplies resulting data to a single input single output/multiple input single output encoder (SISO/MISO encoder) 119.

The SISO/MISO encoder 119 applies space-time coding to the data from the time interleaver 118, and supplies the data to a frequency interleaver 120.

The frequency interleaver 120 performs frequency interleaving (interleaving in a frequency direction) in units of symbols, for the data from the SISO/MISO encoder 119, and supplies the data to a frame builder/resource allocation unit 131.

Meanwhile, control data (signalling) for transmission control such as base band (BB) signaling (BB header) is supplied to a BCH encoder 121, for example.

The BCH encoder 121 performs BCH coding for the control data supplied thereto, similarly to the BCH encoder 114, and supplies resulting data to an LDPC encoder 122.

The LDPC encoder 122 performs LDPC coding for the data from the BCH encoder 121 as LDPC target data, similarly to the LDPC encoder 115, and supplies a resulting LDPC code to a mapper 123.

The mapper 123 maps the LDPC code from the LDPC encoder 122 to a signal point representing one symbol of quadrature modulation in units of code bits of one bit or more (in units of symbols) of the LDPC code and performs quadrature modulation, similarly to the mapper 117, and supplies resulting data to a frequency interleaver 124.

The frequency interleaver 124 performs frequency interleaving in in units of symbols, for the data from the mapper 123, similarly to the frequency interleaver 120, and supplies resulting data to a frame builder/resource allocation unit 131.

The frame builder/resource allocation unit 131 inserts pilot symbols into necessary positions of the data (symbols) from the frequency interleavers 120 and 124, and configures a frame by a predetermined number of symbols (for example, a physical layer (PL) frame, a T2 frame, a C2 frame, or the like) from resulting data (symbols), and supplies the frame to an OFDM generation unit 132.

The OFDM generation unit 132 generates an OFDM signal corresponding to the frame from the frame builder/resource allocation unit 131, and transmits the OFDM signal via the communication path 13 (FIG. 7).

Note that the transmission device 11 can be configured without including part of the blocks illustrated in FIG. 8, such as the time interleaver 118, the SISO/MISO encoder 119, the frequency interleaver 120, and the frequency interleaver 124.

Configuration Example of Bit Interleaver 116

Figure 9:
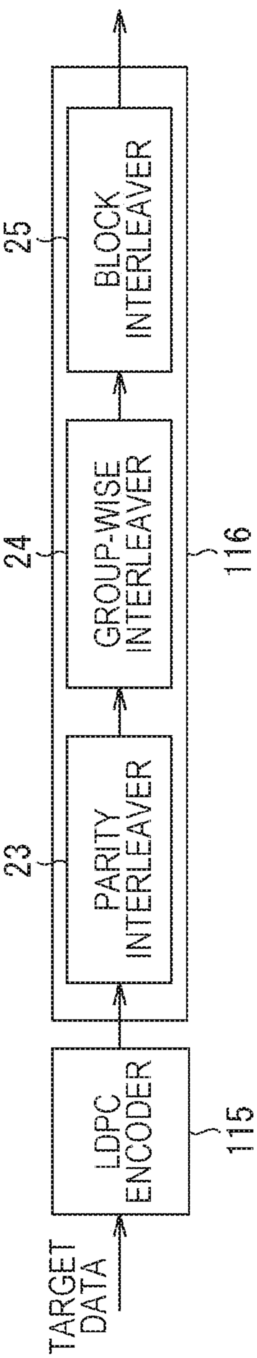
FIG. 9 is a block diagram illustrating a configuration example of a bit interleaver 116.

FIG. 9 is a block diagram illustrating a configuration example of the bit interleaver 116 in FIG. 8.

The bit interleaver 116 has a function to interleave data, and is configured by a parity interleaver 23, a group-wise interleaver 24, and a block interleaver 25.

The parity interleaver 23 performs parity interleaving to interleave the position of another parity bit with the parity bit of the LDPC code from the LDPC encoder 115, and supplies the LDPC code after the parity interleaving to the group-wise interleaver 24.

The group-wise interleaver 24 performs group-wise interleaving for the LDPC code from the parity interleaver 23, and supplies the LDPC code after the group-wise interleaving to the block interleaver 25.

Here, in the group-wise interleaving, the LDPC code from the parity interleaver 23 is interleaved in units of bit groups, where 360 bits of one section is set as a bit group, the one section being obtained by dividing the LDPC code of one code from the head of the LDPC code into sections in units of 360 bits, the unit being equal to a parallel factor P to be described below, and taking one of the divided sections as the one section.

In a case of performing the group-wise interleaving, an error rate can be improved as compared with a case of not performing the group-wise interleaving. As a result, favorable communication quality can be secured in data transmission.

The block interleaver 25 performs block interleaving for demultiplexing the LDPC code from the group-wise interleaver 24 to symbolize the LDPC code of one code into an m-bit symbol that is a unit of mapping, and supplies the symbol to the mapper 117 (FIG. 8).

Here, in the block interleaving, for example, the LDPC code from the group-wise interleaver 24 is written in a column (vertical) direction and is read in a row (cross) direction with respect to a storage region in which columns as storage regions each storing a predetermined bit length in the column direction are arranged in the row direction by the number of bit length m of the symbol, whereby the LDPC code is symbolized into the m-bit symbol.

<Parity Check Matrix of LDPC Code>

Figure 10:
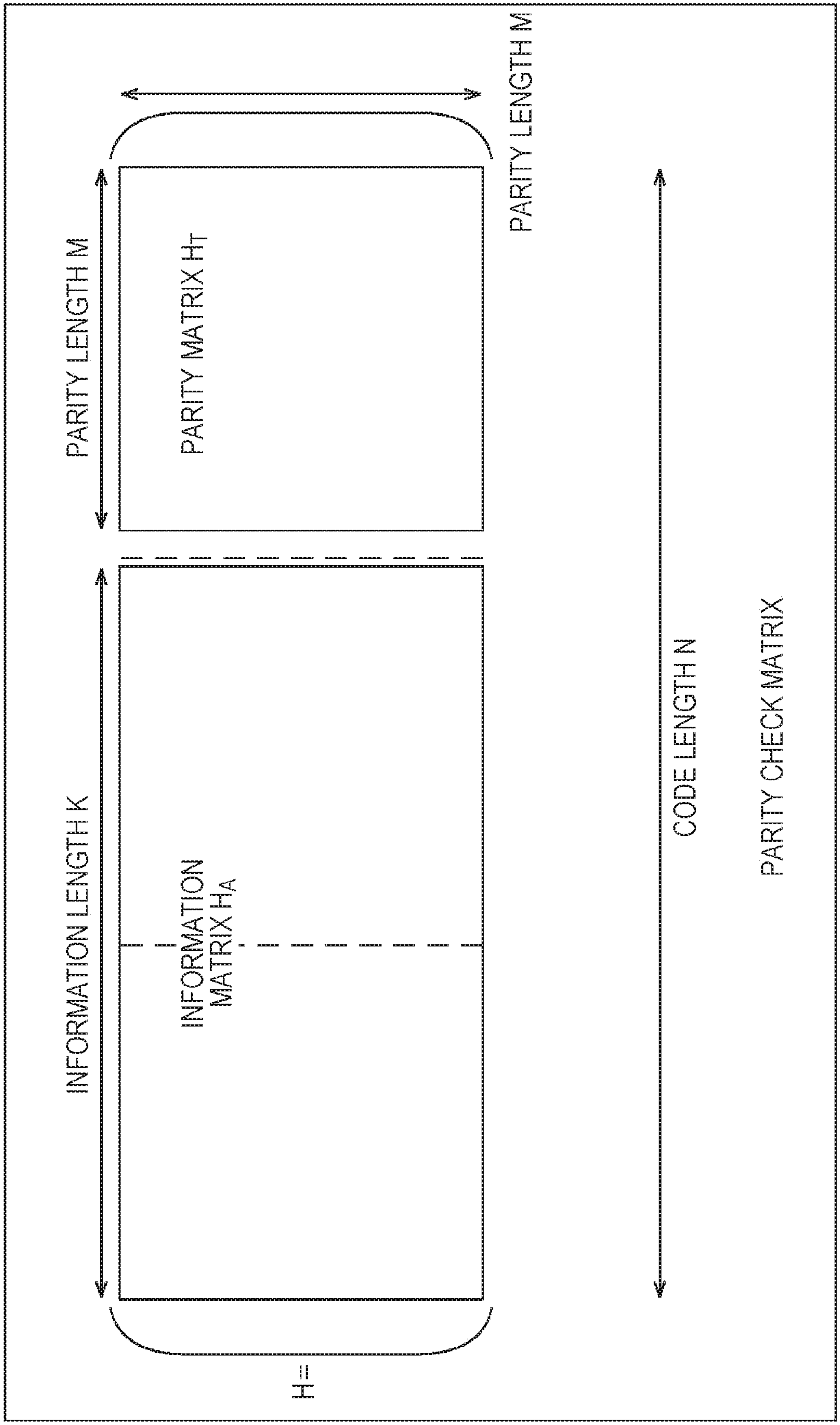
FIG. 10 is a diagram illustrating an example of a parity check matrix.

FIG. 10 is a diagram illustrating an example of the parity check matrix H used for LDPC coding in the LDPC encoder 115.

The parity check matrix H has a low-density generation matrix (LDGM) structure and can be expressed as an expression $H=[H_A|H_T]$ (elements of the information matrix $H_A$ are on the left side and elements of the parity check matrix $H_T$ are on the right side) using an information matrix $H_A$ of a portion corresponding to the information bits and a parity matrix $H_T$ corresponding to the parity bits, of the code bits of the LDPC code.

Here, the bit length of the information bits and the bit length of the parity bits, of the code bits of the LDPC code of one code (one codeword), are respectively referred to as an information length K and a parity length M, and the bit length of the code bits of one (one codeword) LDPC code is referred to as code length N (=K+M).

The information length K and the parity length M of the LDPC code of a given code length N are determined by a coding rate. Furthermore, the parity check matrix H is a matrix of M×N in rows×columns (M-row N-column matrix). Then, the information matrix $H_A$ is an M×K matrix, and the parity matrix $H_T$ is an M×M matrix.

Figure 11:
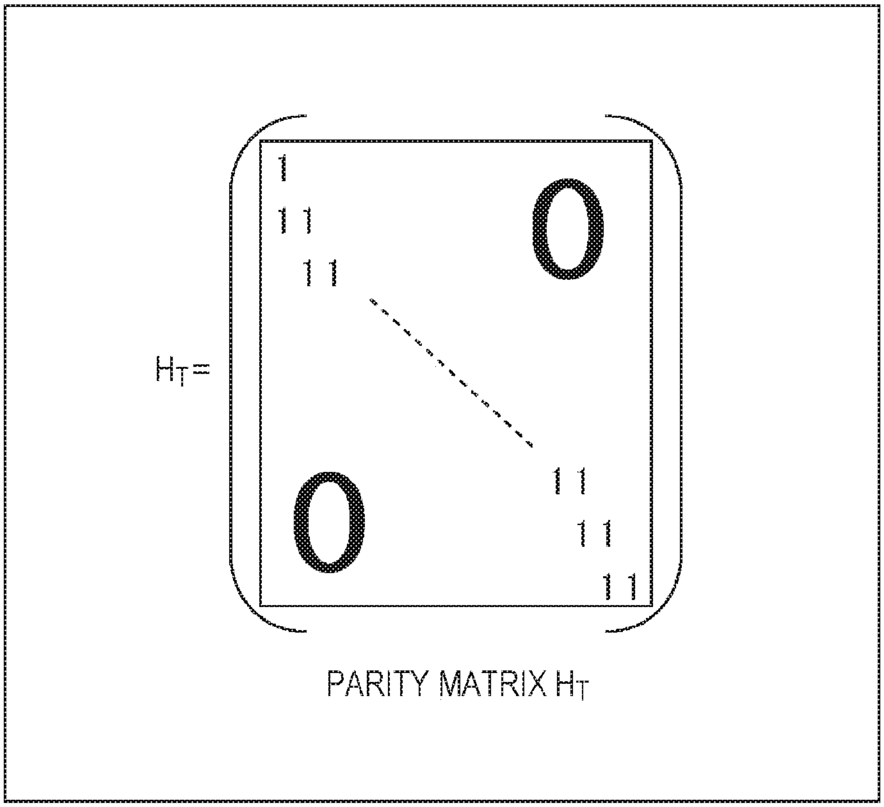
FIG. 11 is a diagram illustrating an example of a parity matrix.

FIG. 11 is a diagram illustrating an example of the parity matrix $H_T$ of the parity check matrix H used for LDPC coding in the LDPC encoder 115 in FIG. 8.

As the parity matrix $H_T$ of the parity check matrix H used for LDPC coding in the LDPC encoder 115, a parity matrix $H_T$ similar to the parity check matrix H of the LDPC code defined in the standard such as DVB-T.2 can be adopted, for example.

The parity matrix $H_T$ of the parity check matrix H of the LDPC code defined in the standard such as DVB-T.2 is a matrix having a step structure (lower bidiagonal matrix) in which elements of 1 are arranged in a step-like manner, as illustrated in FIG. 11. The row weight of the parity matrix $H_T$ is 1 in the 1st row and 2 in all the remaining rows. Furthermore, the column weight is 1 in the last one column and 2 in all the remaining columns.

As described above, the LDPC code of the parity check matrix H in which the parity matrix $H_T$ has the step structure can be easily generated using the parity matrix H.

In other words, the LDPC code (one codeword) is expressed with a row vector c, and a column vector obtained by transposing the row vector thereof is represented as $c^T$. Furthermore, a portion of the information bits, of the row vector c that is the LDPC code, is expressed with a row vector A, and a portion of the parity bits, of the row vector c, is expressed with a row vector T.

In this case, the row vector c can be expressed as an expression c=[A|T] (elements of the row vector A are on the left side and elements of the row vector T are on the right side) using the row vector A as the information bits and the row vector T as the parity bits.

The parity check matrix H and the row vector c=[A|T] as the LDPC code need to satisfy an expression $Hc^T=0$, and the row vector T as the parity bits constituting the row vector c=[A|T] satisfying the expression $Hc^T=0$ can be sequentially obtained (in order) by sequentially setting the element of each row to 0 from the element in the 1st row of the column vector $Hc^T$ in the expression $Hc^T=0$ in a case where the parity matrix $H_T$ of the parity check matrix $H=[H_A|H_T]$ has the step structure illustrated in FIG. 11.

Figure 12:
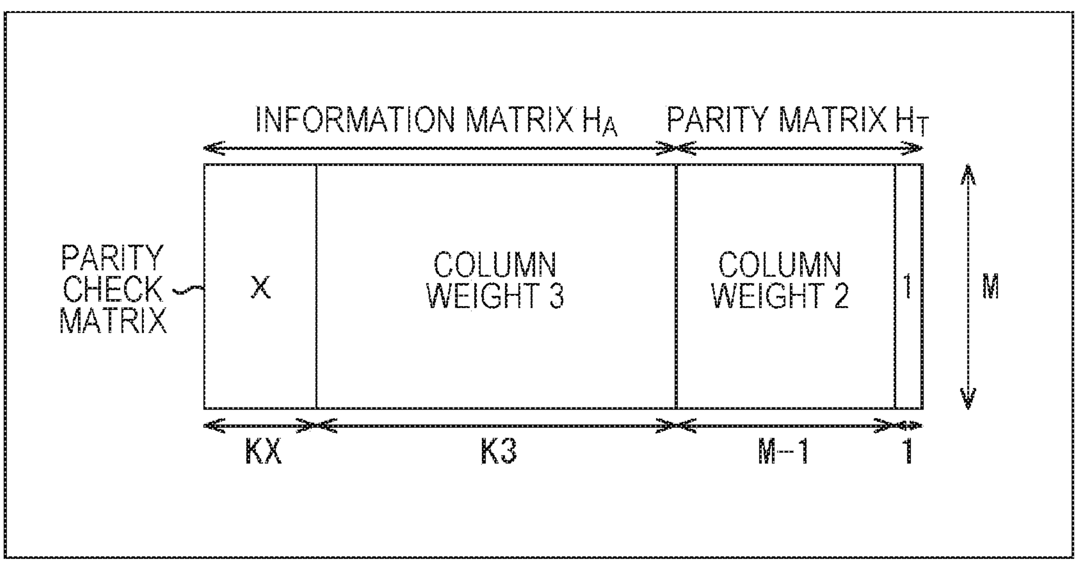
FIG. 12 is a diagram for describing a parity check matrix of an LDPC code defined in the standard of DVB-T.2.

FIG. 12 is a diagram for describing the parity check matrix H of the LDPC code defined in the standard such as DVB-T.2.

In the parity check matrix H of the LDPC code defined in the standard such as DVB-T.2, the column weight is X in KX columns from the 1st column, 3 in following K3 columns, 2 in following M−1 columns, and 1 in the last one column.

Here, KX+K3+M−1+1 is equal to the code length N.

FIG. 13 is a diagram illustrating the numbers of columns KX, K3, and M, and the column weight X for each coding rate r of the LDPC code defined in the standard such as DVB-T.2.

In the standard such as DVB-T.2, LDPC codes having code lengths N of 64800 bits and 16200 bits are defined.

Then, eleven coding rates (nominal rates) of 1/4, 1/3, 2/5, 1/2, 3/5, 2/3, 3/4, 4/5, 5/6, 8/9, and 9/10 are defined for the LDPC code with the code length N of 64800 bits. Ten coding rates of 1/4, 1/3, 2/5, 1/2, 3/5, 2/3, 3/4, 4/5, 5/6, and 8/9 are defined for the LDPC code with the code length N of 16200 bits.

Here, the code length N of 64800 bits is also referred to as 64 k bits and the code length N of 16200 bits is also referred to as 16 k bits.

In regard to the LDPC code, code bits corresponding to a column having a larger column weight of the parity check matrix H tend to have a lower error rate.

In the parity check matrix H defined in the standard such as DVB-T.2 illustrated in FIGS. 12 and 13, the column weight tends to be larger in columns on the head side (left side), and therefore the code bits on the head side are more resistant to errors and end code bits are more susceptible to errors in the LDPC code corresponding to the parity check matrix H.

<Parity Interleaving>

The parity interleaving by the parity interleaver 23 in FIG. 9 will be described with reference to FIGS. 14, 15A, 15B, and 16.

Figure 14:
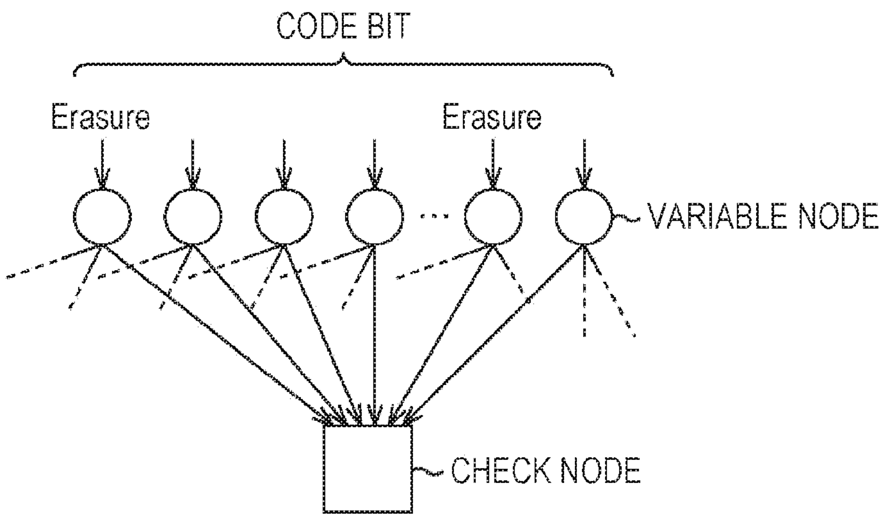
FIG. 14 is a diagram illustrating an example of a Tanner graph regarding decoding of an LDPC code.

FIG. 14 is a diagram illustrating an example of (a part of) a Tanner graph of the parity check matrix of the LDPC code.

As illustrated in FIG. 14, when two or more of (the code bits corresponding to) the variable nodes connected to the check node become errors such as erasures at the same time, the check node returns a message informing that a probability of a value being 0 and a probability of a value being 1 are equal to all the variable nodes connected to the check node. Therefore, if a plurality of variable nodes connected to the same check node become erasures or the like at the same time, the performance of the decoding will deteriorate.

By the way, the LDPC code output from the LDPC encoder 115 in FIG. 8 is an IRA code, similar to the LDPC code defined in the standard such as DVB-T.2, for example, and the parity matrix $H_T$ of the parity check matrix H has a step structure, as illustrated in FIG. 11.

Figure 15A:
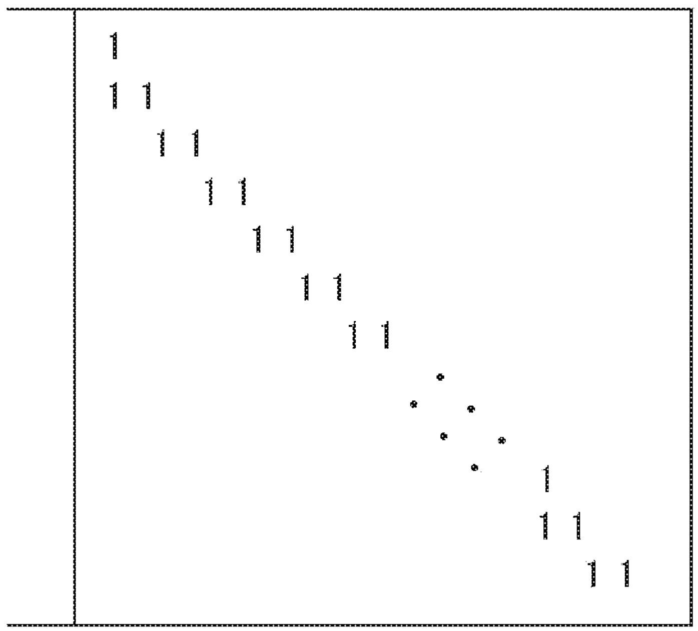
FIGS. 15A and 15B are diagrams illustrating examples of a parity matrix HT having a step structure and a Tanner graph corresponding to the parity matrix HT.
Figure 15B:
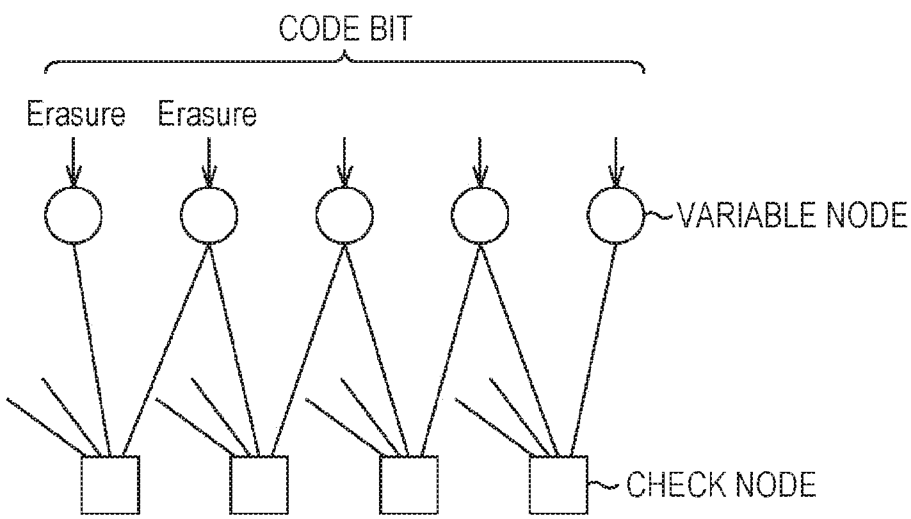

FIGS. 15A and 15B are diagrams illustrating examples of the parity matrix HT having the step structure, as illustrated in FIG. 11, and a Tanner graph corresponding to the parity matrix HT.

FIG. 15A illustrates an example of the parity matrix HT having a step structure, and FIG. 15B illustrates a Tanner graph corresponding to the parity matrix HT in FIG. 15A.

In the parity matrix $H_T$ having a step structure, elements of 1 are adjacent (except the 1st row) in rows. Therefore, in the Tanner graph of the parity matrix $H_T$, two adjacent variable nodes corresponding to columns of the two adjacent elements where values of the parity matrix $H_T$ are 1 are connected to the same check node.

Therefore, when the parity bits corresponding to the above two adjacent variable nodes become errors at the same time due to burst errors, erasures, or the like, the check node connected to the two variable nodes corresponding to the two error parity bits (variable nodes seeking a message using the parity bits) returns the message informing that a probability of a value being 0 and a probability of a value being 1 are equal to the variable nodes connected to the check node. Therefore, the performance of the decoding deteriorates. Then, when a burst length (the bit length of the parity bits errored in succession) becomes large, the number of check nodes returning the message of equal probability increases, and the performance of the decoding further deteriorates.

Therefore, the parity interleaver 23 (FIG. 9) performs parity interleaving to interleave the positions of other parity bits with the parity bits of the LDPC code from the LDPC encoder 115 in order to prevent deterioration of the performance of the decoding.

Figure 16:
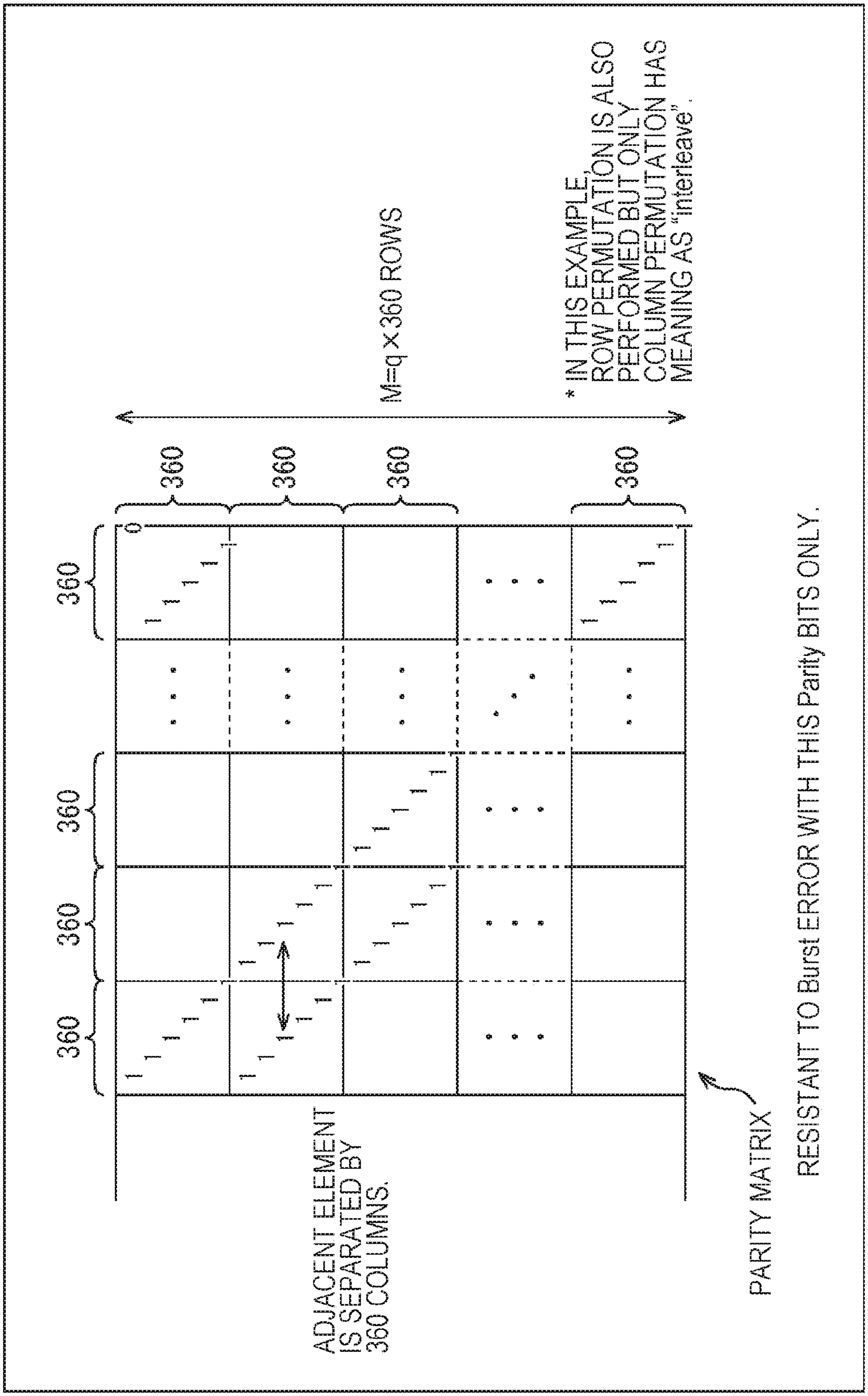
FIG. 16 is a diagram illustrating the parity matrix HT of the parity check matrix H corresponding to the LDPC code after parity interleaving.

FIG. 16 is a diagram illustrating the parity matrix $H_T$ of the parity check matrix H corresponding to the LDPC code after the parity interleaving performed by the parity interleaver 23 in FIG. 9.

Here, the information matrix $H_A$ of the parity check matrix H corresponding to the LDPC code output by the LDPC encoder 115 has a cyclic structure, similarly to the information matrix of the parity check matrix H corresponding to the LDPC code defined in the standard such as DVB-T.2.

The cyclic structure is a structure in which a certain column matches a cyclically shifted another column, and includes, for example, a structure in which, for each P columns, positions of 1 of rows of the P columns become positions cyclically shifted in the column direction by a predetermined value such as a value proportional to a value q obtained by dividing the first column of the P columns by the parity length M. Hereinafter, the P columns in the cyclic structure is referred to as a parallel factor, as appropriate.

As the LDPC code defined in the standard such as DVB-T.2, there are two types of LDPC codes with the code lengths N of 64800 bits and 16200 bits as described in FIGS. 12 and 13. For both the two types of LDPC codes, the parallel factor P is defined as 360, which is one of divisors of the parity length M except 1 and M.

Furthermore, the parity length M is a value other than a prime number represented by an expression M=q×P=q×360, using a value q that varies depending on the coding rate. Therefore, similarly to the parallel factor P, the value q is also another one of the divisors of the parity length M except 1 and M, and is obtained by dividing the parity length M by the parallel factor P (a product of P and q, which are the divisors of the parity length M, becomes the parity length M).

As described above, the parity interleaver 23 interleaves the position of (K+Py+x+1)th code bit with (K+qx+y+1)th code bit of code bits of an N-bit LDPC code, as the parity interleaving, where the information length is K, an integer from 0 to P, exclusive of P, is x, and an integer from 0 to q, exclusive of q, is y.

Since both the (K+qx+y+1)th code bit and the (K+Py+x+1)th code bit are subsequent code bits of (K+1)th code bit and thus are parity bits, the positions of the parity bits of the LDPC code are moved according to the parity interleaving.

According to such parity interleaving, (the parity bits corresponding to) the variable nodes connected to the same check node are separated by the parallel factor P, in other words, 360 bits. Therefore, in a case where the burst length is less than 360 bits, a situation where a plurality of variable nodes connected to the same check node becomes error at the same time can be avoided, and as a result, the resistance to the burst errors can be improved.

Note that the LDPC code after the parity interleaving to interleave the position of the (K+Py+x+1)th code bit with the (K+qx+y+1)th code bit matches the LDPC code of the parity check matrix (hereinafter also referred to as a transformed parity check matrix) that is obtained by performing column permutation to permutate the (K+qx+y+1)th column of the original parity check matrix H with the (K+Py+x+1)th column.

Furthermore, a pseudo cyclic structure having P columns (360 columns in FIG. 16) as a unit appears in the parity matrix of the transformed parity check matrix, as illustrated in FIG. 16.

Here, the pseudo cyclic structure means a structure having a cyclic structure excluding a part.

A transformed parity check matrix obtained by applying column permutation corresponding to the parity interleaving to the parity check matrix of the LDPC code defined in the standard such as DVB-T.2 lacks one element of 1 (has an element of 0) in a portion (a shift matrix to be described below) of 360 rows×360 columns in an upper right corner portion of the transformed parity check matrix, and thus has a so-called pseudo cyclic structure, rather than a (complete) cyclic structure on that regard.

A transformed parity check matrix for the parity check matrix of the LDPC code output by the LDPC encoder 115 has a pseudo cyclic structure, similarly to the transformed parity check matrix for the parity check matrix of the LDPC code defined in the standard such as DVB-T.2.

Note that the transformed parity check matrix in FIG. 16 is a matrix obtained by applying the column permutation corresponding to the parity interleaving to the original parity check matrix H, and applying permutation for rows (row permutation) so as to configure the transformed parity check with configuration matrices to be describe below.

Figure 17:
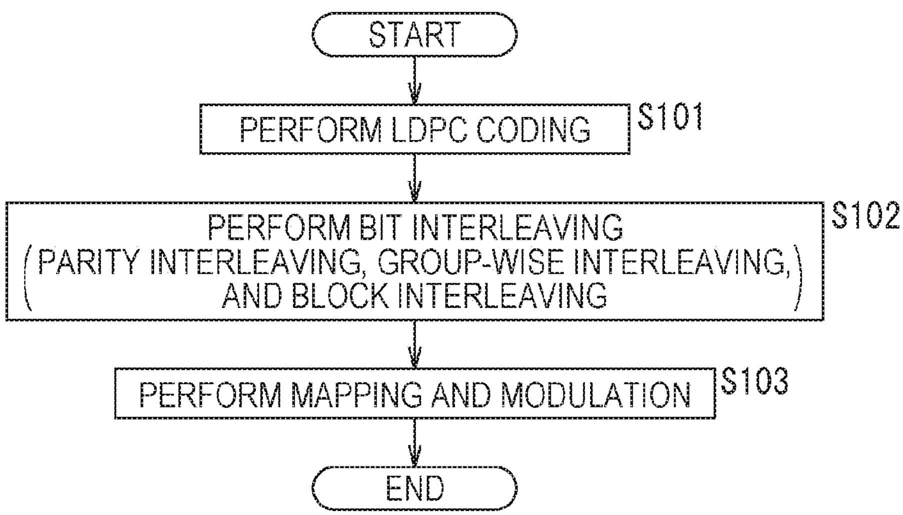
FIG. 17 is a flowchart for describing processing performed by a bit interleaver 116 and a mapper 117.

FIG. 17 is a flowchart for describing processing performed by the LDPC encoder 115, the bit interleaver 116, and the mapper 117 in FIG. 8.

The LDPC encoder 115 waits for supply of the LDPC target data from the BCH encoder 114. In step S101, the LDPC encoder 115 encodes the LDPC target data into the LDPC code, and supplies the LDPC code to the bit interleaver 116. The processing proceeds to step S102.

In step S102, the bit interleaver 116 performs the bit interleaving for the LDPC code from the LDPC encoder 115, and supplies the symbol obtained by the bit interleaving to the mapper 117. The processing proceeds to step S103.

In other words, in step S102, in the bit interleaver 116 (FIG. 9), the parity interleaver 23 performs the parity interleaving for the LDPC code from the LDPC encoder 115, and supplies the LDPC code after the parity interleaving to the group-wise interleaver 24.

The group-wise interleaver 24 performs the group-wise interleaving for the LDPC code from the parity interleaver 23, and supplies the LDPC code to the block interleaver 25.

The block interleaver 25 performs the block interleaving for the LDPC code after the group-wise interleaving by the group-wise interleaver 24, and supplies a resulting m-bit symbol to the mapper 117.

In step S103, the mapper 117 maps the symbol from the block interleaver 25 to any of $2^m$ signal points determined by the modulation method of the quadrature modulation performed by the mapper 117 and performs the quadrature modulation, and supplies resulting data to the time interleaver 118.

As described above, by performing the parity interleaving and the group-wise interleaving, the error rate of the case where a plurality of code bits of the LDPC code is transmitted as one symbol can be improved.

Here, in FIG. 9, for convenience of description, the parity interleaver 23 as a block for performing the parity interleaving and the group-wise interleaver 24 as a block for performing the group-wise interleaving are separately configured. However, the parity interleaver 23 and the group-wise interleaver 24 can be integrally configured.

In other words, both the parity interleaving and the group-wise interleaving can be performed by writing and reading code bits with respect to a memory, and can be expressed by a matrix for converting an address for writing code bits (write address) into an address for reading code bits (read address).

Therefore, by obtaining a matrix obtained by multiplying a matrix expressing the parity interleaving and a matrix expressing the group-wise interleaving, the parity interleaving is performed by converting code bits by these matrices, and further the group-wise interleaving is performed for the LDPC code after the parity interleaving, whereby a result can be obtained.

Furthermore, the block interleaver 25 can also be integrally configured in addition to the parity interleaver 23 and the group-wise interleaver 24

In other words, the block interleaving performed by the block interleaver 25 can also be expressed by the matrix converting the write address of the memory for storing the LDPC code into the read address.

Therefore, by obtaining a matrix obtained by multiplying the matrix expressing the parity interleaving, the matrix expressing the group-wise interleaving, and the matrix expressing the block interleaving, the parity interleaving, the group-wise interleaving, and the block interleaving can be collectively performed by the matrices.

Note that one or the amount of the parity interleaving and the group-wise interleaving may not be performed.

Configuration Example of LDPC Encoder 115

Figure 18:
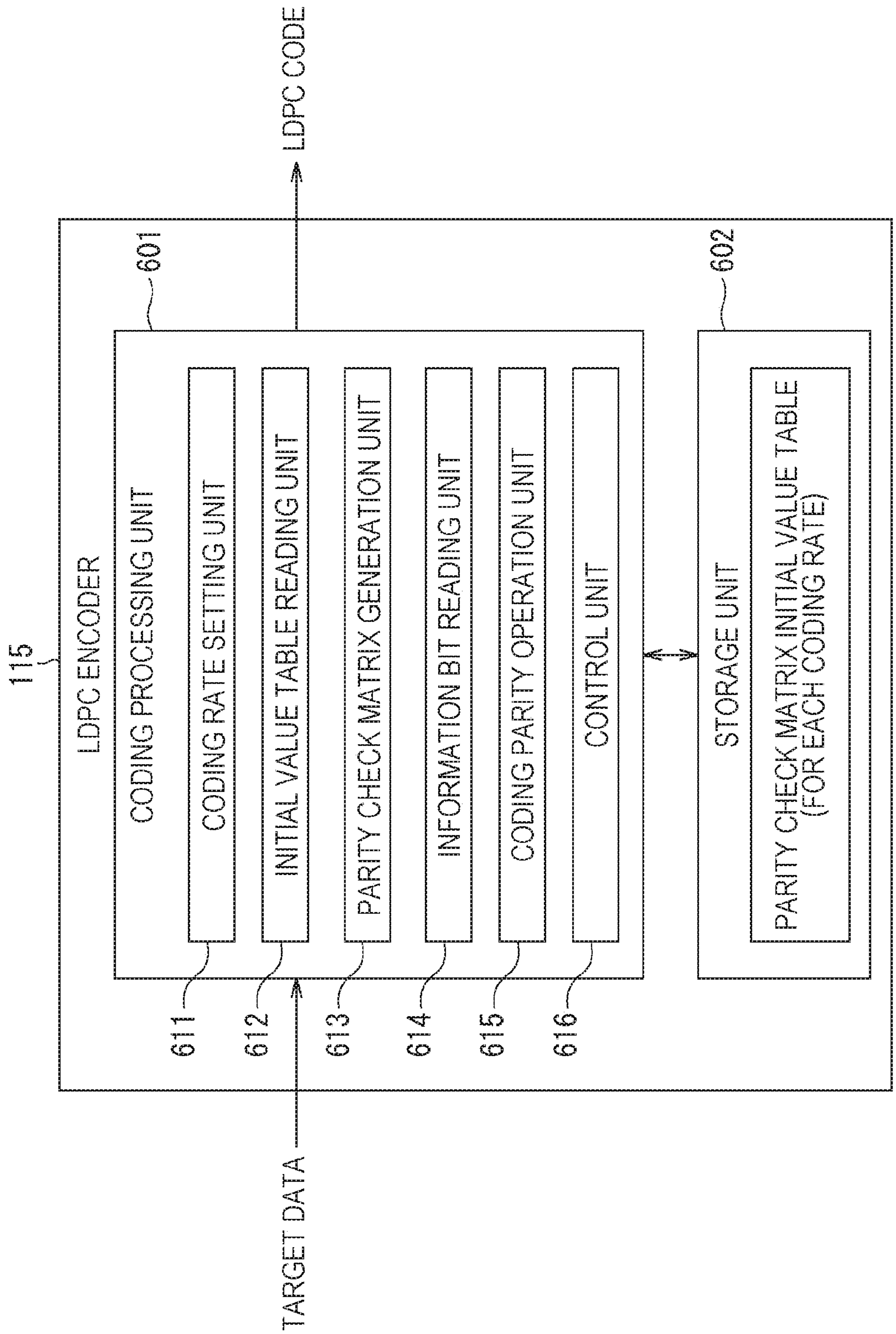
FIG. 18 is a block diagram illustrating a configuration example of an LDPC encoder 115.

FIG. 18 is a block diagram illustrating a configuration example of the LDPC encoder 115 in FIG. 8.

Note that the LDPC encoder 122 in FIG. 8 is similarly configured.

As described in FIGS. 12 and 13, in the standard such as DVB-T.2, LDPC codes having two types of code lengths N of 64800 bits and 16200 bits are defined.

Then, the eleven coding rates of 1/4, 1/3, 2/5, 1/2, 3/5, 2/3, 3/4, 4/5, 5/6, 8/9, and 9/10 are defined for the LDPC code with the code length N of 64800 bits. The ten coding rates of 1/4, 1/3, 2/5, 1/2, 3/5, 2/3, 3/4, 4/5, 5/6, and 8/9 are defined for the LDPC code with the code length N of 16200 bits (FIGS. 12 and 13).

The LDPC encoder 115 can perform, for example, such coding (error correction coding) with the LDPC codes with the coding rates of the code lengths N of 64800 bits and 16200 bits according to the parity check matrix H prepared for each code length N and each coding rate.

Besides, the LDPC encoder 115 can perform LDPC coding according to the parity check matrix H of the LDPC code with an arbitrary code length N and an arbitrary coding rate r.

The LDPC encoder 115 is configured by a coding processing unit 601 and a storage unit 602.

The coding processing unit 601 is configured by a coding rate setting unit 611, an initial value table reading unit 612, a parity check matrix generation unit 613, an information bit reading unit 614, a coding parity operation unit 615, and a control unit 616. The coding processing unit 601 performs the LDPC coding for the LDPC target data supplied to the LDPC encoder 115, and supplies a resulting LDPC code to the bit interleaver 116 (FIG. 8).

In other words, the coding rate setting unit 611 sets the code length N and the coding rate r of the LDPC code, and in addition, specific information specifying the LDPC code, according to the operation of the operator, for example.

The initial value table reading unit 612 reads, from the storage unit 602, a parity check matrix initial value table to be described below, expressing the parity check matrix of the LDPC code specified with the specific information set by the coding rate setting unit 611.

The parity check matrix generation unit 613 generates the parity check matrix H on the basis of the parity check matrix initial value table read by the initial value table reading unit 612, and stores the parity check matrix H in the storage unit 602. For example, the parity check matrix generation unit 613 arranges the elements of 1 of the information matrix $H_A$ corresponding to the information length K (=the code length N−the parity length M) according to the code length N and the coding rate r set by the coding rate setting unit 611 with a period of every 360 columns (parallel factor P) in the column direction to generate the parity check matrix H, and stores the parity check matrix H in the storage unit 602.

The information bit reading unit 614 reads (extracts) the information bits of the information length K from the LDPC target data supplied to the LDPC encoder 115.

The coding parity operation unit 615 reads the parity check matrix H generated by the parity check matrix generation unit 613 from the storage unit 602, and calculates the parity bits for the information bits read by the information bit reading unit 614 on the basis of a predetermined expression using the parity check matrix H, thereby generating the codeword (LDPC code).

The control unit 616 controls the blocks constituting the coding processing unit 601.

The storage unit 602 stores a plurality of parity check matrix initial value tables respectively corresponding to the plurality of coding rates illustrated in FIGS. 12 and 13 for the code lengths N of 64800 bits and 16200 bits, and the like, for example. Furthermore, the storage unit 602 temporarily stores data necessary for the processing of the coding processing unit 601.

Figures 19, 20:
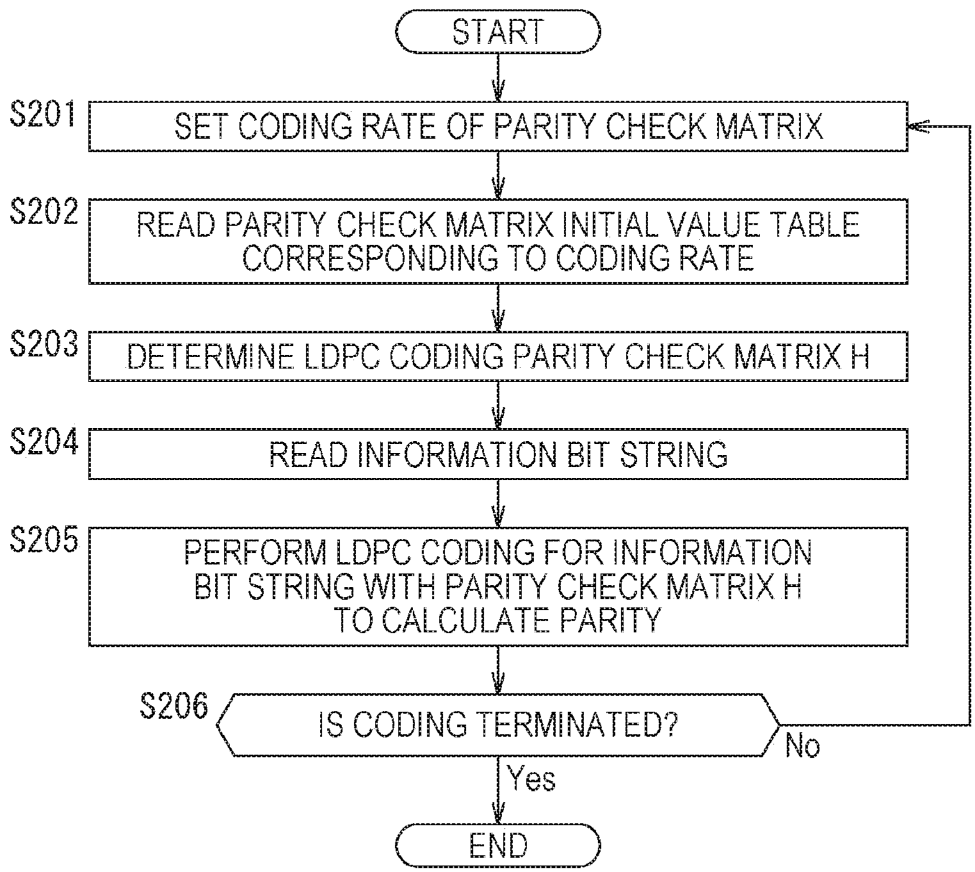
FIG. 19 is a flowchart for describing an example of processing of the LDPC encoder 115.
FIG. 20 is a diagram illustrating an example of a parity check matrix initial value table with a coding rate of 1/4 and a code length of 16200.

FIG. 19 is a flowchart for describing an example of the processing of the LDPC encoder 115 in FIG. 18.

In step S201, the coding rate setting unit 611 sets the code length N and the coding rate r for performing the LDPC coding, and in addition, the specific information specifying the LDPC code.

In step S202, the initial value table reading unit 612 reads, from the storage unit 602, the predetermined parity check matrix initial value table specified with the code length N, the coding rate r, and the like as the specific information set by the coding rate setting unit 611.

In step S203, the parity check matrix generation unit 613 obtains (generates) the parity check matrix H of the LDPC code with the code length N and the coding rate r set by the coding rate setting unit 611, using the parity check matrix initial value table read from the storage unit 602 by the initial value table reading unit 612, and supplies and stores the parity check matrix H in the storage unit 602.

In step S204, the information bit reading unit 614 reads the information bits of the information length K (=N×r) corresponding to the code length N and the coding rate r set by the coding rate setting unit 611 from the LDPC target data supplied to the LDPC encoder 115, and reads the parity check matrix H obtained by the parity check matrix generation unit 613 from the storage unit 602, and supplies the information bits and the parity check matrix H to the coding parity operation unit 615.

In step S205, the coding parity operation unit 615 sequentially operates the parity bit of the codeword c that satisfies the expression (8), using the information bits and the parity check matrix H from the information bit reading unit 614.

$$Hc^T=0 \tag{8}$$

In the expression (8), c represents the row vector as the codeword (LDPC code), and $c^T$ represents transposition of the row vector c.

Here, as described above, in the case of expressing the portion of the information bits, of the row vector c as the LDPC code (one codeword), with the row vector A, and the portion of the parity bits, of the row vector c, with the row vector T, the row vector c can be expressed as the expression c=[A|T] using the row vector A as the information bits and the row vector T as the parity bits.

The parity check matrix H and the row vector c=[A|T] as the LDPC code need to satisfy the expression $Hc^T=0$, and the row vector T as the parity bits constituting the row vector c=[A|T] satisfying the expression $Hc^T=0$ can be sequentially obtained by sequentially setting the element of each row to 0 from the element in the 1st row of the column vector $Hc^T$ in the expression $Hc^T=0$ in the case where the parity matrix $H_T$ of the parity check matrix $H=[H_A|H_T]$ has the step structure illustrated in FIG. 11.

The coding parity operation unit 615 obtains the parity bits T for the information bits A from the information bit reading unit 614, and outputs the codeword c=[A|T] expressed with the information bits A and the parity bits T as an LDPC coding result of the information bits A.

Thereafter, in step S206, the control unit 616 determines whether or not to terminate the LDPC coding. In a case where it is determined that the LDPC coding is not terminated in step S206, in other words, in a case where there is still LDPC target data to be LDPC-encoded, the processing returns to step S201 (or step S204), and hereinafter the processing from step S201 (or step S204) to step S206 is repeated.

Furthermore, in step S206, in a case where it is determined that the LDPC coding is terminated, in other words, for example, in a case where there is no LDPC target data to be LDPC-encoded, the LDPC encoder 115 terminates the processing.

In regard to the LDPC encoder 115, the parity check matrix initial value table (expressing the parity check matrix) of the LDPC codes of various code lengths N and coding rates r can be prepared in advance. The LDPC encoder 115 can perform the LDPC coding for the LDPC codes of various code lengths N and coding rates r, using the parity check matrix H generated from the parity check matrix initial value table prepared in advance. Note that, since the parity check matrix H can be generated from the parity check matrix initial value table, the parity check matrix H and the parity check matrix initial value table are equivalent information. In the implementation of the LDPC encoder 115, the parity check matrix H is generated from the parity check matrix initial value table, and the LDPC coding is performed using the parity check matrix H. In addition, the LDPC coding can be performed using the parity check matrix initial value table as it is.

Example of Parity Check Matrix Initial Value Table

The parity check matrix initial value table is a table representing the positions of the elements of 1 of the information matrix $H_A$ (FIG. 10) corresponding to the information length K according to the code length N and the coding rate r of the LDPC code (the LDPC code defined by the parity check matrix H) of the parity check matrix H in every 360 columns (parallel factor P), and is created in advance for each parity check matrix H of each code length N and each coding rate r.

In other words, the parity check matrix initial value table represents at least the positions of the elements of 1 of the information matrix $H_A$ in every 360 columns (parallel factor P).

Furthermore, as the parity check matrix H, there are a parity check matrix in which the entire parity matrix $H_T$ has a step structure, and a parity check matrix in which a part of the parity matrix $H_T$ has a step structure and the remaining part is a diagonal matrix (identity matrix).

Hereinafter, an expression method for the parity check matrix initial value table representing the parity check matrix in which a part of the parity matrix $H_T$ has a step structure and the remaining part is a diagonal matrix is also referred to as type A method. Furthermore, an expression method for the parity check matrix initial value table indicating the parity check matrix in which the entire parity matrix $H_T$ has a step structure is also referred to as type B method.

Furthermore, the LDPC code for the parity check matrix represented by the parity check matrix initial value table by the type A method is also referred to as type A code, and the LDPC code for the parity check matrix represented by the parity check matrix initial value table by the type B method is also referred to as type B code.

The designations "type A" and "type B" are designations in accordance with the standard of ATSC 3.0. For example, in ATSC 3.0, both the type A code and type B code are adopted.

Note that, in DVB-T.2 and the like, the type B code is adopted.

FIG. 20 is a diagram illustrating an example of the parity check matrix initial value table by the type B method.

In other words, FIG. 20 illustrates the parity check matrix initial value table (representing the parity check matrix H) of the type B code with the code length N of 16200 bits and the coding rate r (coding rate on the notation of DVB-T.2) of 1/4 defined in the standard of DVB-T.2.

The parity check matrix generation unit 613 (FIG. 18) obtains the parity check matrix H as follows using the parity check matrix initial value table by the type B method.

FIG. 21 is a diagram for describing a method of obtaining the parity check matrix H from the parity check matrix initial value table by the type B method.

In other words, FIG. 21 illustrates the parity check matrix initial value table of the type B code with the code length N of 16200 bits and the coding rate r of 2/3 defined in the standard of DVB-T.2.

The parity check matrix initial value table by the type B method is a table representing the positions of the elements of 1 of the entire information matrix $H_A$ corresponding to the information length K according to the code length N and the coding rate r of the LDPC code in every 360 columns (parallel factor P). In the i-th row, row numbers of the elements of 1 of the (1+360×(i−1))th column of the parity check matrix H (row numbers of when the row number of the 1st row of the parity check matrix H is counted as 0) are arranged by the number of the column weights of the (1+360×(i−1))th column.

Here, since the parity matrix HT (FIG. 10) corresponding to the parity length M of the parity check matrix H by the type B method has the step structure as illustrated in FIGS. 15A and 15B, the parity check matrix H can be obtained if the information matrix HA (FIG. 10) corresponding to the information length K can be obtained according to the parity check matrix initial value table.

The number of rows k+1 of the parity check matrix initial value table by the type B method differs depending on the information length K.

The relationship of the expression (9) holds between the information length K and the number of rows k+1 of the parity check matrix initial value table.

$$K=(k+1)\times 360 \tag{9}$$

Here, 360 in the expression (9) is the parallel factor P described in FIG. 16.

In the parity check matrix initial value table in FIG. 21, thirteen numerical values are arranged in the 1st to 3rd rows, and three numerical values are arranged in the 4th to (k+1)th rows (30th row in FIG. 21).

Therefore, the column weight of the parity check matrix H obtained from the parity check matrix initial value table in FIG. 21 is 13 from the 1st to (1+360×(3−1)−1)th columns, and 3 from the (1+360×(3−1))th to K-th columns.

The 1st row of the parity check matrix initial value table in FIG. 21 is 0, 2084, 1613, 1548, 1286, 1460, 3196, 4297, 2481, 3369, 3451, 4620, and 2622, which indicates that, in the 1st column of the parity check matrix H, the elements of the rows with the row numbers of 0, 2084, 1613, 1548, 1286, 1460, 3196, 4297, 2481, 3369, 3451, 4620, and 2622 are 1 (and the other elements are 0).

Furthermore, the 2nd row of the parity check matrix initial value table in FIG. 21 is 1, 122, 1516, 3448, 2880, 1407, 1847, 3799, 3529, 373, 971, 4358, and 3108, which indicates that, in the 361st (=1+360×(2−1))th column of the parity check matrix H, the elements of the rows with the row numbers of 1, 122, 1516, 3448, 2880, 1407, 1847, 3799, 3529, 373, 971, 4358, and 3108 are 1.

As described above, the parity check matrix initial value table represents the positions of the elements of 1 of the information matrix $H_A$ of the parity check matrix H in every 360 columns.

The columns other than the (1+360×(i−1))th column of the parity check matrix H, in other words, the (2+360×(i−1)th to (360xi)th columns are obtained by cyclically shifting and arranging the elements of 1 of the (1+360×(i−1))th column determined by the parity check matrix initial value table downward (downward of the columns) according to the parity length M.

In other words, for example, the (2+360×(i−1))th column is obtained by cyclically shifting the (1+360×(i−1))th column downward by M/360 (=q). The next (3+360×(i−1))th column is obtained by cyclically shifting the (1+360×(i−1)) th column downward by 2×M/360 (=2×q) (by cyclically shifting the (2+360×(i−1))th column downward by M/360 (=q)).

Now, in a case where the numerical value of the j-th column (j-th from the left) in the i-th row (i-th from the top) of the parity check matrix initial value table is represented as $h_{i,j}$ and the row number of the element of j-th 1 of the w-th column of the parity check matrix H is represented as $H_{w-j}$, the row number $H_{w-j}$ of the element of 1 of the w-th column that is a column other than the (1+360×(i−1))th column of the parity check matrix H can be obtained by the expression (10).

$$H_{w-j}=\mathrm{mod}\{h_{i,j}+\mathrm{mod}((w-1),P)\times q,M) \tag{10}$$

Here, mod (x, y) means the remainder of dividing x by y.

Furthermore, P is the above-described parallel factor, and in the present embodiment, P is 360 as in DVB-T.2 or the like and the standard of ATSC 3.0, for example. Moreover, q is a value M/360 obtained by dividing the parity length M by the parallel factor P (=360).

The parity check matrix generation unit 613 (FIG. 18) specifies the row number of the element of 1 in the (1+360×(i−1))th column of the parity check matrix H using the parity check matrix initial value table.

Moreover, the parity check matrix generation unit 613 (FIG. 18) calculates the row number $H_{w-j}$ of the element of 1 in the w-th column that is a column other than the (1+360×(i−1))th column of the parity check matrix H according to the expression (10), and generates the parity check matrix H in which the elements of the row numbers obtained as described above are 1.

Figures 22, 23:
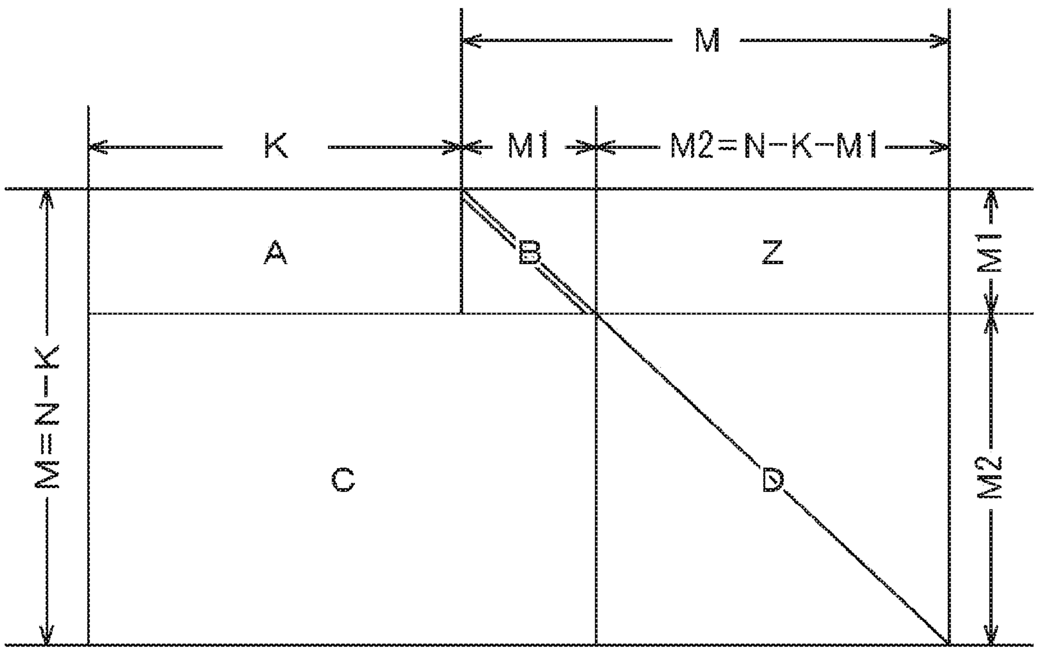
FIG. 22 is a diagram illustrating a structure of a parity check matrix.
FIG. 23 is a diagram illustrating an example of a parity check matrix initial value table.

FIG. 22 is a diagram illustrating a structure of the parity check matrix H by the type A method.

The parity check matrix by the type A method is configured by an A matrix, a B matrix, a C matrix, a D matrix, and a Z matrix.

The A matrix is an upper left matrix in the parity check matrix H, of M1 rows and K columns expressed by a predetermined value M1 and the information length K=the code length N×the coding rate r of the LDPC code.

The B matrix is a matrix of M1 rows and M1 columns having a step structure adjacent to the right of the A matrix.

The C matrix is a matrix of N−K−M1 rows and K+M1 columns adjacent to below the A matrix and the B matrix.

The D matrix is an identity matrix of N−K−M1 rows and N−K−M1 columns adjacent to the right of the C matrix.

The Z matrix is a zero matrix (0 matrix) of M1 rows and N−K−M1 columns adjacent to the right of the B matrix.

In the parity check matrix H by the type A method configured by the above A matrix to D matrix and Z matrix, the A matrix and a part of the C matrix constitute the information matrix, and the B matrix, the rest of the C matrix, the D matrix, and the Z matrix constitute the parity matrix.

Note that, since the B matrix is a matrix with a step structure and the D matrix is an identity matrix, a part (the part of the B matrix) of the parity matrix of the parity check matrix H by the type A method has the step structure and the remaining part (the part of the D matrix) is a diagonal matrix (identity matrix).

The A matrix and the C matrix have a cyclic structure of every parallel factor P columns (for example, 360 columns), similarly to the information matrix of the parity check matrix H by type B method, and the parity check matrix initial value table by the type A method represents the positions of the elements of 1 of the A matrix and the C matrix in every 360 columns.

Here, as described above, since the A matrix and a part of the C matrix constitute the information matrix, the parity check matrix initial value table by the type A method representing the positions of the elements of 1 of the A matrix and the C matrix in every 360 columns can be said to represent at least the positions of the elements of 1 of the information matrix in every 360 columns.

Note that, since the parity check matrix initial value table by the type A method represents the positions of the elements of 1 of the A matrix and the C matrix in every 360 columns, the parity check matrix initial value table can also be said to represent the positions of the elements of 1 of a part (the remaining part of the C matrix) of the parity check matrix in every 360 columns.

FIG. 23 is a diagram illustrating an example of the parity check matrix initial value table by the type A method.

In other words, FIG. 23 illustrates an example of the parity check matrix initial value table representing the parity check matrix H with the code length N of 35 bits and the coding rate r of 2/7.

The parity check matrix initial value table by the type A method is a table representing the positions of the elements of 1 of the A matrix and the C matrix in every parallel factor P. In the i-th row, row numbers of the elements of 1 of the (1+P×(i−1))th column of the parity check matrix H (the row numbers of when the row number of the 1st row of the parity check matrix H is counted as 0) are arranged by the number of the column weight of the (1+P×(i−1))th column.

Note that, here, for simplify the description, the parallel factor P is 5, for example.

The parity check matrix H by the type A method has M1, M2, Q1, and Q2 as parameters.

M1 (FIG. 22) is a parameter for determining the size of the B matrix, and takes a value that is a multiple of the parallel factor P. By adjusting M1, the performance of the LDPC code changes, and M1 is adjusted to a predetermined value when determining the parity check matrix H. Here, it is assumed that 15 is adopted as M1, which is three times the parallel factor P=5.

M2 (FIG. 22) takes a value M-M1 obtained by subtracting M1 from the parity length M.

Here, since the information length K is N×r=35×2/7=10 and the parity length M is N−K=35-10=25, M2 is M-M1=25-15=10.

Q1 is obtained according to an expression Q1=M1/P, and represents the number of shifts (the number of rows) of cyclic shift in the A matrix.

In other words, the columns other than the (1+P×(i−1))th column of the A matrix of the parity check matrix H by the type A method, in other words, the (2+P×(i−1))th to (P×i)th columns are obtained by cyclically shifting and arranging the elements of 1 of the (1+P×(i−1))th column determined by the parity check matrix initial value table downward (downward of the columns), and Q1 represents the number of shifts of the cyclic shift in the A matrix.

Q2 is obtained according to an expression Q2=M2/P, and represents the number of shifts (the number of rows) of cyclic shift in the C matrix.

In other words, the columns other than the (1+P×(i−1))th column of the C matrix of the parity check matrix H by the type A method, in other words, the (2+P×(i−1))th to (P×i)th columns are obtained by cyclically shifting and arranging the elements of 1 of the (1+P×(i−1))th column determined by the parity check matrix initial value table downward (downward of the columns), and Q2 represents the number of shifts of the cyclic shift in the C matrix.

Here, Q1 is M1/P=15/5=3, and Q2 is M2/P=10/5=2.

In the parity check matrix initial value table in FIG. 23, three numerical values are arranged in the 1st and 2nd rows, and one numerical value is arranged in the 3rd to 5th rows. According to the arrangement of the numerical values, the column weights of the A matrix and the C matrix of the parity check matrix H obtained from the parity check matrix initial value table in FIG. 23 are 3 from 1st=(1+5×(1-1))th column to 10th=(5×2)th column, and 1 from the 11th=(1+5×(3-1))th column to 25th=(5×5)th column.

In other words, the 1st row of the parity check matrix initial value table in FIG. 23 is 2, 6, and 18, which represents that, in the 1st column of the parity check matrix H, the elements of the rows with the row numbers of 2, 6, and 18 are 1 (and the other elements are 0).

Here, in this case, since the A matrix (FIG. 22) is a matrix of 15 rows and 10 columns (M1 rows and K columns), and the C matrix (FIG. 22) is a matrix of 10 rows and 25 columns (N−K−M1 rows and K+M1 columns), the rows with the row numbers 0 to 14 of the parity check matrix H are rows of the A matrix, and the rows with the row numbers 15 to 24 of the parity check matrix H are rows of the C matrix.

Therefore, rows #2 and #6 of the rows with the row numbers 2, 6, and 18 (hereinafter described as rows #2, #6, and #18) are rows of the A matrix, and the row #18 is a row of the C matrix.

The 2nd row of the parity check matrix initial value table in FIG. 23 is 2, 10, and 19, which represents that, in the 6th (=(1+5×(2-1))th) column of the parity check matrix H, the elements of the rows #2, #10, and #19 are 1.

Here, in the 6th (=(1+5×(2-1))th) column of the parity check matrix H, the rows #2 and #10 of the rows #2, #10, and #19 are rows of the A matrix, and the row #19 is a row of the C matrix.

The 3rd row of the parity check matrix initial value table in FIG. 23 is 22, which represents that, in the 11th (=(1+5×(3-1))th) column of the parity check matrix H, the element of the row #22 is 1.

Here, the row #22 is a row of the C matrix in the 11th (=(1+5×(3-1))th) column of the parity check matrix H.

Similarly, 19 in the 4th row of the parity check matrix initial value table in FIG. 23 represents that the element of the row #19 is 1 in the 16th (=(1+5×(4-1))th) column of the parity check matrix H. 15 in the fifth row of the parity check matrix initial value table in FIG. 23 represents that the element of the row #15 is 1 in the 21 (=(1+5×(5-1))th) column of the parity check matrix H.

As described above, the parity check matrix initial value table represents the positions of the elements of 1 of the A matrix and the C matrix of the parity check matrix H in every parallel factor P=5 columns.

The columns other than the (1+5×(i−1))th column of the A matrix and the C matrix of the parity check matrix H, in other words, the (2+5×(i−1))th to (5×i)th columns are obtained by cyclically shifting and arranging the elements of 1 of the (1+5×(i−1))th column determined by the parity check matrix initial value table downward (downward of the columns) according to the parameters Q1 and Q2.

In other words, for example, the (2+5×(i−1))th column of the A matrix is obtained by cyclically shifting the (1+5×(i−1))th column downward by Q1 (=3). The next (3+5×(i−1))th column is obtained by cyclically shifting the (1+5×(i−1))th column downward by 2×Q1 (=2×3) (by cyclically shifting the (2+5×(i−1))th column downward by Q1).

Furthermore, for example, the (2+5×(i−1))th column of the C matrix is obtained by cyclically shifting the (1+5×(i−1))th column downward by Q2 (=2). The next (3+5×(i−1))th column is obtained by cyclically shifting the (1+5×(i−1))th column downward by 2×Q2 (=2×2) (by cyclically shifting the (2+5×(i−1))th column downward by Q2).

Figure 24:
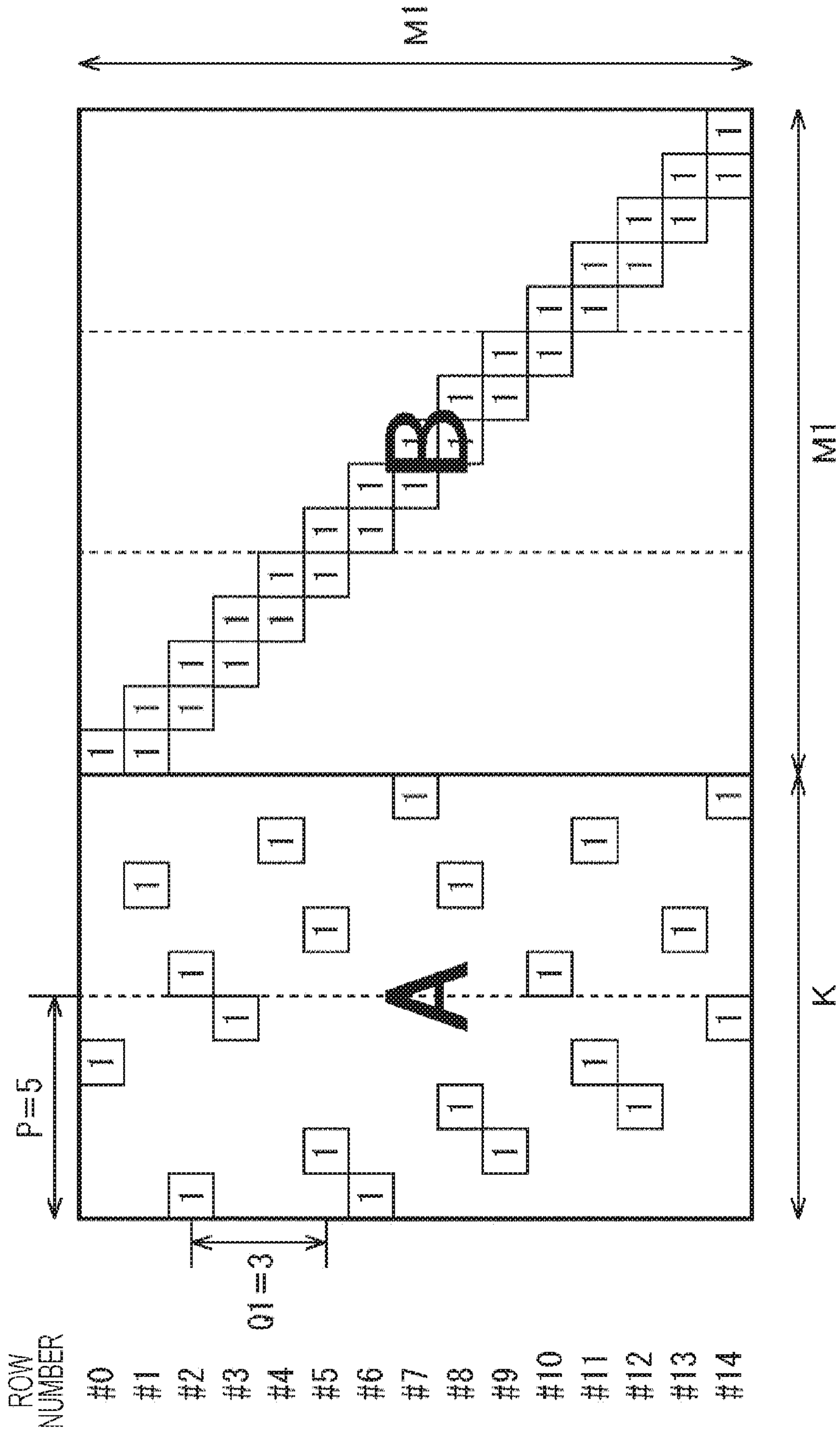
FIG. 24 is a diagram illustrating an A matrix generated from the parity check matrix initial value table.

FIG. 24 is a diagram illustrating the A matrix generated from the parity check matrix initial value table in FIG. 23.

In the A matrix in FIG. 24, the elements of the rows #2 and #6 of the 1st (=(1+5×(1-1))th) column are 1 according to the 1st row of the parity check matrix initial value table in FIG. 23.

Then, the columns from the 2nd (=(2+5×(1-1))th) to 5th (=(5+5×(1-1))th) columns are obtained by cyclically shifting the previous columns downward by Q1=3.

Moreover, in the A matrix in FIG. 24, the elements of the rows #2 and #10 of the 6th (=(1+5×(2-1))th) column are 1 according to the 2nd row of the parity check matrix initial value table in FIG. 23.

Then, the columns from the 7th (=(2+5×(2-1))th) to 10th (=(5+5×(2-1))th) columns are obtained by cyclically shifting the previous columns downward by Q1=3.

Figure 25:
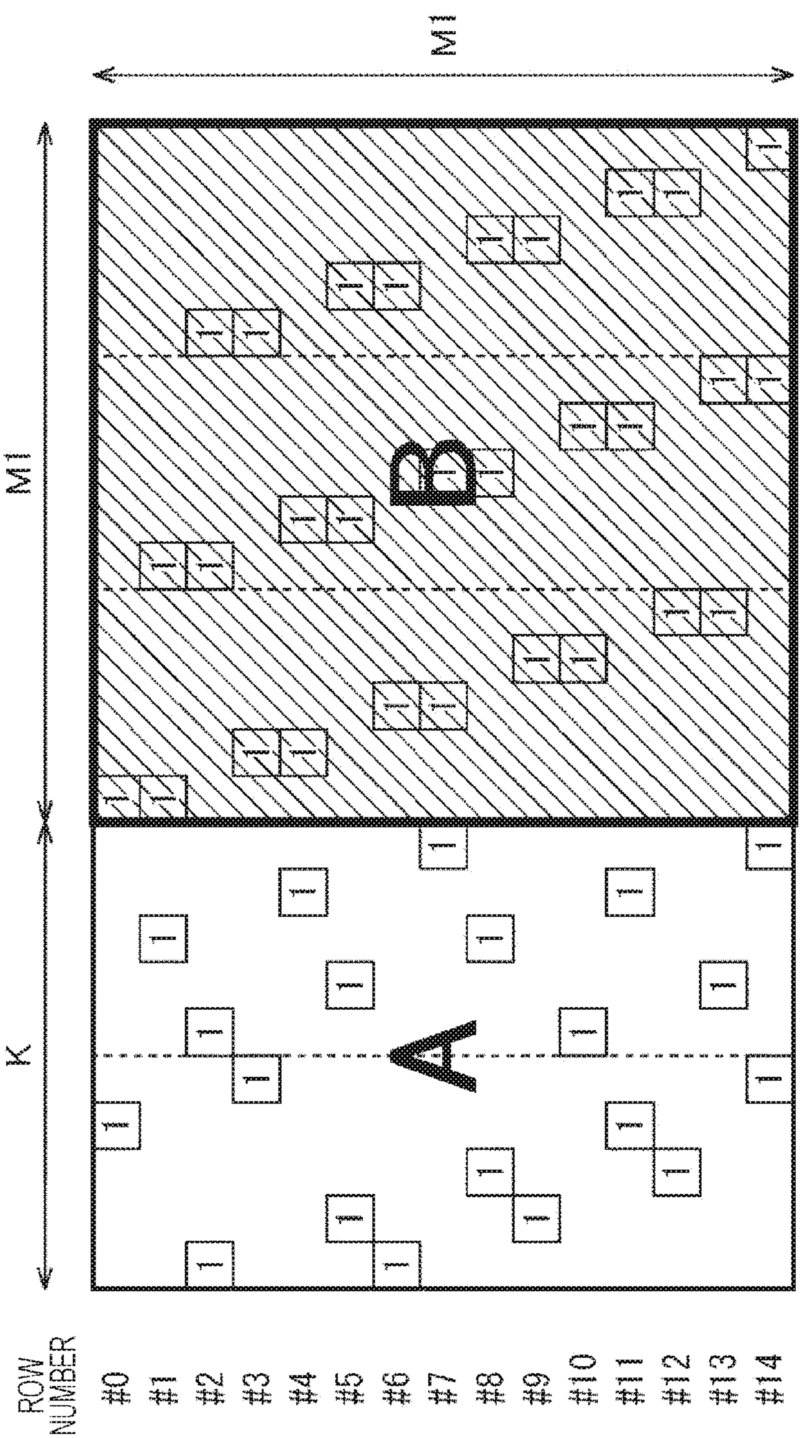
FIG. 25 is a diagram for describing parity interleaving of a B matrix.

FIG. 25 is a diagram illustrating parity interleaving of the B matrix.

The parity check matrix generation unit 613 (FIG. 18) generates the A matrix using the parity check matrix initial value table, and arranges the B matrix having a step structure adjacent to the right of the A matrix. Then, the parity check matrix generation unit 613 treats the B matrix as a parity matrix, and performs parity interleaving such that adjacent elements of 1 of the B matrix having step structure are separated in the row direction by the parallel factor P=5.

FIG. 25 illustrates the A matrix and the B matrix after the parity interleaving of the B matrix in FIG. 24.

Figure 26:
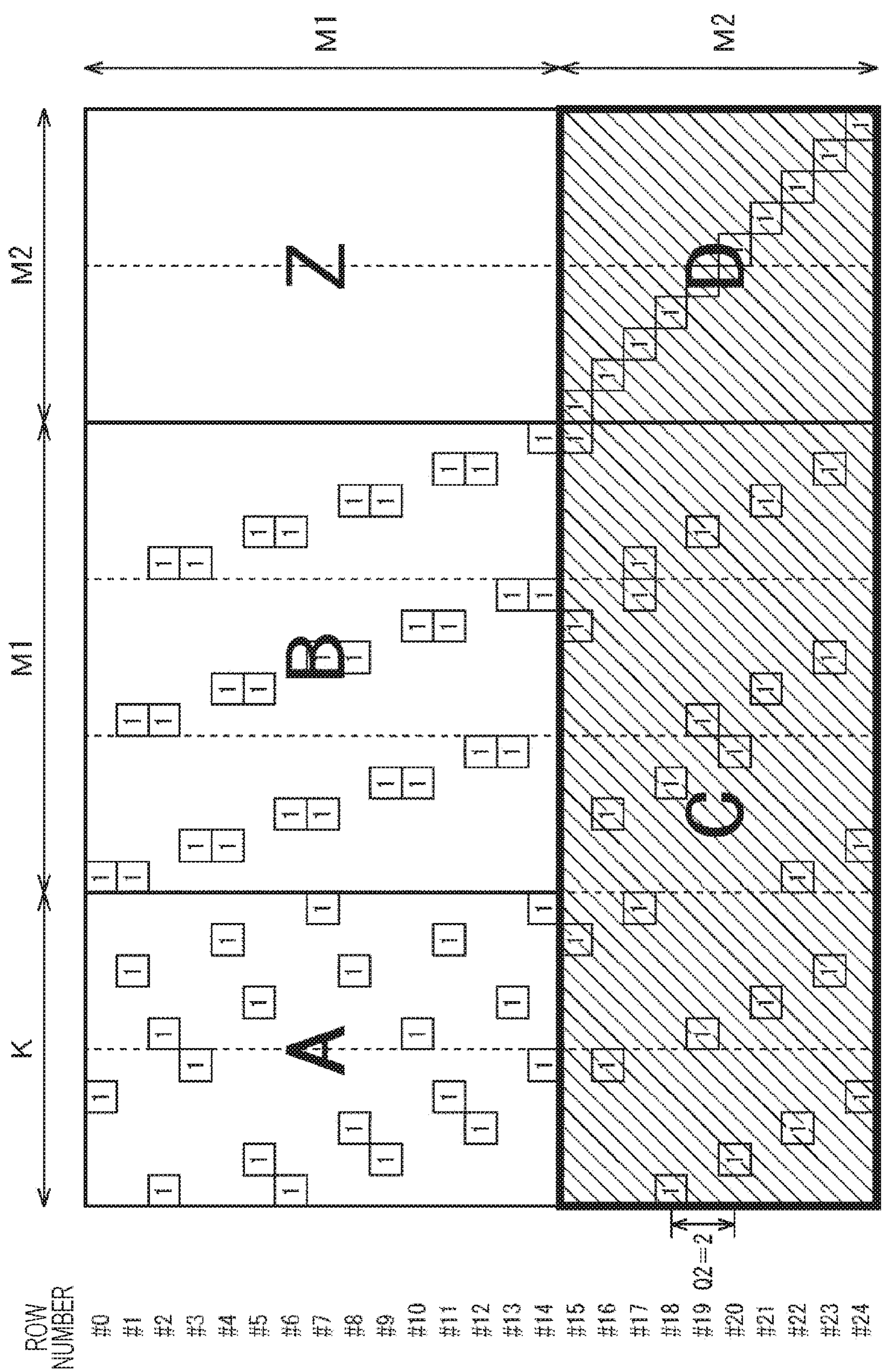
FIG. 26 is a diagram for describing a C matrix generated from the parity check matrix initial value table.

FIG. 26 is a diagram illustrating the C matrix generated from the parity check matrix initial value table in FIG. 23.

In the C matrix in FIG. 26, the element of the row #18 of the 1st (=(1+5×(1-1))th) column of the parity check matrix H is 1 according to the 1st row of the parity check matrix initial value table in FIG. 23.

Then, the columns from the 2nd (=(2+5×(1-1))th) to 5th (=(5+5×(1-1))th) columns of the C matrix are obtained by cyclically shifting the previous columns downward by Q2=2.

Moreover, in the C matrix in FIG. 26, according to the 2nd to 5th rows of the parity check matrix initial value table in FIG. 23, the elements of the row #19 of the 6th (=(1+5×(2-1))th) column, the row #22 of the 11th (=(1+5×(3-1))th) column, the row #19 of the 16th (=(1+5×(4-1))th) column, and the row #15 in the 21st (=(1+5×(5-1))th) columns, of the parity check matrix H, are 1.

Then, columns from the 7th (=2+5×(2-−1))th to the 10th (=5+5×(2-1))th columns, columns from the 12th (=2+5×(3-1))th to 15th (=5+5×(3-1))th columns, columns from the 17th (=2+5×(4-1))th to 20th (=5+5×(4-1))th columns, and columns from the 22nd (=2+5×(5-1))th to the 25th (=5+5×(5-1))th columns are obtained by cyclically shifting the previous columns downward by Q2=2.

The parity check matrix generation unit 613 (FIG. 18) generates the C matrix using the parity check matrix initial value table and arranges the C matrix below the A matrix and the B matrix (after parity interleaving).

Moreover, the parity check matrix generation unit 613 arranges the Z matrix adjacent to the right of the B matrix and arranges the D matrix adjacent to the right of the C matrix to generate the parity check matrix H illustrated in FIG. 26.

Figure 27:
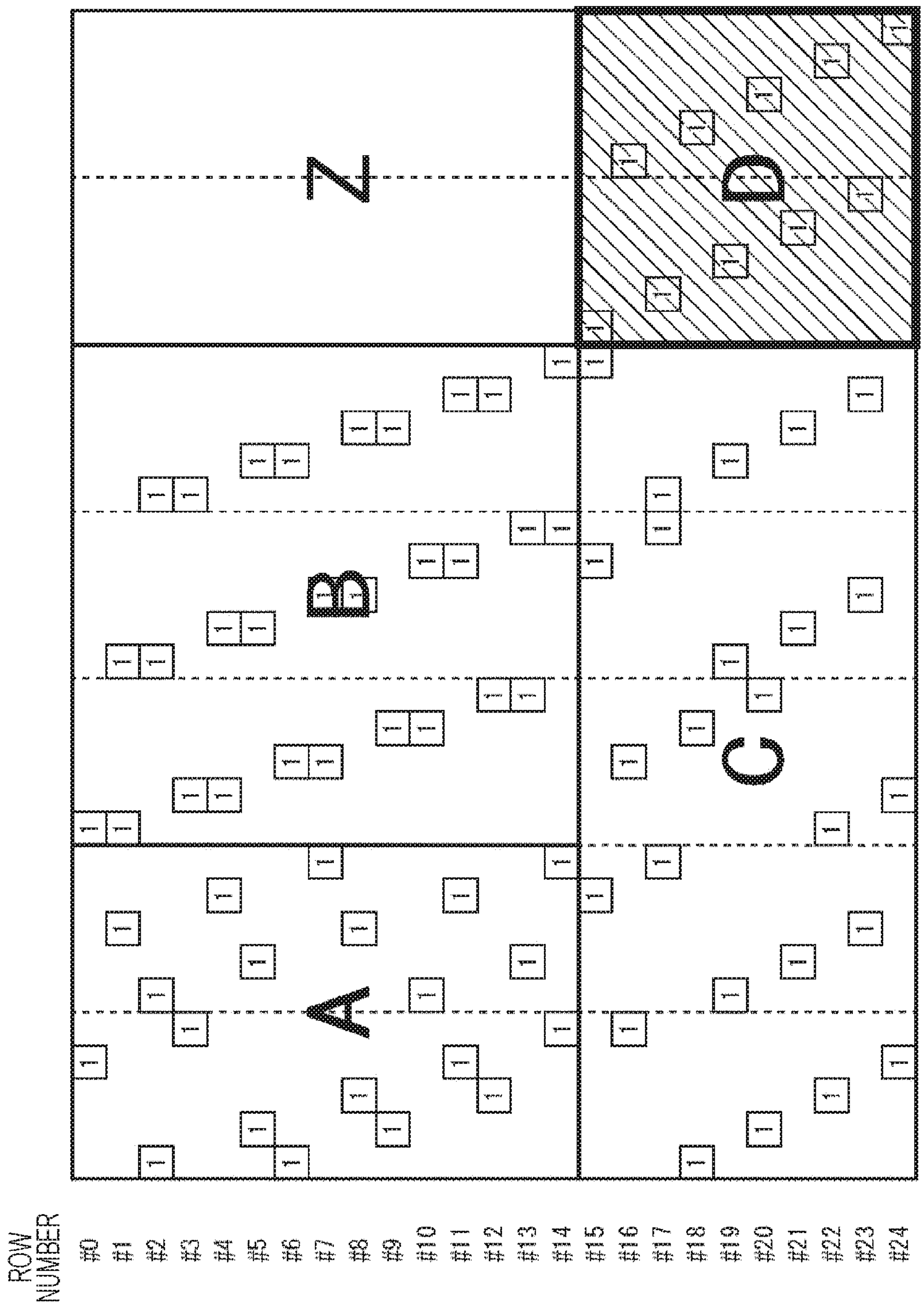
FIG. 27 is a diagram for describing parity interleaving of a D matrix.

FIG. 27 is a diagram for describing parity interleaving of the D matrix.

The parity check matrix generation unit 613 treats the D matrix after generating the parity check matrix H in FIG. 26 as a parity matrix, and performs parity interleaving (of only the D matrix) such that the elements of 1 of the odd rows and the next even rows of the D matrix as an identity matrix are separated by the parallel factor P=5 in the row direction.

FIG. 27 illustrates the parity check matrix H after performing the parity interleaving of the D matrix for the parity check matrix H in FIG. 26.

(The coding parity operation unit 615 (FIG. 18)) of the LDPC encoder 115 performs LDPC coding (generates an LDPC code) using the parity check matrix H in FIG. 27, for example.

Here, the LDPC code generated using the parity check matrix H in FIG. 27 is an LDPC code for which parity interleaving has been performed. Therefore, it is not necessary to perform the parity interleaving in the parity interleaver 23 (FIG. 9) for the LDPC code generated using the parity check matrix H in FIG. 27. In other words, the LDPC code generated using the parity check matrix H after the parity interleaving of the D matrix is performed is the LDPC code for which the parity interleaving has been performed. Therefore, the parity interleaving in the parity interleaver 23 is skipped for the LDPC code.

Figure 28:
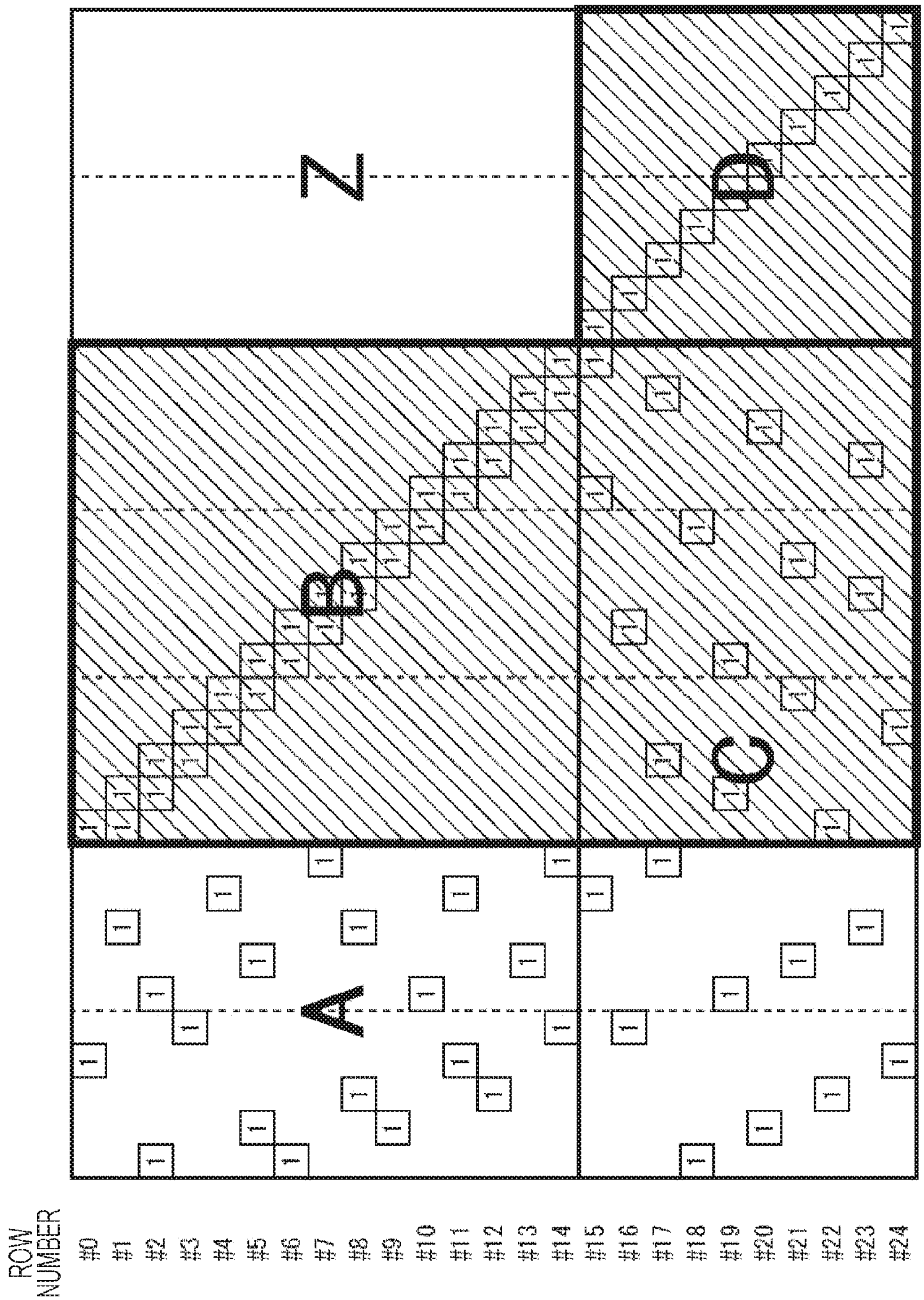
FIG. 28 is a diagram illustrating a parity check matrix in which column permutation as parity deinterleaving for restoring parity interleaving is performed.

FIG. 28 illustrates a parity check matrix H in which column permutation as parity deinterleaving for restoring the parity interleaving is performed for the B matrix, a part of the C matrix (a portion of the C matrix arranged below the B matrix), and the D matrix of the parity check matrix H in FIG. 27.

The LDPC encoder 115 can perform LDPC coding (generates an LDPC code) using the parity check matrix H in FIG. 28.

In a case of performing the LDPC coding using the parity check matrix H in FIG. 28, an LDPC code for which parity interleaving is not performed can be obtained according to the LDPC coding. Therefore, in a case of performing the LDPC coding using the parity check matrix H in FIG. 28, the parity interleaving is performed in the parity interleaver 23 (FIG. 9).

Figure 29:
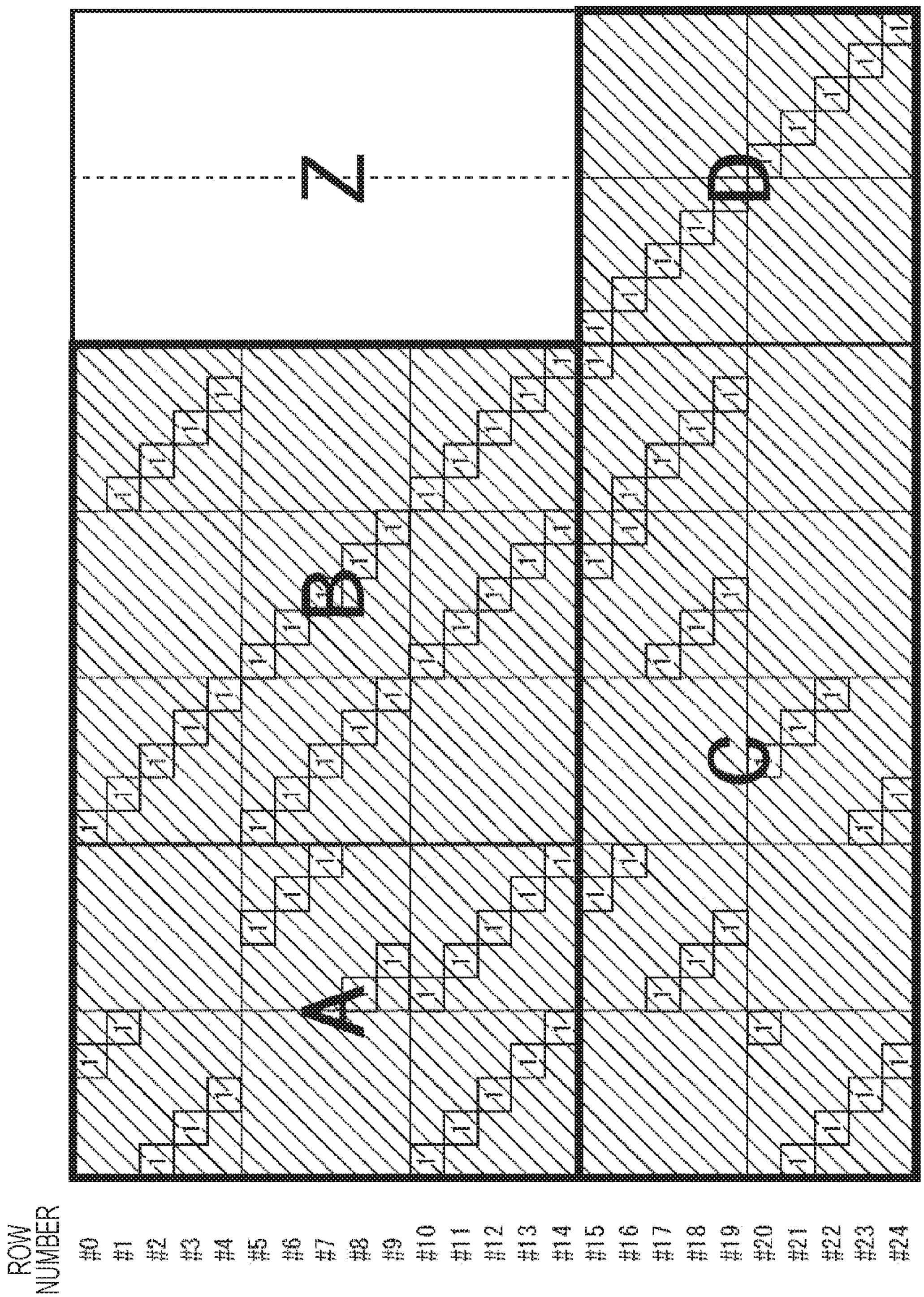
FIG. 29 is a diagram illustrating a transformed parity check matrix obtained by performing row permutation for the parity check matrix.

FIG. 29 is a diagram illustrating a transformed parity check matrix obtained by performing row permutation for the parity check matrix H in FIG. 27.

The transformed parity check matrix is, as described below, a matrix represented by a combination of a P×P identity matrix, a quasi identity matrix in which one or more of is in the identity matrix is 0, a shift matrix obtained by cyclically shifting the identity matrix or the quasi identity matrix, a sum matrix that is a sum of two or more of the identity matrix, the quasi identity matrix, and the shift matrix, and a P×P zero matrix.

By using the transformed parity check matrix for decoding the LDPC code, architecture of performing P check node operations and variable node operations at the same time can be adopted in decoding the LDPC code, as described below.

One of methods of securing favorable communication quality in data transmission using an LDPC code, there is a method using an LDPC code with high performance.

Here, the LDPC code with high performance is an LDPC code obtained from an appropriate parity check matrix H.

The appropriate parity check matrix H is, for example, a parity check matrix that satisfies a predetermined condition that makes a bit error rate (BER) (and a frame error rate (FER)) smaller when the LDPC code obtained from the parity check matrix H is transmitted at low $E_s/N_0$ or $E_b/N_o$ (signal power to noise power ratio per bit).

The appropriate parity check matrix H can be obtained by, for example, performing a simulation to measure BERs of when LDPC codes obtained from various parity check matrices satisfying the predetermined condition are transmitted at low $E_s/N_o$.

Examples of the predetermined condition to be satisfied by the appropriate parity check matrix H include a good analysis result obtained by an analysis method of performance of code called density evolution, and absence of a loop of the elements of 1, called cycle 4.

Here, it is known that the decoding performance of the LDPC code is degraded if the elements of 1 are densely packed in the information matrix $H_A$ as in the cycle 4, and therefore, absence of the cycle 4 is desirable in the parity check matrix H.

In the parity check matrix H, a minimum value of the length of a loop (loop length) configured by the elements of 1 is called girth. The absence of the cycle 4 means that the girth is greater than 4.

Note that the predetermined condition to be satisfied by the appropriate parity check matrix H can be appropriately determined from the viewpoints of improvement of the decoding performance of the LDPC code, facilitation (simplification) of the decoding processing for the LDPC code, and the like.

Figure 30:
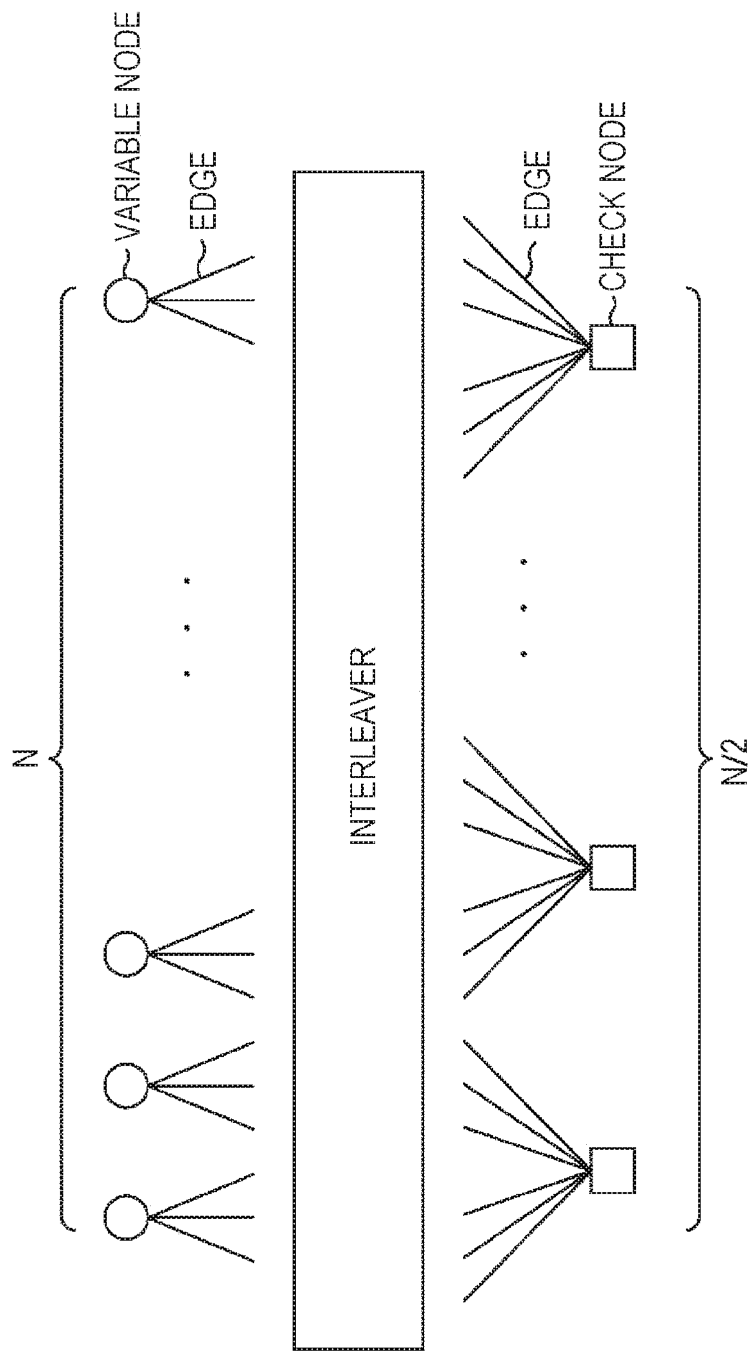
FIG. 30 is a diagram illustrating an example of a Tanner graph of an ensemble of degree sequence with a column weight of 3 and a row weight of 6.
Figure 31:
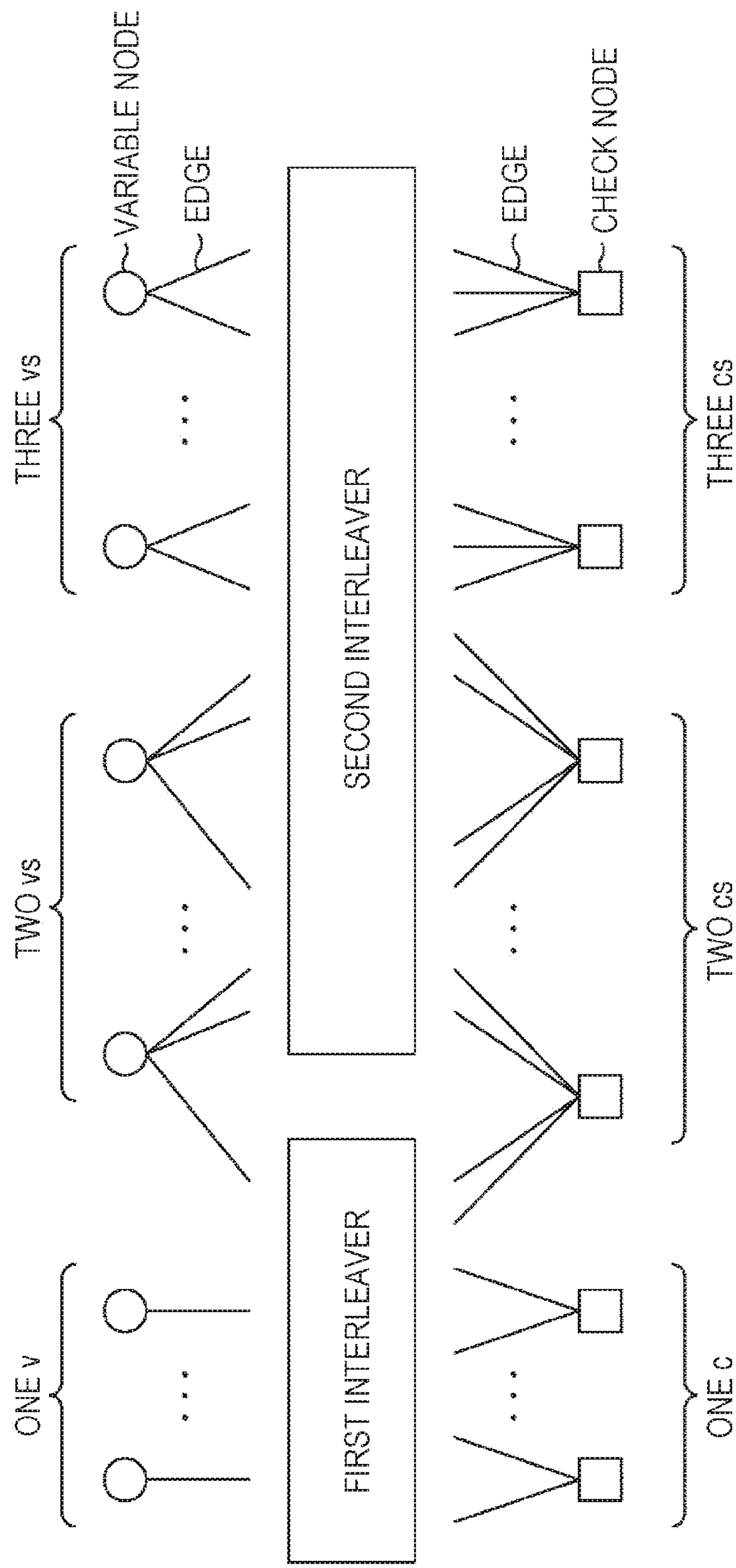
FIG. 31 is a diagram illustrating an example of a Tanner graph of a multi-edge type ensemble.

FIGS. 30 and 31 are diagrams for describing density evolution by which an analysis result as the predetermined condition to be satisfied by the appropriate parity check matrix H can be obtained.

The density evolution is a code analysis method of calculating an expected value of an error probability for the entire LDPC code (ensemble) with the code length N of characterized by a degree sequence to be described below.

For example, when increasing a variance of noise from 0 on an AWGN channel, the expected value of the error probability of an ensemble is initially 0, but the expected value becomes not 0 when the variance of noise becomes a certain threshold or greater.

According to the density evolution, good or bad of the performance of the ensemble (appropriateness of the parity check matrix) can be determined by comparing the threshold of the variance of noise (hereinafter also referred to as performance threshold) at which the expected value of the error probability becomes not 0.

Note that, for a specific LDPC code, an ensemble to which the LDPC code belongs is determined, and the density evolution is performed for the ensemble, whereby rough performance of the LDPC code can be predicted.

Therefore, if an ensemble with high performance is found, the LDPC code with high performance can be found from LDPC codes belonging to the ensemble.

Here, the above-described degree sequence indicates what ratio the variable nodes and check nodes having weights of respective values exist to the code length N of the LDPC code.

For example, a regular (3, 6) LDPC code with the coding rate of 1/2 belongs to an ensemble characterized by a degree sequence indicating that the weights (column weights) of all the variable nodes are 3 and the weights (row weights) of all the check nodes are 6.

FIG. 30 illustrates a Tanner graph of such an ensemble.

In the Tanner bluff in FIG. 30, N variable nodes illustrated by the circles (o) in FIG. 30 exist, the number N being equal to the code length N, and N/2 check nodes illustrated by the squares (□) in FIG. 30 exist, the number N/2 being equal to a multiplication value obtained by multiplying the code length N by the coding rate of 1/2.

Three edges with an equal column weight are connected to each variable node. Therefore, there are a total of 3N edges connected to the N variable nodes.

Furthermore, six edges with an equal row weight are connected to each check node. Therefore, there are a total of 3N edges connected to the N/2 check nodes.

Moreover, in the Tanner graph in FIG. 30, there is one interleaver.

The interleaver randomly rearranges the 3N edges connected to the N variable nodes and connects each edge after the rearrangement to any of the 3N edges connected to the N/2 check nodes.

The number of patterns for rearranging the 3N edges connected to the N variable nodes in the interleaver is (3N). (3N)×(3N−1)× . . . ×1). Therefore, the ensemble characterized by the degree sequence indicating that the weights of all the variable nodes are 3 and the weights of all the check nodes are 6 is a set of (3N). LDPC codes.

In the simulation for finding the LDPC code with high performance (appropriate parity check matrix), a multi-edge type ensemble can be used in the density evolution.

In the multi-edge type ensemble, the interleaver which the edges connected to the variable nodes and the edges connected to the check nodes go through is divided into multi edges, whereby characterization of the ensemble is more strictly performed.

FIG. 31 illustrates an example of a Tanner graph of a multi-edge type ensemble.

In the Tanner graph in FIG. 31, there are two interleavers: a first interleaver and a second interleaver.

Furthermore, in the Tanner graph in FIG. 31, v1 variable nodes each having one edge connected to the first interleaver and 0 edges connected to the second interleaver, v2 variable nodes each having one edge connected to the first interleaver and two edges connected to the second interleaver, v3 variable nodes each having 0 edges connected to the first interleaver and two edges connected to the second interleaver exist.

Moreover, in the Tanner graph in FIG. 31, c1 check nodes each having two edges connected to the first interleaver and 0 edges connected to the second interleaver, c2 check nodes each having two edges connected to the first interleaver and two edges connected to the second interleaver, and c3 check nodes each having 0 edges connected to the first interleaver and three edges connected to the second interleaver exist.

Here, the density evolution and its implementation are described in, for example, "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 5, NO. 2, February 2001.

In the simulation for obtaining (the parity check matrix) of the LDPC code, an ensemble in which the performance threshold that is $E_b/N_o$ (signal power to noise power ratio per bit) at which the BER starts to drop (start to become small) becomes a predetermined value or less is found by the multi-edge type density evolution, and the LDPC code that makes the BER small in a case of using one or more quadrature modulations such as QPSK is selected from among the LDPC codes belonging to the ensemble as the LDPC code with high performance.

For data transmission of the transmission system in FIG. 7, the type A code or the type B code corresponding to the parity check matrix H having a cyclic structure with the parallel factor P of 360 similar to DVB-T.2, ATSC3.0, or the like, which can be obtained by the above simulation, can be adopted.

Furthermore, for data transmission in the transmission system in FIG. 7, an LDPC code with the code length N longer than DVB-T.2 or ATSC3.0, in other words, an LDPC code with the code length N of 69120 bits and the coding rate r of 2/16, 3/16, 4/16, 5/16, 6/16, 7/16, 8/16, 9/16, 10/16, 11/16, 12/16, 13/16, or 14/16 can be adopted.

<Constellation>

FIGS. 32, 33, 34, 35A, 35B, 36, 37, 38, 39, 40, 41, 42, 43, 44, 45, 46, 47, 48, 49, 50, 51, 52, 53A, 53B, 54, 55, and 56 are diagrams illustrating examples of constellations adaptable in the transmission system in FIG. 7.

In the transmission system in FIG. 7, for example, a constellation to be used in MODCOD that is a combination of a modulation method (MODulation) and the LDPC code (CODe) can be set for the MODCOD.

One or more constellations can be set for one MODCOD.

As the constellation, there are a uniform constellation (UC) in which arrangement of signal points is uniform and a non uniform constellation (NUC) in which arrangement of signal points are not uniform.

Furthermore, as the NUC, there are a constellation called 1-dimensional ($M^2$-QAM) non-uniform constellation (1D-NUC), a constellation called 2-dimensional (QQAM) non-uniform constellation (2D-NUC), and the like.

In general, the BER is further improved in the 1D NUC than the UC, and moreover, the BER is further improved in the 2D NUC than the 1D NUC.

The UC can be adopted as the constellation for the modulation method of QPSK. For example, the UC or the 2D NUC can be adopted as a constellation for the modulation method of 16QAM, 64QAM, 256QAM, or the like. For example, the UC or the 1D NUC can be adopted as a constellation for the modulation method of 1024QAM, 4096QAM, or the like.

In the transmission system in FIG. 7, for example, constellations defined in ATSC 3.0, DVB-C.2 or the like, and various other constellations that improve the error rate can be used.

In other words, in the case where the modulation method is QPSK, for example, the same UC can be used for the coding rates r of the LDPC codes.

Furthermore, in the case where the modulation method is 16QAM, 64QAM, or 256QAM, for example, the same UC can be used for the coding rates r of the LDPC codes. Moreover, in the case where the modulation method is 16QAM, 64QAM, or 256QAM, for example, different 2D NUCs can be used for the coding rates r of the LDPC codes, respectively.

Furthermore, in the case where the modulation method is 1024QAM, or 4096QAM, for example, the same UC can be used for each coding rate r of the LDPC code. Moreover, in the case where the modulation method is 1024QAM, or 4096QAM, for example, different 1D NUCs can be used for the coding rates r of the LDPC codes, respectively.

Here, the UC of QPSK is also described as QPSK-UC, and the UC of $2^m$QAM is also described as $2^m$QAM-UC. Furthermore, the 1D NUC and 2D NUC of $2^m$QAM are also described as $2^m$QAM-1D NUC and $2^m$QAM-2D NUC, respectively.

Hereinafter, some of constellations defined in ATSC3.0 will be described.

FIG. 32 is a diagram illustrating coordinates of QPSK-UC signal points used for all the coding rates of the LDPC codes defined in ATSC 3.0 in the case where the modulation method is QPSK.

In FIG. 32, "Input Data cell y" indicates a 2-bit symbol to be mapped to QPSK-UC, and "Constellation point $z_s$" indicates a coordinate of a signal point $z_s$. Note that an index s of the signal point $z_s$ (an index q of a signal point $z_q$ as described below is similar) indicates discrete time of symbols (time interval between one symbol and a next symbol).

In FIG. 32, the coordinate of the signal point $z_s$ is expressed in the form of a complex number, and j represents an imaginary unit ($\sqrt{(-1)}$).

FIG. 33 is a diagram illustrating coordinates of signal points of 16QAM-2D-NUC used for the coding rates r (CR)=2/15, 3/15, 4/15, 5/15, 6/15, 7/15, 8/15, 9/15, 10/15, 11/15, 12, 15, and 13/15 of the LDPC codes defined in ATSC3.0 in the case where the modulation method is 16QAM.

In FIG. 33, the coordinate of the signal point $z_s$ is expressed in the form of a complex number, and j represents an imaginary unit, similarly to FIG. 32.

In FIG. 33, w #k represents a coordinate of a signal point in the first quadrant of the constellation.

In the 2D-NUC, a signal point in the second quadrant of the constellation is arranged at a position obtained by symmetrically moving a signal point in the first quadrant with respect to a Q axis, and a signal point in the third quadrant of the constellation is arranged at a position obtained by symmetrically moving a signal point in the first quadrant with respect to the origin. Then, a signal point in the fourth quadrant of the constellation is arranged at a position obtained by symmetrically moving a signal point in the first quadrant with respect to an I axis.

Here, in the case where the modulation method is $2^m$QAM, m bits are regarded as one symbol, and the one symbol is mapped to a signal point corresponding to the symbol.

The m-bit symbol can be expressed by, for example, an integer value of 0 to $2^m-1$. Now, symbols y(0), y(1), . . . , y($2^m-1$) expressed by integer values of 0 to $2^m-1$ can be classified into four groups of symbols y(0) to y(b−1), y(b) to y(2b−1), y(2b) to y(3b−1), and y(3b) to y(4b−1), where $b=2^m/4$.

In FIG. 33, the suffix k of w #k takes an integer value in a range of 0 to b−1, and w #k represents a coordinate of a signal point corresponding to a symbol y(k) in a range of symbols y(0) to y(b−1).

Then, a coordinate of a signal point corresponding to a symbol y(k+b) in a range of symbols y(b) to y(2b−1) is represented as −conj(w #k), and a coordinate of a signal point corresponding to a symbol y(k+2b) in a range of symbols y(2b) to y(3b−1) is represented as conj(w #k). Furthermore, a coordinate of a signal point corresponding to a symbol y(k+3b) in a range of symbols y(3b) to y(4b−1) is represented by −w #k.

Here, conj(w #k) represents a complex conjugate of w #k.

For example, in a case where the modulation method is 16QAM, symbols y(0), y(1), . . . , and y(15) of m=4 bits are classified into four groups of symbols y(0) to y(3), y(4) to y(7), y(8) to y(11), and y(12) to y(15), where $b=2^4/4=4$.

Then, for example, the symbol y(12), of the symbols y(0) to y(15), is a symbol y(k+3b)=y(0+3×4) in the range of symbols y(3b) to y(4b−1)) and k=0, and therefore the coordinate of the signal point corresponding to the symbol y(12) is −w #k=−w0.

Now, assuming that the coding rate r (CR) of the LDPC code is, for example, 9/15, w0 in a case where the modulation method is 16QAM and the coding rate r is 9/15 is 0.2386+j0.5296 according to FIG. 33, and therefore the coordinate −w0 of the signal point corresponding to the symbol y(12) is −(0.2386+j0.5296).

FIG. 34 is a diagram illustrating examples of coordinates of signal points of 1024QAM-1D NUC used for the coding rates r (CR)=2/15, 3/15, 4/15, 5/15, 6/15, 7/15, 8/15, 9/15, 10/15, 11/15, 12, 15, and 13/15 of the LDPC codes defined in ATSC3.0 in the case where the modulation method is 1024QAM.

In FIG. 34, u #k represents a real part $Re(z_s)$ and an imaginary part $Im(z_s)$ of the complex number as the coordinate of the signal point $z_s$ of 1D NUC, and is a component of a vector u=(u0, u1, . . . , u #V−1) called position vector. The number V of the components u #k of the position vector u is given by an expression $V=(2^m)/2$.

FIGS. 35A and 35B are diagrams illustrating a relationship between the symbol y of 1024QAM and (the component u #k of) the position vector u.

Now, it is assumed that the 10-bit symbol y of 1024QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, and $y_{9,s}$.

FIG. 35A illustrates a correspondence between the even-numbered 5 bits y1,s, y3,s, y5,s, y7,s, y9,s of the symbol y, and u #k representing the real part Re(zs) of (the coordinate) of the signal point zs corresponding to the symbol y.

FIG. 35B illustrates a correspondence between the odd-numbered 5 bits y0,s, y2,s, y4,s, y6,s, y8,s of the symbol y, and u #k representing the imaginary part Im(zs) of the signal point zs corresponding to the symbol y.

In a case where the 10-bit symbol y=($y_{0,s}$, $y_{1,s}$, $y_{2,s}$, $y_{3,s}$, $y_{4,s}$, $y_{5,s}$, $y_{6,s}$, $y_{7,s}$, $y_{8,s}$, $y_{9,s}$) of 1024QAM is (0,0,1,0,0,1,1,1,0,0), for example, the odd-numbered 5 bits ($y_{0,s}$, $y_{2,s}$, $y_{4,s}$, $y_{6,s}$, $y_{8,s}$) are (0, 1, 0, 1, 0) and the even-numbered 5 bits ($y_{1,s}$, $y_{3,s}$, $y_{5,s}$, $y_{7,s}$, $y_{9,s}$) are (0, 0, 1, 1, 0).

In FIG. 35A, the even-numbered 5 bits (0, 0, 1, 1, 0) are associated with u11, and therefore the real part Re(zs) of the signal point zs corresponding to the symbol y=(0, 0, 1, 0, 0, 1, 1, 1, 0, 0) is u11.

In FIG. 35B, the odd-numbered 5 bits (0, 1, 0, 1, 0) are associated with u3, and therefore the imaginary part Im(zs) of the signal point zs corresponding to the symbol y=(0, 0, 1, 0, 0, 1, 1, 1, 0, 0) is u3.

Meanwhile, when the coding rate r of the LDPC code is 6/15, for example, u3 is 0.1295 and u11 is 0.7196 according to FIG. 34 in regard to the 1D NUC used in a case where the modulation method is 1024QAM and the coding rate r (CR) of the LDPC code=6/15.

Therefore, the real part $Re(z_s)$ of the signal point $z_s$ corresponding to the symbol y=(0, 0, 1, 0, 0, 1, 1, 1, 0, 0) is u11=0.7196 and the imaginary part $Im(z_s)$ is u3=0.1295. As a result, the coordinate of the signal point $z_s$ corresponding to the symbol y=(0, 0, 1, 0, 0, 1, 1, 1, 0, 0) is expressed by 0.7196+j0.1295.

Note that the signal points of the 1D NUC are arranged in a lattice on a straight line parallel to the I axis and a straight line parallel to the Q axis in the constellation. However, the interval between signal points is not constant. Furthermore, average power of the signal points on the constellation can be normalized in transmission of (data mapped to) the signal points. Normalization can be performed by, where the root mean square of absolute values of all (the coordinates of) the signal points on the constellation is $P_{ave}$, multiplying each signal point $z_s$ on the constellation by a reciprocal $1/(\sqrt{P_{ave}})$ of the square root $\sqrt{P_{ave}}$ of the root mean square value $P_{ave}$.

The transmission system in FIG. 7 can use the constellation defined in ATSC 3.0 as described above.

FIGS. 36 to 47 illustrate coordinates of signal points of UCs defined in DVB-C.2.

In other words, FIG. 36 is a diagram illustrating a real part $Re(z_q)$ of a coordinate $z_q$ of a signal point of QPSK-UC (UC in QPSK) defined in DVB-C.2. FIG. 37 is a diagram illustrating an imaginary part $Im(z_q)$ of a coordinate $z_q$ of a signal point of QPSK-UC defined in DVB-C.2.

FIG. 38 is a diagram illustrating a real part $Re(z_q)$ of a coordinate $z_q$ of a signal point of 16QAM-UC (UC of 16QAM) defined in DVB-C.2. FIG. 39 is a diagram illustrating an imaginary part $Im(z_q)$ of a coordinate $z_q$ of a signal point of 16QAM-UC defined in DVB-C.2.

FIG. 40 is a diagram illustrating a real part $Re(z_q)$ of a coordinate $z_q$ of a signal point of 64QAM-UC (UC of 64QAM) defined in DVB-C.2. FIG. 41 is a diagram illustrating an imaginary part $Im(z_q)$ of a coordinate $z_q$ of a signal point of 64QAM-UC specified in DVB-C.2.

FIG. 42 is a diagram illustrating a real part $Re(z_q)$ of a coordinate $z_q$ of a signal point of 256QAM-UC (UC of 256QAM) defined in DVB-C.2. FIG. 43 is a diagram illustrating an imaginary part $Im(z_q)$ of coordinate $z_q$ of a signal point of 256QAM-UC defined in DVB-C.2.

FIG. 44 is a diagram illustrating a real part $Re(z_q)$ of a coordinate $z_q$ of a signal point of 1024QAM-UC (UC of 1024QAM) defined in DVB-C.2. FIG. 45 is a diagram illustrating an imaginary part $Im(z_q)$ of a coordinate $z_q$ of a signal point of 1024QAM-UC specified in DVB-C.2.

FIG. 46 is a diagram illustrating a real part $Re(z_q)$ of a coordinate $z_q$ of a signal point of 4096QAM-UC (UC of 4096QAM) defined in DVB-C.2. FIG. 47 is a diagram illustrating an imaginary part $Im(z_q)$ of a coordinate $z_q$ of a signal point of 4096QAM-UC defined in DVB-C.2.

Note that, in FIGS. 36 to 47, $y_{i,q}$ represent the (i+1)th bit from the head of the m-bit symbol (for example, a 2-bit symbol in QPSK) of $2^m$QAM. Furthermore, average power of the signal points on the constellation can be normalized in transmission of (data mapped to) the signal points of UC. Normalization can be performed by, where the root mean square of absolute values of all (the coordinates of) the signal points on the constellation is $P_{ave}$, multiplying each signal point $z_q$ on the constellation by a reciprocal $1/(\sqrt{P_{ave}})$ of the square root $\sqrt{P_{ave}}$ of the root mean square value $P_{ave}$.

In the transmission system in FIG. 7, the UC defined in DVB-C.2 as described above can be used.

FIGS. 48, 49, 50, 51, 52, 53A, 53B, 54, 55, and 56 are diagrams illustrating examples of coordinates of signal points of other NUCs.

That is, FIG. 48 is a diagram illustrating examples of coordinates of signal points of 16QAM-2D-NUC.

FIG. 49 is a diagram illustrating examples of coordinates of signal points of 64QAM-2D-NUC.

FIGS. 50 and 51 are diagrams illustrating examples of coordinates of signal points of 256QAM-2D-NUC.

Note that FIG. 51 is a diagram following FIG. 50.

In FIGS. 48 to 51, the coordinate of the signal point $z_s$ is expressed in the form of a complex number, and j represents an imaginary unit, similarly to FIG. 33.

In FIGS. 48 to 51, w #k represents a coordinate of a signal point in the first quadrant of the constellation, similarly to FIG. 33.

Here, as described in FIG. 33, when the m-bit symbol can be expressed by, for example, an integer value of 0 to $2^m-1$ and $b=2^m/4$, the symbols y(0), y(1), . . . , $y(2^m-1)$ expressed by integer values of 0 to $2^m-1$ can be classified into four groups of symbols y(0) to y(b−1), y(b) to y(2b−1), y(2b) to y(3b−1), and y(3b) to y(4b−1).

In FIGS. 48 to 51, the suffix k of w #k takes an integer value in the range of 0 to b−1, and w #k represents a coordinate of a signal point corresponding to the symbol y(k) in the range of symbols y(0) to y(b−1), similarly to FIG. 33.

Moreover, in FIGS. 48 to 51, a coordinate of a signal point corresponding to the symbol y(k+3b) in the range of symbols y(3b) to y(4b−1) is represented by −w #k, similarly to FIG. 33.

Note that, in FIG. 33, a coordinate of a signal point corresponding to the symbol y(k+b) in the range of symbols y(b) to y(2b−1) is represented as −conj(w #k), and a coordinate of a signal point corresponding to the symbol y(k+2b) in the range of symbols y(2b) to y(3b−1) is represented as conj(w #k). However, the sign of conj is inverted in FIGS. 48 to 51.

In other words, in FIGS. 48 to 51, a coordinate of a signal point corresponding to the symbol y(k+b) in the range of symbols y(b) to y(2b−1) is represented as conj(w #k), and a coordinate of a signal point corresponding to the symbol y(k+2b) in the range of symbols y(2b) to y(3b−1) is represented as −conj(w #k).

FIG. 52 is a diagram illustrating examples of coordinates of signal points of 1024QAM-1D-NUC.

In other words, FIG. 52 is a diagram illustrating a relationship between the real part $Re(z_s)$ and the imaginary part $Im(z_s)$ of the complex number as the coordinate of the signal point $z_s$ of 1024QAM-1D-NUC and the (component u #k of) the position vector u.

FIGS. 53A and 53B are diagrams illustrating the relationship between the symbol y of 1024QAM and (the component u #k of) the position vector u in FIG. 52.

In other words, now, it is assumed that the 10-bit symbol y of 1024QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{8,s}$, and $y_{9,s}$.

FIG. 53A illustrates a correspondence between the odd-numbered 5 bits y0,s, y2,s, y4,s, y6,s, y8,s of the 10-bit symbol y, and the position vector u #k representing the real part Re(zs) of (the coordinate of) the signal point zs corresponding to the symbol y.

FIG. 53B illustrates a correspondence between the even-numbered 5 bits y1,s, y3,s, y5,s, y7,s, y9,s of the 10-bit symbol y, and the position vector u #k representing the imaginary part Im(zs) of the signal point zs corresponding to the symbol y.

Since the way of obtaining the coordinate of the signal point zs of when the 10-bit symbol y of 1024QAM is mapped to the signal point zs of 1024QAM-1D-NUC defined in FIGS. 52, 53A, and 53B are similar to the case described in FIGS. 34, 35A, and 35B, description is omitted.

FIG. 54 is a diagram illustrating examples of coordinates of signal points of 4096QAM-1D-NUC.

In other words, FIG. 54 is a diagram illustrating a relationship between the real part $Re(z_s)$ and the imaginary part $Im(z_s)$ of the complex number as the coordinate of the signal point $z_s$ of 4096QAM-1D-NUC and the position vector u (u #k).

FIGS. 55 and 56 are diagrams illustrating the relationship between the symbol y of 4096QAM and (the component u #k of) the position vector u in FIG. 54.

In other words, now, it is assumed that the 12-bit symbol y of 4096QAM is expressed as, from the head bit (most significant bit), $y_{0,s}$, $y_{1,s}$, $y_{2,s}$, $y_{3,s}$, $y_{4,s}$, $y_{5,s}$, $y_{6,s}$, $y_{7,s}$, $y_{9,s}$, $y_{9,s}$, $y_{10,s}$, $y_{11,s}$.

FIG. 55 illustrates a correspondence between the odd-numbered 6 bits $y_{0,s}$, $y_{2,s}$, $y_{4,s}$, $y_{6,s}$, $y_{8,s}$, $y_{10,s}$ of the 12-bit symbol y, and the position vector u #k representing the real part $Re(z_s)$ of the signal point $z_s$ corresponding to the symbol y.

FIG. 56 illustrates a correspondence between the even-numbered 6 bits $y_{1,s}$, $y_{3,s}$, $y_{5,s}$, $y_{7,s}$, $y_{9,s}$, $y_{11,s}$ of the 12-bit symbol y, and the position vector u #k representing the imaginary part $Im(z_s)$ of the signal point $z_s$ corresponding to the symbol y.

Since the way of obtaining the coordinate of the signal point $z_s$ of when the 12-bit symbol y of 4096QAM is mapped to the signal point $z_s$ of 4096QAM-1D-NUC defined in FIGS. 54 to 56 is similar to the case described in FIGS. 34 and 35, description is omitted.

Note that average power of the signal points on the constellation can be normalized in transmission of (data mapped to) the signal points of the NUCs in FIGS. 48, 49, 50, 51, 52, 53A, 53B, 54, 55, and 56. Normalization can be performed by, where the root mean square of absolute values of all (the coordinates of) the signal points on the constellation is Pave, multiplying each signal point zs on the constellation by a reciprocal 1/(√Pave) of the square root √Pave of the root mean square value Pave. In FIGS. 35A and 35B described above, the odd-numbered bits of the symbol y are associated with the position vector u #k representing the imaginary part Im(zs) of the signal point zs and the even-numbered bits of the symbol y are associated with the position vector u #k representing the real part Re(zs) of the signal point zs. In FIGS. 53A and 53B, and FIGS. 55 and 56, conversely, the odd-numbered bits of the symbol y are associated with the position vector u #k representing the real part Re(zs) of the signal point zs and the even-numbered bits of the symbol y are associated with the position vector u #k representing the imaginary part Im(zs) of the signal point zs.

<Block Interleaver 25>

Figure 57:
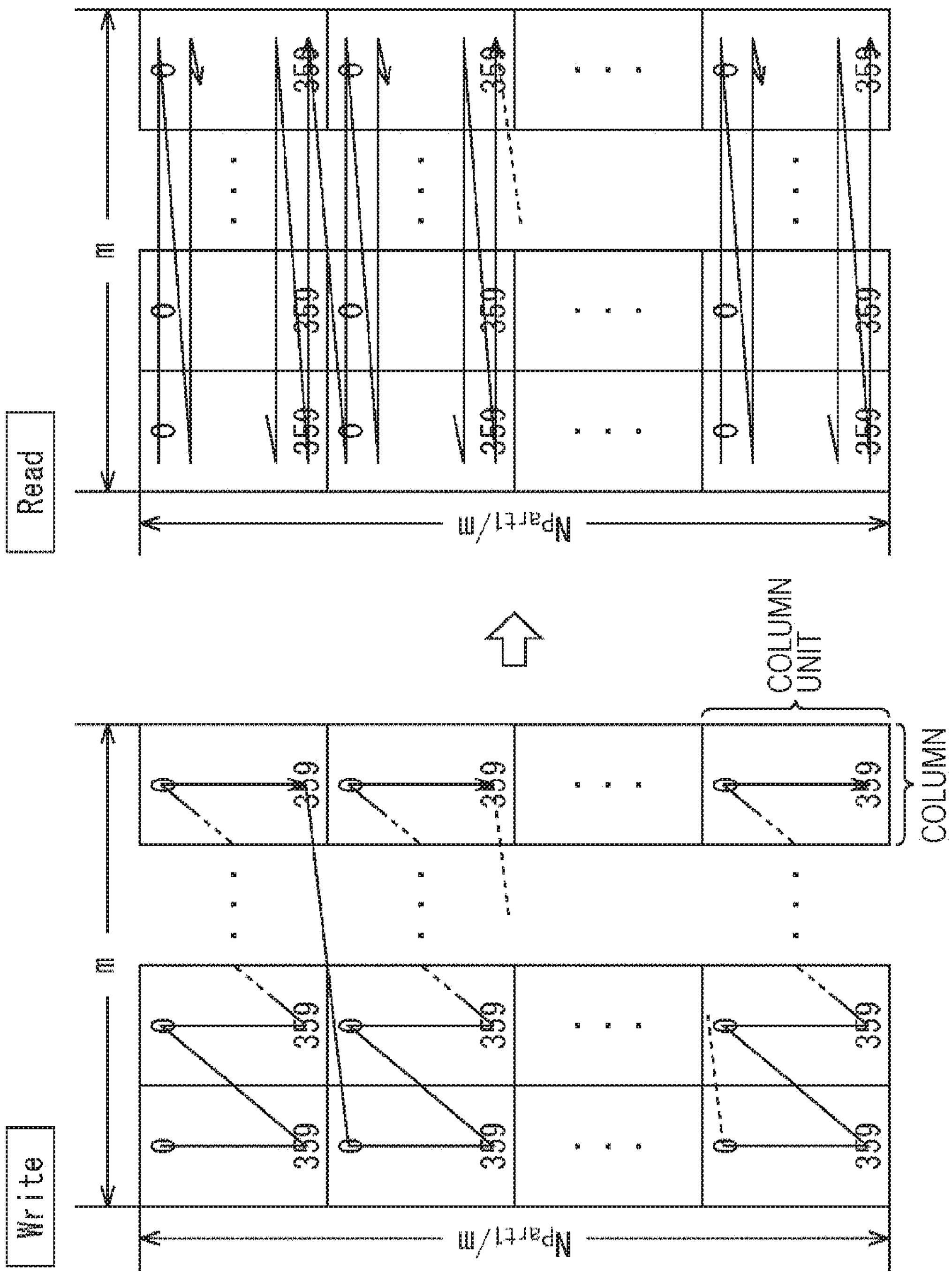
FIG. 57 is a diagram for describing block interleaving performed by a block interleaver 25.

FIG. 57 is a diagram for describing block interleaving performed by the block interleaver 25 in FIG. 9.

The block interleaving is performed by dividing the LDPC code of one codeword into a part called part 1 and a part called part 2 from the head of the LDPC code.

Npart 1+Npart 2 is equal to the code length N, where the length (bit length) of part 1 is Npart 1 and the length of part 2 is Npart 2.

Conceptually, in the block interleaving, columns as storage regions each storing Npart1/m bits in a column (vertical) direction as one direction are arranged in a row direction orthogonal to the column direction by the number m equal to the bit length m of the symbol, and each column is divided from the top into a small unit of 360 bits that is the parallel factor P. This small unit of column is also called column unit.

In the block interleaving, as illustrated in FIG. 57, writing of part 1 of the LDPC code of one codeword downward (in the column direction) from the top of the first column unit of the column is performed in the columns from left to right direction.

Then, when the writing to the first column unit of the rightmost column is completed, the writing returns to the leftmost column, and writing downward from the top of the second column unit of the column is performed in the columns from the left to right direction, as illustrated in FIG. 57. Hereinafter, writing of part 1 of the LDPC code of one codeword is similarly performed.

When the writing of part 1 of the LDPC code of one codeword is completed, part 1 of the LDPC code is read in units of m bits in the row direction from the first column of all the m columns, as illustrated in FIG. 57.

The unit of m bits of part 1 is supplied from the block interleaver 25 to the mapper 117 (FIG. 8) as the m-bit symbol.

The reading of part 1 in units of m bits is sequentially performed toward lower rows of the m columns. When the reading of part 1 is completed, part 2 is divided into units of m bits from the top and is supplied from the block interleaver 25 to the mapper 117 as the m-bit symbol.

Therefore, part 1 is symbolized while being interleaved, and part 2 is sequentially dividing into m bits and symbolized without being interleaved.

Npart1/m as the length of the column is a multiple of 360 as the parallel factor P, and the LDPC code of one codeword is divided into part 1 and part 2 so that Npart1/m becomes a multiple of 360.

FIG. 58 is a diagram illustrating examples of part 1 and part 2 of the LDPC code with the code length N of 69120 bits in the case where the modulation method is QPSK, 16QAM, 64QAM, 256QAM, 1024QAM, and 4096QAM.

In FIG. 58, part 1 is 68400 bits and part 2 is 720 bits in the case where the modulation method is 1024QAM, and part 1 is 69120 bits and part 2 is 0 bits in the cases where the modulation methods are QPSK, 16QAM, 64QAM, 256QAM, and 4096QAM. The number of columns required for block interleaving is equal to the number of bits m of the symbol.

<Group-wise Interleaving>

Figure 59:
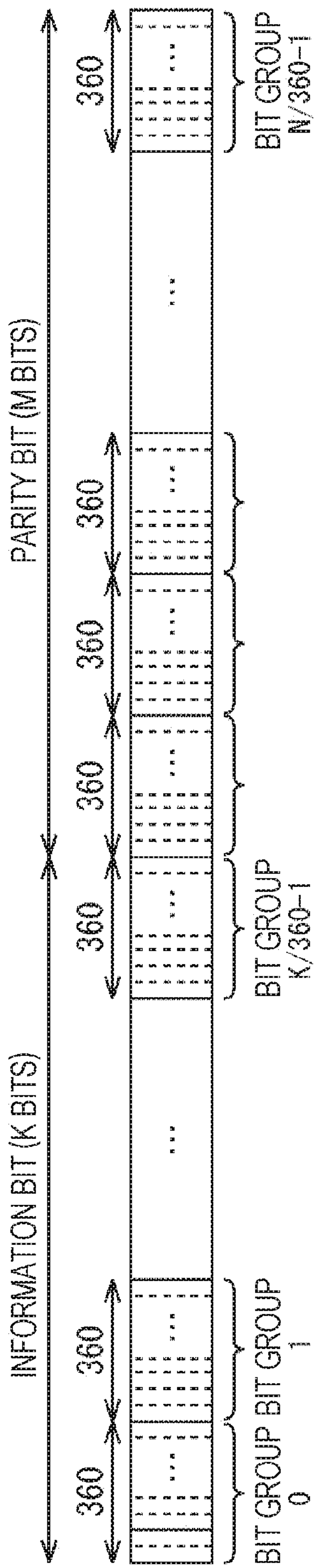
FIG. 59 is a diagram for describing group-wise interleaving performed by a group-wise interleaver 24.

FIG. 59 is a diagram for describing group-wise interleaving performed by the group-wise interleaver 24 in FIG. 9.

In the group-wise interleaving, as illustrated in FIG. 59, the LDPC code of one codeword is interleaved in units of bit groups according to a predetermined pattern (hereinafter also referred to as GW pattern) where one section of 360 bits is set as a bit group, the one section of 360 bits being obtained by dividing the LDPC code of one code into units of 360 bits, the unit being equal to the parallel factor P, from the head of the LDPC code.

Here, the (i+1)th bit group from the head of when the LDPC code of one codeword is divided into bit groups is hereinafter also described as bit group i.

In a case where the parallel factor P is 360, for example, an LDPC code with the code length N of 1800 bits is divided into 5 (=1800/360) bit groups of bit groups 0, 1, 2, 3, and 4. Moreover, for example, an LDPC code with the code length N of 69120 bits is divided into 192 (=69120/360) bit groups of the bit groups 0, 1, . . . , 191.

Furthermore, hereinafter, the GW pattern is represented by a sequence of numbers representing a bit group. For example, regarding the LDPC code with the code length N of 1,800 bits, GW patterns 4, 2, 0, 3, and 1 indicate interleaving (rearranging) arrangement of the bit groups 0, 1, 2, 3, and 4 into arrangement of the bit groups 4, 2, 0, 3, and 1.

For example, now, it is assumed that the (i+1)th code bit from the head of the LDPC code with the code length N of 1800 bits is represented by $x_i$.

In this case, according to the group-wise interleaving of the GW patterns 4, 2, 0, 3, and 1, the 1800-bit LDPC code $\{x_0, x_1, \ldots, x_{1799}\}$ is interleaved in arrangement of $\{x_{1440}, x_{1441}, \ldots, x_{1799}\}$ $\{x_{720}, x_{721}, \ldots x_{1079}\}$ $\{x_0, x_1, \ldots, x_{359}\}$ $\{x_{1080}, x_{1081}, \ldots x_{1439}\}$, and $\{x_{360}, x_{361}, \ldots, x_{719}\}$.

The GW pattern can be set for each code length N of the LDPC code, each coding rate r, each modulation method, each constellation, or each combination of two or more of the code length N, the coding rate r, the modulation method, and the constellation.

Example of GW Pattern for LDPC Code

FIG. 60 is a diagram illustrating an example of the GW pattern for the LDPC code with the code length N of 69120 bits.

According to the GW pattern in FIG. 60, a sequence of bit groups 0 to 191 of the 69120-bit LDPC code is interleaved into a sequence of bit groups 12, 8, 132, 26, 3, 18, 19, 98, 37, 190, 123, 81, 95, 167, 76, 66, 27, 46, 105, 28, 29, 170, 20, 96, 35, 177, 24, 86, 114, 63, 52, 80, 119, 153, 121, 107, 97, 129, 57, 38, 15, 91, 122, 14, 104, 175, 150, 1, 124, 72, 90, 32, 161, 78, 44, 73, 134, 162, 5, 11, 179, 93, 6, 152, 180, 68, 36, 103, 160, 100, 138, 146, 9, 82, 187, 147, 7, 87, 17, 102, 69, 110, 130, 42, 16, 71, 2, 169, 58, 33, 136, 106, 140, 84, 79, 143, 156, 139, 55, 116, 4, 21, 144, 64, 70, 158, 48, 118, 184, 50, 181, 120, 174, 133, 115, 53, 127, 74, 25, 49, 88, 22, 89, 34, 126, 61, 94, 172, 131, 39, 99, 183, 163, 111, 155, 51, 191, 31, 128, 149, 56, 85, 109, 10, 151, 188, 40, 83, 41, 47, 178, 186, 43, 54, 164, 13, 142, 117, 92, 113, 182, 168, 165, 101, 171, 159, 60, 166, 77, 30, 67, 23, 0, 65, 141, 185, 112, 145, 135, 108, 176, 45, 148, 137, 125, 62, 75, 189, 59, 173, 154, 157.

Configuration Example of Reception Device 12

Figure 61:
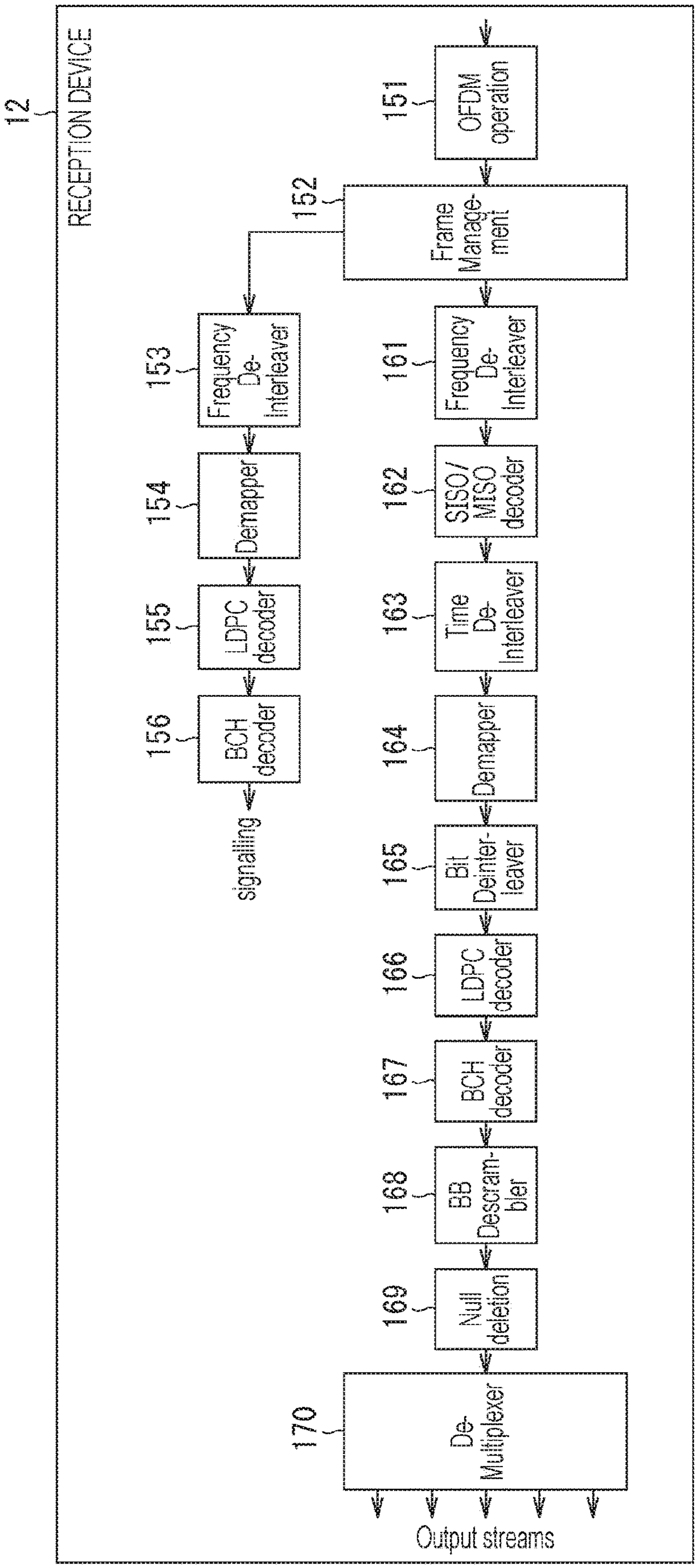
FIG. 61 is a block diagram illustrating a configuration example of a reception device 12.

FIG. 61 is a block diagram illustrating a configuration example of the reception device 12 in FIG. 7.

An OFDM processing unit (OFDM operation) 151 receives an OFDM signal from the transmission device 11 (FIG. 7) and performs signal processing for the OFDM signal. Data obtained by performing the signal processing by the OFDM processing unit 151 is supplied to a frame management unit 152.

The frame management unit 152 processes (interprets) a frame configured by the data supplied from the OFDM processing unit 151, and supplies a signal of resulting target data and a signal of control data to frequency deinterleavers 161 and 153, respectively.

The frequency deinterleaver 153 performs frequency deinterleaving for the data from the frame management unit 152 in units of symbols, and supplies the data to a demapper 154.

The demapper 154 performs demapping (signal point arrangement decoding) and quadrature demodulation for the data (data on the constellation) from the frequency deinterleaver 153 on the basis of arrangement (constellation) of the signal points determined by the quadrature modulation performed on the transmission device 11 side, and supplies resulting data ((likelihood) of the LDPC code) to an LDPC decoder 155.

The LDPC decoder 155 performs LDPC decoding for the LDPC code from the demapper 154, and supplies resulting LDPC target data (here, BCH code) to a BCH decoder 156.

The BCH decoder 156 performs BCH decoding for the LDPC target data from the LDPC decoder 155, and outputs resulting control data (signaling).

Meanwhile, the frequency deinterleaver 161 performs frequency deinterleaving in units of symbols for the data from the frame management unit 152, and supplies the data to an SISO/MISO decoder 162.

The SISO/MISO decoder 162 performs space-time decoding of the data from the frequency deinterleaver 161 and supplies the data to a time deinterleaver 163.

The time deinterleaver 163 deinterleaver the data from the SISO/MISO decoder 162 in units of symbols and supplies the data to a demapper 164.

The demapper 164 performs demapping (signal point arrangement decoding) and quadrature demodulation for the data (data on the constellation) from the time deinterleaver 163 on the basis of arrangement (constellation) of the signal points determined by the quadrature modulation performed on the transmission device 11 side, and supplies resulting data to a bit deinterleaver 165.

The bit deinterleaver 165 performs bit deinterleaving for the data from the demapper 164, and supplies (likelihood of) the LDPC code that is data after the bit deinterleaving to the LDPC decoder 166.

The LDPC decoder 166 performs LDPC decoding for the LDPC code from the bit deinterleaver 165, and supplies resulting LDPC target data (here, the BCH code) to a BCH decoder 167.

The BCH decoder 167 performs BCH decoding for the LDPC target data from the LDPC decoder 155, and supplies resulting data to a BB descrambler 168.

The BB descrambler 168 applies BB descrambling to the data from the BCH decoder 167, and supplies resulting data to a null deletion unit 169.

The null deletion unit 169 deletes the null inserted by the padder 112 in FIG. 8 from the data from the BB descrambler 168, and supplies the data to the demultiplexer 170.

The demultiplexer 170 demultiplexes each of one or more streams (target data) multiplexed into the data from the null deletion unit 169, applies necessary processing, and outputs a result as an output stream.

Note that the reception device 12 can be configured without including a part of the blocks illustrated in FIG. 61. In other words, in a case where the transmission device 11 (FIG. 8) is configured without including the time interleaver 118, the SISO/MISO encoder 119, the frequency interleaver 120, and the frequency interleaver 124, for example, the reception device 12 can be configured without including the time deinterleaver 163, the SISO/MISO decoder 162, the frequency deinterleaver 161, and the frequency deinterleaver 153 that are blocks respectively corresponding to the time interleaver 118, the SISO/MISO encoder 119, the frequency interleaver 120, and the frequency interleaver 124 of the transmission device 11.

Configuration Example of Bit DeInterleaver 165

Figure 62:
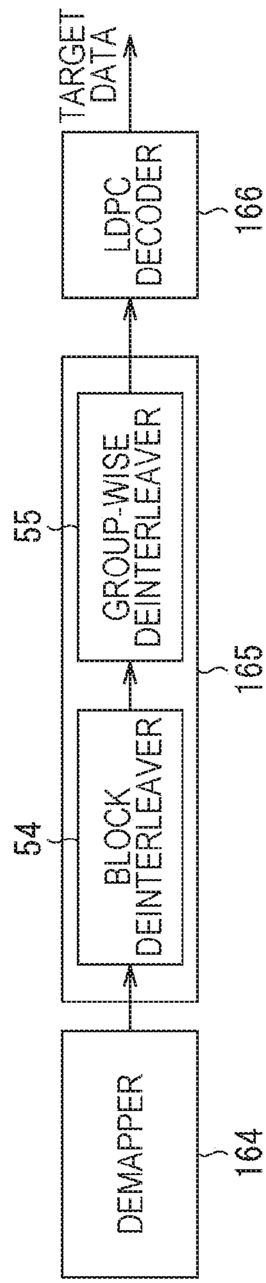
FIG. 62 is a block diagram illustrating a configuration example of a bit deinterleaver 165.

FIG. 62 is a block diagram illustrating a configuration example of the bit deinterleaver 165 in FIG. 61.

The bit deinterleaver 165 is configured by a block deinterleaver 54 and a group-wise deinterleaver 55, and performs (bit) deinterleaving of the symbol bit of the symbol that is the data from the demapper 164 (FIG. 61).

In other words, the block deinterleaver 54 performs, for the symbol bit of the symbol from demapper 164, block deinterleaving corresponding to the block interleaving performed by the block interleaver 25 in FIG. 9 (processing reverse to the block interleaving), in other words, block deinterleaving of returning the positions of (the likelihood of) the code bits of the LDPC code rearranged by the block interleaving to the original positions, and supplies a resulting LDPC code to the group-wise deinterleaver 55.

The group-wise deinterleaver 55 performs, for example, for the LDPC code from the block deinterleaver 54, group-wise deinterleaving corresponding to the group-wise interleaving performed by the group-wise interleaver 24 in FIG. 9 (processing reverse to the group-wise interleaving), in other words, group-wise deinterleaving of rearranging, in units of bit groups, the code bits of the LDPC code changed in arrangement in units of bit groups by the group-wise interleaving described in FIG. 59 to restore the original arrangement.

Here, in a case where the parity interleaving, the group-wise interleaving, and the block interleaving have been applied to the LDPC code to be supplied from the demapper 164 to the bit deinterleaver 165, the bit deinterleaver 165 can perform all of parity deinterleaving corresponding to the parity interleaving (processing reverse to the parity interleaving, in other words, parity deinterleaving of returning the code bits of the LDPC code changed in arrangement by the parity interleaving to the original arrangement), the block deinterleaving corresponding to the block interleaving, and the group-wise deinterleaving corresponding to the group-wise interleaving.

Note that the bit deinterleaver 165 in FIG. 62 is provided with the block deinterleaver 54 for performing the block deinterleaving corresponding to the block interleaving, and the group-wise deinterleaver 55 for performing the group-wise deinterleaving corresponding to the group-wise interleaving, but the bit deinterleaver 165 is not provided with a block for performing the parity deinterleaving corresponding to the parity interleaving and does not perform the parity deinterleaving.

Therefore, the LDPC code for which the block deinterleaving and the group-wise deinterleaving are performed and the parity deinterleaving is not performed is supplied from the (group-wise deinterleaver 55) of the bit deinterleaver 165 to the LDPC decoder 166.

The LDPC decoder 166 performs LDPC decoding for the LDPC code from the bit deinterleaver 165, using a transformed parity check matrix obtained by performing at least column permutation corresponding to the parity interleaving for the parity check matrix H by the type B method used for the LDPC coding by the LDPC encoder 115 in FIG. 8, or a transformed parity check matrix (FIG. 29) obtained by performing row permutation for the parity check matrix (FIG. 27) by the type A method, and outputs resulting data as a decoding result of the LDPC target data.

Figure 63:
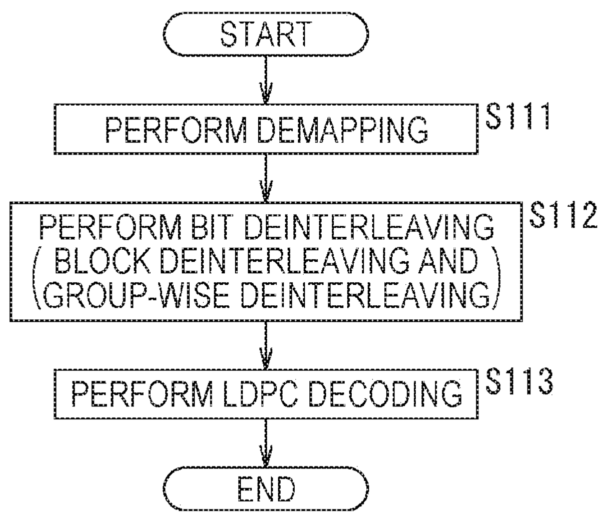
FIG. 63 is a flowchart for describing an example of processing performed by a demapper 164, a bit deinterleaver 165, and an LDPC decoder 166.

FIG. 63 is a flowchart for describing processing performed by the demapper 164, the bit deinterleaver 165, and the LDPC decoder 166 in FIG. 62.

In step S111, the demapper 164 performs demapping and quadrature demodulation for the data (the data on the constellation mapped to the signal points) from the time deinterleaver 163 and supplies the data to the bit deinterleaver 165. The processing proceeds to step S112.

In step S112, the bit deinterleaver 165 performs deinterleaving (bit deinterleaving) for the data from the demapper 164. The process proceeds to step S113.

In other words, in step S112, in the bit deinterleaver 165, the block deinterleaver 54 performs block deinterleaving for the data (symbol) from the demapper 164, and supplies code bits of the resulting LDPC code to the group-wise deinterleaver 55.

The group-wise deinterleaver 55 performs group-wise deinterleaving for the LDPC code from the block deinterleaver 54, and supplies (the likelihood) of the resulting LDPC code to the LDPC decoder 166.

In step S113, the LDPC decoder 166 performs LDPC decoding for the LDPC code from the group-wise deinterleaver 55 using the parity check matrix H used for the LDPC coding by the LDPC encoder 115 in FIG. 8, in other words, the transformed parity check matrix obtained from the parity check matrix H, for example, and supplies resulting data as a decoding result of the LDPC target data to the BCH decoder 167.

Note that, even in FIG. 62, the block deinterleaver 54 for performing the block deinterleaving and the group-wise deinterleaver 55 for performing the group-wise deinterleaving are separately configured, as in the case in FIG. 9, for convenience of description. However, the block deinterleaver 54 and the group-wise deinterleaver 55 can be integrally configured.

Furthermore, in a case where the group-wise interleaving is not performed in the transmission device 11, the reception device 12 can be configured without including the group-wise deinterleaver 55 for performing the group-wise deinterleaving.

<LDPC Decoding>

The LDPC decoding performed by the LDPC decoder 166 in FIG. 61 will be further described.

The LDPC decoder 166 in FIG. 61 performs the LDPC decoding for the LDPC code from the group-wise deinterleaver 55, for which the block deinterleaving and the group-wise deinterleaving have been performed and the parity deinterleaving has not been performed, using the transformed parity check matrix obtained by performing at least column permutation corresponding to the parity interleaving for the parity check matrix H by the type B method used for the LDPC coding by the LDPC encoder 115 in FIG. 8, or the transformed parity check matrix (FIG. 29) obtained by performing row permutation for the parity check matrix (FIG. 27) by the type A method.

Here, LDPC decoding for enabling suppression of a circuit scale and suppression of an operation frequency within a sufficiently feasible range by being performed using a transformed parity check matrix has been previously proposed (for example, see U.S. Pat. No. 4,224,777).

Therefore, first, the LDPC decoding using a transformed parity check matrix, which has been previously proposed, will be described with reference to FIGS. 64 to 67.

Figure 64:
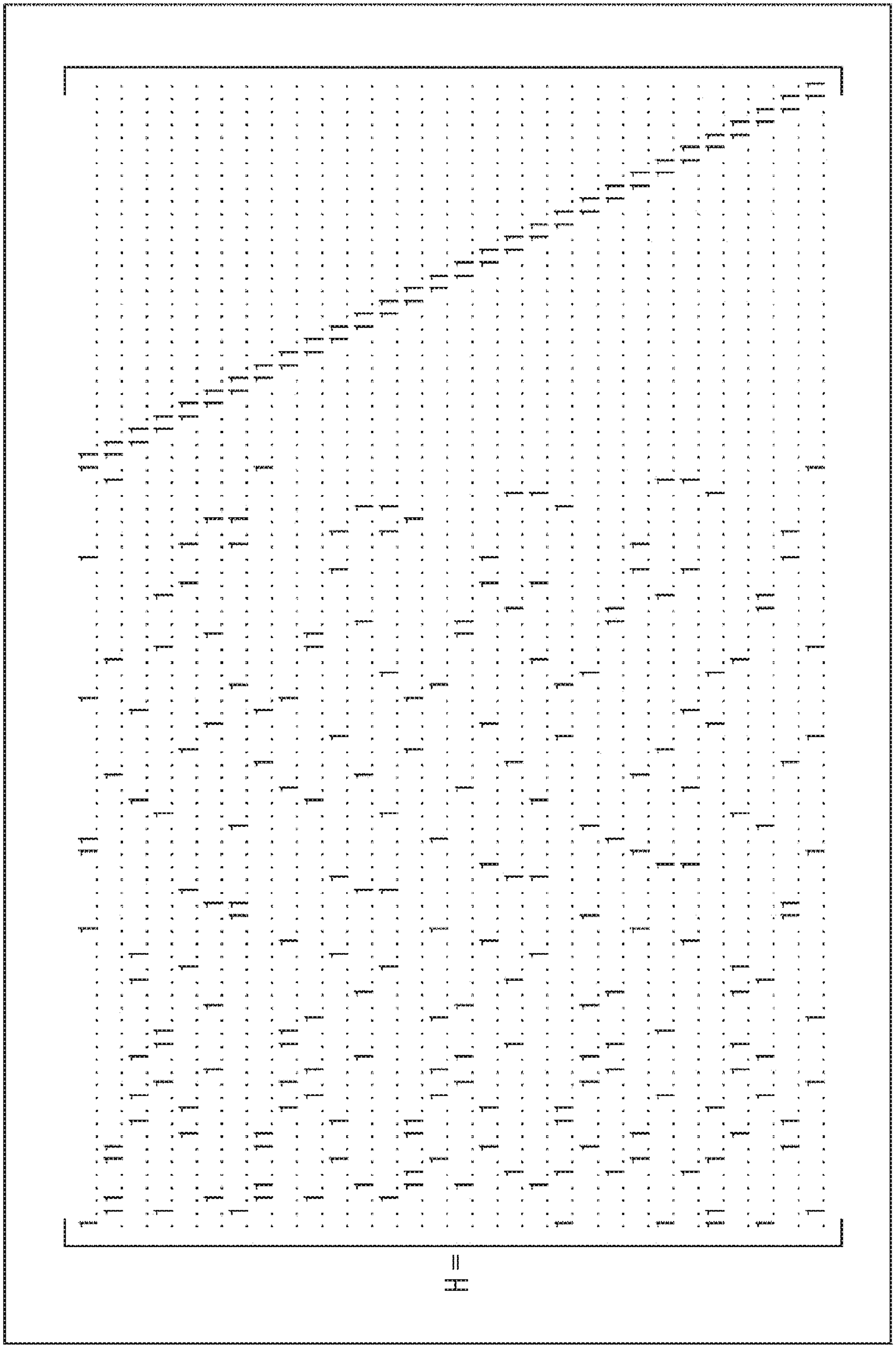
FIG. 64 is a diagram illustrating an example of a parity check matrix of an LDPC code.

FIG. 64 is a diagram illustrating an example of the parity check matrix H of the LDPC code with the code length N of 90 and the coding rate of 2/3.

Note that, in FIG. 64 (similarly performed in FIGS. 65 and 66 described below), 0 is expressed by a period (.).

In the parity check matrix H in FIG. 64, the parity matrix has a step structure.

Figure 65:
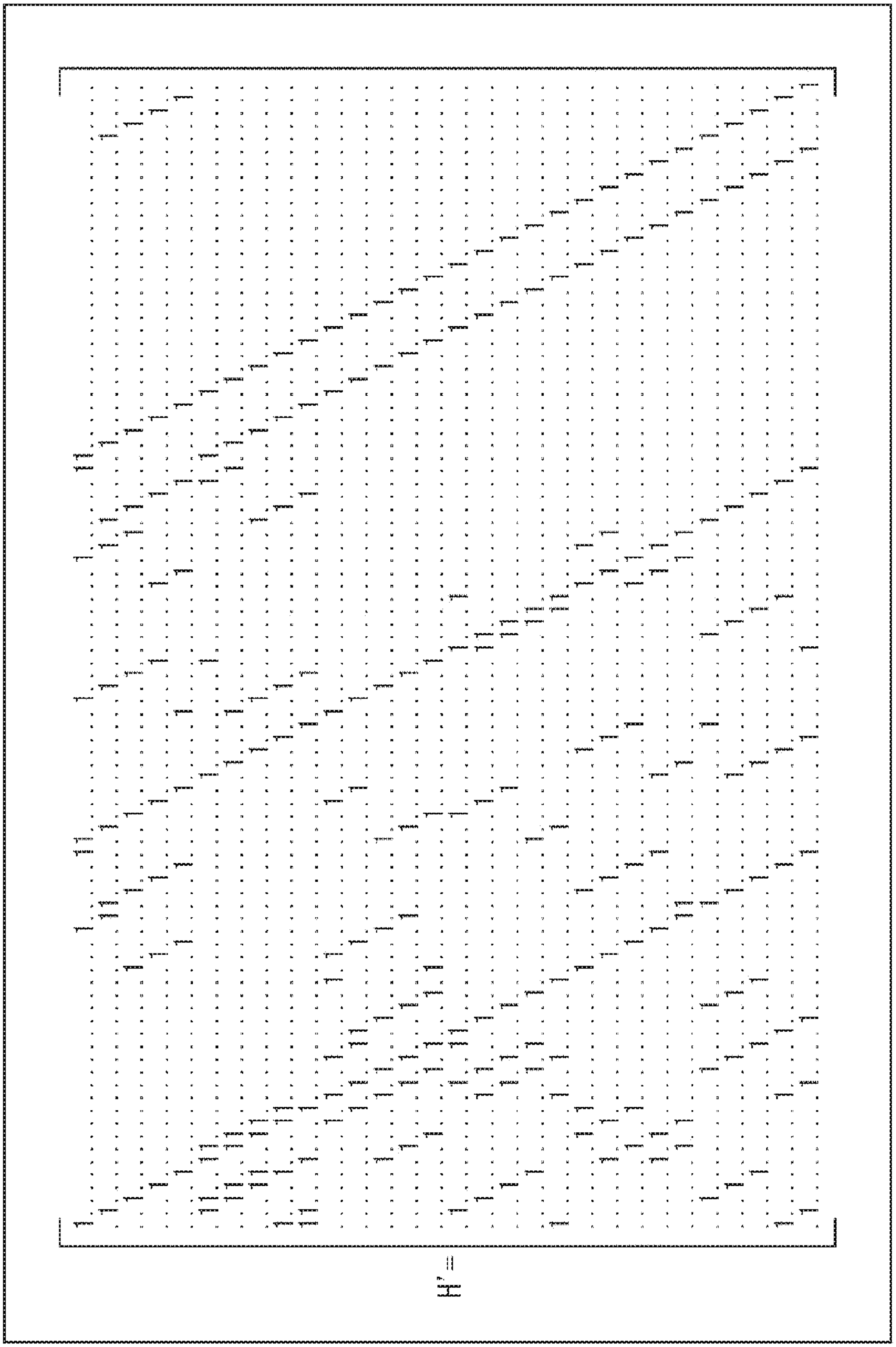
FIG. 65 is a diagram illustrating an example of a matrix (transformed parity check matrix) obtained by applying row permutation and column permutation to a parity check matrix.

FIG. 65 is a diagram illustrating a parity check matrix H' obtained by applying row permutation of the expression (11) and column permutation of the expression (12) to the parity check matrix H in FIG. 64

$$\text{Row permutation: } (6s+t+1)\text{th row} \rightarrow (5t+s+1)\text{th row} \quad (11)$$

$$\text{Column permutation: } (6x+y+61)\text{th column} \rightarrow (5y+x+61)\text{th column} \quad (12)$$

Note that, in the expressions (11) and (12), s, t, x and y are integers in ranges of 0≤s<5, 0≤t<6, 0≤x<5, and 0≤t<6, respectively.

According to the row permutation of the expression (11), permutation is performed in such a manner that the 1, 7, 13, 19, 19 and 25th rows where the remainder becomes 1 when being divided by 6 are respectively permutated to the 1, 2, 3, 4, and 5th rows, and the 2, 8, 14, 20, and 26th rows where the remainder becomes 2 when being divided by 6 are respectively permutated to the 6, 7, 8, 9, and 10th rows.

Furthermore, according to the column permutation of the expression (12), permutation is performed for the 61st and subsequent columns (parity matrix) in such a manner that the 61, 67, 73, 79, and 85th columns where the remainder becomes 1 when being divided by 6 are respectively permutated to the 61, 62, 63, 64, and 65, and the 62, 68, 74, 80, and 86th columns where the remainder becomes 2 when being divided by 6 are respectively permutated to the 66, 67, 68, 69, and 70th columns.

A matrix obtained by performing the row and column permutation for the parity check matrix H in FIG. 64 is the parity check matrix H' in FIG. 65.

Here, the row permutation of the parity check matrix H does not affect the arrangement of the code bits of the LDPC code.

Furthermore, the column permutation of the expression (12) corresponds to parity interleaving with the information length K of 60, the parallel factor P of 5, and the divisor q (=M/P) of the parity length M (30 here) of 6, of the parity interleaving of interleaving the position of the (K+Py+x+1)th code bit with the (K+qx+y+1)th code bit.

Therefore, the parity check matrix H' in FIG. 65 is a transformed parity check matrix obtained by performing at least the column permutation of permutating the (K+qx+y+1)th column to the (K+Py+x+1)th column, of the parity check matrix (hereinafter referred to as original parity check matrix as appropriate) H in FIG. 64.

When multiplying the transformed parity check matrix H' in FIG. 65 by a resultant obtained by performing the same permutation as the expression (12) for the LDPC code of the original parity check matrix H in FIG. 64, a 0 vector is output. In other words, assuming that a row vector obtained by applying the column permutation of the expression (12) to the row vector c as the LDPC code (one codeword) of the original parity check matrix H is represented by c', $H'c'^T$ naturally becomes a 0 vector because $Hc^T$ becomes a 0 vector from the nature of the parity check matrix.

From the above, the transformed parity check matrix H' in FIG. 65 is a parity check matrix of the LDPC code c' obtained by performing the column permutation of the expression (12) for the LDPC code c of the original parity check matrix H.

Therefore, a similar decoding result to the case of decoding the LDPC code of the original parity check matrix H using the parity check matrix H can be obtained by performing the column permutation of the expression (12) for the LDPC code c of the original parity check matrix H, decoding (LDPC decoding) the LDPC code c' after the column permutation using the transformed parity check matrix H' in FIG. 65, and applying reverse permutation to the column permutation of the expression (12) to the decoding result.

Figure 66:
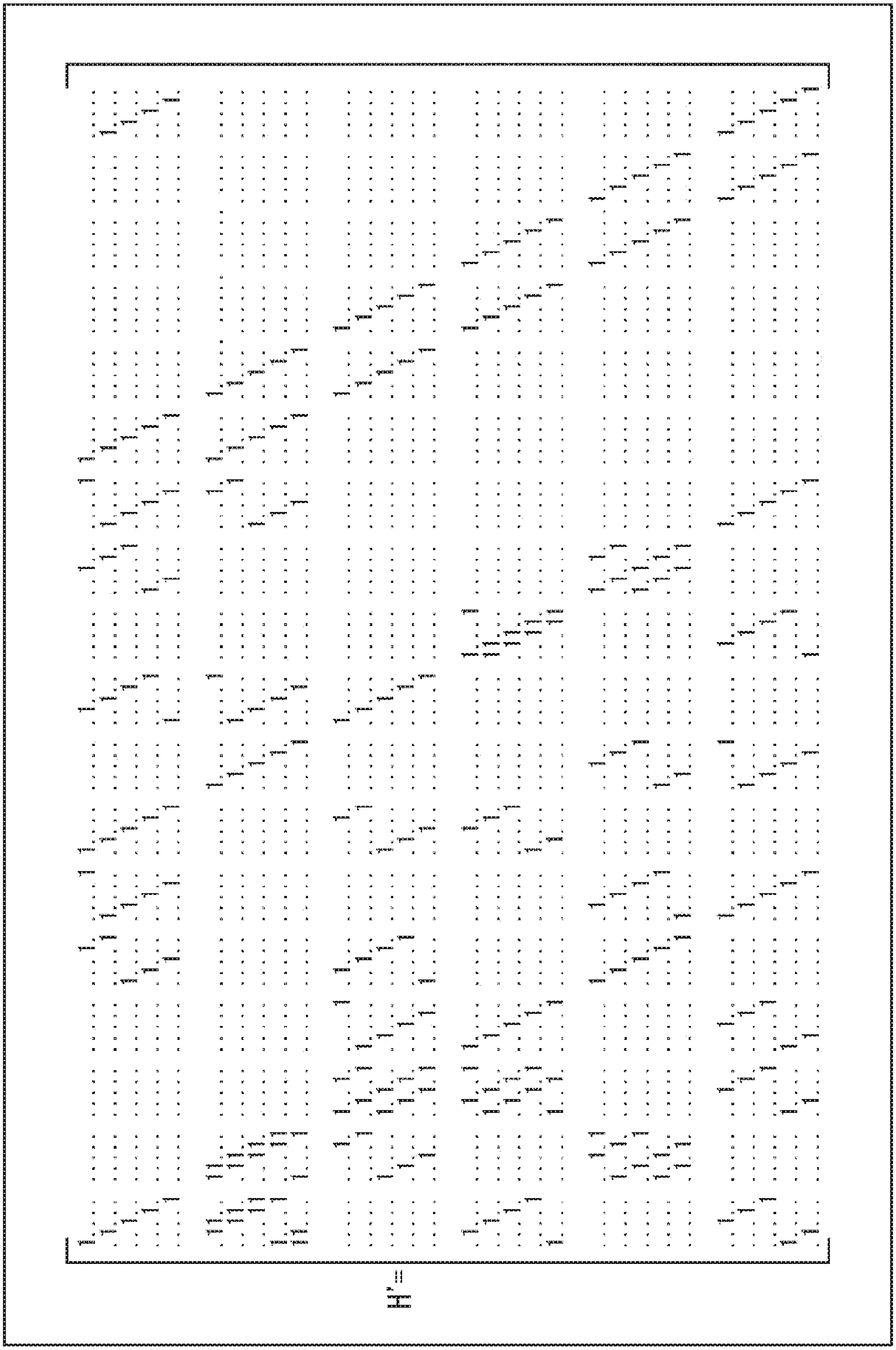
FIG. 66 is a diagram illustrating an example of a transformed parity check matrix divided into 5×5 units.

FIG. 66 is a diagram illustrating the transformed parity check matrix H' in FIG. 65, which is separated in units of 5×5 (5 rows by 5 columns) matrix.

In FIG. 66, the transformed parity check matrix H' is represented by a combination of an identity matrix of 5×5 (=P $x_P$) as the parallel factor P, a matrix where one or more of is in the identity matrix become 0 (hereinafter, the matrix is referred to as quasi identify matrix), a matrix obtained by cyclically shifting the identity matrix or the quasi identify matrix (hereinafter the matrix is referred to as shift matrix as appropriate), and a sum of two or more of the identity matrix, the quasi identify matrix, and the shift matrix (hereinafter, the matrix is referred to as sum matrix as appropriate), and a 5×5 zero matrix.

It can be said that the transformed parity check matrix H' in FIG. 66 is configured by the 5×5 identity matrix, the quasi identity matrix, the shift matrix, the sum matrix, and the 0 matrix. Therefore, these 5×5 matrices (the identity matrix, the quasi identity matrix, the shift matrix, the sum matrix, and the 0 matrix) constituting the transformed parity check matrix H' are hereinafter referred to as configuration matrices as appropriate.

For decoding of an LDPC code of a parity check matrix represented by a P×P configuration matrix, an architecture that simultaneously performs P check node operations and variable node operations can be used.

Figure 67:
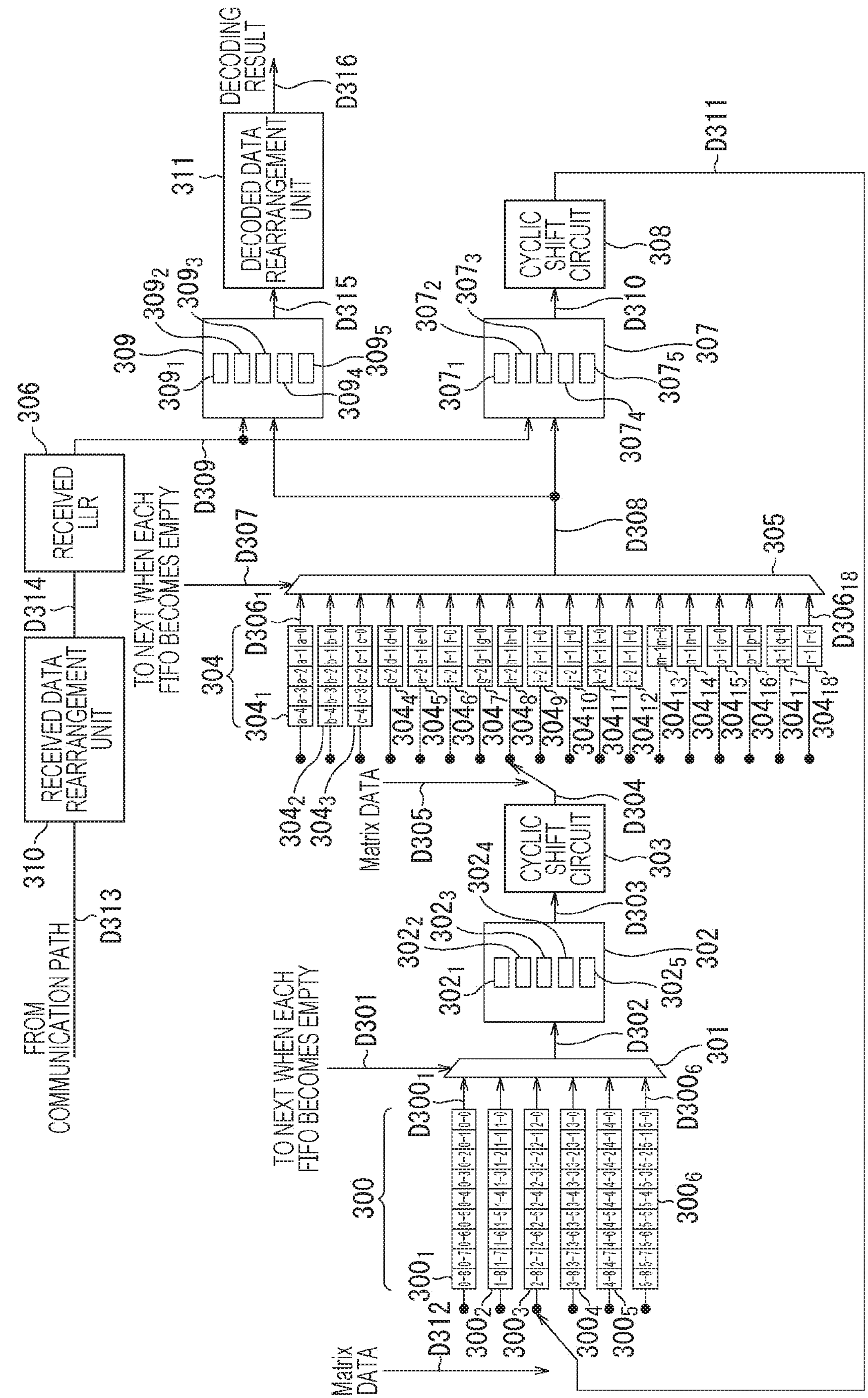
FIG. 67 is a block diagram illustrating a configuration example of a decoding device that collectively performs P node operations.

FIG. 67 is a block diagram illustrating a configuration example of a decoding device that performs such decoding.

In other words, FIG. 67 illustrates a configuration example of a decoding device that decodes the LDPC code using the transformed parity check matrix H' in FIG. 66 obtained by performing at least the column permutation of the expression (12) for the original parity check matrix H in FIG. 64.

The decoding device in FIG. 67 includes an edge data storage memory 300 including six FIFO $\mathbf{300}_1$ to $\mathbf{300}_6$, a selector 301 for selecting the FIFO $\mathbf{300}_1$ to $\mathbf{300}_6$, a check node calculation unit 302, two cyclic shift circuits 303 and 308, an edge data storage memory 304 including eighteen FIFO $\mathbf{304}_1$ to $\mathbf{304}_{18}$, a selector 305 for selecting the FIFO $\mathbf{304}_1$ to $\mathbf{304}_{18}$, a received data memory 306 for storing received data, a variable node calculation unit 307, a decoded word calculation unit 309, a received data rearrangement unit 310, and a decoded data rearrangement unit 311.

First, a method of storing data in the edge data storage memories 300 and 304 will be described.

The edge data storage memory 300 is configured by the six FIFO $\mathbf{300}_1$ to $\mathbf{300}_6$, the six corresponding to a number obtained by dividing the number of rows of 30 of the transformed parity check matrix H' in FIG. 66 by the number of rows (parallel factor P) of 5 of the configuration matrix. The FIFO $\mathbf{300}_y$ (y=1, 2, . . . , 6) includes storage regions of a plurality of stages, and messages corresponding to five edges, the five corresponding to the number of rows and the number of columns (parallel factor P) of the configuration matrix, can be read and write at the same time with respect to the storage regions of the respective stages. Furthermore, the number of stages of the storage regions of the FIFO $\mathbf{300}_y$ is nine that is the maximum value of the number of is (Hamming weights) in the row direction of the transformed parity check matrix in FIG. 66.

In the FIFO $\mathbf{300}_1$, data (message vi from the variable node) corresponding to the positions of 1 of the 1st to 5th rows of the transformed parity check matrix H' in FIG. 66 (a message $v_i$ from the variable node is stored close to each other (ignoring 0) for each row in the cross direction. In other words, data corresponding to the positions of 1 of the 5×5 identity matrix of from (1, 1) to (5, 5) of the transformed parity check matrix H' is stored in the storage region of the first stage of the FIFO $\mathbf{300}_1$, where the j-th row i-th column is represented by (j, i). Data corresponding to the positions of 1 of the shift matrix of from (1, 21) to (5, 25) of the transformed parity check matrix H' (the shift matrix obtained by cyclically shifting the 5×5 identity matrix by only 3 in the right direction) is stored in the storage region of the second stage. Data is stored in association with the transformed parity check matrix H', similarly in the storage regions of the third to eighth stages. Then, data corresponding to the positions of 1 of the shift matrix of from (1, 86) to (5, 90) of the transformed parity check matrix H' (the shift matrix obtained by permutating 1 in the 1st row of the 5×5 identity matrix to 0 and cyclically shifting the identity matrix by only 1 in the left direction) is stored in the storage region of the ninth stage.

Data corresponding to the positions of 1 of from the 6th to 10th rows of the transformed parity check matrix H' in FIG. 66 is stored in the FIFO $\mathbf{300}_2$. In other words, data corresponding to the positions of 1 of a first shift matrix constituting the sum matrix of from (6, 1) to (10, 5) of the transformed parity check matrix H' (the sum matrix that is a sum of the first shift matrix obtained by cyclically shifting the 5×5 identity matrix by 1 to the right and a second shift matrix obtained by cyclically shifting the 5×5 identity matrix by 2 to the right) is stored in the storage region of the first stage of the FIFO $\mathbf{300}_2$. Furthermore, data corresponding to the positions of 1 of the second shift matrix constituting the sum matrix of from (6, 1) to (10, 5) of the transformed parity check matrix H' is stored in the storage region of the second stage.

In other words, in regard to the configuration matrix with the weight of 2 or more, when the configuration matrix is expressed by a form of a sum of some matrices of a P×P identity matrix with the weight of 1, a quasi identity matrix in which one or more of the elements of 1 of the identity matrix are 0, and a shift matrix obtained by cyclically shifting the identity matrix or the quasi identity matrix, the data corresponding to the position of 1 of the identity matrix with the weight of 1, the quasi identity matrix, or the shift matrix is stored in the same address (the same FIFO of FIFOs $\mathbf{300}_1$ to $\mathbf{300}_6$).

Hereinafter, data is stored in association with the transformed parity check matrix H', similarly in the storage regions of the third to ninth stages.

Data are similarly stored in the FIFO $\mathbf{300}_3$ to $\mathbf{300}_6$ in association with the transformed parity check matrix H'.

The edge data storage memory 304 is configured by the eighteen FIFO $\mathbf{304}_1$ to $\mathbf{304}_{18}$, the eighteen corresponding to a number obtained by dividing the number of columns of 90 of the transformed parity check matrix H' by the number of columns (parallel factor P) of 5 of the configuration matrix. The FIFO $\mathbf{304}_x$ (x=1, 2, . . . , 18) includes storage regions of a plurality of stages, and messages corresponding to five edges, the five corresponding to the number of rows and the number of columns (parallel factor P) of the configuration matrix, can be read and written at the same time with respect to the storage regions of the respective stages.

In the FIFO $\mathbf{304}_1$, data (message u from the check node) corresponding to the positions of 1 of the 1st to 5th columns of the transformed parity check matrix H' in FIG. 66 are stored close to each other (ignoring 0) for each column in the vertical direction. In other words, data corresponding to the positions of 1 of the 5×5 identity matrix of from (1, 1) to (5, 5) of the transformed parity check matrix H' is stored in the storage region of the first stage of the FIFO $\mathbf{304}_1$. Data corresponding to the positions of 1 of a first shift matrix constituting the sum matrix of from (6, 1) to (10, 5) of the transformed parity check matrix H' (the sum matrix that is a sum of the first shift matrix obtained by cyclically shifting the 5×5 identity matrix by 1 to the right and a second shift matrix obtained by cyclically shifting the 5×5 identity matrix by 2 to the right) is stored in the storage region of the second stage. Furthermore, data corresponding to the positions of 1 of the second shift matrix constituting the sum matrix of from (6, 1) to (10, 5) of the transformed parity check matrix H' is stored in the storage region of the third stage.

In other words, in regard to the configuration matrix with the weight of 2 or more, when the configuration matrix is expressed by a form of a sum of some matrices of a P×P identity matrix with the weight of 1, a quasi identity matrix in which one or more of the elements of 1 of the identity matrix are 0, and a shift matrix obtained by cyclically shifting the identity matrix or the quasi identity matrix, the data corresponding to the position of 1 of the identity matrix with the weight of 1, the quasi identity matrix, or the shift matrix is stored in the same address (the same FIFO of FIFOs $\mathbf{304}_1$ to $\mathbf{304}_{18}$).

Hereinafter, data is stored in association with the transformed parity check matrix H', similarly in the storage regions of the fourth and fifth stages. The number of stages of the storage regions of the FIFO $304_1$ is five that is the maximum value of the number of is (Hamming weights) in the row direction in the 1st to 5th columns of the transformed parity check matrix H'.

Data is similarly stored in the FIFOs $304_2$ and $304_3$ in association with the transformed parity check matrix H', and respective lengths (stages) are five. Data is similarly stored in the FIFOs $304_4$ to $304_{12}$ in association with the transformed parity check matrix H', and respective lengths are three. Data is similarly stored in the FIFOs $304_{13}$ and $304_{18}$ in association with the transformed parity check matrix H', and respective lengths are two.

Next, the operation of the decoding device in FIG. 67 will be described.

The edge data storage memory 300 includes six FIFOs $300_1$ to $300_6$, and selects FIFO to store data from among the six FIFOs $300_1$ to $300_6$ according to information (matrix data) D312 indicating which row of the transformed parity check matrix H' in FIG. 66 five messages D311 supplied from the previous cyclic shift circuit 308 belong to, and collectively stores the five messages D311 to the selected FIFO in order. Furthermore, in reading data, the edge data storage memory 300 sequentially reads the five messages D$300_1$ from the FIFO $300_1$ and supplies the read messages to the next selector 301. The edge data storage memory 300 sequentially reads the messages from the FIFOs $300_2$ to $300_6$ after completion of the reading of the message from the FIFO $300_1$, and supplies the messages to the selector 301.

The selector 301 selects the five messages from the FIFO currently being read out, of the FIFOs $300_1$ to $300_6$, according to a select signal D301, and supplies the messages as message D302 to the check node calculation unit 302.

The check node calculation unit 302 includes five check node calculators 3021 to 3025, and performs the check node operation according to the expression (7), using the messages D302 (D$302_1$ to D$302_5$) (the messages $v_i$ of the expression (7)) supplied through the selector 301, and supplies five messages D303 (D$303_1$ to D$303_5$) obtained as a result of the check node operation (messages $u_j$ of the expression (7)) to the cyclic shift circuit 303.

The cyclic shift circuit 303 cyclically shifts the five messages D$303_1$ to D$303_5$ obtained by the check node calculation unit 302, on the basis of information (matrix data) D305 indicating how many identity matrices (or quasi identify matrices), which are the basis of the transformed parity check matrix H', have been cyclically shifted for the corresponding edge, and supplies a result as a message D304 to the edge data storage memory 304.

The edge data storage memory 304 includes eighteen FIFOs $304_1$ to $304_{18}$, and selects FIFO to store data from among the FIFOs $304_1$ to $304_{18}$ according to information (matrix data) D305 indicating which row of the transformed parity check matrix H' five messages D304 supplied from the previous cyclic shift circuit 303 belong to, and collectively stores the five messages D304 to the selected FIFO in order. Furthermore, in reading data, the edge data storage memory 304 sequentially reads five messages D$306_1$ from the FIFO $304_1$ and supplies the read messages to the next selector 305. The edge data storage memory 304 sequentially reads the messages from the FIFOs $304_2$ to $304_{18}$ after completion of the reading of the message from the FIFO $304_1$, and supplies the messages to the selector 305.

The selector 305 selects the five messages from the FIFO currently being read out, of the FIFOs $304_1$ to $304_{18}$, according to a select signal D307, and supplies the messages as message D308 to the variable node calculation unit 307 and the decoded word calculation unit 309.

Meanwhile, the received data rearrangement unit 310 rearranges an LDPC code D313 corresponding to the parity check matrix H in FIG. 64, which has been received via the communication path 13, by performing the column permutation of the expression (12), and supplies data as received data D314 to the received data memory 306. The received data memory 306 calculates and stored received LLR (log likelihood ratio) from the received data D314 supplied from the received data rearrangement unit 310, and groups five received LLRs and collectively supplies the five received LLRs as a received value D309 to the variable node calculation unit 307 and the decoded word calculation unit 309.

The variable node calculation unit 307 includes five variable node calculators $\mathbf{307}_1$ to $\mathbf{307}_5$, and performs the variable node operation according to the expression (1), using the messages D308 (D$308_1$ to D$308_5$) (messages $u_j$ of the expression (1)) supplied via the selector 305, and the five received values D309 (received values $u_{0i}$ of the expression (1)) supplied from the received data memory 306, and supplies messages D310 (D$310_1$ to D$310_5$) (messages $v_i$ of the expression (1)) obtained as a result of the operation to the cyclic shift circuit 308.

The cyclic shift circuit 308 cyclically shifts the messages D$310_1$ to D$310_5$ calculated by the variable node calculation unit 307 on the basis of information indicating how many identity matrices (or quasi identify matrices), which are the basis of the transformed parity check matrix H', have been cyclically shifted for the corresponding edge, and supplies a result as a message D311 to the edge data storage memory 300.

By one round of the above operation, one decoding (variable node operation and check node operation) of the LDPC code can be performed. After decoding the LDPC code a predetermined number of times, the decoding device in FIG. 67 obtains and outputs a final decoding result in the decoded word calculation unit 309 and the decoded data rearrangement unit 311.

In other words, the decoded word calculation unit 309 includes five decoded word calculators 3091 to 3095, and calculates, as a final stage of the plurality of times of decoding, the decoding result (decoded word) on the basis of the expression (5), using the five messages D308 (D$308_1$ to D$308_5$) (messages $u_j$ of the expression (5)) output by the selector 305, and the five received values D309 (received values $u_{0i}$ of the expression (5)) supplied from the received data memory 306, and supplies resulting decoded data D315 to the decoded data rearrangement unit 311.

The decoded data rearrangement unit 311 rearranges the decoded data D315 supplied from the decoded word calculation unit 309 by performing reverse permutation to the column permutation of the expression (12), and outputs a final decoding result D316.

As described above, by applying at least one or both of the row permutation and the column permutation to the parity check matrix (original parity check matrix) to transform the parity check matrix into a parity check matrix (transformed parity check matrix) that can be represented by a combination of a P×P identity matrix, a quasi identity matrix in which one or more of is in the identity matrix are 0, a shift matrix obtained by cyclically shifting the identity matrix or the quasi identity, a sum matrix that is a sum of two or more of the identity matrix, the quasi identify matrix, and the shift matrix, and a P×P zero matrix, in other words, by a combination of the configuration matrices, an architecture to perform P check node operations and variable node operations at the same time for decoding of the LDPC code, the P being a number smaller than the number of rows and the number of columns of the parity check matrix, can be adopted. In the case of adopting the architecture to perform P node operations (check node operations and variable node operations) at the same time, the P being the number smaller than the number of rows and the number of columns of the parity check matrix, a large number of repetitive decodings can be performed while suppressing the operation frequency to the feasible range, as compared with a case of performing the number of node operations at the same time, the number being equal to the number of rows and the number of columns of the parity check matrix.

The LDPC decoder 166 constituting the reception device 12 in FIG. 61 performs the LDPC decoding by performing the P check node operations and variable node operations at the same time, for example, similarly to the decoding device in FIG. 67.

In other words, to simplify the description, assuming that the parity check matrix of the LDPC code output by the LDPC encoder 115 constituting the transmission device 11 in FIG. 8 is the parity check matrix H with the parity matrix having a step structure, as illustrated in FIG. 64, for example, the parity interleaver 23 of the transmission device 11 performs the parity interleaving of interleaving the position of the (K+Py+x+1)th code bit with (K+qx+y+1)th code bit with the setting of the information length K of 60, the parallel factor P of 5, the divisor q (=M/P) of the parity length M of 6.

Since this parity interleaving corresponds to the column permutation of the expression (12) as described above, the LDPC decoder 166 does not need to perform the column permutation of the expression (12).

Therefore, the reception device 12 in FIG. 61 performs similar processing to the decoding device in FIG. 67 except that the LDPC code for which the parity deinterleaving has not been performed, in other words, the LDPC code in the state where the column permutation by the expression (12) has been performed, is supplied from the group-wise deinterleaver 55 to the LDPC decoder 166, as described above, and the LDPC decoder 166 does not perform the column permutation of the expression (12).

Figure 68:
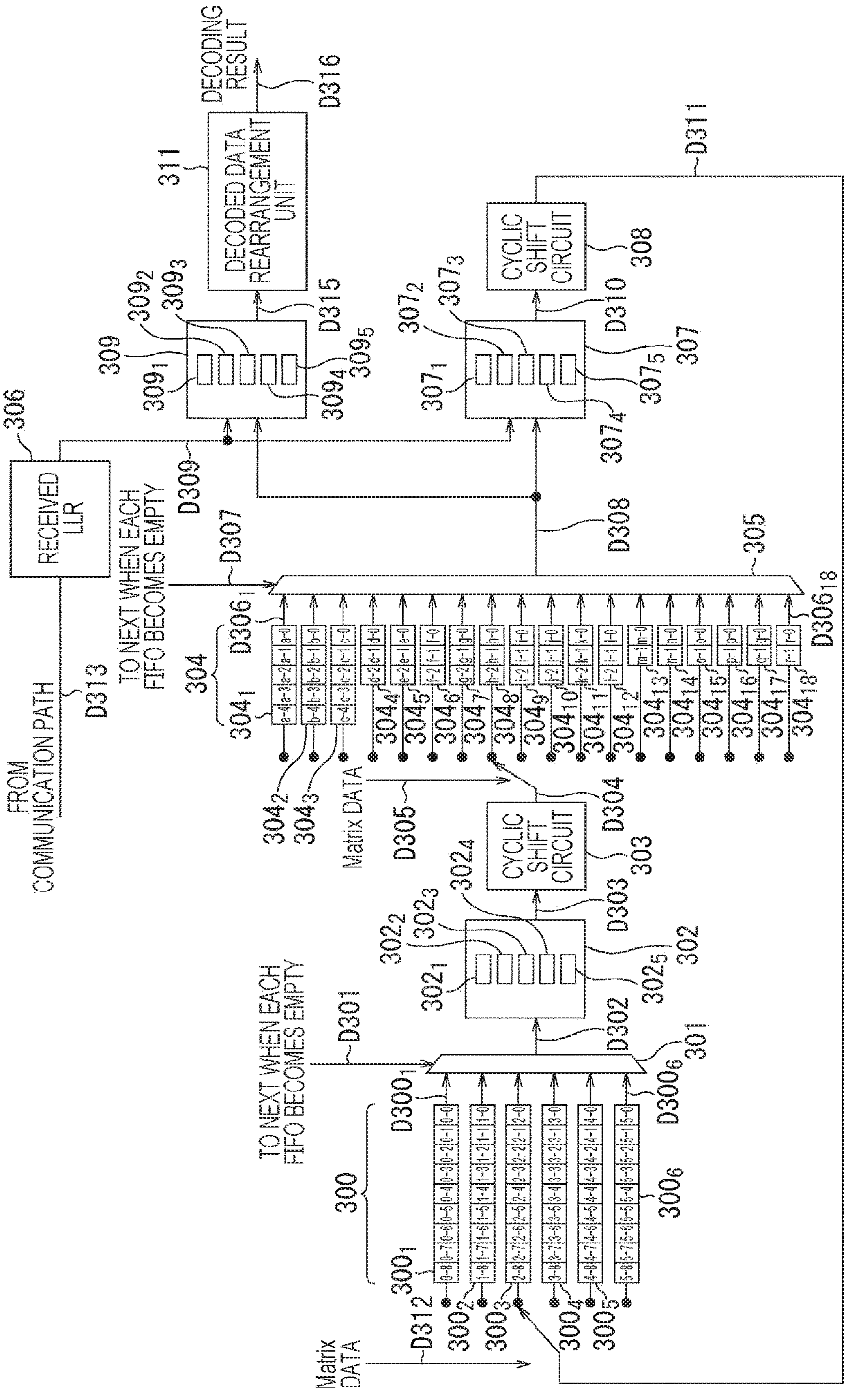
FIG. 68 is a block diagram illustrating a configuration example of the LDPC decoder 166.

In other words, FIG. 68 is a diagram illustrating a configuration example of the LDPC decoder 166 in FIG. 61.

In FIG. 68, the LDPC decoder 166 is similarly configured to the decoding device in FIG. 67 except that the received data rearrangement unit 310 in FIG. 67 is not provided, and performs similar processing to the decoding device in FIG. 67 except that the column permutation of the expression (12) is not performed. Therefore, description is omitted.

As described above, since the LDPC decoder 166 can be configured without including the received data rearrangement unit 310, the scale can be reduced as compared with the decoding device in FIG. 67.

Note that, in FIGS. 64 to 68, to simplify the description, the code length N of 90, the information length K of 60, the parallel factor (the numbers of rows and columns of the configuration matrix) P of 5, and the divisor q (=M/P) of the parity length M of 6 are set for the LDPC code. However, the code length N, the information length K, the parallel factor P, and the divisor q (=M/P) are not limited to the above-described values.

In other words, in the transmission device 11 in FIG. 8, what the LDPC encoder 115 outputs is the LDPC codes with the code lengths N of 64800, 16200, 69120, and the like, the information length K of N−Pq (=N−M), the parallel factor P of 360, and the divisor q of M/P. However, the LDPC decoder 166 in FIG. 68 can be applied to a case of performing the LDPC decoding by performing the P check node operations and variable node operations at the same time for such LDPC codes.

Furthermore, after the decoding of the LDPC code in the LDPC decoder 166, the parity part of the decoding result is unnecessary, and in a case of outputting only the information bits of the decoding result, the LDPC decoder 166 can be configured without the decoded data rearrangement unit 311.

Configuration Example of Block Deinterleaver 54

Figure 69:
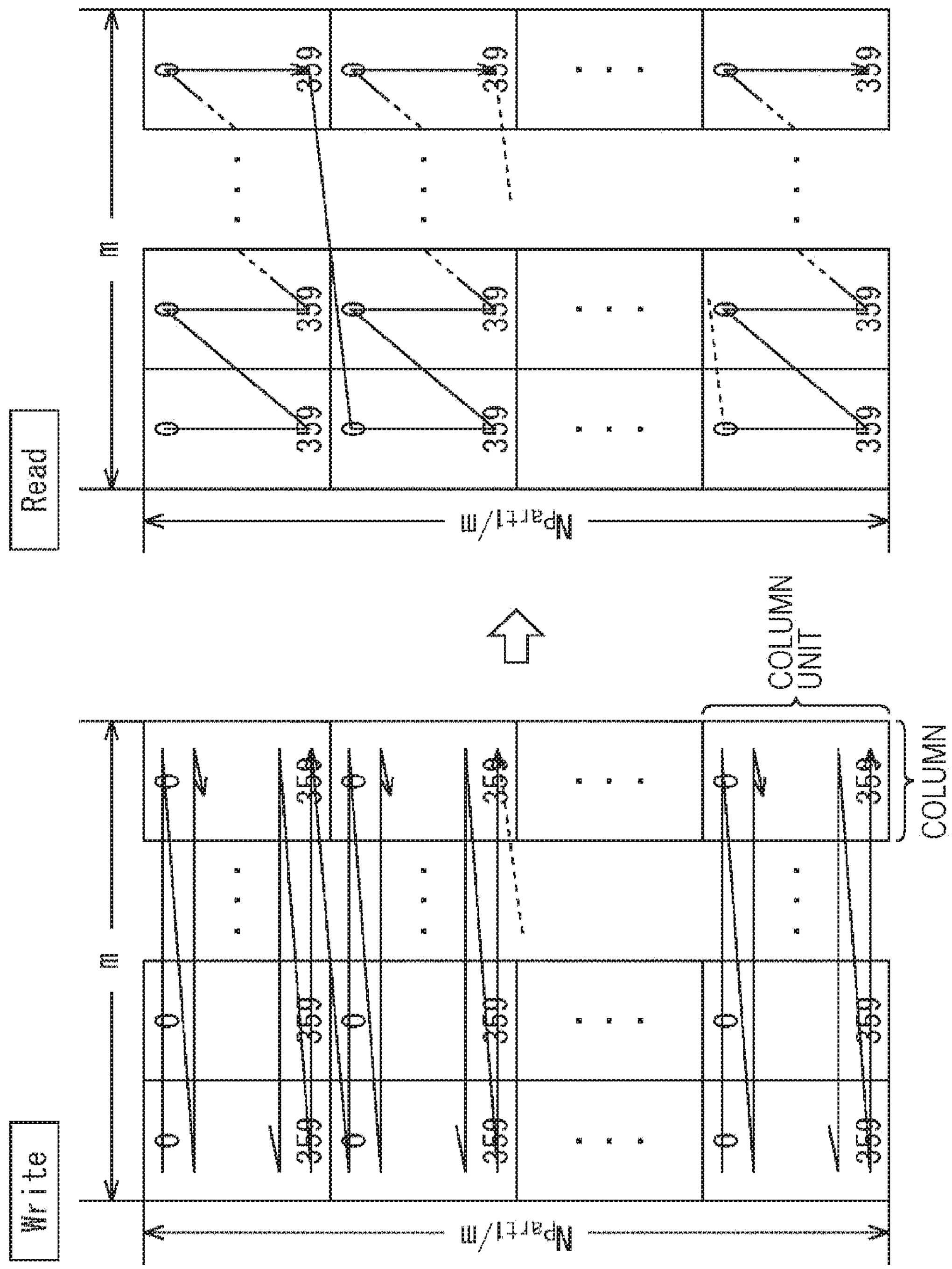
FIG. 69 is a diagram for describing block deinterleaving performed by a block deinterleaver 54.

FIG. 69 is a diagram for describing block deinterleaving performed by the block deinterleaver 54 in FIG. 62.

In the block deinterleaving, reverse processing to the block interleaving by the block interleaver 25 described in FIG. 57 is performed to return (restore) the arrangement of the code bits of the LDPC code to the original arrangement.

In other words, in the block deinterleaving, for example, as in the block interleaving, the LDPC code is written and read with respect to m columns, the m being equal to the bit length m of the symbol, whereby the arrangement of the code bits of the LDPC code is returned to the original arrangement.

Note that, in the block deinterleaving, writing of the LDPC code is performed in the order of reading the LDPC code in the block interleaving. Moreover, in the block deinterleaving, reading of the LDPC code is performed in the order of writing the LDPC code in the block interleaving.

In other words, in regard to part 1 of the LDPC code, part 1 of the LDPC code in units of m-bit symbol is written in the row direction from the 1st row of all the m columns, as illustrated in FIG. 69. In other words, the code bit of the LDPC code, which is the m-bit symbol, is written in the row direction.

Writing of part 1 in units of m bits is sequentially performed toward lower rows of the m columns, and when the writing of part 1 is completed, as illustrated in FIG. 69, reading of part 1 downward from the top of the first column unit of the column is performed in the columns from the left to right direction.

When the reading to the rightmost column is completed, the reading returns to the leftmost column, and reading downward from the top of the second column unit of the column is performed in the columns from the left to right direction, as illustrated in FIG. 69. Hereinafter, reading of part 1 of the LDPC code of one codeword is similarly performed.

When the reading of part 1 of the LDPC code of one codeword is completed, in regard to part 2 in units of m-bit symbols, the units of m-bit symbols are sequentially concatenated after part 1, whereby the LDPC code in units of symbols is returned to the arrangement of code bits of the LDPC code (the LDCP code before block interleaving) of the original one codeword.

Another Configuration Example of Bit Deinterleaver 165

Figure 70:
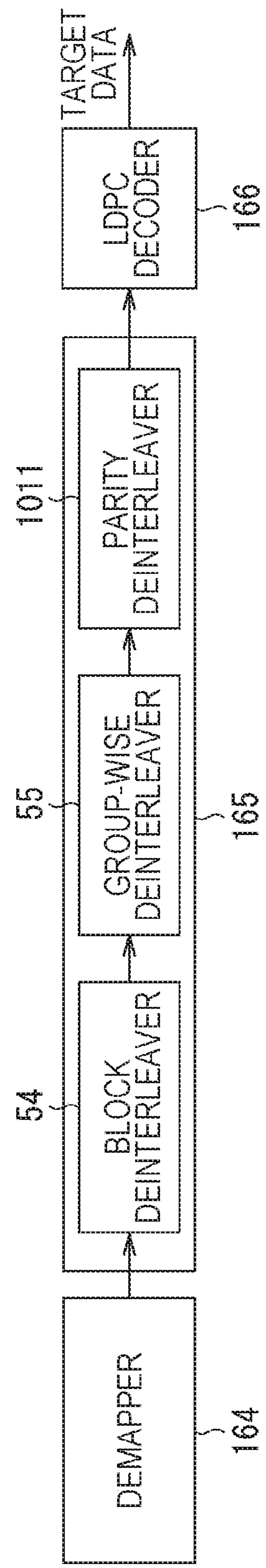
FIG. 70 is a block diagram illustrating another configuration example of the bit deinterleaver 165.

FIG. 70 is a block diagram illustrating another configuration example of the bit deinterleaver 165 in FIG. 61.

Note that, in FIG. 70, parts corresponding to those in FIG. 62 are given the same reference numerals, and hereinafter, description thereof will be omitted as appropriate.

In other words, the bit deinterleaver 165 in FIG. 70 is similarly configured to the case in FIG. 62 except that a parity deinterleaver 1011 is newly provided.

In FIG. 70, the bit deinterleaver 165 includes the block deinterleaver 54, the group-wise deinterleaver 55, and the parity deinterleaver 1011, and performs bit deinterleaving for the code bits of the LDPC code from the demapper 164.

In other words, the block deinterleaver 54 performs, for the LDPC code from demapper 164, block deinterleaving corresponding to the block interleaving performed by the block interleaver 25 of the transmission device 11 (processing reverse to the block interleaving), in other words, block deinterleaving of returning the positions of the code bits rearranged by the block interleaving to the original positions, and supplies a resulting LDPC code to the group-wise deinterleaver 55.

The group-wise deinterleaver 55 performs, for the LDPC code from the block deinterleaver 54, group-wise deinterleaving corresponding to group-wise interleaving as rearrangement processing performed by the group-wise interleaver 24 of the transmission device 11.

The LDPC code obtained as a result of group-wise deinterleaving is supplied from the group-wise deinterleaver 55 to the parity deinterleaver 1011.

The parity deinterleaver 1011 performs, for the bit codes after the group-wise deinterleaving in the group-wise deinterleaver 55, parity deinterleaving corresponding to the parity interleaving performed by the parity interleaver 23 of the transmission device 11 (processing reverse to the parity interleaving), in other words, parity deinterleaving of returning the arrangement of the code bits of the LDPC code changed in arrangement by the parity interleaving to the original arrangement.

The LDPC code obtained as a result of the parity deinterleaving is supplied from the parity deinterleaver 1011 to the LDPC decoder 166.

Therefore, in the bit deinterleaver 165 in FIG. 70, the LDPC code for which the block deinterleaving, group-wise deinterleaving, and the parity deinterleaving have been performed, in other words, the LDPC code obtained by the LDPC coding according to the parity check matrix H, is supplied to the LDPC decoder 166.

The LDPC decoder 166 performs LDPC decoding for the LDPC code from the bit deinterleaver 165 using the parity check matrix H used for the LDPC coding by the LDPC encoder 115 of the transmission device 11.

In other words, in the type B method, the LDPC decoder 166 performs, for the LDPC code from the bit deinterleaver 165, the LDPC decoding using the parity check matrix H itself (of the type B method) used for the LDPC coding by the LDPC encoder 115 of the transmission device 11 or using the transformed parity check matrix obtained by performing at least column permutation corresponding to the parity interleaving for the parity check matrix H. Furthermore, in the type A method, the LDPC decoder 166 performs, for the LDPC code from the bit deinterleaver 165, the LDPC decoding using the parity check matrix (FIG. 28) obtained by applying column permutation to the parity check matrix (FIG. 27) (of the type A method) used for the LDPC coding by the LDPC encoder 115 of the transmission device 11 or using the transformed parity check matrix (FIG. 29) obtained by applying row permutation to the parity check matrix (FIG. 27) used for the LDPC coding.

Here, in FIG. 70, since the LDPC code obtained by LDPC coding according to the parity check matrix H is supplied from (the parity deinterleaver 1011 of) the bit deinterleaver 165 to the LDPC decoder 166, in a case of performing LDPC decoding of the LDPC code using the parity check matrix H itself by the type B method used for the LDPC coding by the LDPC encoder 115 of the transmission device 11 or using the parity check matrix (FIG. 28) obtained by applying column permutation to the parity check matrix (FIG. 27) by the type A method used for the LDPC coding, the LDPC decoder 166 can be configured as a decoding device for performing LDPC decoding by a full serial decoding method in which operations of messages (a check node message and a variable node message) are sequentially performed for one node at a time or a decoding device for performing LDPC decoding by a full parallel decoding method in which operations of messages are performed simultaneously (parallelly) for all nodes.

Furthermore, in the LDPC decoder 166, in a case of performing LDPC decoding of the LDPC code using the transformed parity check matrix obtained by applying at least column permutation corresponding to the parity interleaving to the parity check matrix H by the type B method used for the LDPC coding by the LDPC encoder 115 of the transmission device 11 or using the transformed parity check matrix (FIG. 29) obtained by applying row permutation to the parity check matrix (FIG. 27) by the type A method used for the LDPC coding, the LDPC decoder 166 can be configured as an architecture decoding device for simultaneously performing the check node operation and the variable node operation for P nodes (or divisors of P other than 1), the architecture decoding device being also a decoding device (FIG. 67) including the received data rearrangement unit 310 for rearranging the code bits of the LDPC code by applying column permutation similar to the column permutation (parity interleaving) for obtaining the transformed parity check matrix to the LDPC code.

Note that, in FIG. 70, for convenience of description, the block deinterleaver 54 for performing block deinterleaving, the group-wise deinterleaver 55 for performing group-wise deinterleaving, and the parity deinterleaver 1011 for performing parity deinterleaving are separately configured. However, two or more of the block deinterleaver 54, the group-wise deinterleaver 55, and the parity deinterleaver 1011 can be integrally configured similarly to the parity interleaver 23, the group-wise interleaver 24, and the block interleaver 25 of the transmission device 11.

Configuration Example of Reception System

Figure 71:
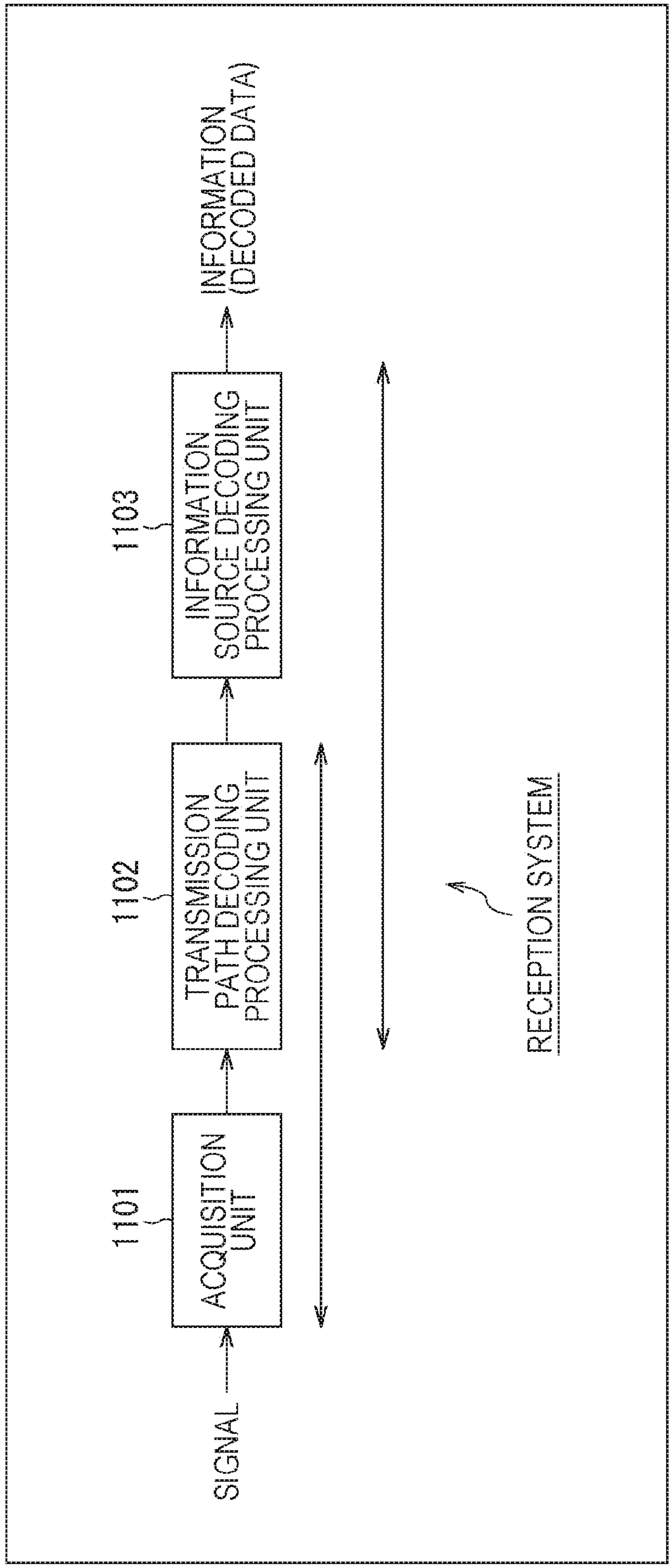
FIG. 71 is a block diagram illustrating a first configuration example of a reception system to which a reception device 12 is applicable.

FIG. 71 is a block diagram illustrating a first configuration example of the reception system to which the reception device 12 is applicable.

In FIG. 71, the reception system includes an acquisition unit 1101, a transmission path decoding processing unit 1102, and an information source decoding processing unit 1103.

The acquisition unit 1101 acquires a signal including the LDPC code obtained by performing at least the LDPC coding for the LDPC target data such as image data and audio data of a program or the like, via a transmission path (communication path, not illustrated) such as, for example, terrestrial digital broadcasting, satellite digital broadcasting, a cable television (CATV) network, the Internet, or another network, and supplies the signal to the transmission path decoding processing unit 1102.

Here, in a case where the signal acquired by the acquisition unit 1101 is broadcasted from, for example, a broadcasting station via terrestrial waves, satellite waves, cable television (CATV) networks, or the like, the acquisition unit 1101 is configured by a tuner, a set top box (STB), or the like. Furthermore, in a case where the signal acquired by the acquisition unit 1101 is transmitted from a web server by multicast like an internet protocol television (IPTV), for example, the acquisition unit 1101 is configured by, for example, a network interface (I/F) such as a network interface card (NIC).

The transmission path decoding processing unit 1102 corresponds to the reception device 12. The transmission path decoding processing unit 1102 applies transmission path decoding processing including at least processing of correcting an error occurring in the transmission path to the signal acquired by the acquisition unit 1101 via the transmission path, and supplies a resulting signal to the information source decoding processing unit 1103.

In other words, the signal acquired by the acquisition unit 1101 via the transmission path is a signal obtained by performing at least error correction coding for correcting an error occurring in the transmission path, and the transmission path decoding processing unit 1102 applies the transmission path decoding processing such as the error correction processing to such a signal, for example.

Here, examples of the error correction coding include LDPC coding and BCH coding. Here, at least the LDPC coding is performed as the error correction coding.

Furthermore, the transmission path decoding processing may include demodulation of a modulated signal, and the like.

The information source decoding processing unit 1103 applies information source decoding processing including at least processing of decompressing compressed information into original information to the signal to which the transmission path decoding processing has been applied.

In other words, compression encoding for compressing information is sometimes applied to the signal acquired by the acquisition unit 1101 via the transmission path in order to reduce the amount of data such as image and sound as the information. In that case, the information source decoding processing unit 1103 applies the information source decoding processing such as processing of decompressing the compressed information into the original information (decompression processing) to the signal to which the transmission path decoding processing has been applied.

Note that, in a case where the compression encoding has not been applied to the signal acquired by the acquisition unit 1101 via the transmission path, the information source decoding processing unit 1103 does not perform the processing of decompressing the compressed information into the original information.

Here, an example of the decompression processing includes MPEG decoding. Furthermore, the transmission path decoding processing may include descrambling in addition to the decompression processing.

In the reception system configured as described above, the acquisition unit 1101 acquires the signal obtained by applying the compression encoding such as MPEG coding to data such as image and sound, for example, and further applying the error correction coding such as the LDPC coding to the compressed data, via the transmission path, and supplies the acquired signal to the transmission path decoding processing unit 1102.

The transmission path decoding processing unit 1102 applies processing similar to the processing performed by the reception device 12 to the signal from the acquisition unit 1101 as the transmission path decoding processing, and supplies the resulting signal to the information source decoding processing unit 1103.

The information source decoding processing unit 1103 applies the information source decoding processing such as MPEG decoding to the signal from the transmission path decoding processing unit 1102, and outputs resulting image or sound.

The reception system in FIG. 71 as described above can be applied to, for example, a television tuner for receiving television broadcasting as digital broadcasting.

Note that the acquisition unit 1101, the transmission path decoding processing unit 1102, and the information source decoding processing unit 1103 can be configured as independent devices (hardware (integrated circuits (ICs)) or software modules), respectively.

Furthermore, the acquisition unit 1101, the transmission path decoding processing unit 1102, and the information source decoding processing unit 1103 can be configured as a set of the acquisition unit 1101 and the transmission path decoding processing unit 1102, a set of the transmission path decoding processing unit 1102 and the information source decoding processing unit 1103, or a set of the acquisition unit 1101, the transmission path decoding processing unit 1102, and the information source decoding processing unit 1103, as an independent device.

Figure 72:
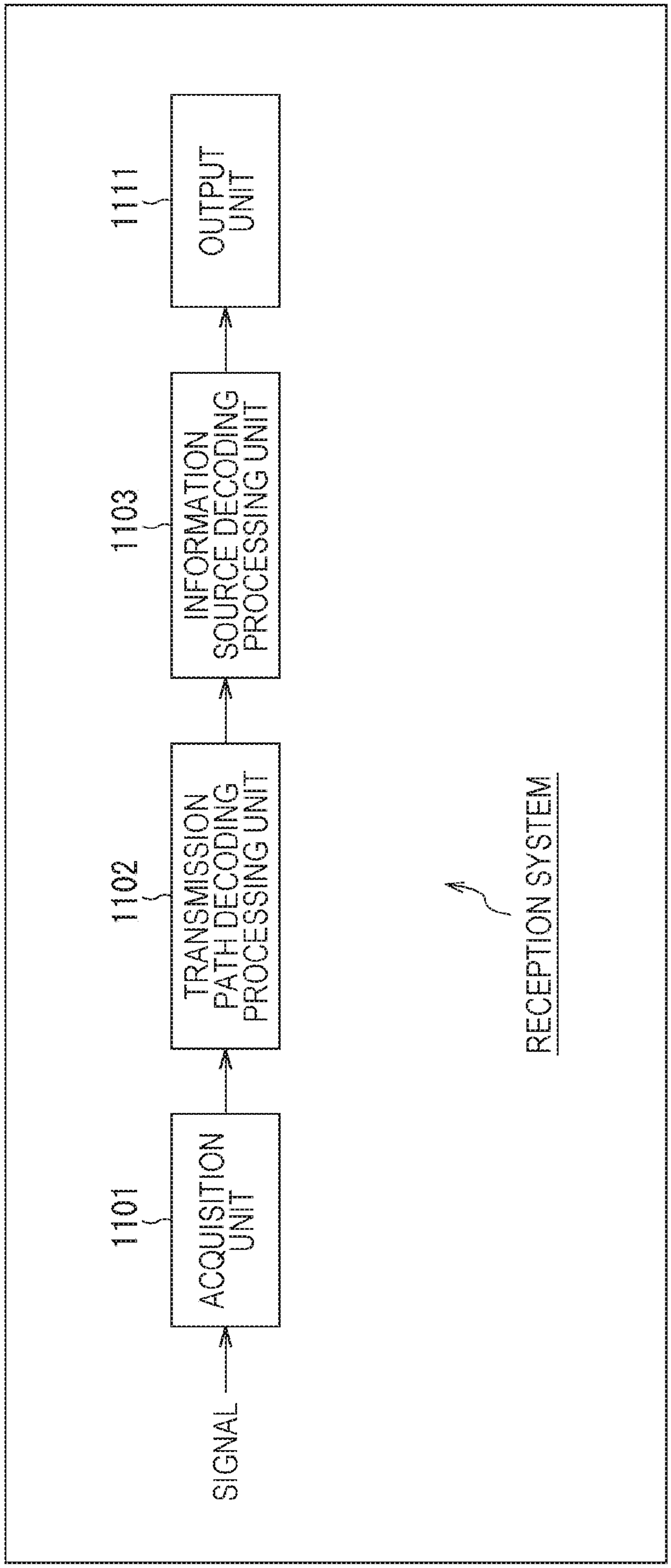
FIG. 72 is a block diagram illustrating a second configuration example of the reception system to which the reception device 12 is applicable.

FIG. 72 is a block diagram illustrating a second configuration example of the reception system to which the reception device 12 is applicable.

Note that, in FIG. 72, parts corresponding to those in FIG. 71 are given the same reference numerals, and hereinafter, description thereof will be omitted as appropriate.

The reception system in FIG. 72 is common to the case in FIG. 71 in including the acquisition unit 1101, the transmission path decoding processing unit 1102, and the information source decoding processing unit 1103 but is different from the case in FIG. 71 in newly including an output unit 1111.

The output unit 1111 is, for example, a display device for displaying an image or a speaker for outputting a sound, and outputs an image, a sound, or the like as a signal output from the information source decoding processing unit 1103. In other words, the output unit 1111 displays an image or outputs a sound.

The reception system in FIG. 72 as described above can be applied to, for example, a television (TV) receiver for receiving television broadcasting as the digital broadcasting, a radio receiver for receiving radio broadcasting, or the like.

Note that, in a case where the compression encoding has not been applied to the signal acquired by the acquisition unit 1101, the signal output by the transmission path decoding processing unit 1102 is supplied to the output unit 1111.

Figure 73:
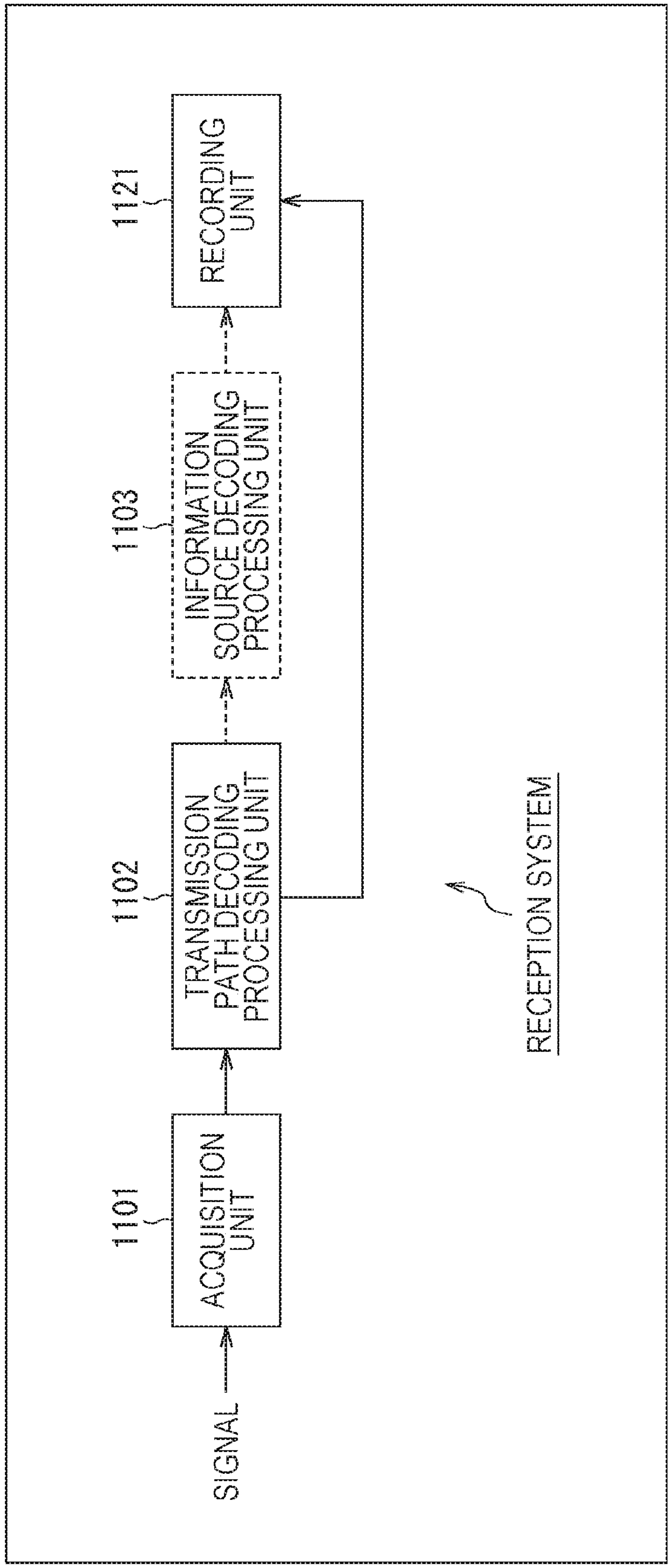
FIG. 73 is a block diagram illustrating a third configuration example of the reception system to which the reception device 12 is applicable.

FIG. 73 is a block diagram illustrating a third configuration example of the reception system to which the reception device 12 is applicable.

Note that, in FIG. 72, parts corresponding to those in FIG. 71 are given the same reference numerals, and hereinafter, description thereof will be omitted as appropriate.

The reception system in FIG. 73 is common to the case in FIG. 71 in including the acquisition unit 1101 and the transmission path decoding processing unit 1102.

However, the reception system in FIG. 73 is different from the case in FIG. 71 in not including the information source decoding processing unit 1103 and newly including a recording unit 1121.

The recording unit 1121 records (stores) the signal (for example, a TS packet of TS of MPEG) output by the transmission path decoding processing unit 1102 on a recording (storage) medium such as an optical disk, a hard disk (magnetic disk), or a flash memory.

The reception system in FIG. 73 as described above can be applied to a recorder for recording television broadcasting or the like.

Note that, in FIG. 73, the reception system includes the information source decoding processing unit 1103, and the information source decoding processing unit 1103 can record the signal to which the information source decoding processing has been applied, in other words, the image or sound obtained by decoding, in the recording unit 1121.

<Punctured LDPC Code>

Figure 74:
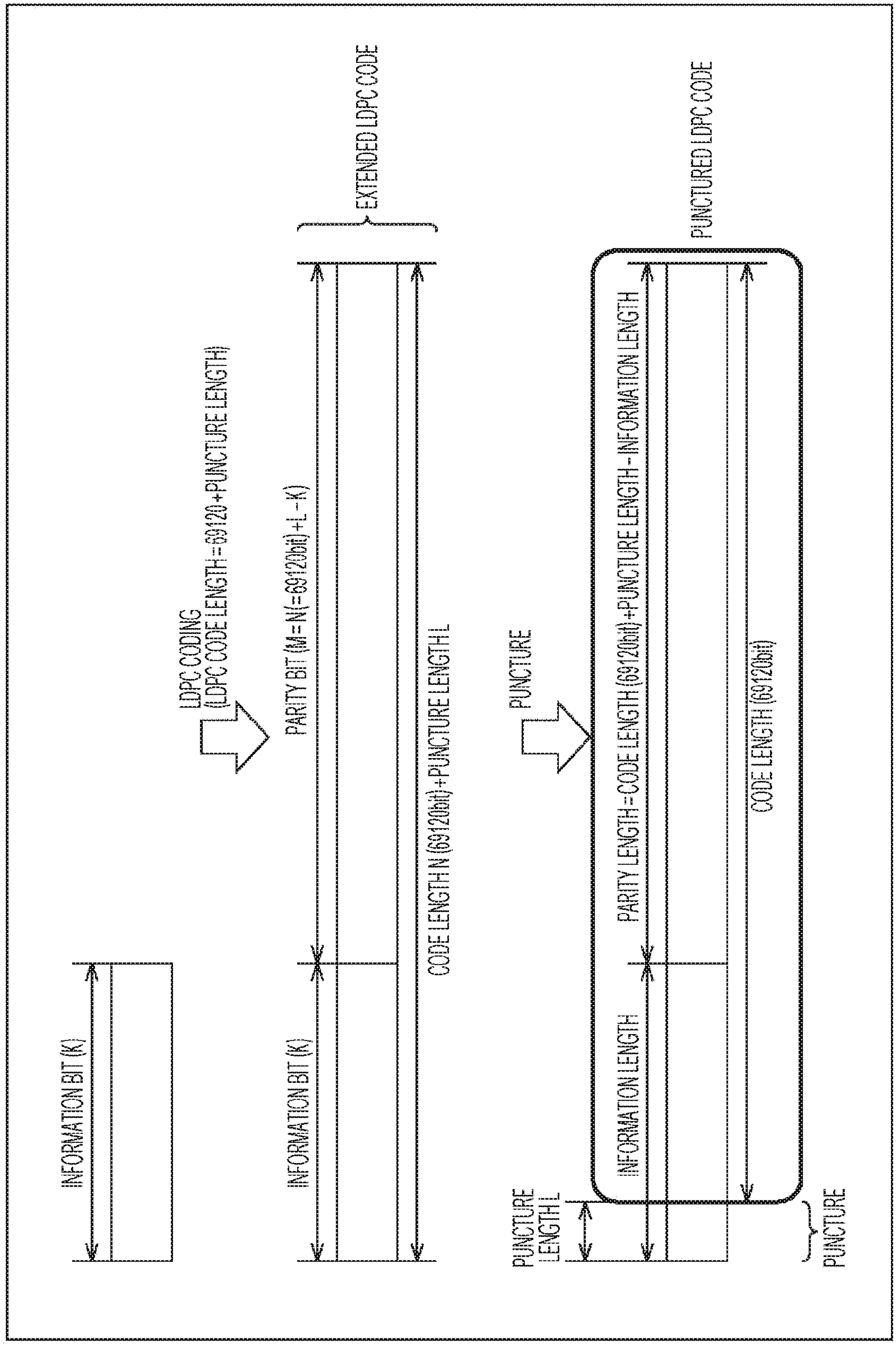
FIG. 74 is a diagram for describing a punctured LDPC code.

FIG. 74 is a diagram for describing a punctured LDPC code.

For the data transmission of the transmission system in FIG. 7, an LDPC code obtained by performing LDPC coding for information bits on the basis of the parity check matrix, or a punctured LDPC code obtained by puncturing (deleting) part of the bits of the LDPC code obtained by the LDPC coding can be used.

Hereinafter, the code length of the punctured LDPC code is represented by N, and for example, N=69120 (bits).

Furthermore, the information length of the information bits is represented by K, and the coding rate of the punctured LDPC code is represented by r. The coding rate r is expressed by the expression r=K/N.

In the punctured LDPC coding for coding the information bits of the information length K to the punctured LDPC code with the coding rate r, LDPC coding for the information bits with the information length K=N×r is performed on the basis of an extended parity check matrix having rows and columns each extended by a predetermined puncture length L with respect to a parity check matrix of an LDPC code with the code length N and the coding rate r, as illustrated in FIG. 74, so that an extended LDPC code having parity bits with a parity length M=N+L−K is generated.

Then, in the punctured LDPC coding, a head of the information bits of the extended LDPC code is punctured by the puncture length L, so that a punctured LDPC code with the code length N and the coding rate r is generated.

Since the code length of the extended LDPC code is (N+L) bits, and bits of the puncture length L are punctured from the (N+L) bits, an N-bit punctured LDPC code is obtained according to the puncturing of the (N+L)-bit extended LDPC code.

The punctured LDPC code includes only K-L bits, not K bits, as the information bits, but the information bits targeted for punctured LDPC coding are K bits, and the punctured LDPC code obtained by the punctured LDPC coding for the information bits has N bits. Therefore, the coding rate r of the punctured LDPC code becomes K/N.

Figure 75B:
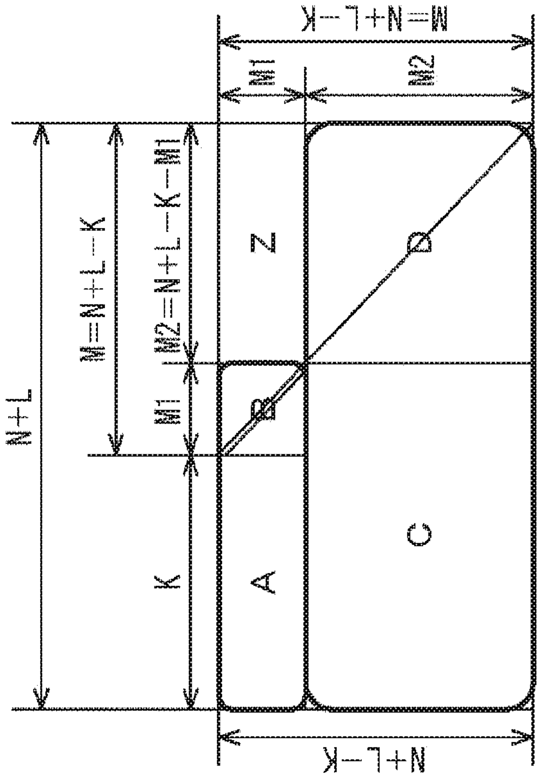
FIGS. 75A and 75B are diagrams for describing a structure of an extended parity check matrix of a type A method for encoding K-bit information bits into an (N+L)-bit extended LDPC code.
Figure 75A:
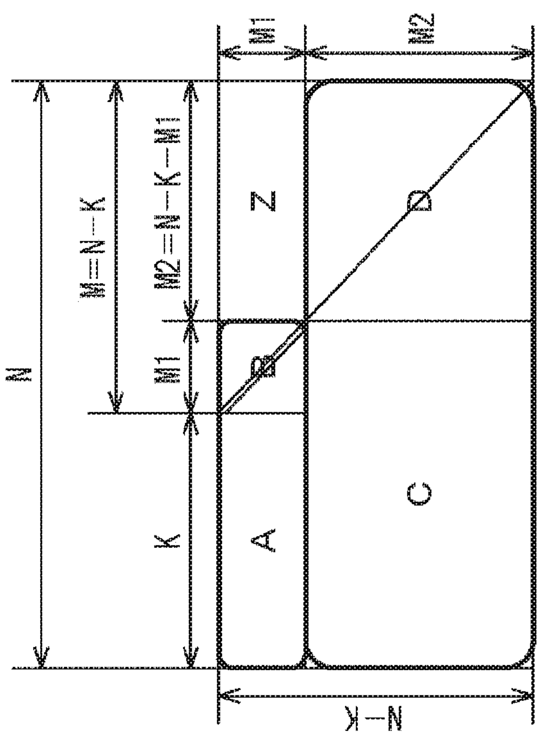

FIGS. 75A and 75B are diagrams for describing a structure of the extended parity check matrix by the type A method for encoding K-bit information bits into the (N+L)-bit extended LDPC code.

FIG. 75A illustrates a structure of a parity check matrix of a type A code with the code length N and the coding rate r (hereinafter the parity check matrix is also referred to as type A regular parity check matrix).

The structure of the type A regular parity check matrix is as described in FIG. 22.

In other words, the type A regular parity check matrix is an (N−K)-row N-column matrix including an A matrix, a B matrix, a C matrix, a D matrix, and a Z matrix.

Then, the A matrix is a matrix of M1 rows and K columns, the B matrix is a matrix of M1 rows and M1 columns, the C matrix is a matrix of N−K−M1 (=M2) rows and K+M1 columns, the D matrix is an identity matrix of N−K−M1 (=M2) rows and N−K−M1 (=M2) columns, and the Z matrix is a zero matrix of M1 rows and N−K−M1 (=M2) columns.

FIG. 75B illustrates a structure of an extended parity check matrix (hereinafter also referred to as type A extended parity check matrix) having rows and columns each extended by a predetermined puncture length L with respect to the type A regular parity check matrix in FIG. 75A.

The type A extended parity check matrix includes the A matrix, the B matrix, the C matrix, the D matrix, and the Z matrix, similarly to the type A regular parity check matrix.

Note that the type A extended parity check matrix is a matrix of N+L−K rows and N+L columns, having rows and columns each extended by the puncture length L, as compared with the type A regular parity check matrix.

Then, the A matrix is a matrix of M1 rows and K columns, the B matrix is a matrix of M1 rows and M1 columns, the C matrix is a matrix of N+L−K−M1 rows and K+M1 columns, the D matrix is an identity matrix of M2 (=N+L−K−M1) rows and M2 columns, and the Z matrix is a zero matrix of M1 rows and M2 (=N+L−K−M1) columns.

Here, the parity length M of the type A regular parity check matrix is expressed by an expression M=N−K, and the parity length M of the type A extended parity check matrix is expressed by an expression M=N+L−K. Therefore, the parity length M of the type A extended parity check matrix is longer by the puncture length L than the parity length M of the type A regular parity check matrix.

When the parity length M is expressed by an expression M=M1+M2, using the parameter M1, M2 of the type A regular parity check matrix is expressed by an expression M2=N−K−M1, and M2 of the type A extended parity check matrix is expressed by an expression M2=N+L−K-M1.

In the type A extended parity check matrix, one or both of M1 and M2 are larger than M1 and M2 of the type A regular parity check matrix.

Figure 76A:
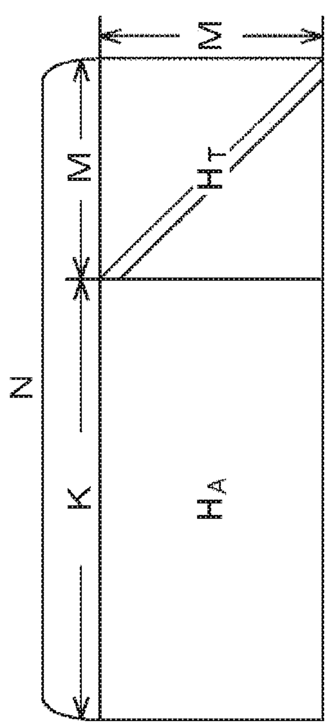
FIGS. 76A and 76B are diagrams for describing a structure of an extended parity check matrix of a type B method for encoding K-bit information bits into an (N+L)-bit extended LDPC code.
Figure 76B:
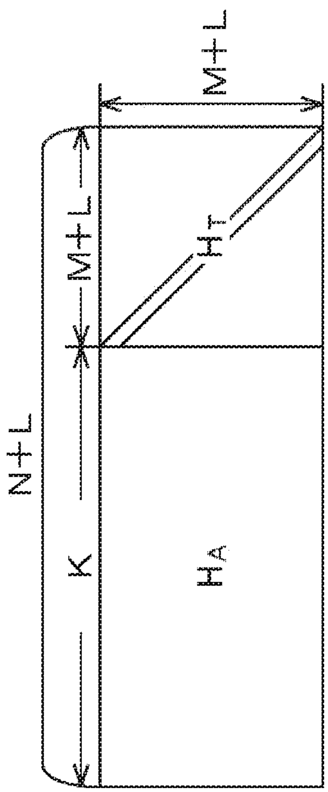

FIGS. 76A and 76B are diagrams for describing a structure of the extended parity check matrix by the type B method for encoding K-bit information bits into the (N+L)-bit extended LDPC code.

FIG. 76A illustrates a structure of a parity check matrix of a type B code with the code length N and the coding rate r (hereinafter the parity check matrix is also referred to as type B regular parity check matrix).

The structure of the type B regular parity check matrix is as described in FIG. 10.

In other words, the type B regular parity check matrix is a matrix of M (=N−K) rows and N columns in which an information matrix $H_A$ of a portion corresponding to the information bits and a parity matrix $H_T$ corresponding to parity bits are arranged side by side.

Then, the information matrix $H_A$ is a matrix of M rows and K (=N×r) columns, and the parity matrix $H_T$ is a matrix of M rows and M columns. Note that the parity matrix $H_T$ has a step structure as described in FIG. 11.

FIG. 76B illustrates a structure of an extended parity check matrix (hereinafter also referred to as type B extended parity check matrix) having rows and columns each extended by the predetermined puncture length L with respect to the type B regular parity check matrix in FIG. 76A.

The type B extended parity check matrix is a matrix in which the information matrix $H_A$ and the parity matrix $H_T$ are arranged side by side, similarly to the type B regular parity check matrix.

Note that the type B extended parity check matrix is a matrix of M+L rows and N+L columns, having rows and columns each extended by the puncture length L, as compared with the type B regular parity check matrix.

Then, the information matrix $H_A$ is a matrix of M+L rows and K columns, and the parity matrix $H_T$ is a matrix of M+L rows and M+L columns.

Therefore, the parity length M+L (=N+L−K) of the type B extended parity check matrix is longer by the puncture length L than the parity length M of the type B regular parity check matrix. As a result, in the type B extended parity check matrix, the number of rows of the information matrix $H_A$ is larger by the puncture length L than that in the type B regular parity check matrix, and the number of rows and columns of the parity matrix $H_T$ are larger by the puncture length L than those in the type B regular parity check matrix.

Figure 77:
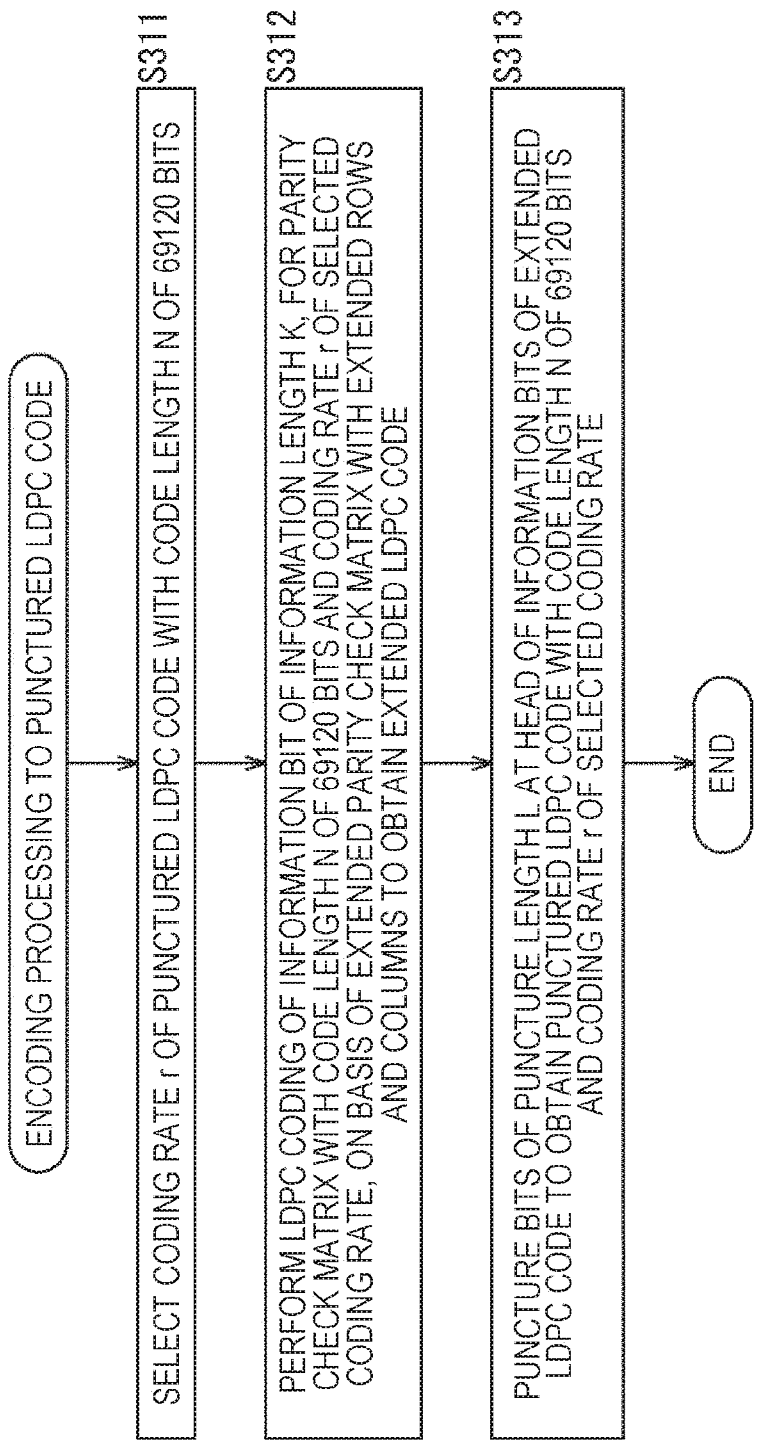
FIG. 77 is a flowchart for describing an example of processing (encoding processing) of the LDPC encoder 115 in a case where a punctured LDPC code with a code length N=69120 is used for data transmission.

FIG. 77 is a flowchart for describing an example of processing (encoding processing) of the LDPC encoder 115 (FIG. 8) in the case where the punctured LDPC code with the code length N=69120 is used for data transmission.

In step S311, the LDPC encoder 115 selects the coding rate r of the punctured LDPC code with the code length N=69120. For example, the LDPC encoder 115 selects, as a selected coding rate, a coding rate determined in advance, a coding rate specified by the operator of the transmission device 11, and the like.

In step S312, the LDPC encoder 115 performs the LDPC coding for the information bits of the information length K=N×r on the basis of the extended parity check matrix having rows and columns each extended by a predetermined puncture length L with respect to the parity check matrix with the code length N of 69120 bits and the coding rate r of the selected coding rate, thereby generating (obtaining) the extended LDPC code having the parity bits of the parity length M=N+L−K and the code length of N+L.

In step S313, the LDPC encoder 115 punctures the head of the information bits of the extended LDPC code by the puncture length L to generate (obtain) the punctured LDPC code with the code length N and the coding rate r, and supplies the punctured LDPC code to the subsequent bit interleaver 116 (FIG. 8).

Figure 78:
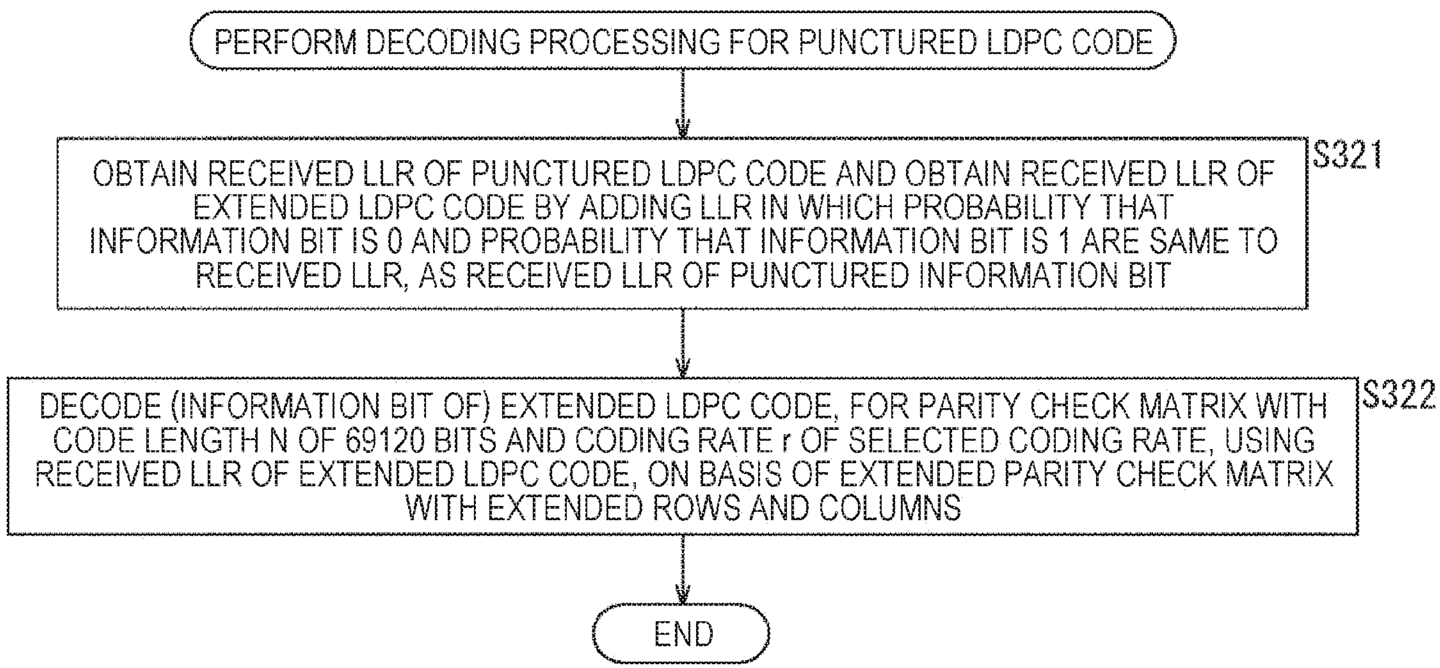
FIG. 78 is a flowchart for describing an example of processing (decoding processing) of the LDPC decoder 166 in a case where a punctured LDPC code with a code length N=69120 is used for data transmission.

FIG. 78 is a flowchart for describing an example of processing (decoding processing) of the LDPC decoder 166 (FIG. 61) in the case where the punctured LDPC code with the code length N=69120 is used for data transmission.

In step S321, the LDPC decoder 166 obtains the received LLR of the punctured LDPC code from the bit deinterleaver 165, and adds an LLR indicating that a probability of the information bits being 0 and a probability of the information bits being 1 are the same to the received LLR as received LLR of L bits of the head of the information bits punctured by the LDPC encoder 115, thereby obtaining the received LLR of the extended LDPC code.

In step S322, the LDPC decoder 166 decodes (the information bits of) the extended LDPC code using the received LLR of the extended LDPC code on the basis of the extended parity check matrix having rows and columns extended with respect to the parity check matrix of the code length N of 69120 bits and the coding rate r of the selected coding rate.

Here, as the extended LDPC code, for example, the type A code or the type B code corresponding to the parity check matrix H having a cyclic structure with the parallel factor P of 360 similar to DVB-T.2, ATSC3.0, or the like, can be adopted.

Moreover, as the extended LDPC code, for example, the LDPC code from which the punctured LDPC code can be obtained can be adopted, the punctured LDPC code having the code length N longer than 64 k bits of DVB-T.2 or ATSC3.0, in other words, the code length N of 69120 bits, and the coding rate r of 2/16, 3/16, 4/16, 5/16, 6/16, 7/16, 8/16, 9/16, 10/16, 11/16, 12/16, 13/16, or 14/16.

As the extended LDPC code, for example, an LDPC code from which the punctured LDPC code with good BER can be obtained can be adopted by the simulation described in FIGS. 30 and 31, for example. In the simulation, for example, the puncture length L for puncturing the extended LDPC code can be obtained together with (the parity check matrix of) the extended LDPC code using BER as an index.

According to the punctured LDPC code obtained by puncturing the extended LDPC code obtained as described above by the puncture length L similarly obtained, favorable communication quality can be secured in data transmission.

Hereinafter, examples of the parity check matrix initial value table representing the extended parity check matrix of the extended LDPC code obtained by the simulation and the puncture length L will be described.

FIGS. 79 and 80 are diagrams illustrating examples of a parity check matrix initial value table (code table) representing a type A extended parity check matrix of an extended LDPC code of the type A method (before puncturing) (hereinafter also referred to as type A extended LDPC code for (69 k, 2/16)) to be used in a case of obtaining a punctured LDPC code with the code length N of 69120 (69 k) bits and the coding rate r (Rate) of 2/16.

Note that FIG. 80 is a diagram following FIG. 79.

Puncturing with the puncture length L=0 is performed for a type A extended LDPC code for (69 k, 2/16). Therefore, the punctured LDPC code obtained by puncturing the type A extended LDPC code for (69 k, 2/16) is the same as the type A extended LDPC code for (69 k, 2/16) before puncturing.

FIGS. 81 and 82 are diagrams illustrating examples of a parity check matrix initial value table representing a type A extended parity check matrix of an extended LDPC code of the type A method (hereinafter also referred to as type A extended LDPC code for (69 k, 3/16)) to be used in a case of obtaining a punctured LDPC code with the code length N of 69120 bits and the coding rate r of 3/16.

Note that FIG. 82 is a diagram following FIG. 81.

Puncturing with the puncture length L=0 is performed for a type A extended LDPC code for (69 k, 3/16). Therefore, the punctured LDPC code obtained by puncturing the type A extended LDPC code for (69 k, 3/16) is the same as the type A extended LDPC code for (69 k, 3/16) before puncturing.

FIGS. 83 and 84 are diagrams illustrating examples of a parity check matrix initial value table representing a type A extended parity check matrix of an extended LDPC code of the type A method (hereinafter also referred to as type A extended LDPC code for (69 k, 4/16)) to be used in a case of obtaining a punctured LDPC code with the code length N of 69120 bits and the coding rate r of 4/16.

Note that FIG. 84 is a diagram following FIG. 83.

Puncturing with the puncture length L=0 is performed for a type A extended LDPC code for (69 k, 4/16). Therefore, the punctured LDPC code obtained by puncturing the type A extended LDPC code for (69 k, 4/16) is the same as the type A extended LDPC code for (69 k, 4/16) before puncturing.

FIGS. 85 and 86 are diagrams illustrating examples of a parity check matrix initial value table representing a type A extended parity check matrix of an extended LDPC code of the type A method (hereinafter also referred to as type A extended LDPC code for (69 k, 5/16)) to be used in a case of obtaining a punctured LDPC code with the code length N of 69120 bits and the coding rate r of 5/16.

Note that FIG. 86 is a diagram following FIG. 85.

Puncturing with the puncture length L=1800 is performed for a type A extended LDPC code for (69 k, 5/16). Therefore, the punctured LDPC code obtained by puncturing the type A extended LDPC code for (69 k, 5/16) is shorter by the puncture length L=1800 than the type A extended LDPC code for (69 k, 5/16) before puncturing.

FIGS. 87 and 88 are diagrams illustrating examples of a parity check matrix initial value table representing a type A extended parity check matrix of an extended LDPC code of the type A method (hereinafter also referred to as type A extended LDPC code for (69 k, 6/16)) to be used in a case of obtaining a punctured LDPC code with the code length N of 69120 bits and the coding rate r of 6/16.

Note that FIG. 88 is a diagram following FIG. 87.

Puncturing with the puncture length L=1800 is performed for a type A extended LDPC code for (69 k, 6/16). Therefore, the punctured LDPC code obtained by puncturing the type A extended LDPC code for (69 k, 6/16) is shorter by the puncture length L=1800 than the type A extended LDPC code for (69 k, 6/16) before puncturing.

FIGS. 89, 90, and 91 are diagrams illustrating examples of a parity check matrix initial value table representing a type A extended parity check matrix of an extended LDPC code of the type A method (hereinafter also referred to as type A extended LDPC code for (69 k, 7/16)) to be used in a case of obtaining a punctured LDPC code with the code length N of 69120 bits and the coding rate r of 7/16.

Note that FIG. 90 is a diagram following FIG. 89 and FIG. 91 is a diagram following FIG. 90.

Puncturing with the puncture length L=2160 is performed for a type A extended LDPC code for (69 k, 7/16). Therefore, the punctured LDPC code obtained by puncturing the type A extended LDPC code for (69 k, 7/16) is shorter by the puncture length L=2160 than the type A extended LDPC code for (69 k, 7/16) before puncturing.

FIGS. 92, 93, and 94 are diagrams illustrating examples of a parity check matrix initial value table representing a type A extended parity check matrix of an extended LDPC code of the type A method (hereinafter also referred to as type A extended LDPC code for (69 k, 8/16)) to be used in a case of obtaining a punctured LDPC code with the code length N of 69120 bits and the coding rate r of 8/16.

Note that FIG. 93 is a diagram following FIG. 92 and FIG. 94 is a diagram following FIG. 93.

Puncturing with the puncture length L=2520 is performed for a type A extended LDPC code for (69 k, 8/16). Therefore, the punctured LDPC code obtained by puncturing the type A extended LDPC code for (69 k, 8/16) is shorter by the puncture length L=2520 than the type A extended LDPC code for (69 k, 8/16) before puncturing.

FIGS. 95, 96, 97, and 98 are diagrams illustrating examples of a parity check matrix initial value table representing a type A extended parity check matrix of an extended LDPC code of the type A method (hereinafter also referred to as type A extended LDPC code for (69 k, 9/16)) to be used in a case of obtaining a punctured LDPC code with the code length N of 69120 bits and the coding rate r of 9/16.

Figure 98:
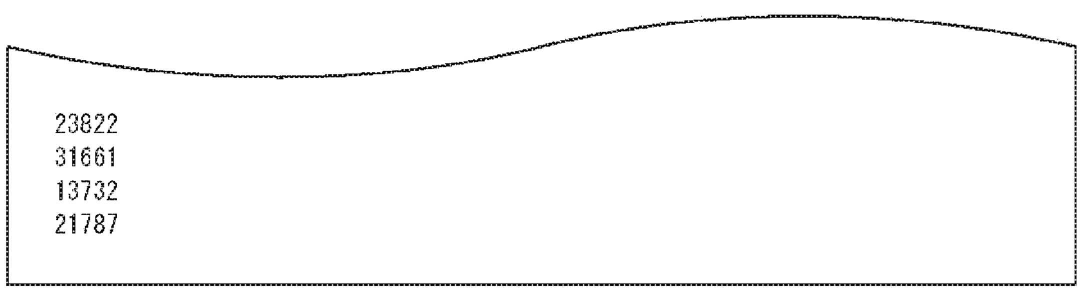
FIG. 98 is a diagram illustrating an example of a parity check matrix initial value table representing a type A extended parity check matrix of a type A extended LDPC code for (69 k, 9/16).

Note that FIG. 96 is a diagram following FIG. 95 and FIG. 97 is a diagram following FIG. 96. Note that FIG. 98 is a diagram following FIG. 97.

Puncturing with the puncture length L=1800 is performed for a type A extended LDPC code for (69 k, 9/16). Therefore, the punctured LDPC code obtained by puncturing the type A extended LDPC code for (69 k, 9/16) is shorter by the puncture length L=1800 than the type A extended LDPC code for (69 k, 9/16) before puncturing.

Figure 99:
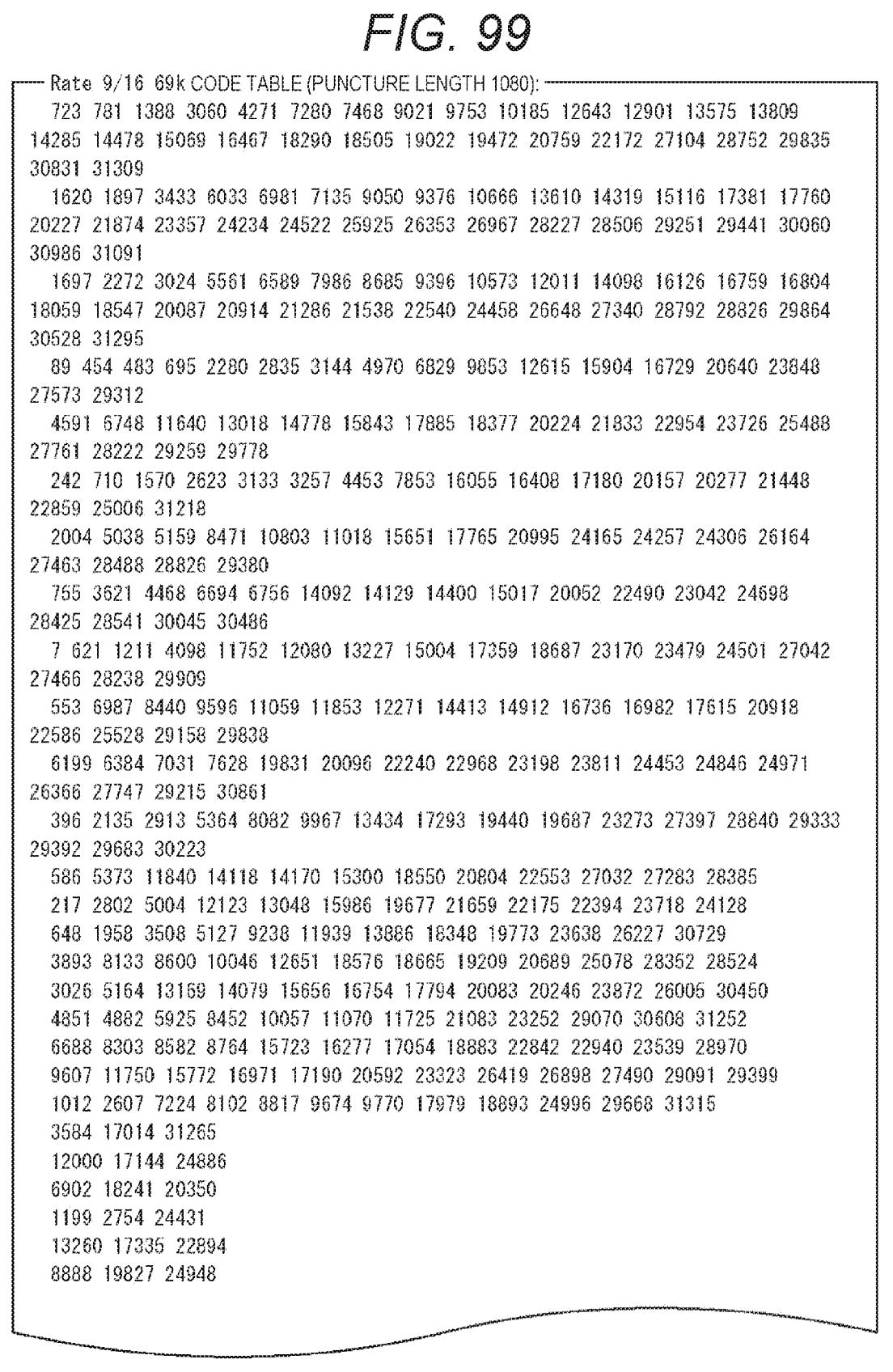
Figure 100:
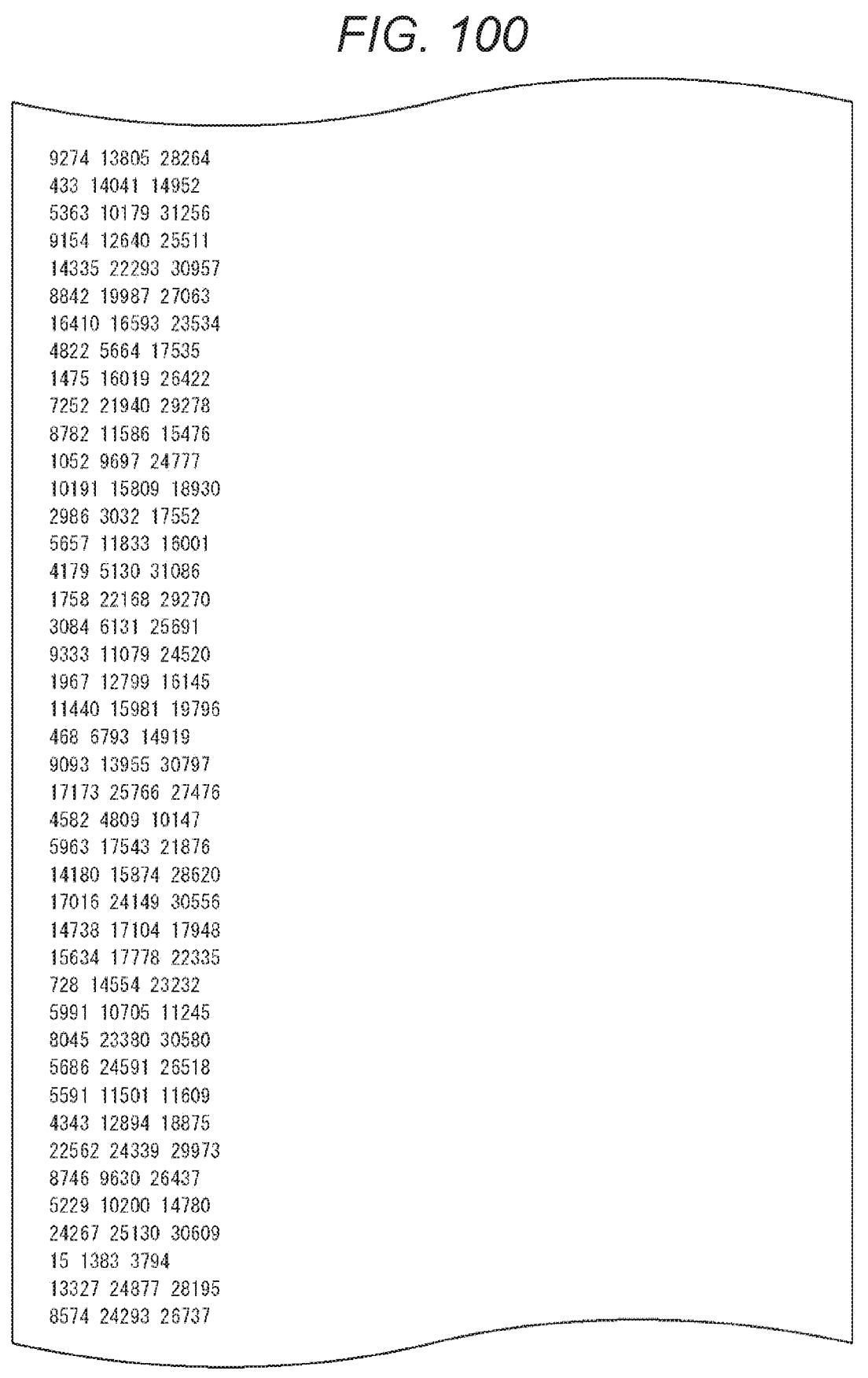
Figure 101:
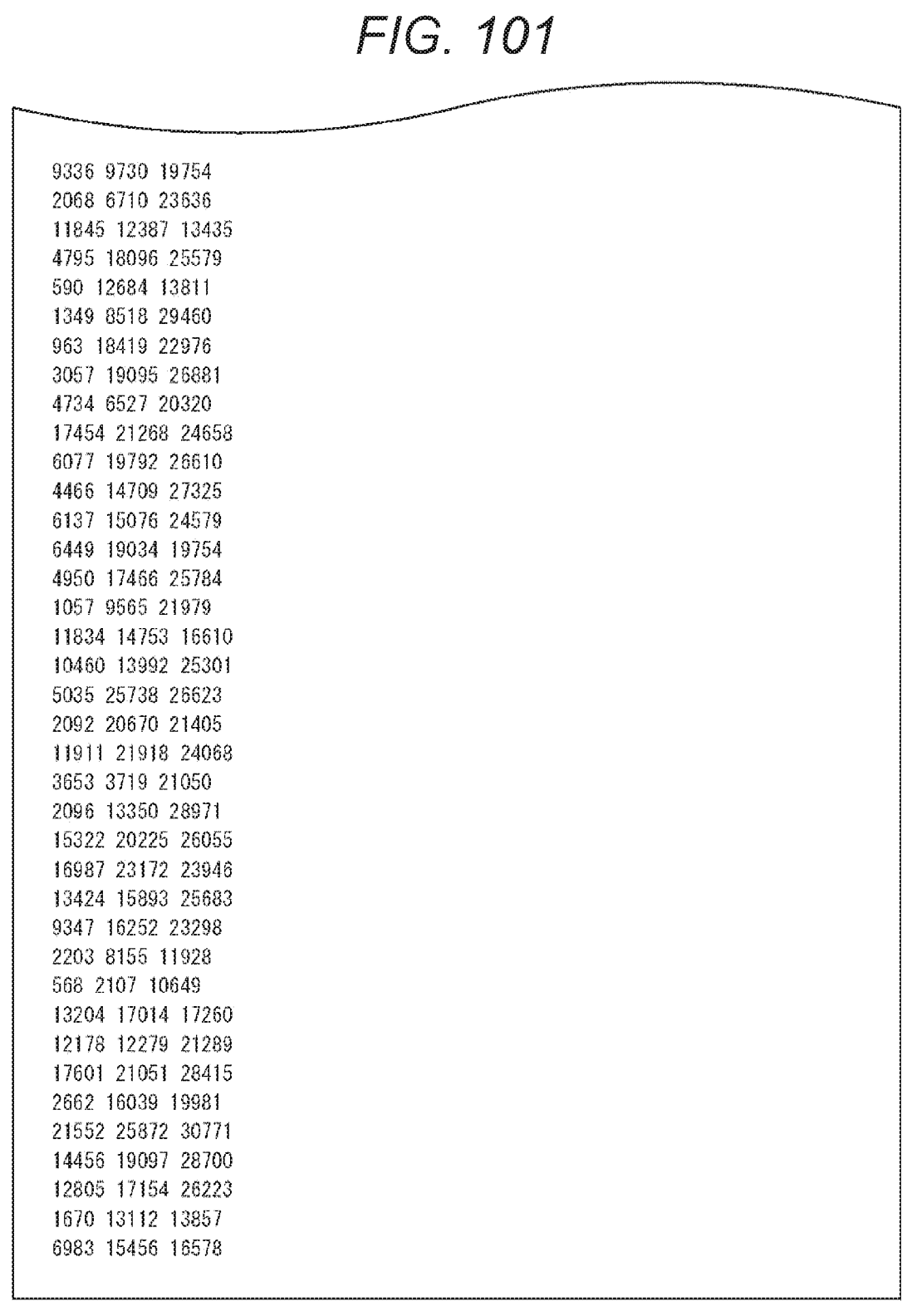

FIGS. 99, 100, and 101 are diagrams illustrating examples of a parity check matrix initial value table representing a type B extended parity check matrix of an extended LDPC code of the type B method (hereinafter also referred to as type B extended LDPC code for (69 k, 9/16)) to be used in a case of obtaining a punctured LDPC code with the code length N of 69120 bits and the coding rate r of 9/16.

Note that FIG. 100 is a diagram following FIG. 99 and FIG. 101 is a diagram following FIG. 100.

Puncturing with the puncture length L=1080 is performed for a type B extended LDPC code for (69 k, 9/16). Therefore, the punctured LDPC code obtained by puncturing the type B extended LDPC code for (69 k, 9/16) is shorter by the puncture length L=1080 than the type B extended LDPC code for (69 k, 9/16) before puncturing.

FIGS. 102, 103, 104, 105 are diagrams illustrating examples of a parity check matrix initial value table representing a type B extended parity check matrix of an extended LDPC code of the type B method (hereinafter also referred to as type B extended LDPC code for (69 k, 10/16)) to be used in a case of obtaining a punctured LDPC code with the code length N of 69120 bits and the coding rate r of 10/16.

Figure 102:
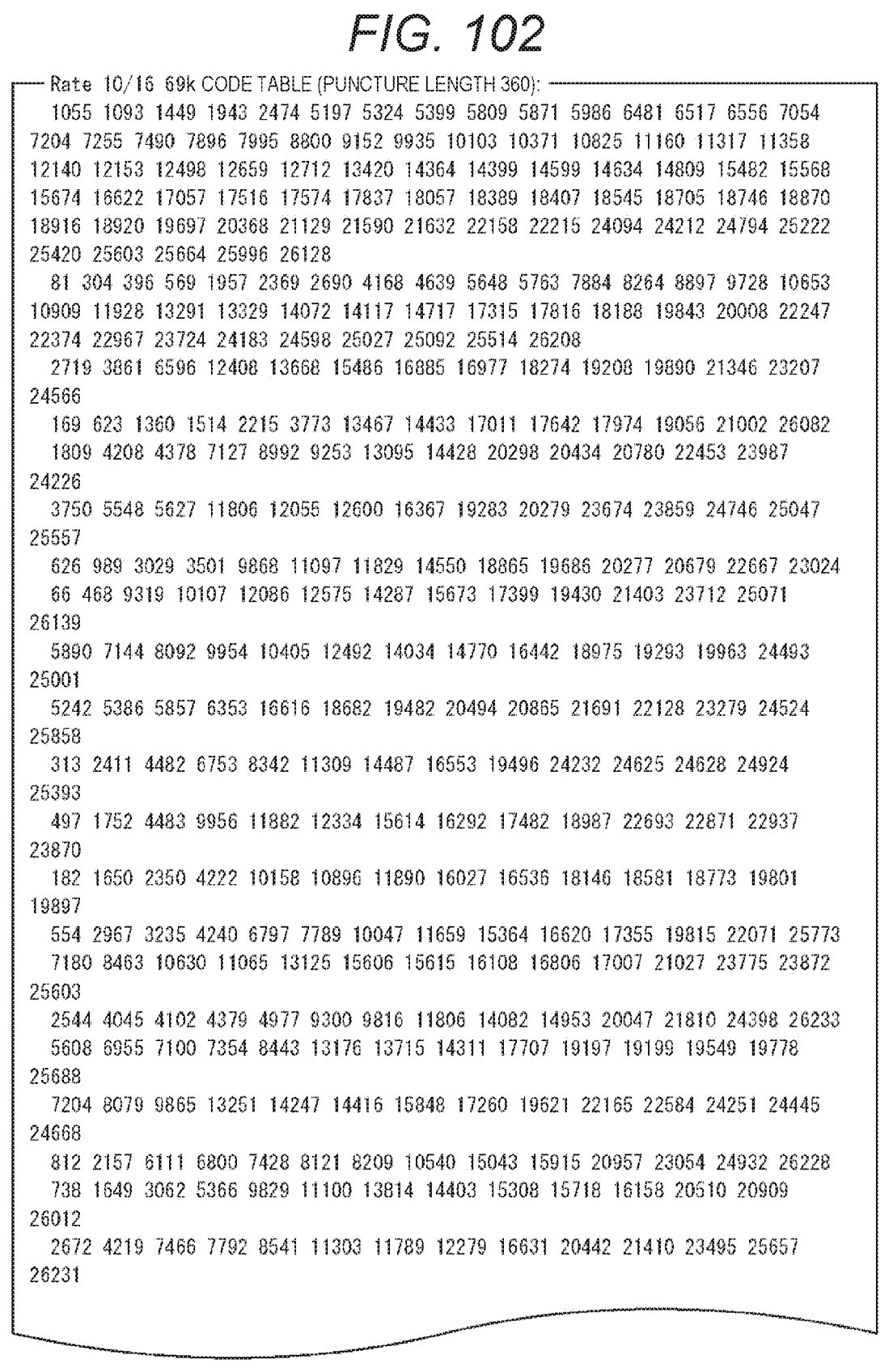
Figure 103:
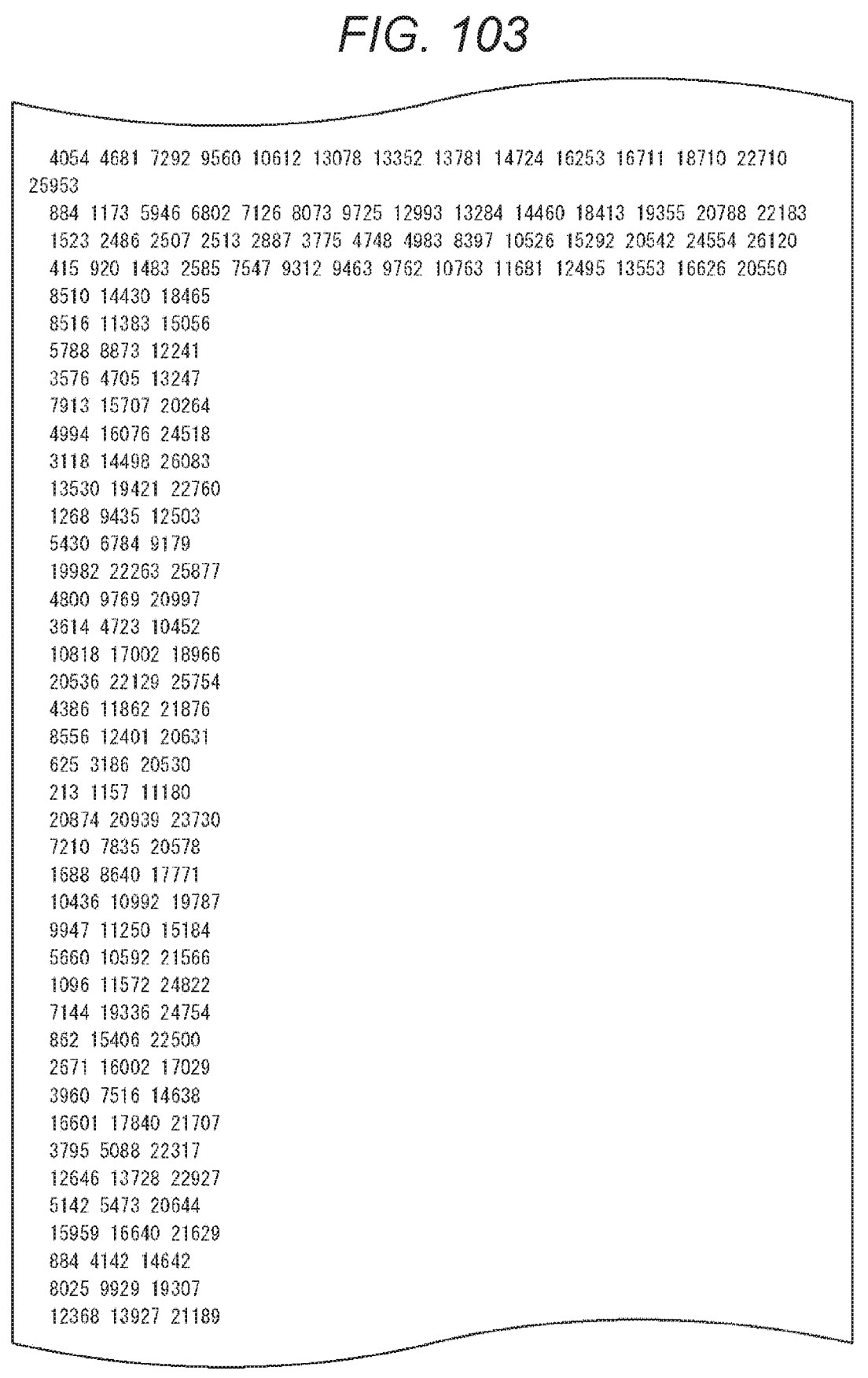
Figure 104:
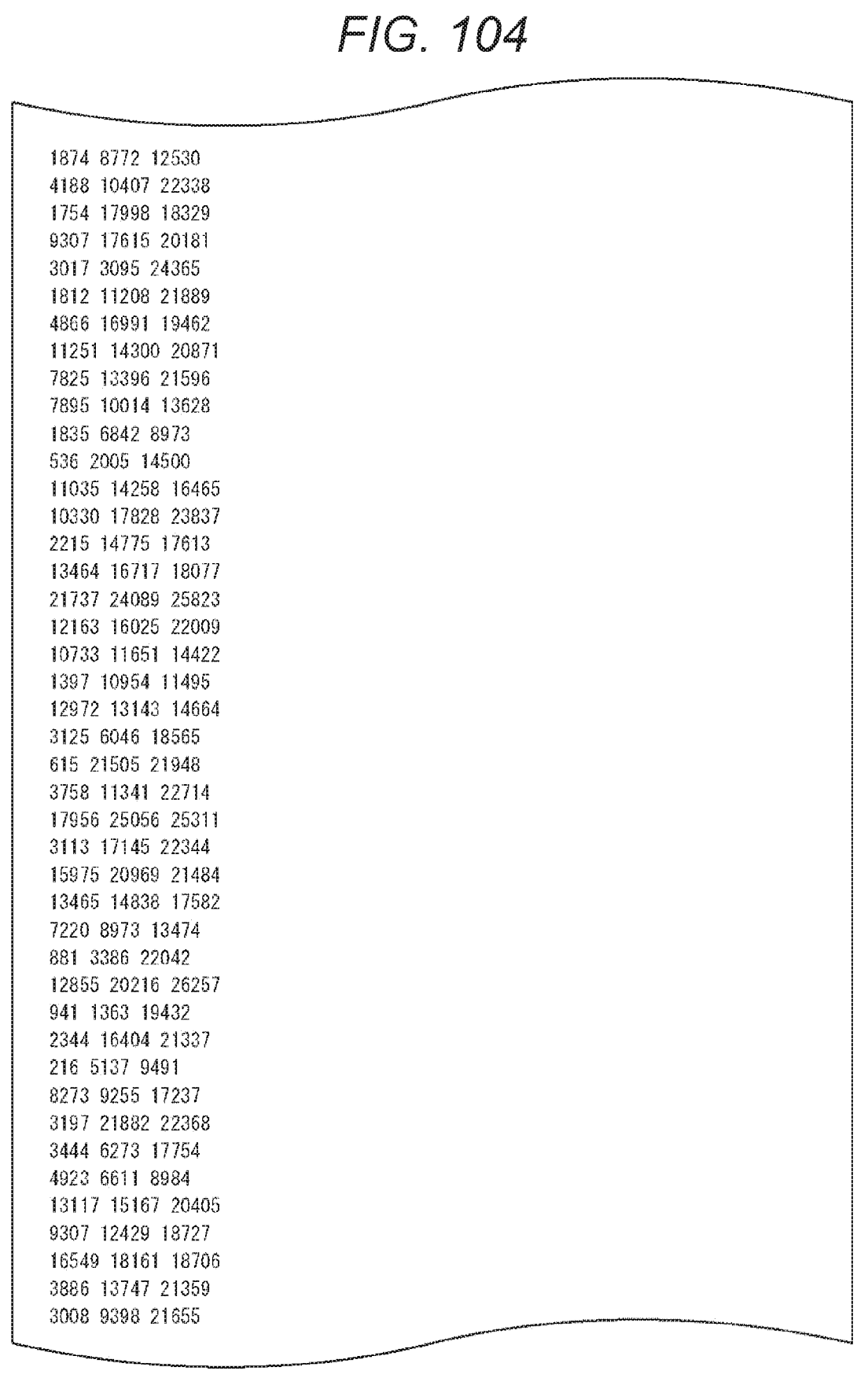
Figure 105:
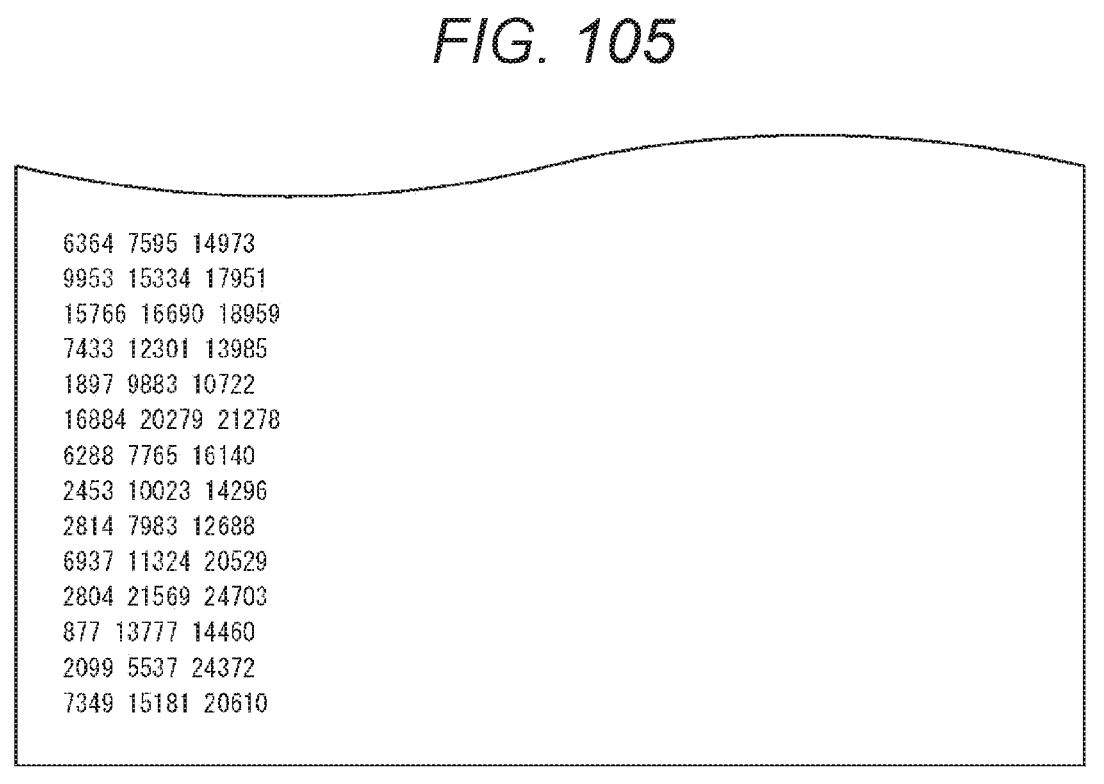

Note that FIG. 103 is a diagram following FIG. 102 and FIG. 104 is a diagram following FIG. 103. Note that FIG. 105 is a diagram following FIG. 104.

Puncturing with the puncture length L=360 is performed for a type B extended LDPC code for (69 k, 10/16). Therefore, the punctured LDPC code obtained by puncturing the type B extended LDPC code for (69 k, 10/16) is shorter by the puncture length L=360 than the type B extended LDPC code for (69 k, 10/16) before puncturing.

FIGS. 106, 107, 108, and 109 are diagrams illustrating examples of a parity check matrix initial value table representing a type B extended parity check matrix of an extended LDPC code of the type B method (hereinafter also referred to as type B extended LDPC code for (69 k, 11/16)) to be used in a case of obtaining a punctured LDPC code with the code length N of 69120 bits and the coding rate r of 11/16.

Figure 106:
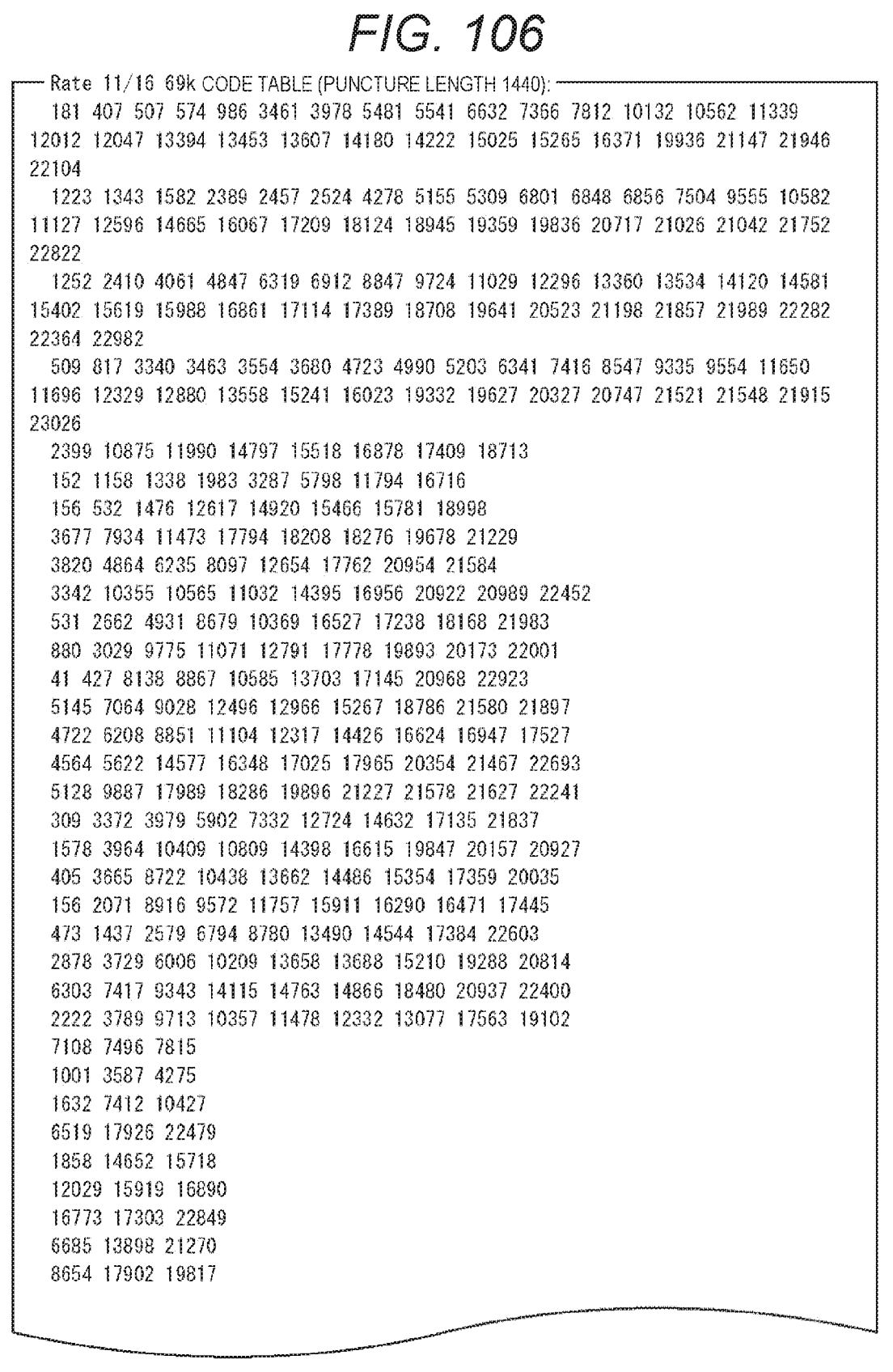
Figure 107:
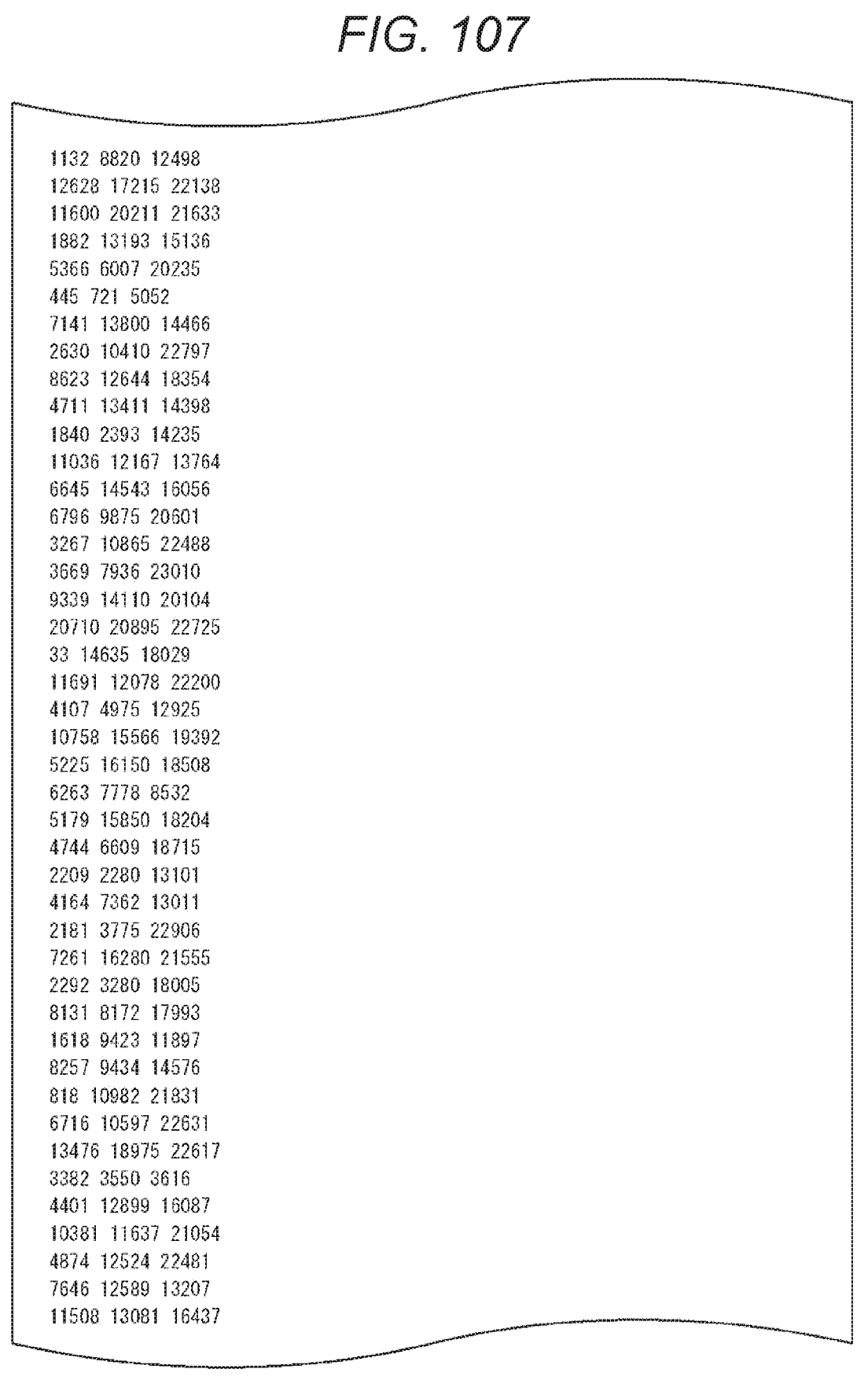
Figure 108:
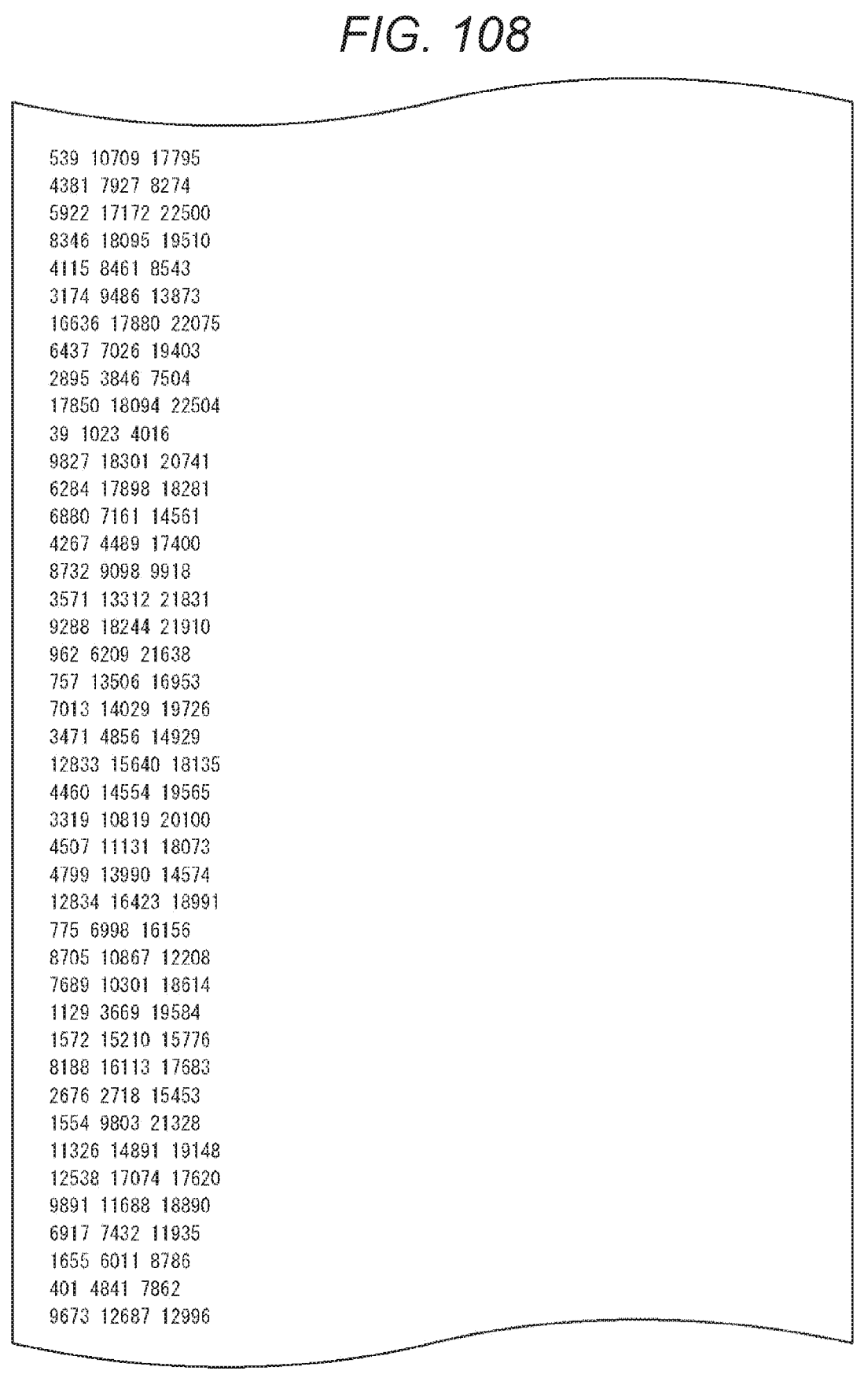
Figure 109:
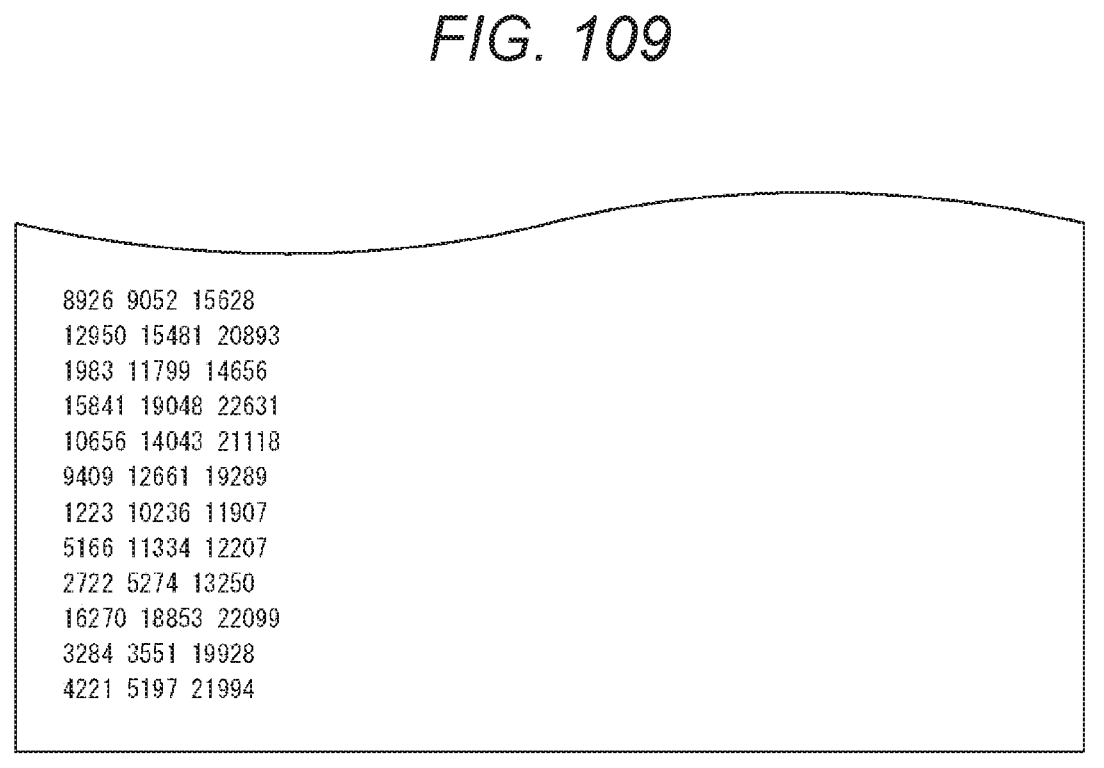

Note that FIG. 107 is a diagram following FIG. 106 and FIG. 108 is a diagram following FIG. 107. Note that FIG. 109 is a diagram following FIG. 108.

Puncturing with the puncture length L=1440 is performed for a type B extended LDPC code for (69 k, 11/16). Therefore, the punctured LDPC code obtained by puncturing the type B extended LDPC code for (69 k, 11/16) is shorter by the puncture length L=1440 than the type B extended LDPC code for (69 k, 11/16) before puncturing.

FIGS. 110, 111, 112, and 113 are diagrams illustrating examples of a parity check matrix initial value table representing a type B extended parity check matrix of an extended LDPC code of the type B method (hereinafter also referred to as type B extended LDPC code for (69 k, 12/16)) to be used in a case of obtaining a punctured LDPC code with the code length N of 69120 bits and the coding rate r of 12/16.

Figure 110:
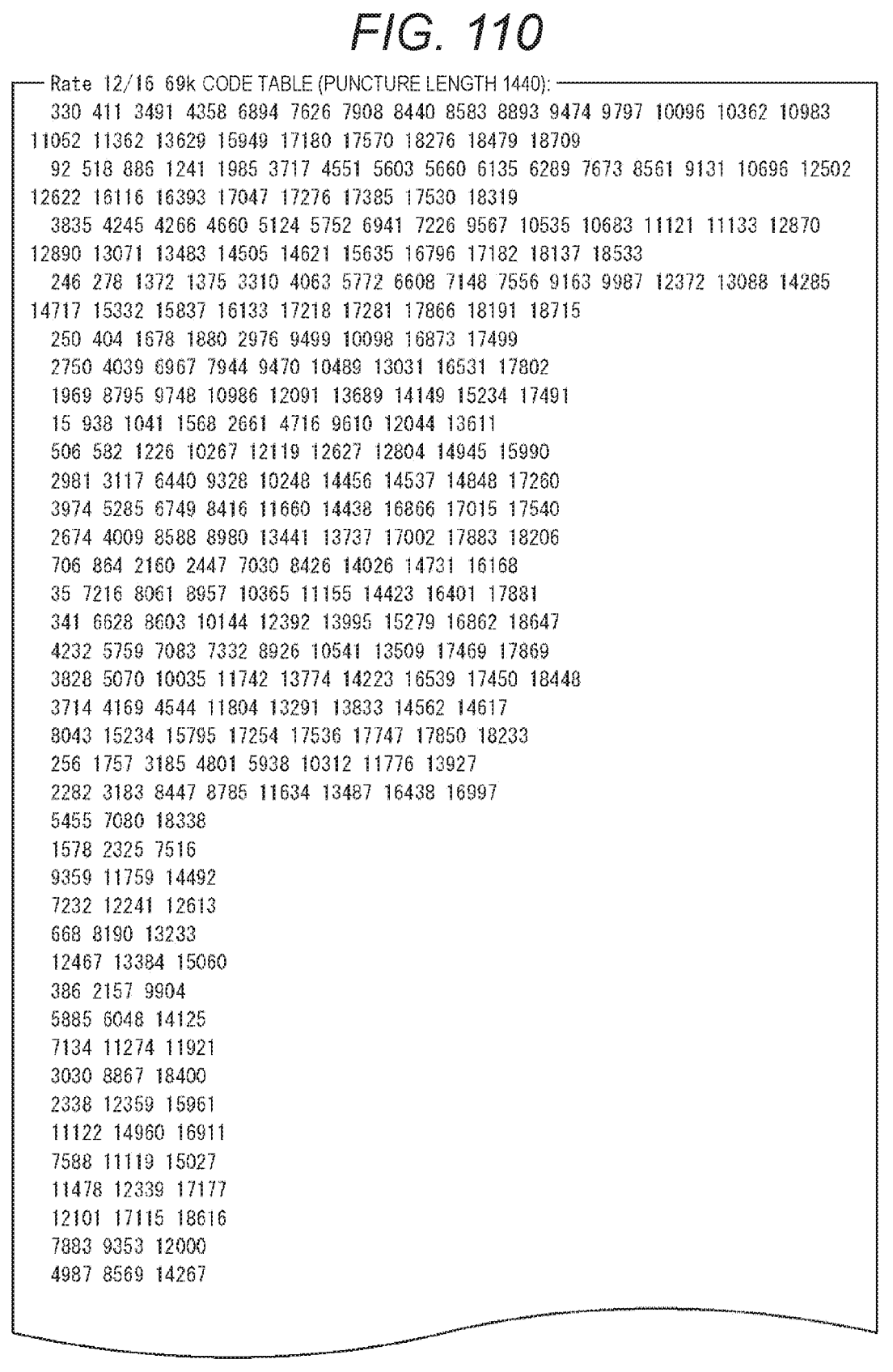
Figure 111:
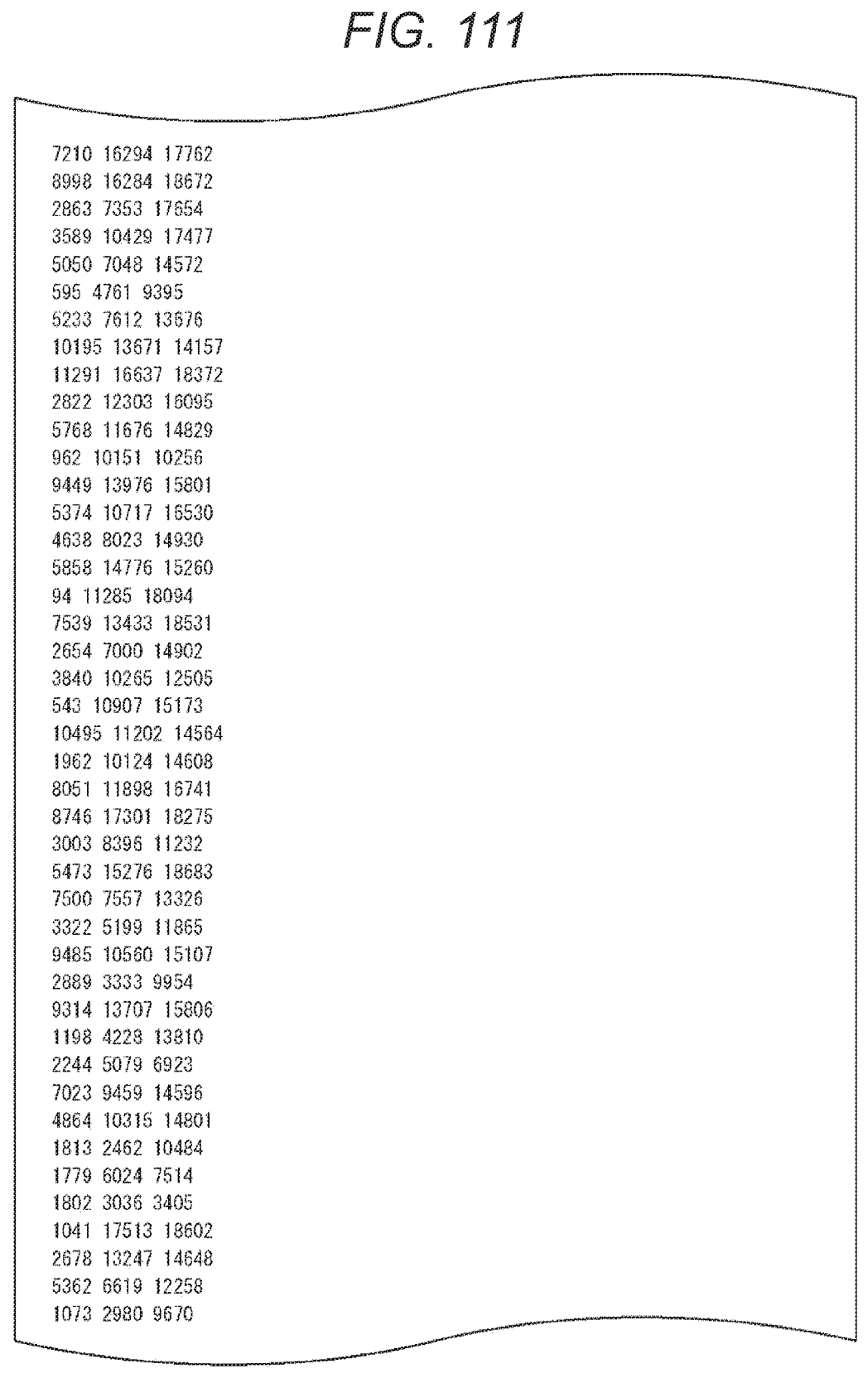
Figure 112:
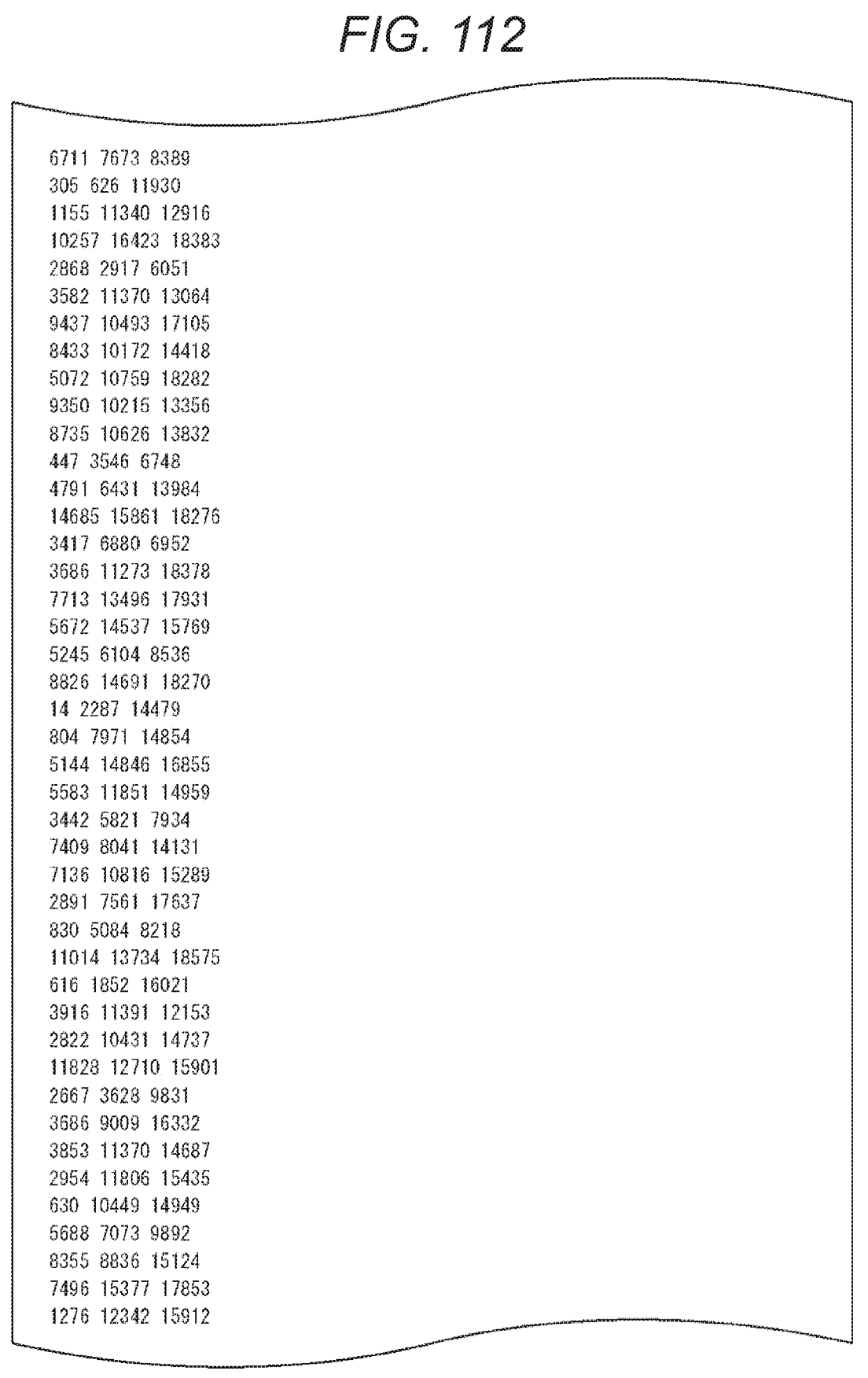
Figure 113:
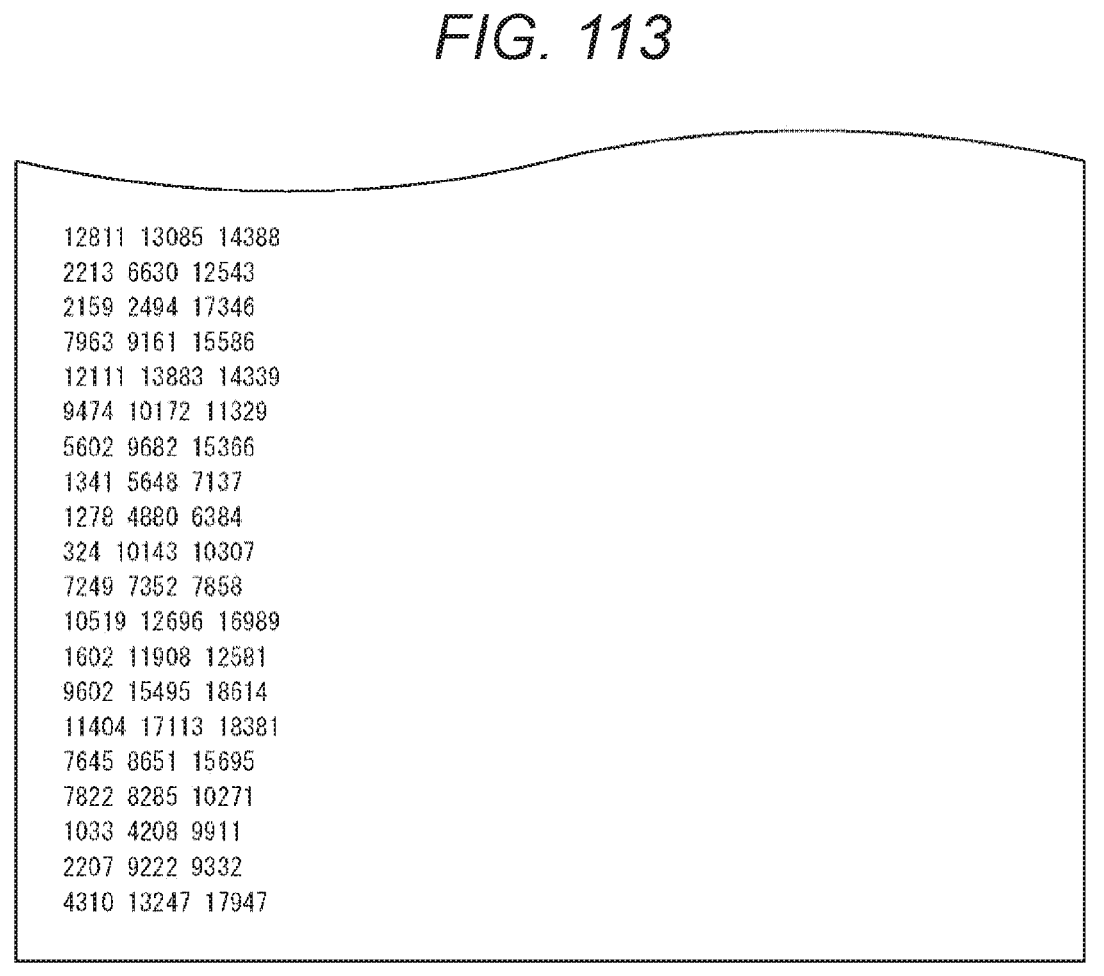

Note that FIG. 111 is a diagram following FIG. 110 and FIG. 112 is a diagram following FIG. 111. Note that FIG. 113 is a diagram following FIG. 112.

Puncturing with the puncture length L=1440 is performed for a type B extended LDPC code for (69 k, 12/16). Therefore, the punctured LDPC code obtained by puncturing the type B extended LDPC code for (69 k, 12/16) is shorter by the puncture length L=1440 than the type B extended LDPC code for (69 k, 12/16) before puncturing.

FIGS. 114, 115, 116, and 117 are diagrams illustrating examples of a parity check matrix initial value table representing a type B extended parity check matrix of an extended LDPC code of the type B method (hereinafter also referred to as type B extended LDPC code for (69 k, 13/16)) to be used in a case of obtaining a punctured LDPC code with the code length N of 69120 bits and the coding rate r of 13/16.

Figure 114:
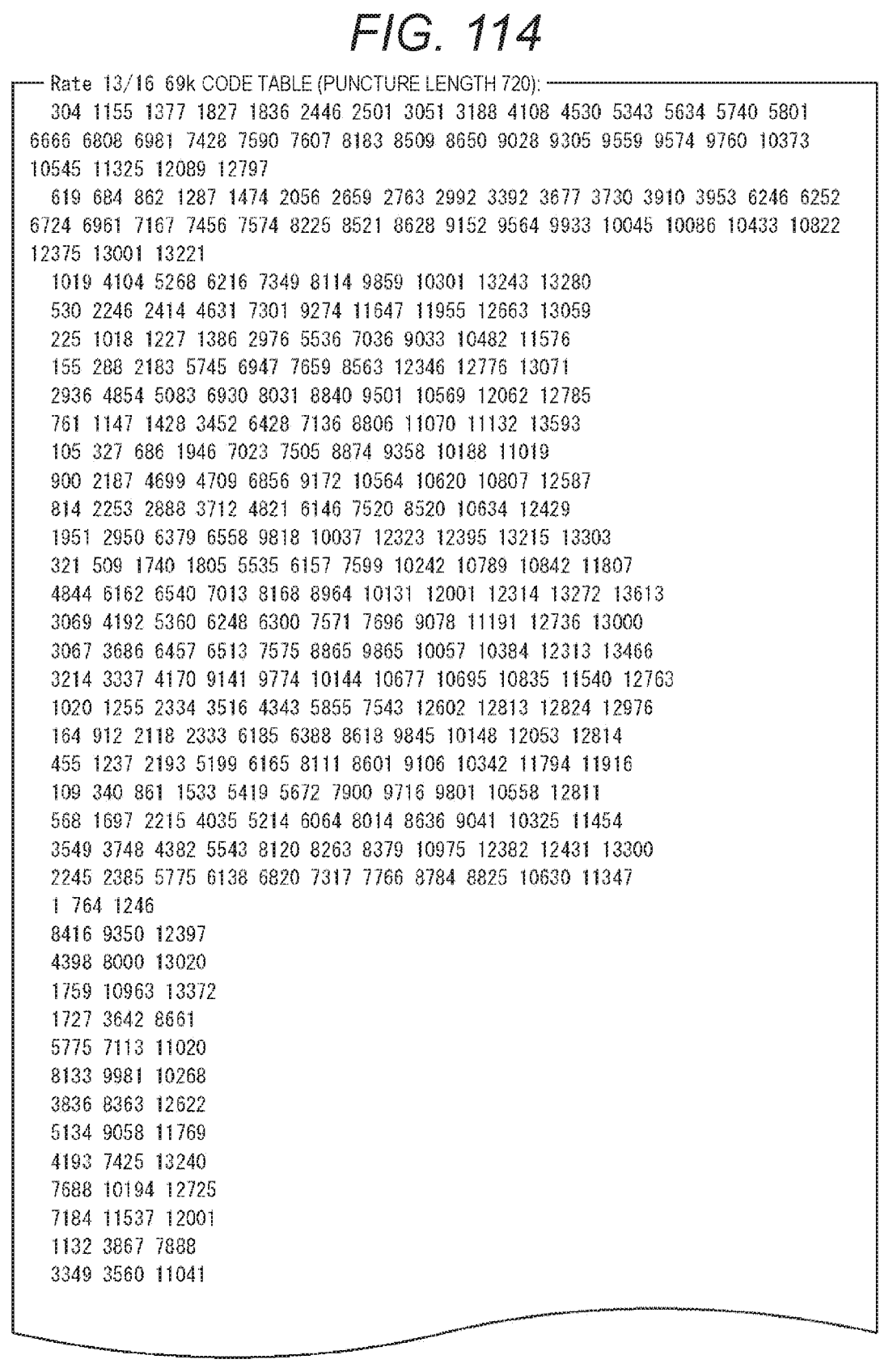
Figure 115:
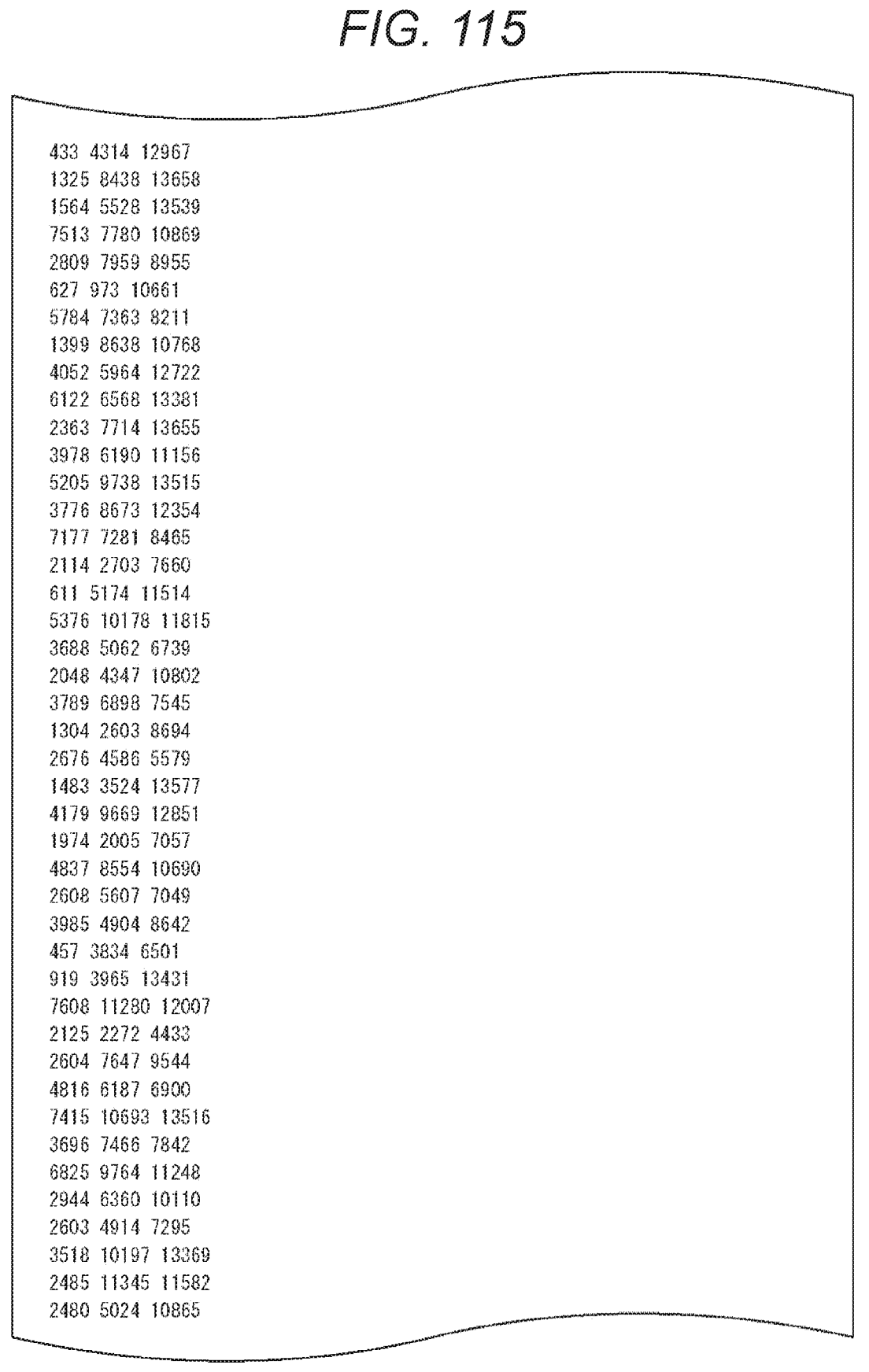
Figure 116:
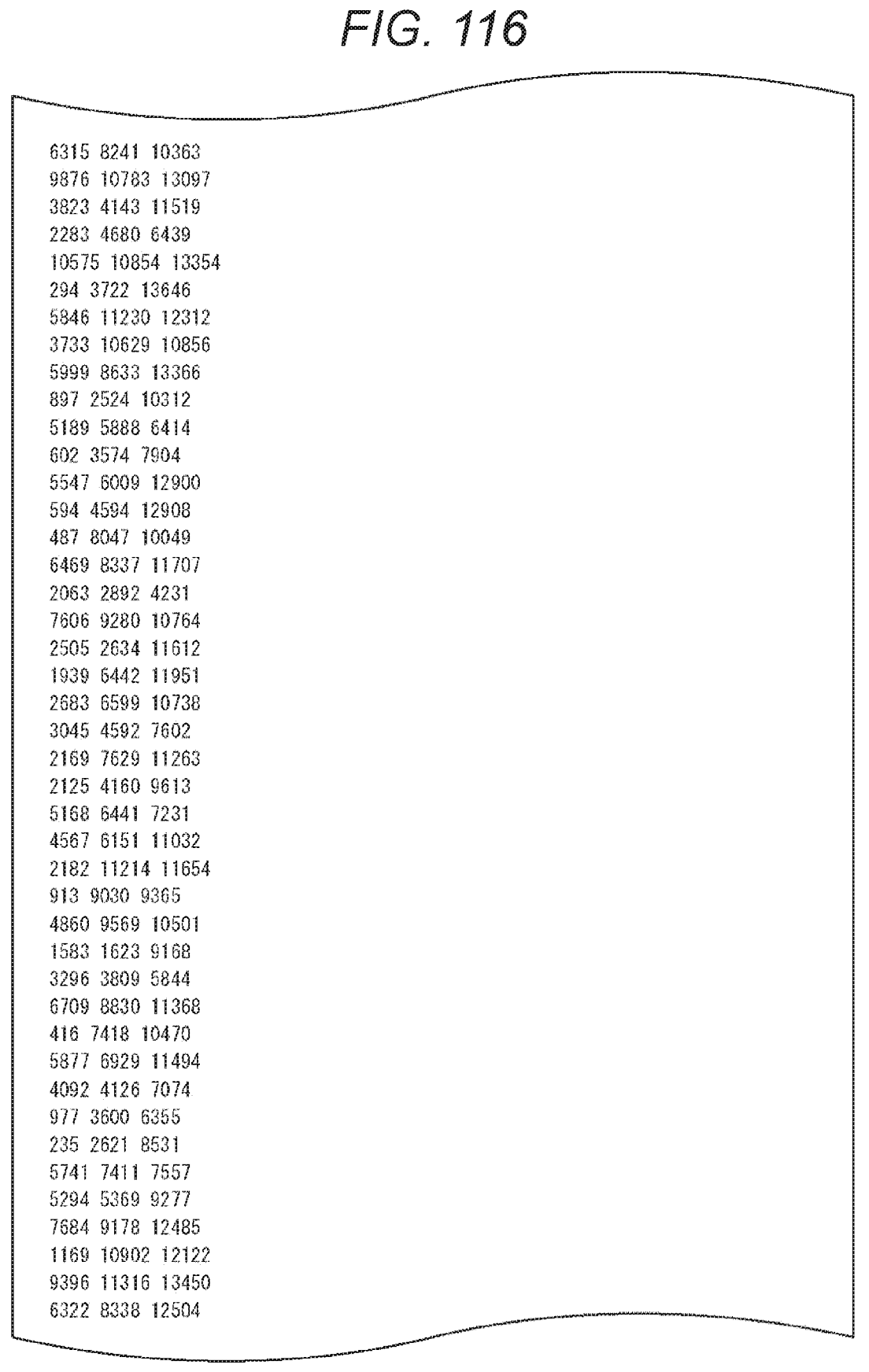
Figure 117:
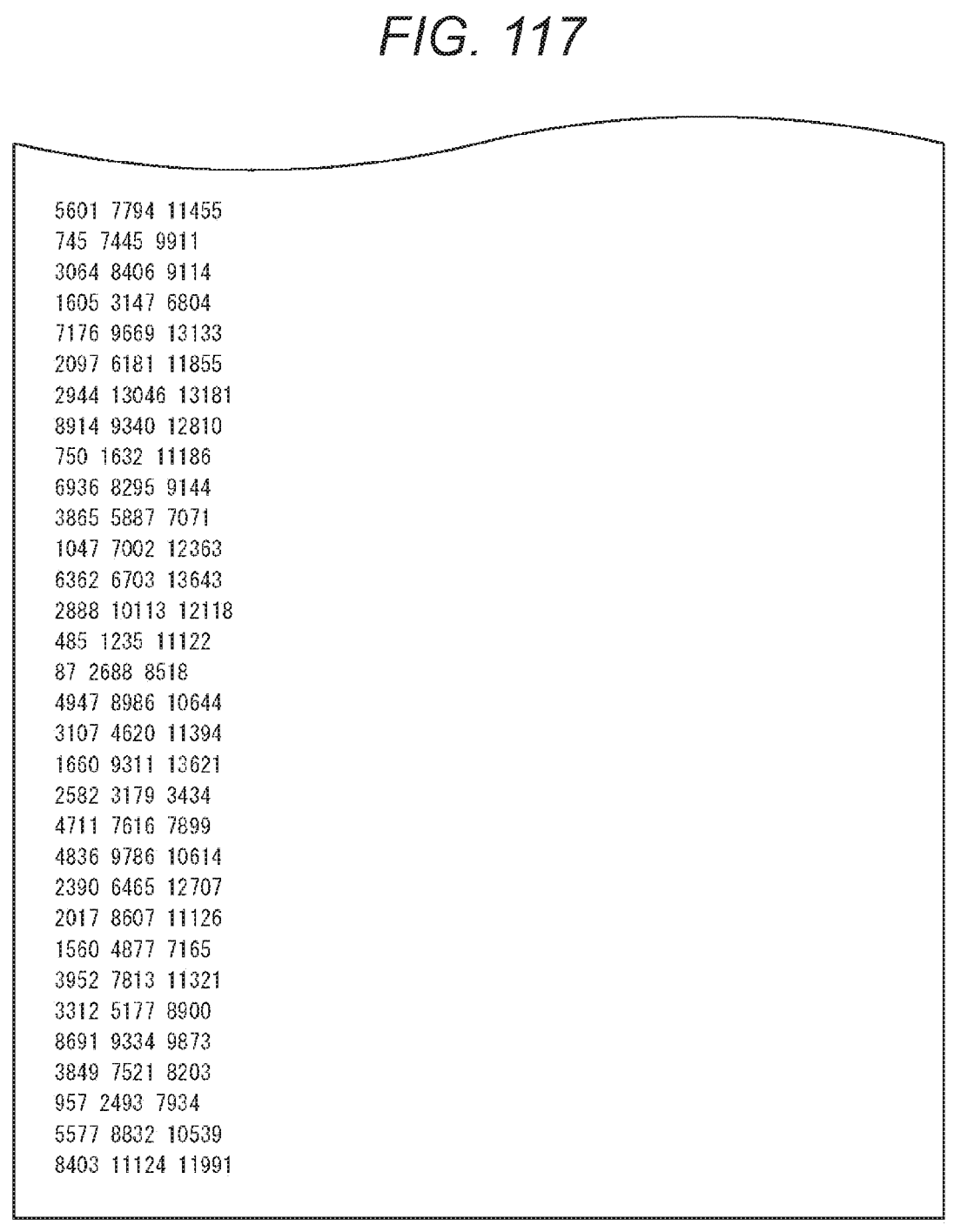

Note that FIG. 115 is a diagram following FIG. 114 and FIG. 116 is a diagram following FIG. 115. Note that FIG. 117 is a diagram following FIG. 116.

Puncturing with the puncture length L=720 is performed for a type B extended LDPC code for (69 k, 13/16). Therefore, the punctured LDPC code obtained by puncturing the type B extended LDPC code for (69 k, 13/16) is shorter by the puncture length L=720 than the type B extended LDPC code for (69 k, 13/16) before puncturing.

FIGS. 118, 119, 120, and 121 are diagrams illustrating examples of a parity check matrix initial value table representing a type B extended parity check matrix of an extended LDPC code of the type B method (hereinafter also referred to as type B extended LDPC code for (69 k, 14/16)) to be used in a case of obtaining a punctured LDPC code with the code length N of 69120 bits and the coding rate r of 14/16.

Figure 118:
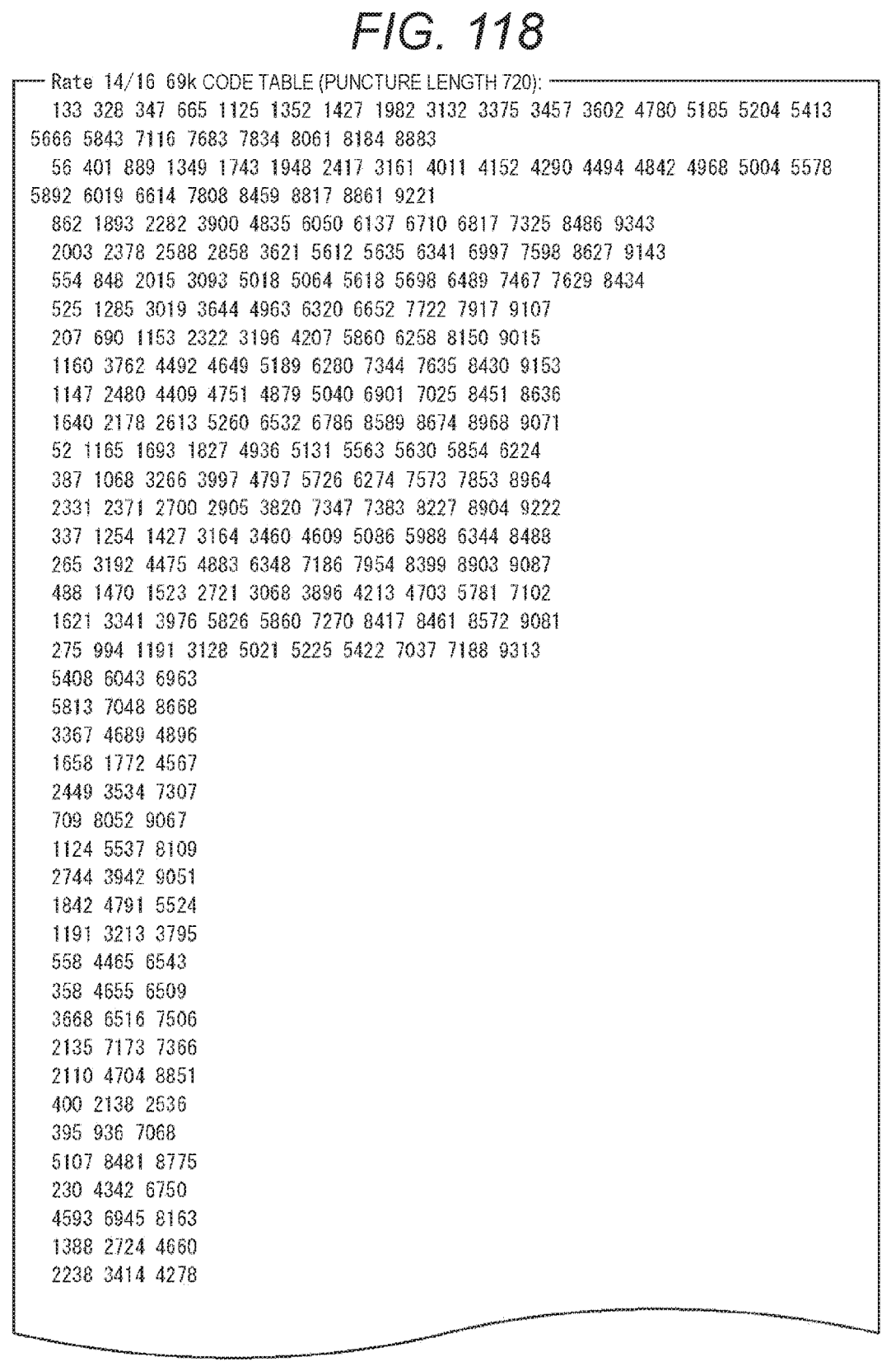
Figure 119:
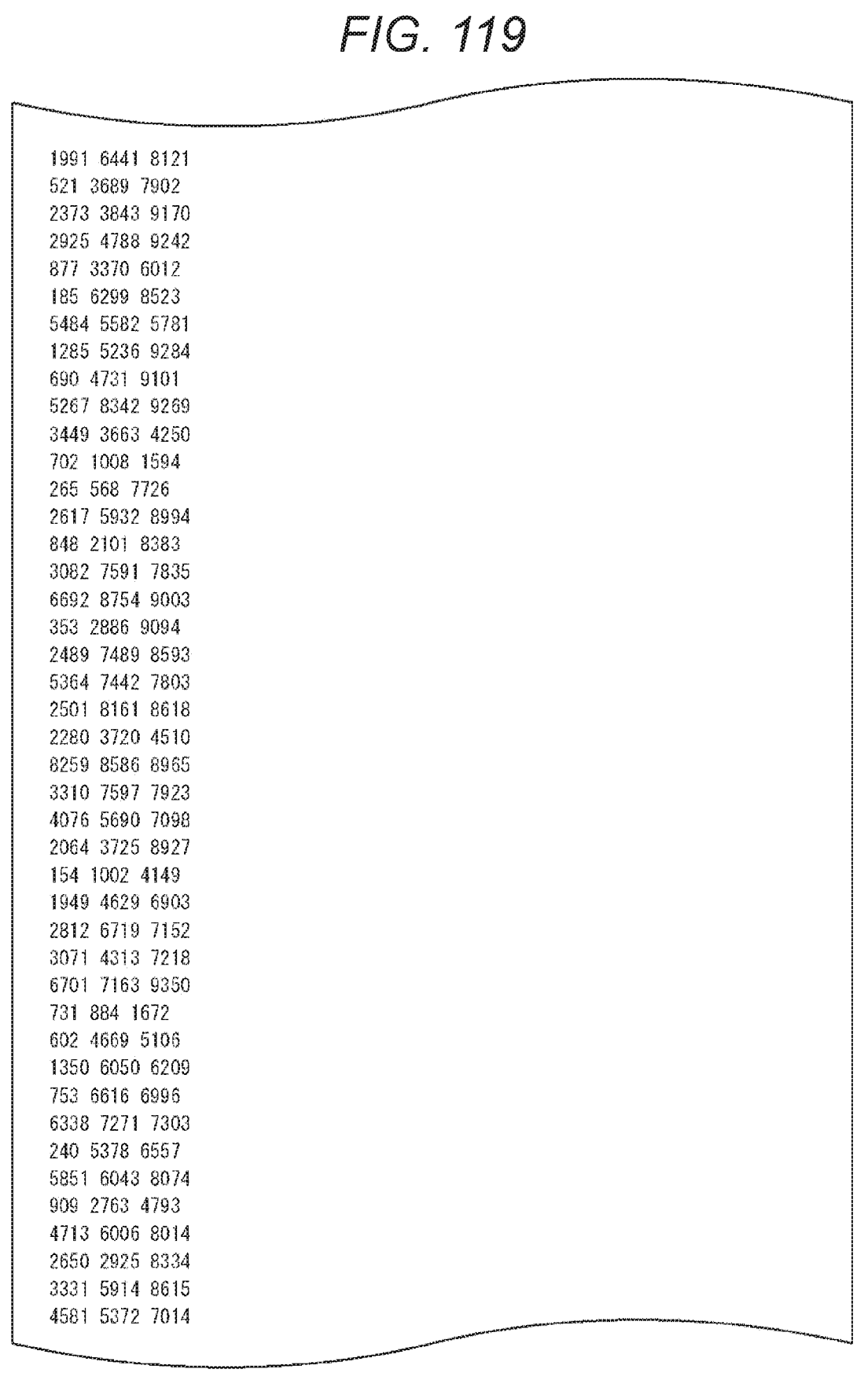
Figure 120:
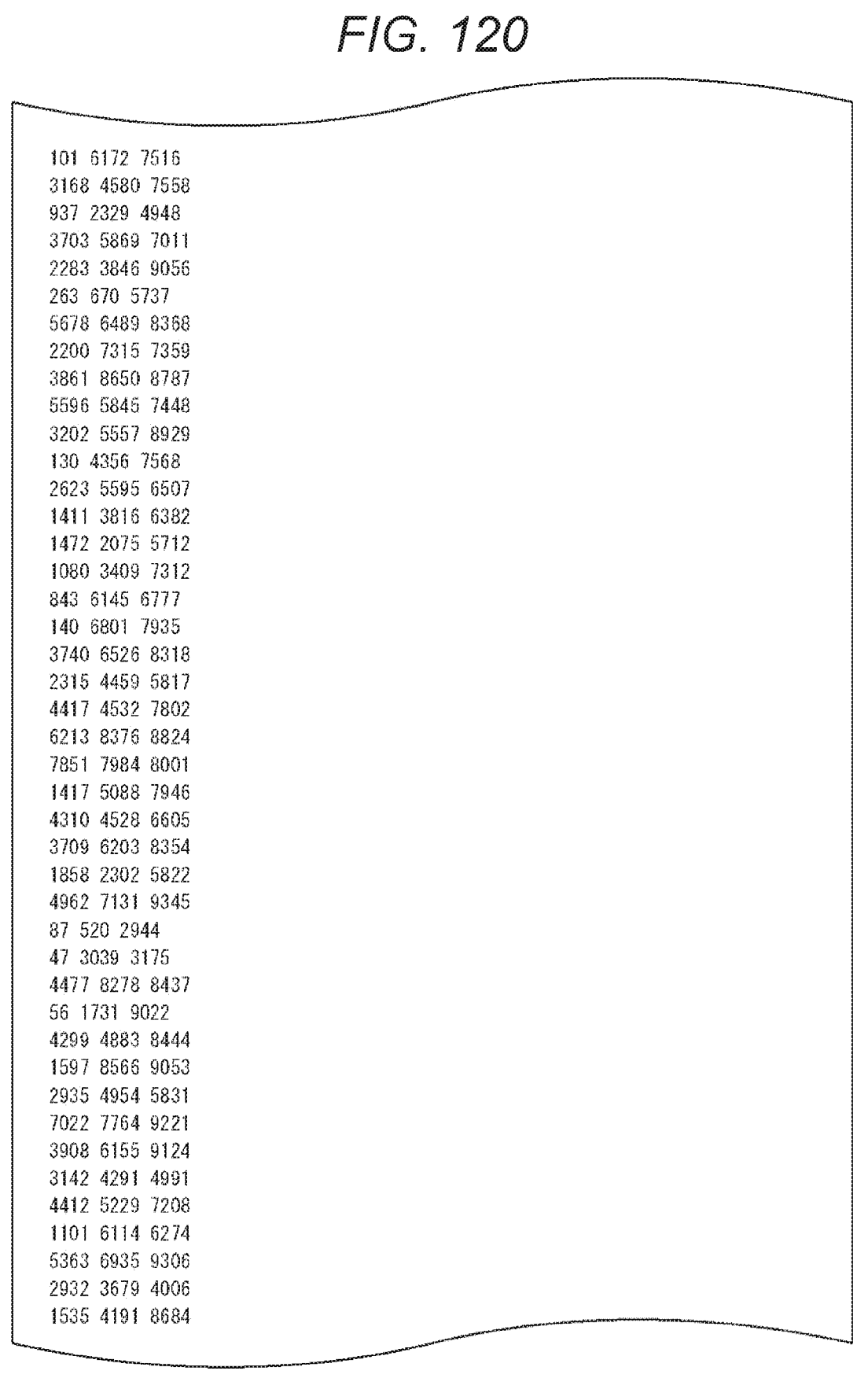
Figure 121:
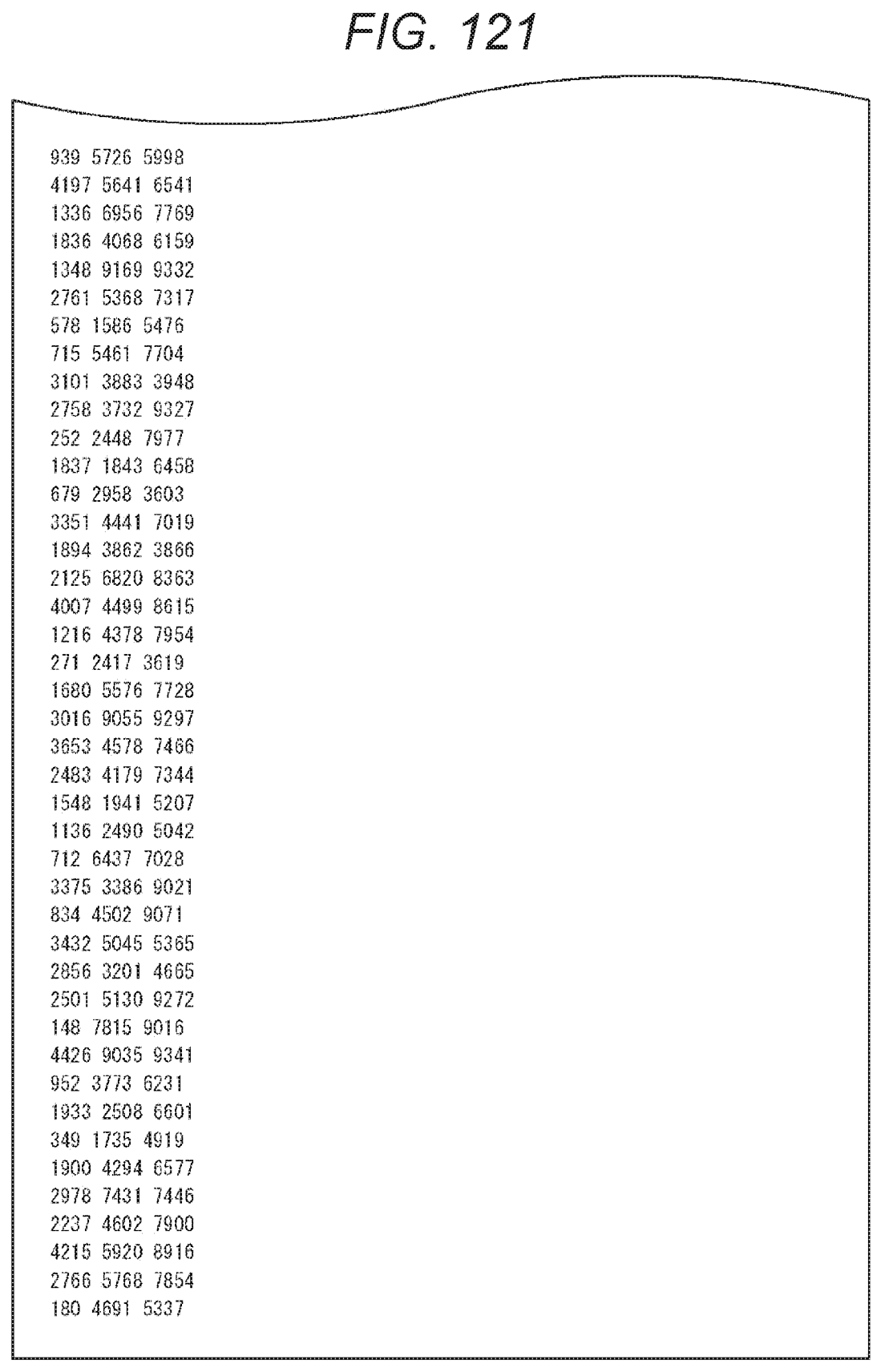

Note that FIG. 119 is a diagram following FIG. 118 and FIG. 120 is a diagram following FIG. 119. Note that FIG. 121 is a diagram following FIG. 120.

Puncturing with the puncture length L=720 is performed for a type B extended LDPC code for (69 k, 14/16). Therefore, the punctured LDPC code obtained by puncturing the type B extended LDPC code for (69 k, 14/16) is shorter by the puncture length L=720 than the type B extended LDPC code for (69 k, 14/16) before puncturing.

Figure 122:
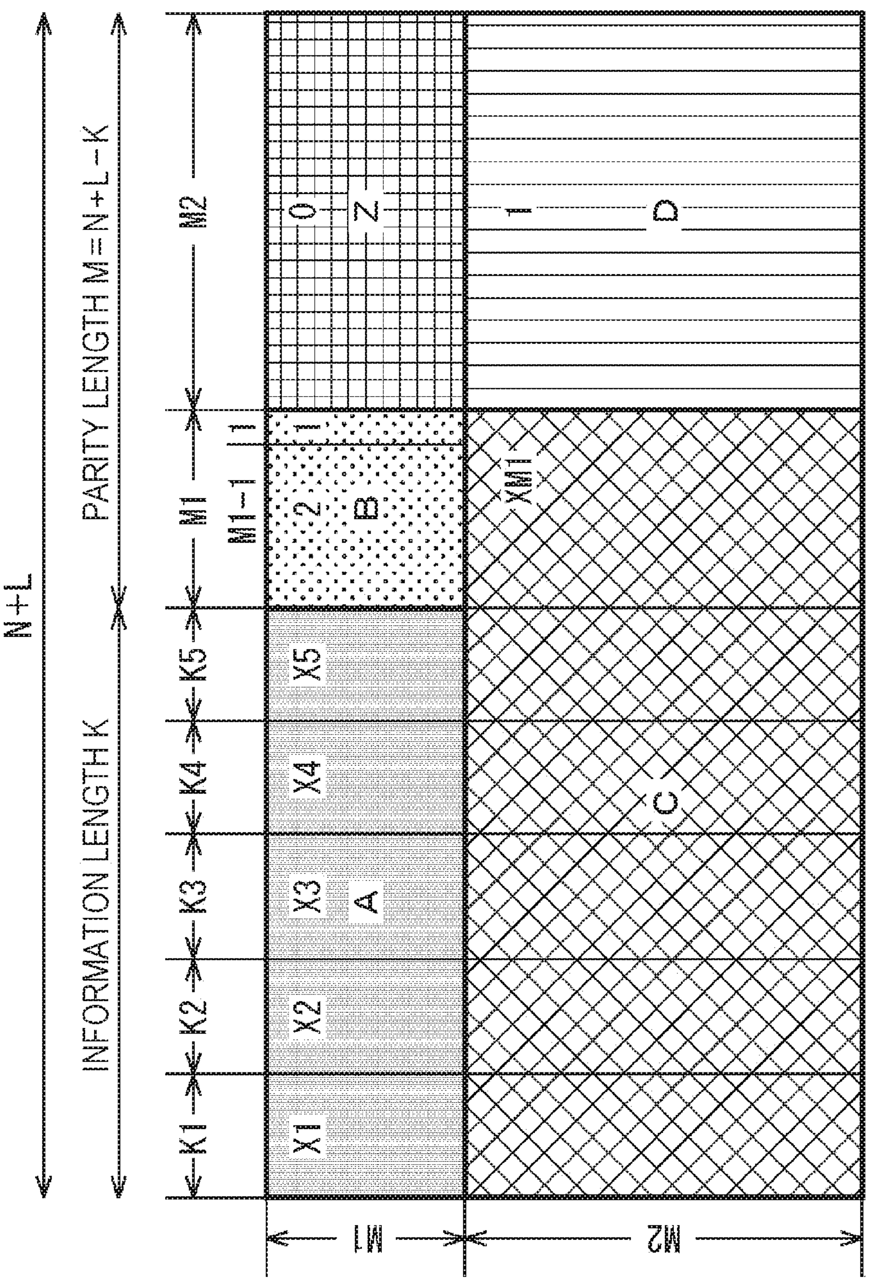

FIG. 122 is a diagram for describing column weights of the type A extended parity check matrix represented by the parity check matrix initial value table of the type A method in FIGS. 79 to 98.

For the type A extended parity check matrix, as illustrated in FIG. 122, the column weight of K1 columns from the first column of the A matrix and the C matrix is represented as X1, the column weight of subsequent K2 columns of the A matrix and the C matrix is represented as X2, the column weight of subsequent K3 columns of the A matrix and the C matrix is represented as X3, the column weight of subsequent K4 columns of the A matrix and the C matrix is represented as X4, and the column weight of subsequent K5 columns of the A matrix and the C matrix is represented as X5.

Here, the number of columns of the A matrix is equal to an information length K=K1+K2+K3+K4+K5, and the number of columns of the C matrix is K+M1 larger than the information length K=K1+K2+K3+K4+K5.

Furthermore, for the type A extended parity check matrix, the column weight of the (K+1)th to the M1 column of the C matrix is represented as XM1.

In the type A extended parity check matrix, the parity length M=N+L−K is equal to a sum M1+M2 of the number of columns M1 of the B matrix and the number of columns M2 of the Z matrix.

A code length N+L of the type A extended parity check matrix is a sum 69120+L of the code length N=69120 and the puncture length L of the punctured LDPC code, and can be represented as K1+K2+K3+K4+K5+M1+M2.

Furthermore, for the type A extended parity check matrix, the column weight of the first column to the M1-1 column of the B matrix is 2, and the column weight of the M1 column (last column) of the B matrix is 1. Moreover, the column weight of the D matrix is 1 and the column weight of the Z matrix is 0.

FIG. 123 is a diagram illustrating parameters of the type A extended parity check matrix represented by the parity check matrix initial value table of the type A method in FIGS. 79 to 98.

X1 to X5, K1 to K5, XM1, M1, M2, the information length K, and the puncture length L in FIG. 122 as parameters of the type A extended parity check matrix of the extended LDPC code of the type A method used in the case of obtaining the punctured LDPC code of r=2/16, 3/16, 4/16, 5/16, 6/16, 7/16, 8/16, or 9/16 are as illustrated in FIG. 123.

In other words, for the type A extended parity check matrix of the extended LDPC code of the type A method used in the case of obtaining the punctured LDPC code of r=2/16, the information length K, the puncture length L, (X1, K1), (X2, K2), (X3, K3), (X4, K4), (X5, K5), XM1, M1, and M2 are 8640, 0, (21, 1440), (20, 7200), (0, 0), (0, 0), (0, 0), 16, 1800, and 58680.

For the type A extended parity check matrix of the extended LDPC code of the type A method used in the case of obtaining the punctured LDPC code of r=3/16, the information length K, the puncture length L, (X1, K1), (X2, K2), (X3, K3), (X4, K4), (X5, K5), XM1, M1, and M2 are 12960, 0, (16, 11520), (15, 1440), (0, 0), (0, 0), (0, 0), 11, 1800, and 54360.

For the type A extended parity check matrix of the extended LDPC code of the type A method used in the case of obtaining the punctured LDPC code of r=4/16, the information length K, the puncture length L, (X1, K1), (X2, K2), (X3, K3), (X4, K4), (X5, K5), XM1, M1, and M2 are 17280, 0, (13, 16200), (12, 720), (45, 360), (0, 0), (0, 0), 9, 1800, and 50040.

For the type A extended parity check matrix of the extended LDPC code of the type A method used in the case of obtaining the punctured LDPC code of r=5/16, the information length K, the puncture length L, (X1, K1), (X2, K2), (X3, K3), (X4, K4), (X5, K5), XM1, M1, and M2 are 21600, 1800, (28, 720), (27, 1080), (9, 7560), (8, 3960), (10, 8280), 4, 3600, and 45720.

For the type A extended parity check matrix of the extended LDPC code of the type A method used in the case of obtaining the punctured LDPC code of r=6/16, the information length K, the puncture length L, (X1, K1), (X2, K2), (X3, K3), (X4, K4), (X5, K5), XM1, M1, and M2 are 25920, 1800, (25, 1800), (9, 13680), (8, 8640), (10, 1800), (0, 0), 2, 3600, and 41400.

For the type A extended parity check matrix of the extended LDPC code of the type A method used in the case of obtaining the punctured LDPC code of r=7/16, the information length K, the puncture length L, (X1, K1), (X2, K2), (X3, K3), (X4, K4), (X5, K5), XM1, M1, and M2 are 30240, 2160, (19, 2160), (8, 26280), (7, 360), (3, 1440), (0, 0), 2, 3960, and 37080.

For the type A extended parity check matrix of the extended LDPC code of the type A method used in the case of obtaining the punctured LDPC code of r=8/16, the information length K, the puncture length L, (X1, K1), (X2, K2), (X3, K3), (X4, K4), (X5, K5), XM1, M1, and M2 are 34560, 2520, (15, 1800), (14, 720), (8, 20880), (7, 5040), (4, 6120), 1, 5040, and 32040.

For the type A extended parity check matrix of the extended LDPC code of the type A method used in the case of obtaining the punctured LDPC code of r=9/16, the information length K, the puncture length L, (X1, K1), (X2, K2), (X3, K3), (X4, K4), (X5, K5), XM1, M1, and M2 are 38880, 1800, (18, 1440), (17, 360), (10, 3240), (9, 12240), (4, 21600), 1, 9000, and 23040.

The parameters X1 to X5, K1 to K5, XM1, and M1 (M2), and the puncture length L are set to further improve the performance (e.g., BER or the like) of the punctured LDPC code.

Figure 124:
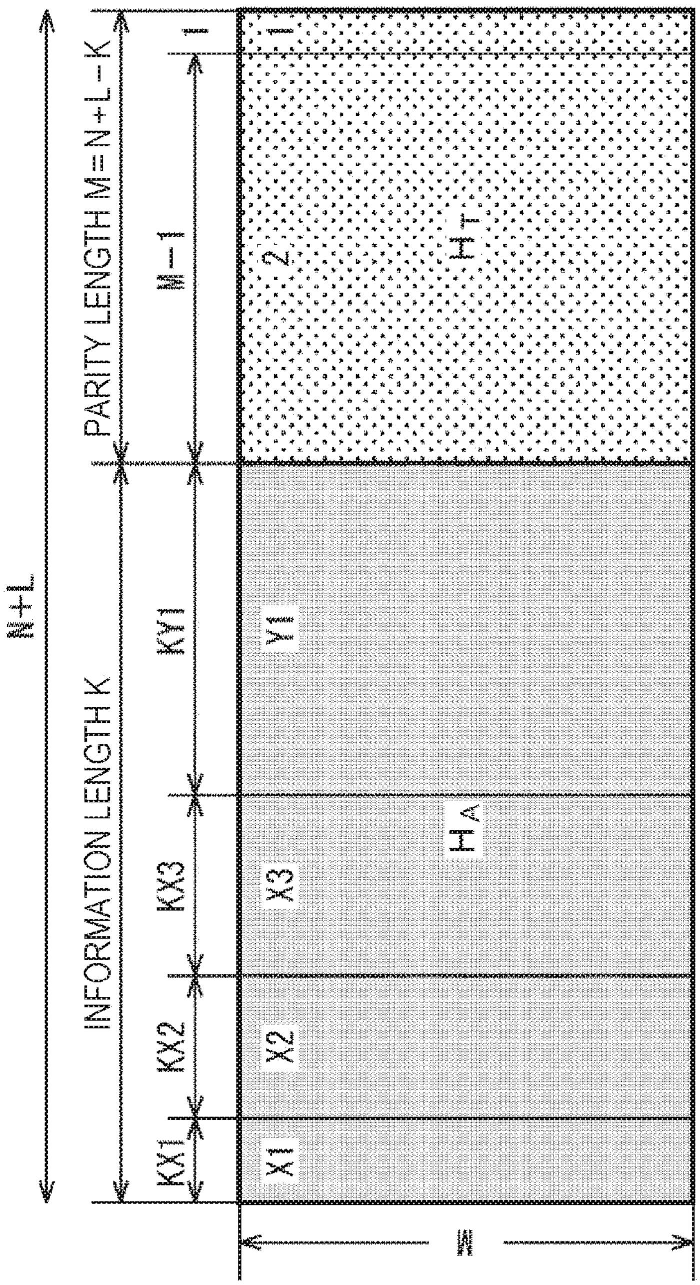

FIG. 124 is a diagram for describing column weights of the type B extended parity check matrix represented by the parity check matrix initial value table of the type B method in FIGS. 99 to 121.

For type B extended parity check matrix, as illustrated in FIG. 124, the column weight of KX1 columns from the first column is represented as X1, the column weight of subsequent KX2 columns is represented as X2, the column weight of subsequent KX3 columns is represented as X3, and the column weight of subsequent KY1 columns is represented as Y1.

Note that KX1+KX2+KX3+KY1 is equal to the information length K, and KX1+KX2+KX3+KY1+M is equal to the code length N+L=69120+L of the extended LDPC code.

Furthermore, for the type B extended parity check matrix, the column weight of the last M columns, in other words, the M−1 columns of the parity matrix $H_T$ excluding the last one column is 2, and the column weight of the last one column is 1.

FIG. 125 is a diagram illustrating parameters of the type B extended parity check matrix represented by the parity check matrix initial value table of the type B method in FIGS. 99 to 121.

X1, KX1, X2, KX2, X3, KX3, Y1, KY1, M, the information length K, and the puncture length L in FIG. 124 as parameters of the type B extended parity check matrix of the extended LDPC code of the type B method used in the case of obtaining the punctured LDPC code of r=9/16, 10/16, 11/16, 12/16, 13/16, or 14/16 are as illustrated in FIG. 125.

In other words, for the type B extended parity check matrix of the extended LDPC code of the type B method used in the case of obtaining the punctured LDPC code of r=9/16, the information length K, the puncture length L, X1, KX1, X2, KX2, X3, KX3, Y1, KY1, and M are 38880, 1080, 29, 1080, 17, 3240, 12, 3240, 3, 31320, and 31320.

For the type B extended parity check matrix of the extended LDPC code of the type B method used in the case of obtaining the punctured LDPC code of r=10/16, the information length K, the puncture length L, X1, KX1, X2, KX2, X3, KX3, Y1, KY1, and M are 43200, 360, 73, 360, 38, 360, 14, 8280, 3, 34200, and 26280.

For the type B extended parity check matrix of the extended LDPC code of the type B method used in the case of obtaining the punctured LDPC code of r=11/16, the information length K, the puncture length L, X1, KX1, X2, KX2, X3, KX3, Y1, KY1, and M are 47520, 1440, 29, 1440, 8, 1800, 9, 5760, 3, 38520, and 23040.

For the type B extended parity check matrix of the extended LDPC code of the type B method used in the case of obtaining the punctured LDPC code of r=12/16, the information length K, the puncture length L, X1, KX1, X2, KX2, X3, KX3, Y1, KY1, and M are 51840, 1440, 24, 1440, 9, 4680, 8, 1440, 3, 44280, and 18720.

For the type B extended parity check matrix of the extended LDPC code of the type B method used in the case of obtaining the punctured LDPC code of r=13/16, the information length K, the puncture length L, X1, KX1, X2, KX2, X3, KX3, Y1, KY1, and M are 56160, 720, 34, 720, 10, 3600, 11, 4320, 3, 47520, and 13680.

For the type B extended parity check matrix of the extended LDPC code of the type B method used in the case of obtaining the punctured LDPC code of r=14/16, the information length K, the puncture length L, X1, KX1, X2, KX2, X3, KX3, Y1, KY1, and M are 60480, 720, 24, 720, 12, 1080, 10, 4680, 3, 54000, and 9360.

The parameters X1, KX1, X2, KX2, X3, KX3, Y1, KY1 and the puncture length L (parity length M=N+L−K) are set to further improve the performance (e.g., BER or the like) of the punctured LDPC code.

According to the punctured LDPC code as described above, good BER/FER and capacity (communication path capacity) can be realized.

Here, in the extended parity check matrix, the column weight (for example, X1) on the left side tends to be larger than the column weight (for example, X3) on the right side, as illustrated in FIGS. 123 and 125.

Therefore, in the extended LDPC code, bits on the left side (on the head side) are connected to a larger number of nodes (check nodes) in the Tanner graph of the extended parity check matrix. As a result, in the extended LDPC code, if an error occurs in a left bit, the influence of the error may be propagated to many nodes and prevent improvement of BER.

Therefore, for the extended LDPC code, puncturing the bits on the left side, that is, the bits on the head side of the information bit can suppress propagation of the influence of the error to many nodes and prevention of improvement of BER.

Note that, here, the bits on the head side of the extended LDPC code (the head portion of the information bits) are punctured, but the bits to be punctured are limited to the bits on the head side of the extended LDPC code.

In other words, puncturing of the extended LDPC code can be performed, for example, for arbitrary bits such as part of the parity bits of the extended LDPC code.

<Embodiment of Computer>

Next, the above-described series of processing can be executed by hardware or software. In a case of executing the series of processing by software, a program that configures the software is installed in a general-purpose computer or the like.

Figure 126:
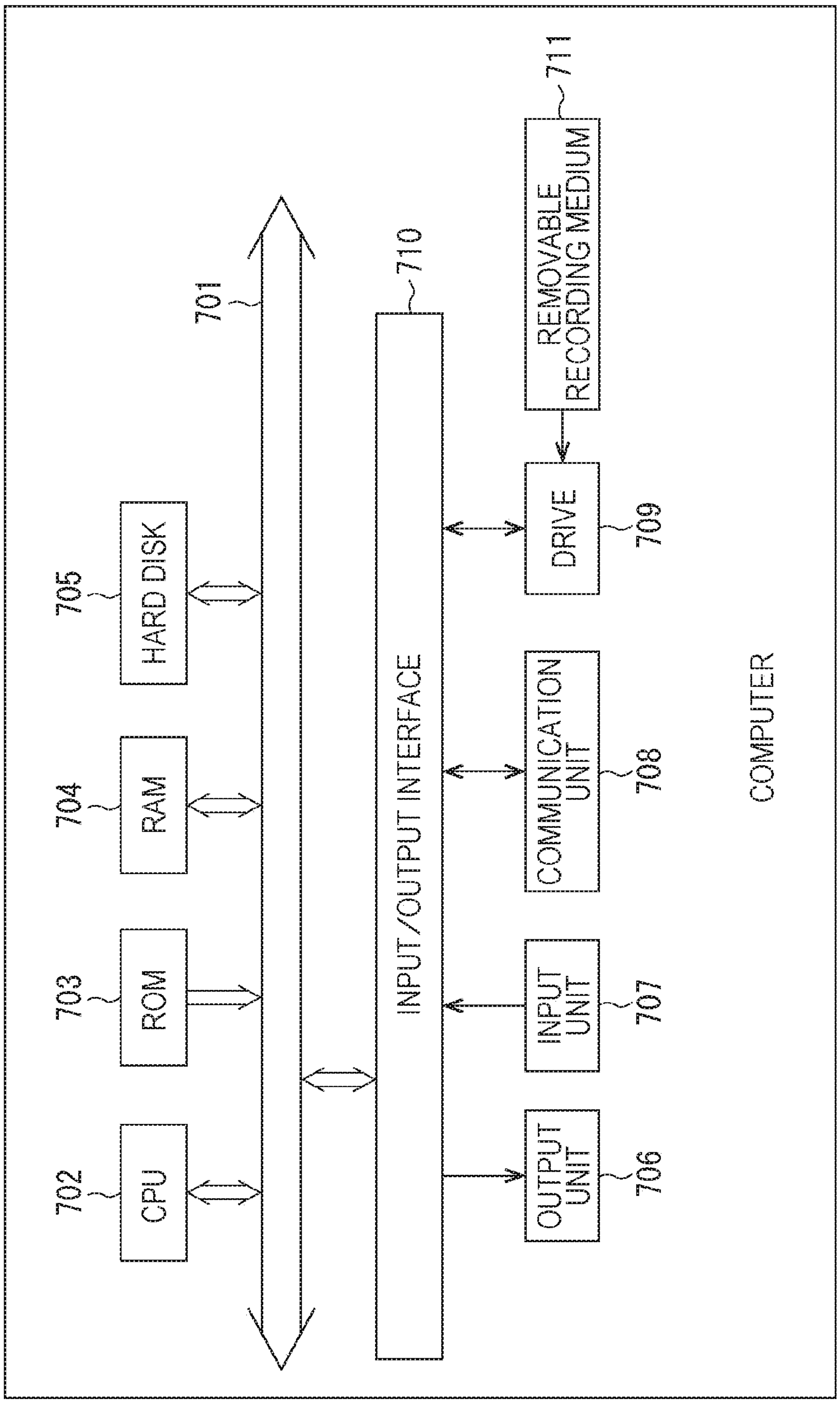

Thus, FIG. 126 illustrates a configuration example of an embodiment of a computer to which a program for executing the above-described series of processing is installed.

The program can be recorded in advance in a hard disk 705 or a ROM 703 as a recording medium built in the computer.

Alternatively, the program can be temporarily or permanently stored (recorded) on a removable recording medium 711 such as a flexible disk, a compact disc read only memory (CD-ROM), a magneto optical (MO) disk, a digital versatile disc (DVD), a magnetic disk, or a semiconductor memory. Such a removable recording medium 711 can be provided as so-called package software.

Note that the program can be installed from the above-described removable recording medium 711 to the computer, can be transferred from a download site to the computer via a satellite for digital satellite broadcasting, or can be transferred by wired means to the computer via a network such as a local area network (LAN) or the internet, and the program thus transferred can be received by a communication unit 708 and installed on the built-in hard disk 705 in the computer.

The computer incorporates a central processing unit (CPU) 702. An input/output interface 710 is connected to the CPU 702 via a bus 701. The CPU 702 executes the program stored in the read only memory (ROM) 703 according to a command when the command is input by the user by an operation of an input unit 707 including a keyboard, a mouse, a microphone, and the like via the input/output interface 710. Alternatively, the CPU 702 loads the program stored in the hard disk 705, the program transferred from the satellite or the network, received by the communication unit 708, and installed in the hard disk 705, or the program read from the removable recording medium 711 attached to a drive 709 and installed in the hard disk 705 to a random access memory (RAM) 704 and executes the program. As a result, the CPU 702 performs the processing according to the above-described flowchart or the processing performed by the configuration of the above-described block diagram. Then, the CPU 702 causes an output unit 706 including a liquid crystal display (LCD), a speaker, and the like to output the processing result, the communication unit 708 to transmit the processing result, and the hard disk 705 to record the processing result, via the input/output interface 710, as necessary, for example.

Here, processing steps describing the program for causing the computer to perform various types of processing does not necessarily need to be processed chronologically according to the order described in the flowcharts, and includes processing executed in parallel or individually (for example, processing by parallel processing or object).

Furthermore, the program may be processed by one computer or may be processed in a distributed manner by a plurality of computers. Moreover, the program may be transferred to a remote computer and executed.

Note that embodiments of the present technology are not limited to the above-described embodiments, and various modifications can be made without departing from the gist of the present technology.

For example, (the parity check matrix initial value table of) the above-described new LDPC code and GW pattern can be used for a satellite channel, a ground wave, a cable (wired channel), and another communication path 13 (FIG. 7). Moreover, the new LDPC code and GW pattern can be used for data transmission other than digital broadcasting.

Note that the effects described in the present specification are merely examples and are not limited, and other effects may be exhibited.

REFERENCE SIGNS LIST

11 Transmission device
12 Reception device
23 Parity interleaver
24 Group-wise interleaver
25 Block interleaver
54 Block deinterleaver
55 Group-wise deinterleaver
111 Mode adaptation/multiplexer
112 Padder
113 BB scrambler
114 BCH encoder
115 LDPC encoder
116 Bit interleaver
117 Mapper
118 Time interleaver
119 SISO/MISO encoder
120 Frequency interleaver
121 BCH encoder
122 LDPC encoder
123 Mapper
124 Frequency interleaver
131 Frame builder/resource allocation unit 132 OFDM generation unit
151 OFDM processing unit
152 Frame management unit
153 Frequency deinterleaver
154 Demapper
155 LDPC decoder
156 BCH decoder
161 Frequency deinterleaver
162 SISO/MISO decoder
163 Time deinterleaver
164 Demapper
165 Bit deinterleaver
166 LDPC decoder
167 BCH decoder
168 BB descrambler
169 Null deletion unit
170 Demultiplexer
300 Edge data storage memory
301 Selector
302 Check node calculation unit
303 Cyclic shift circuit
304 Edge data storage memory
305 Selector
306 Received data memory
307 Variable node calculation unit
308 Cyclic shift circuit
309 Decoded word calculation unit
310 Received data rearranging unit
311 Decoded data rearranging unit
601 Coding processing unit
602 Storage unit
611 Coding rate setting unit
612 Initial value table reading unit
613 Parity check matrix generation unit
614 Information bit reading unit
615 Coding parity operation unit
616 Control unit
701 Bus
702 CPU
703 ROM
704 RAM
705 Hard disk
706 Output unit
707 Input unit
708 Communication unit
709 Drive
710 Input/output interface
711 Removable recording medium
1001 Reverse permutation unit
1002 Memory
1011 Parity deinterleaver
1101 Acquisition unit
1101 Transmission path decoding processing unit
1103 Information source decoding processing unit
1111 Output unit
1121 Recording unit

The invention claimed is:

1. A transmission device, comprising:
an encoder configured to:
perform low density parity check (LDPC) coding for information bits with an information length K=N×r to generate an extended LDPC code having parity bits with a parity length M=N+L−K, wherein
the LDPC coding is performed based on an extended parity check matrix having rows and columns, and
the rows and the columns of the extended parity check matrix are extended by a puncture length L with respect to a parity check matrix of an LDPC code with a code length N of 69120 bits and a coding rate r of 2/16;

puncture a head of the information bits of the extended LDPC code by the puncture length L to generate a punctured LDPC code with the code length N of 69120 bits and the coding rate r of 2/16; and transmit the generated punctured LDPC code from the transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 1444 1737 1780 9182 9748 9954 11859 23510 36957 41211 41804 41857 42268 42854 45152 46217 46448 52760 57528 59998 60168

281 1279 1468 9650 11337 15973 21859 24346 25864 28317 33522 35344 40280 43576 43942 50851 53221 57076 57561 59922 59962

132 758 1470 2901 2957 3365 4567 7062 10939 12288 20818 35122 39299 41903 43394 44289 49129 51394 53222 53899 56037

9 756 1510 3127 4867 15380 16575 17906 19275 20944 25462 27021 31939 34367 36491 39391 45013 45505 47768 50626 51547

188 252 1181 2939 4132 7944 12352 15443 17831 18785 18904 22672 23400 30518 30652 45102 51500 52032 52868 60341

496 564 1527 2708 2751 3658 6451 8212 11654 17193 21558 23963 28394 30554 30628 35052 44835 45090 49804 52979

793 858 1710 3561 10566 11369 17707 20970 22329 22383 24607 31237 38613 42719 43867 45715 50453 51882 55535 60316

689 980 1657 2690 4633 11070 16939 18443 20748 21753 25742 30361 31544 31693 33019 40842 47042 48850 52130 56606

198 281 1664 3384 12801 17438 24093 29656 30578 31929 35921 38919 38984 40957 43262 48155 50743 56398 56427 59215

457 1065 1196 2861 12717 15390 16655 17899 18300 22233 31560 32716 34991 43324 46709 51328 52891 54292 56334 59229

1307 1481 1599 13551 21460 22804 23439 32551 32671 35941 36329 40096 41474 45156 50568 55578 55667 56581 59061 60009

99 485 708 4043 5527 5824 7489 8809 15871 17753 18297 18507 19070 22839 28023 41124 43165 50873 51968 57000

188 412 1641 1833 5707 7556 10610 12636 14533 26728 27604 31757 32972 34677 36279 38315 42252 43155 53121 57503

300 794 1153 6459 7063 13526 17788 18308 21233 21439 22250 28514 32042 32160 36140 44273 49289 50434 51163 56471

757 1336 1440 5560 6283 10080 10986 13051 17638 22870 31581 35463 41212 42195 43305 46746 49564 56412 58207 59477

106 1195 1474 6273 14321 14746 16496 17016 17214 19472 27450 33489 40638 42896 43150 47624 51106 51339 53730 55816

98 1002 1336 2076 9328 10989 13413 13916 14455 17863 19776 24981 31172 39450 40385 43348 44833 46967 52917 58029

262 1363 1605 4715 8438 8794 12188 18208 19803 28570 36281 38576 39120 40344 44994 45827 46559 49914 50771 56658

870 1743 1764 5521 8695 11745 15888 16359 16412 33151 37033 38281 38499 39026 41174 44818 53168 56178 58405 60285

861 1142 1169 2232 4370 9265 10442 15376 15947 19420 24577 29045 36440 38242 41035 47841 49589 50529 52662 59907

231 913 1440 2695 6369 7938 8296 12107 14329 19324 25096 26108 35369 38516 41289 43604 52617 57130 59909 60020

214 667 762 3988 6762 14360 15257 18298 18943 19364 29813 33804 35106 36373 39451 39478 45683 47618 48539 59814

1144 1150 1746 1800 7038 11454 18376 18819 21869 26781 33351 35591 46571 49235 49956 50749 51642 53390 56404 58103

308 317 1510 5176 12653 13311 15884 18075 22371 26021 27004 29283 30382 32114 32978 35790 47224 48249 51701 57840

2786 5188 6809 7110 7138 7167 8042 12569 15301 27503 27894 32875 35277 48267 49051 57363

6186 6554 12052 14220 15013 15388 22130 27207 30084 30620 31562 36834 38446 52593 56791 60017

8810 12703 21600 21640 22233 26157 27268 27384 33020 39679 49298 51854 52364 53298 55215 59802

2670 6309 10054 11421 11750 11901 12053 12752 17466 28571 29910 32369 34446 38373 49448 51729

11357 12810 13252 14755 22824 30867 32868 33512 34862 35560 38704 41861 42805 43103 48692 55234.

2. A transmission method, comprising:

performing low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 2/16;

puncturing a head of the information bits of the extended LDPC code by the puncture length L to generate a punctured LDPC code with the code length N of 69120 bits and the coding rate r of 2/16; and transmitting the generated punctured LDPC code from a transmission device to a reception device, wherein
the extended parity check matrix includes
an A matrix of M1 rows and K columns expressed by a value M1 and the information length K=N×r, wherein the A matrix is an upper left matrix of the extended parity check matrix,
a B matrix of M1 rows and M1 columns, wherein the B matrix has a step structure adjacent to right of the A matrix,
a Z matrix of M1 rows and N+L−K−M1 columns, wherein the Z matrix is a zero matrix adjacent to right of the B matrix,
a C matrix of N+L−K−M1 rows and K+M1 columns, wherein the C matrix is adjacent to below the A matrix and the B matrix, and
a D matrix of N+L−K−M1 rows and N+L−K−M1 columns, wherein the D matrix is an identity matrix adjacent to right of the C matrix,
the puncture length L is 0,
the value M1 is 1800,
the A matrix and the C matrix are represented by a parity check matrix initial value table,
the parity check matrix initial value table is a table representing positions of elements of 1 of the A matrix and the C matrix for every 360 columns, and
the parity check matrix initial value table is
1444 1737 1780 9182 9748 9954 11859 23510 36957 41211 41804 41857 42268 42854 45152 46217 46448 52760 57528 59998 60168
281 1279 1468 9650 11337 15973 21859 24346 25864 28317 33522 35344 40280 43576 43942 50851 53221 57076 57561 59922 59962
132 758 1470 2901 2957 3365 4567 7062 10939 12288 20818 35122 39299 41903 43394 44289 49129 51394 53222 53899 56037
9 756 1510 3127 4867 15380 16575 17906 19275 20944 25462 27021 31939 34367 36491 39391 45013 45505 47768 50626 51547
188 252 1181 2939 4132 7944 12352 15443 17831 18785 18904 22672 23400 30518 30652 45102 51500 52032 52868 60341
496 564 1527 2708 2751 3658 6451 8212 11654 17193 21558 23963 28394 30554 30628 35052 44835 45090 49804 52979
793 858 1710 3561 10566 11369 17707 20970 22329 22383 24607 31237 38613 42719 43867 45715 50453 51882 55535 60316
689 980 1657 2690 4633 11070 16939 18443 20748 21753 25742 30361 31544 31693 33019 40842 47042 48850 52130 56606
198 281 1664 3384 12801 17438 24093 29656 30578 31929 35921 38919 38984 40957 43262 48155 50743 56398 56427 59215
457 1065 1196 2861 12717 15390 16655 17899 18300 22233 31560 32716 34991 43324 46709 51328 52891 54292 56334 59229
1307 1481 1599 13551 21460 22804 23439 32551 32671 35941 36329 40096 41474 45156 50568 55578 55667 56581 59061 60009
99 485 708 4043 5527 5824 7489 8809 15871 17753 18297 18507 19070 22839 28023 41124 43165 50873 51968 57000
188 412 1641 1833 5707 7556 10610 12636 14533 26728 27604 31757 32972 34677 36279 38315 42252 43155 53121 57503
300 794 1153 6459 7063 13526 17788 18308 21233 21439 22250 28514 32042 32160 36140 44273 49289 50434 51163 56471
757 1336 1440 5560 6283 10080 10986 13051 17638 22870 31581 35463 41212 42195 43305 46746 49564 56412 58207 59477
106 1195 1474 6273 14321 14746 16496 17016 17214 19472 27450 33489 40638 42896 43150 47624 51106 51339 53730 55816
98 1002 1336 2076 9328 10989 13413 13916 14455 17863 19776 24981 31172 39450 40385 43348 44833 46967 52917 58029
262 1363 1605 4715 8438 8794 12188 18208 19803 28570 36281 38576 39120 40344 44994 45827 46559 49914 50771 56658
870 1743 1764 5521 8695 11745 15888 16359 16412 33151 37033 38281 38499 39026 41174 44818 53168 56178 58405 60285
861 1142 1169 2232 4370 9265 10442 15376 15947 19420 24577 29045 36440 38242 41035 47841 49589 50529 52662 59907
231 913 1440 2695 6369 7938 8296 12107 14329 19324 25096 26108 35369 38516 41289 43604 52617 57130 59909 60020
214 667 762 3988 6762 14360 15257 18298 18943 19364 29813 33804 35106 36373 39451 39478 45683 47618 48539 59814
1144 1150 1746 1800 7038 11454 18376 18819 21869 26781 33351 35591 46571 49235 49956 50749 51642 53390 56404 58103
308 317 1510 5176 12653 13311 15884 18075 22371 26021 27004 29283 30382 32114 32978 35790 47224 48249 51701 57840
2786 5188 6809 7110 7138 7167 8042 12569 15301 27503 27894 32875 35277 48267 49051 57363
6186 6554 12052 14220 15013 15388 22130 27207 30084 30620 31562 36834 38446 52593 56791 60017
8810 12703 21600 21640 22233 26157 27268 27384 33020 39679 49298 51854 52364 53298 55215 59802
2670 6309 10054 11421 11750 11901 12053 12752 17466 28571 29910 32369 34446 38373 49448 51729
11357 12810 13252 14755 22824 30867 32868 33512 34862 35560 38704 41861 42805 43103 48692 55234.

3. A reception device, comprising:
a decoder configured to decode a punctured low density parity check (LDPC) code obtained from data transmitted by a transmission device, wherein
the transmission device:
performs LDPC coding for information bits with an information length K=N×r to generate an extended LDPC code having parity bits with a parity length M=N+L−K, wherein
the LDPC coding is performed based on an extended parity check matrix having rows and columns, and
the rows and the columns of the extended parity check matrix are extended by a puncture length L with respect to a parity check matrix of an LDPC code with a code length N of 69120 bits and a coding rate r of 2/16,
punctures a head of the information bits of the extended LDPC code by the puncture length L to generate the punctured LDPC code with the code length N of 69120 bits and the coding rate r of 2/16, and
transmits the generated punctured LDPC code from the transmission device to the reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 1444 1737 1780 9182 9748 9954 11859 23510 36957 41211 41804 41857 42268 42854 45152 46217 46448 52760 57528 59998 60168

281 1279 1468 9650 11337 15973 21859 24346 25864 28317 33522 35344 40280 43576 43942 50851 53221 57076 57561 59922 59962

132 758 1470 2901 2957 3365 4567 7062 10939 12288 20818 35122 39299 41903 43394 44289 49129 51394 53222 53899 56037

9 756 1510 3127 4867 15380 16575 17906 19275 20944 25462 27021 31939 34367 36491 39391 45013 45505 47768 50626 51547

188 252 1181 2939 4132 7944 12352 15443 17831 18785 18904 22672 23400 30518 30652 45102 51500 52032 52868 60341

496 564 1527 2708 2751 3658 6451 8212 11654 17193 21558 23963 28394 30554 30628 35052 44835 45090 49804 52979

793 858 1710 3561 10566 11369 17707 20970 22329 22383 24607 31237 38613 42719 43867 45715 50453 51882 55535 60316

689 980 1657 2690 4633 11070 16939 18443 20748 21753 25742 30361 31544 31693 33019 40842 47042 48850 52130 56606

198 281 1664 3384 12801 17438 24093 29656 30578 31929 35921 38919 38984 40957 43262 48155 50743 56398 56427 59215

457 1065 1196 2861 12717 15390 16655 17899 18300 22233 31560 32716 34991 43324 46709 51328 52891 54292 56334 59229

1307 1481 1599 13551 21460 22804 23439 32551 32671 35941 36329 40096 41474 45156 50568 55578 55667 56581 59061 60009

99 485 708 4043 5527 5824 7489 8809 15871 17753 18297 18507 19070 22839 28023 41124 43165 50873 51968 57000

188 412 1641 1833 5707 7556 10610 12636 14533 26728 27604 31757 32972 34677 36279 38315 42252 43155 53121 57503

300 794 1153 6459 7063 13526 17788 18308 21233 21439 22250 28514 32042 32160 36140 44273 49289 50434 51163 56471

757 1336 1440 5560 6283 10080 10986 13051 17638 22870 31581 35463 41212 42195 43305 46746 49564 56412 58207 59477

106 1195 1474 6273 14321 14746 16496 17016 17214 19472 27450 33489 40638 42896 43150 47624 51106 51339 53730 55816

98 1002 1336 2076 9328 10989 13413 13916 14455 17863 19776 24981 31172 39450 40385 43348 44833 46967 52917 58029

262 1363 1605 4715 8438 8794 12188 18208 19803 28570 36281 38576 39120 40344 44994 45827 46559 49914 50771 56658

870 1743 1764 5521 8695 11745 15888 16359 16412 33151 37033 38281 38499 39026 41174 44818 53168 56178 58405 60285

861 1142 1169 2232 4370 9265 10442 15376 15947 19420 24577 29045 36440 38242 41035 47841 49589 50529 52662 59907

231 913 1440 2695 6369 7938 8296 12107 14329 19324 25096 26108 35369 38516 41289 43604 52617 57130 59909 60020

214 667 762 3988 6762 14360 15257 18298 18943 19364 29813 33804 35106 36373 39451 39478 45683 47618 48539 59814

1144 1150 1746 1800 7038 11454 18376 18819 21869 26781 33351 35591 46571 49235 49956 50749 51642 53390 56404 58103

308 317 1510 5176 12653 13311 15884 18075 22371 26021 27004 29283 30382 32114 32978 35790 47224 48249 51701 57840

2786 5188 6809 7110 7138 7167 8042 12569 15301 27503 27894 32875 35277 48267 49051 57363

6186 6554 12052 14220 15013 15388 22130 27207 30084 30620 31562 36834 38446 52593 56791 60017

8810 12703 21600 21640 22233 26157 27268 27384 33020 39679 49298 51854 52364 53298 55215 59802

2670 6309 10054 11421 11750 11901 12053 12752 17466 28571 29910 32369 34446 38373 49448 51729

11357 12810 13252 14755 22824 30867 32868 33512 34862 35560 38704 41861 42805 43103 48692 55234.

4. A reception method, comprising:

decoding a punctured low density parity check (LDPC) code obtained from data transmitted by a transmission method, wherein the transmission method includes:

performing LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 2/16, puncturing a head of the information bits of the extended LDPC code by the puncture length L to generate the punctured LDPC code with the code length N of 69120 bits and the coding rate r of 2/16, and transmitting the generated punctured LDPC code from a transmission device to a reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 1444 1737 1780 9182 9748 9954 11859 23510 36957 41211 41804 41857 42268 42854 45152 46217 46448 52760 57528 59998 60168

281 1279 1468 9650 11337 15973 21859 24346 25864 28317 33522 35344 40280 43576 43942 50851 53221 57076 57561 59922 59962

132 758 1470 2901 2957 3365 4567 7062 10939 12288 20818 35122 39299 41903 43394 44289 49129 51394 53222 53899 56037

9 756 1510 3127 4867 15380 16575 17906 19275 20944 25462 27021 31939 34367 36491 39391 45013 45505 47768 50626 51547

188 252 1181 2939 4132 7944 12352 15443 17831 18785 18904 22672 23400 30518 30652 45102 51500 52032 52868 60341

496 564 1527 2708 2751 3658 6451 8212 11654 17193 21558 23963 28394 30554 30628 35052 44835 45090 49804 52979

793 858 1710 3561 10566 11369 17707 20970 22329 22383 24607 31237 38613 42719 43867 45715 50453 51882 55535 60316

689 980 1657 2690 4633 11070 16939 18443 20748 21753 25742 30361 31544 31693 33019 40842 47042 48850 52130 56606

198 281 1664 3384 12801 17438 24093 29656 30578 31929 35921 38919 38984 40957 43262 48155 50743 56398 56427 59215

457 1065 1196 2861 12717 15390 16655 17899 18300 22233 31560 32716 34991 43324 46709 51328 52891 54292 56334 59229

1307 1481 1599 13551 21460 22804 23439 32551 32671 35941 36329 40096 41474 45156 50568 55578 55667 56581 59061 60009

99 485 708 4043 5527 5824 7489 8809 15871 17753 18297 18507 19070 22839 28023 41124 43165 50873 51968 57000

188 412 1641 1833 5707 7556 10610 12636 14533 26728 27604 31757 32972 34677 36279 38315 42252 43155 53121 57503

300 794 1153 6459 7063 13526 17788 18308 21233 21439 22250 28514 32042 32160 36140 44273 49289 50434 51163 56471

757 1336 1440 5560 6283 10080 10986 13051 17638 22870 31581 35463 41212 42195 43305 46746 49564 56412 58207 59477

106 1195 1474 6273 14321 14746 16496 17016 17214 19472 27450 33489 40638 42896 43150 47624 51106 51339 53730 55816

98 1002 1336 2076 9328 10989 13413 13916 14455 17863 19776 24981 31172 39450 40385 43348 44833 46967 52917 58029

262 1363 1605 4715 8438 8794 12188 18208 19803 28570 36281 38576 39120 40344 44994 45827 46559 49914 50771 56658

870 1743 1764 5521 8695 11745 15888 16359 16412 33151 37033 38281 38499 39026 41174 44818 53168 56178 58405 60285

861 1142 1169 2232 4370 9265 10442 15376 15947 19420 24577 29045 36440 38242 41035 47841 49589 50529 52662 59907

231 913 1440 2695 6369 7938 8296 12107 14329 19324 25096 26108 35369 38516 41289 43604 52617 57130 59909 60020

214 667 762 3988 6762 14360 15257 18298 18943 19364 29813 33804 35106 36373 39451 39478 45683 47618 48539 59814

1144 1150 1746 1800 7038 11454 18376 18819 21869 26781 33351 35591 46571 49235 49956 50749 51642 53390 56404 58103

308 317 1510 5176 12653 13311 15884 18075 22371 26021 27004 29283 30382 32114 32978 35790 47224 48249 51701 57840

2786 5188 6809 7110 7138 7167 8042 12569 15301 27503 27894 32875 35277 48267 49051 57363

6186 6554 12052 14220 15013 15388 22130 27207 30084 30620 31562 36834 38446 52593 56791 60017

8810 12703 21600 21640 22233 26157 27268 27384 33020 39679 49298 51854 52364 53298 55215 59802

2670 6309 10054 11421 11750 11901 12053 12752 17466 28571 29910 32369 34446 38373 49448 51729

11357 12810 13252 14755 22824 30867 32868 33512 34862 35560 38704 41861 42805 43103 48692 55234.

5. A transmission device, comprising:

an encoder configured to:

perform low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 3/16;

puncture a head of the information bits of the extended LDPC code by the puncture length L to generate a punctured LDPC code with the code length N of 69120 bits and the coding rate r of 3/16; and transmit the generated punctured LDPC code from the transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 853 875 1192 2465 3004 4879 9062 21593 24043 26616 30909 32017 35006 42135 44268 56020

161 519 1556 3317 6015 14909 15760 21148 30072 32655 33940 34834 43430 44798 51284 52169

177 999 1683 6976 17610 18152 19591 22312 25036 27303 28584 47608 47749 50216 52322 54007

981 1000 1625 1630 6933 13217 13956 15319 22642 29483 31921 35465 43602 44250 46505 55678

1204 1242 1653 3066 6095 16862 20154 21430 23418 26408 30979 34093 41103 48385 54547 55093

316 1355 1562 2665 5222 6575 18299 19639 24268 30959 37721 47966 48255 51808 53697 56010

183 219 615 2859 6967 8044 13949 22294 28922 29355 32175 32276 33861 49675 52583 53512

263 342 1684 7426 14417 20396 27461 30075 33740 36812 38204 38420 41612 43083 45914 56035

256 870 921 3023 4662 5225 5276 19284 26034 35397 38524 44936 45178 46351 50860 51813

289 898 1442 9135 10774 13951 14133 19070 21192 27854 32118 43657 43859 43934 52772 53659

256 690 1324 3582 7066 8507 26854 34507 40768 44943 47952 50512 52080 52872 53733 53773

238 1037 1388 1929 6395 10653 21299 23085 26467 26836 27834 44924 47310 49393 53742 55883

976 1217 1469 7718 16449 19465 19983 22386 24762 28308 32395 33589 35997 41034 42118 43799

265 368 1365 1375 1808 7556 14593 15079 19648 36077 40397 41971 44940 47570 52522 55839

802 1656 1689 5554 6787 11067 15764 19656 31740 31762 36046 42258 45165 49245 52732 53420

265 307 1299 2775 6738 22483 26322 27615 30628 34194 38024 38787 46089 48680 49115 51063

698 747 1241 2898 5218 7964 15358 17928 28069 29537 33641 36103 40207 40701 42823 42929

70 293 799 16494 16696 20008 21050 23735 34060 34555 35068 37664 45312 47748 50957 52382

1151 1163 1751 7025 10775 15100 22260 24718 28905 30853 33020 43261 46849 48258 54212 56122

279 457 775 8025 13383 16978 19254 23110 28197 31454 33060 38532 41429 41621 42149 54927

494 1130 1351 18525 22446 31344 31582 38324 42396 46010 48804 49241 49379 51987 52296 53133

177 508 1032 3547 8103 13357 14344 15876 20386 22050 23593 35305 47409 53297 55610 56093

988 1091 1785 3400 5144 7245 10179 12918 32871 33462 34484 38318 43410 44103 44267 52837

520 564 1757 12204 16894 17249 21480 21541 23760 28325 36266 40606 46094 48779 55501 56065

914 943 1111 3641 4232 10215 14134 16582 23445 28767 28862 32260 35952 39907 41846 47553

466 554 1697 4921 6953 7034 7052 10648 11628 19174 27830 29210 31722 32281 52559 55802

1135 1273 1408 2599 3618 4903 7210 17368 21014 21287 21926 24070 27741 29801 36137 44272

524 801 1767 4093 9721 12200 19463 29280 31587 33577 39747 43688 46627 49807 51345 55969

489 1390 1756 3050 12113 20477 21376 26797 27049 28907 31534 32746 33345 40582 41970 55911

432 1520 1598 9292 11552 16985 18417 21847 21960 24287 25489 34478 40990 44004 47573 53982

301 592 849 1944 4128 8341 16783 19249 24983 43892 44041 44474 44942 44959 50738 54935

118 558 1470 4368 10132 11791 16523 22408 23766 25111 25426 25779 35005 42742 46197 53118

310 1059 1322 3609 7107 10048 13161 32141 33369 35206 36131 38746 44545 47963 48414

256 346 845 7363 10375 12492 13091 27987 32113 34846 36223 39863 44450 46526 49216

607 683 954 5473 10617 18484 20018 26971 28190 37592 39069 39740 43575 45676 48149

244 635 1208 5450 8082 25030 25149 28411 29333 31324 36972 42071 43401 47088 52085

2841 5514 16122 18061 18199 20340 22525 25022 29914 31732 46415

7567 22860 23157 24194 24622 29643 31255 32355 36379 38228 51173

24002 24459 25897 26955 31168 31630 39183 46791 47323 51503 55241

4817 8291 10219 13991 14318 28549 28836 30491 36884 46310 54625

8275 9585 11678 37216 38932 45186 46287 48023 48862 53636 56067.

6. A transmission method, comprising:

performing low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 3/16;

puncturing a head of the information bits of the extended LDPC code by the puncture length L to generate a punctured LDPC code with the code length N of 69120 bits and the coding rate r of 3/16; and transmitting the generated punctured LDPC code from a transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 853 875 1192 2465 3004 4879 9062 21593 24043 26616 30909 32017 35006 42135 44268 56020
161 519 1556 3317 6015 14909 15760 21148 30072 32655 33940 34834 43430 44798 51284 52169
177 999 1683 6976 17610 18152 19591 22312 25036 27303 28584 47608 47749 50216 52322 54007
981 1000 1625 1630 6933 13217 13956 15319 22642 29483 31921 35465 43602 44250 46505 55678
1204 1242 1653 3066 6095 16862 20154 21430 23418 26408 30979 34093 41103 48385 54547 55093
316 1355 1562 2665 5222 6575 18299 19639 24268 30959 37721 47966 48255 51808 53697 56010
183 219 615 2859 6967 8044 13949 22294 28922 29355 32175 32276 33861 49675 52583 53512
263 342 1684 7426 14417 20396 27461 30075 33740 36812 38204 38420 41612 43083 45914 56035
256 870 921 3023 4662 5225 5276 19284 26034 35397 38524 44936 45178 46351 50860 51813
289 898 1442 9135 10774 13951 14133 19070 21192 27854 32118 43657 43859 43934 52772 53659
256 690 1324 3582 7066 8507 26854 34507 40768 44943 47952 50512 52080 52872 53733 53773
238 1037 1388 1929 6395 10653 21299 23085 26467 26836 27834 44924 47310 49393 53742 55883
976 1217 1469 7718 16449 19465 19983 22386 24762 28308 32395 33589 35997 41034 42118 43799
265 368 1365 1375 1808 7556 14593 15079 19648 36077 40397 41971 44940 47570 52522 55839
802 1656 1689 5554 6787 11067 15764 19656 31740 31762 36046 42258 45165 49245 52732 53420
265 307 1299 2775 6738 22483 26322 27615 30628 34194 38024 38787 46089 48680 49115 51063
698 747 1241 2898 5218 7964 15358 17928 28069 29537 33641 36103 40207 40701 42823 42929
70 293 799 16494 16696 20008 21050 23735 34060 34555 35068 37664 45312 47748 50957 52382
1151 1163 1751 7025 10775 15100 22260 24718 28905 30853 33020 43261 46849 48258 54212 56122
279 457 775 8025 13383 16978 19254 23110 28197 31454 33060 38532 41429 41621 42149 54927
494 1130 1351 18525 22446 31344 31582 38324 42396 46010 48804 49241 49379 51987 52296 53133
177 508 1032 3547 8103 13357 14344 15876 20386 22050 23593 35305 47409 53297 55610 56093
988 1091 1785 3400 5144 7245 10179 12918 32871 33462 34484 38318 43410 44103 44267 52837
520 564 1757 12204 16894 17249 21480 21541 23760 28325 36266 40606 46094 48779 55501 56065
914 943 1111 3641 4232 10215 14134 16582 23445 28767 28862 32260 35952 39907 41846 47553
466 554 1697 4921 6953 7034 7052 10648 11628 19174 27830 29210 31722 32281 52559 55802
1135 1273 1408 2599 3618 4903 7210 17368 21014 21287 21926 24070 27741 29801 36137 44272
524 801 1767 4093 9721 12200 19463 29280 31587 33577 39747 43688 46627 49807 51345 55969
489 1390 1756 3050 12113 20477 21376 26797 27049 28907 31534 32746 33345 40582 41970 55911
432 1520 1598 9292 11552 16985 18417 21847 21960 24287 25489 34478 40990 44004 47573 53982
301 592 849 1944 4128 8341 16783 19249 24983 43892 44041 44474 44942 44959 50738 54935
118 558 1470 4368 10132 11791 16523 22408 23766 25111 25426 25779 35005 42742 46197 53118
310 1059 1322 3609 7107 10048 13161 32141 33369 35206 36131 38746 44545 47963 48414
256 346 845 7363 10375 12492 13091 27987 32113 34846 36223 39863 44450 46526 49216
607 683 954 5473 10617 18484 20018 26971 28190 37592 39069 39740 43575 45676 48149
244 635 1208 5450 8082 25030 25149 28411 29333 31324 36972 42071 43401 47088 52085
2841 5514 16122 18061 18199 20340 22525 25022 29914 31732 46415
7567 22860 23157 24194 24622 29643 31255 32355 36379 38228 51173
24002 24459 25897 26955 31168 31630 39183 46791 47323 51503 55241
4817 8291 10219 13991 14318 28549 28836 30491 36884 46310 54625
8275 9585 11678 37216 38932 45186 46287 48023 48862 53636 56067.

7. A reception device, comprising:

a decoder configured to decode a punctured low density parity check (LDPC) code obtained from data transmitted by a transmission device, wherein the transmission device:

performs LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 3/16, punctures a head of the information bits of the extended LDPC code by the puncture length L to generate the punctured LDPC code with the code length N of 69120 bits and the coding rate r of 3/16, and transmits the generated punctured LDPC code from the transmission device to the reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 853 875 1192 2465 3004 4879 9062 21593 24043 26616 30909 32017 35006 42135 44268 56020

161 519 1556 3317 6015 14909 15760 21148 30072 32655 33940 34834 43430 44798 51284 52169

177 999 1683 6976 17610 18152 19591 22312 25036 27303 28584 47608 47749 50216 52322 54007

981 1000 1625 1630 6933 13217 13956 15319 22642 29483 31921 35465 43602 44250 46505 55678

1204 1242 1653 3066 6095 16862 20154 21430 23418 26408 30979 34093 41103 48385 54547 55093

316 1355 1562 2665 5222 6575 18299 19639 24268 30959 37721 47966 48255 51808 53697 56010

183 219 615 2859 6967 8044 13949 22294 28922 29355 32175 32276 33861 49675 52583 53512

263 342 1684 7426 14417 20396 27461 30075 33740 36812 38204 38420 41612 43083 45914 56035

256 870 921 3023 4662 5225 5276 19284 26034 35397 38524 44936 45178 46351 50860 51813

289 898 1442 9135 10774 13951 14133 19070 21192 27854 32118 43657 43859 43934 52772 53659

256 690 1324 3582 7066 8507 26854 34507 40768 44943 47952 50512 52080 52872 53733 53773

238 1037 1388 1929 6395 10653 21299 23085 26467 26836 27834 44924 47310 49393 53742 55883

976 1217 1469 7718 16449 19465 19983 22386 24762 28308 32395 33589 35997 41034 42118 43799

265 368 1365 1375 1808 7556 14593 15079 19648 36077 40397 41971 44940 47570 52522 55839

802 1656 1689 5554 6787 11067 15764 19656 31740 31762 36046 42258 45165 49245 52732 53420

265 307 1299 2775 6738 22483 26322 27615 30628 34194 38024 38787 46089 48680 49115 51063

698 747 1241 2898 5218 7964 15358 17928 28069 29537 33641 36103 40207 40701 42823 42929

70 293 799 16494 16696 20008 21050 23735 34060 34555 35068 37664 45312 47748 50957 52382

1151 1163 1751 7025 10775 15100 22260 24718 28905 30853 33020 43261 46849 48258 54212 56122

279 457 775 8025 13383 16978 19254 23110 28197 31454 33060 38532 41429 41621 42149 54927

494 1130 1351 18525 22446 31344 31582 38324 42396 46010 48804 49241 49379 51987 52296 53133

177 508 1032 3547 8103 13357 14344 15876 20386 22050 23593 35305 47409 53297 55610 56093

988 1091 1785 3400 5144 7245 10179 12918 32871 33462 34484 38318 43410 44103 44267 52837

520 564 1757 12204 16894 17249 21480 21541 23760 28325 36266 40606 46094 48779 55501 56065

914 943 1111 3641 4232 10215 14134 16582 23445 28767 28862 32260 35952 39907 41846 47553

466 554 1697 4921 6953 7034 7052 10648 11628 19174 27830 29210 31722 32281 52559 55802

1135 1273 1408 2599 3618 4903 7210 17368 21014 21287 21926 24070 27741 29801 36137 44272

524 801 1767 4093 9721 12200 19463 29280 31587 33577 39747 43688 46627 49807 51345 55969

489 1390 1756 3050 12113 20477 21376 26797 27049 28907 31534 32746 33345 40582 41970 55911

432 1520 1598 9292 11552 16985 18417 21847 21960 24287 25489 34478 40990 44004 47573 53982

301 592 849 1944 4128 8341 16783 19249 24983 43892 44041 44474 44942 44959 50738 54935

118 558 1470 4368 10132 11791 16523 22408 23766 25111 25426 25779 35005 42742 46197 53118

310 1059 1322 3609 7107 10048 13161 32141 33369 35206 36131 38746 44545 47963 48414

256 346 845 7363 10375 12492 13091 27987 32113 34846 36223 39863 44450 46526 49216

607 683 954 5473 10617 18484 20018 26971 28190 37592 39069 39740 43575 45676 48149

244 635 1208 5450 8082 25030 25149 28411 29333 31324 36972 42071 43401 47088 52085

2841 5514 16122 18061 18199 20340 22525 25022 29914 31732 46415

7567 22860 23157 24194 24622 29643 31255 32355 36379 38228 51173

24002 24459 25897 26955 31168 31630 39183 46791 47323 51503 55241

4817 8291 10219 13991 14318 28549 28836 30491 36884 46310 54625

8275 9585 11678 37216 38932 45186 46287 48023 48862 53636 56067.

8. A reception method, comprising:

decoding a punctured low density parity check (LDPC) code obtained from data transmitted by a transmission method, wherein the transmission method includes:

performing LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 3/16, puncturing a head of the information bits of the extended LDPC code by the puncture length L to generate the punctured LDPC code with the code length N of 69120 bits and the coding rate r of 3/16, and transmitting the generated punctured LDPC code from a transmission device to a reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 853 875 1192 2465 3004 4879 9062 21593 24043 26616 30909 32017 35006 42135 44268 56020

161 519 1556 3317 6015 14909 15760 21148 30072 32655 33940 34834 43430 44798 51284 52169

177 999 1683 6976 17610 18152 19591 22312 25036 27303 28584 47608 47749 50216 52322 54007

981 1000 1625 1630 6933 13217 13956 15319 22642 29483 31921 35465 43602 44250 46505 55678

1204 1242 1653 3066 6095 16862 20154 21430 23418 26408 30979 34093 41103 48385 54547 55093

316 1355 1562 2665 5222 6575 18299 19639 24268 30959 37721 47966 48255 51808 53697 56010

183 219 615 2859 6967 8044 13949 22294 28922 29355 32175 32276 33861 49675 52583 53512

263 342 1684 7426 14417 20396 27461 30075 33740 36812 38204 38420 41612 43083 45914 56035

256 870 921 3023 4662 5225 5276 19284 26034 35397 38524 44936 45178 46351 50860 51813

289 898 1442 9135 10774 13951 14133 19070 21192 27854 32118 43657 43859 43934 52772 53659

256 690 1324 3582 7066 8507 26854 34507 40768 44943 47952 50512 52080 52872 53733 53773

238 1037 1388 1929 6395 10653 21299 23085 26467 26836 27834 44924 47310 49393 53742 55883

976 1217 1469 7718 16449 19465 19983 22386 24762 28308 32395 33589 35997 41034 42118 43799

265 368 1365 1375 1808 7556 14593 15079 19648 36077 40397 41971 44940 47570 52522 55839

802 1656 1689 5554 6787 11067 15764 19656 31740 31762 36046 42258 45165 49245 52732 53420

265 307 1299 2775 6738 22483 26322 27615 30628 34194 38024 38787 46089 48680 49115 51063

698 747 1241 2898 5218 7964 15358 17928 28069 29537 33641 36103 40207 40701 42823 42929

70 293 799 16494 16696 20008 21050 23735 34060 34555 35068 37664 45312 47748 50957 52382

1151 1163 1751 7025 10775 15100 22260 24718 28905 30853 33020 43261 46849 48258 54212 56122

279 457 775 8025 13383 16978 19254 23110 28197 31454 33060 38532 41429 41621 42149 54927

494 1130 1351 18525 22446 31344 31582 38324 42396 46010 48804 49241 49379 51987 52296 53133

177 508 1032 3547 8103 13357 14344 15876 20386 22050 23593 35305 47409 53297 55610 56093

988 1091 1785 3400 5144 7245 10179 12918 32871 33462 34484 38318 43410 44103 44267 52837

520 564 1757 12204 16894 17249 21480 21541 23760 28325 36266 40606 46094 48779 55501 56065

914 943 1111 3641 4232 10215 14134 16582 23445 28767 28862 32260 35952 39907 41846 47553

466 554 1697 4921 6953 7034 7052 10648 11628 19174 27830 29210 31722 32281 52559 55802

1135 1273 1408 2599 3618 4903 7210 17368 21014 21287 21926 24070 27741 29801 36137 44272

524 801 1767 4093 9721 12200 19463 29280 31587 33577 39747 43688 46627 49807 51345 55969

489 1390 1756 3050 12113 20477 21376 26797 27049 28907 31534 32746 33345 40582 41970 55911

432 1520 1598 9292 11552 16985 18417 21847 21960 24287 25489 34478 40990 44004 47573 53982

301 592 849 1944 4128 8341 16783 19249 24983 43892 44041 44474 44942 44959 50738 54935

118 558 1470 4368 10132 11791 16523 22408 23766 25111 25426 25779 35005 42742 46197 53118

310 1059 1322 3609 7107 10048 13161 32141 33369 35206 36131 38746 44545 47963 48414

256 346 845 7363 10375 12492 13091 27987 32113 34846 36223 39863 44450 46526 49216

607 683 954 5473 10617 18484 20018 26971 28190 37592 39069 39740 43575 45676 48149

244 635 1208 5450 8082 25030 25149 28411 29333 31324 36972 42071 43401 47088 52085

2841 5514 16122 18061 18199 20340 22525 25022 29914 31732 46415

7567 22860 23157 24194 24622 29643 31255 32355 36379 38228 51173

24002 24459 25897 26955 31168 31630 39183 46791 47323 51503 55241

4817 8291 10219 13991 14318 28549 28836 30491 36884 46310 54625

8275 9585 11678 37216 38932 45186 46287 48023 48862 53636 56067.

9. A transmission device, comprising:

an encoder configured to:

perform low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 4/16;

puncture a head of the information bits of the extended LDPC code by the puncture length L to generate a punctured LDPC code with the code length N of 69120 bits and the coding rate r of 4/16; and transmit the generated punctured LDPC code from the transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 797 853 885 2412 8763 16966 18074 21725 21923 22276 32414 49532 51711
39 1096 1305 6276 13449 16227 24628 29368 31384 32207 45115 47748 51161
44 427 1193 4543 10898 29586 34143 40123 44170 46228 47353 48962 49856
541 736 844 4479 7200 16262 18160 24649 29159 42952 43829 47067 48307
95 1342 1783 9131 12031 12989 13202 14244 27356 29527 32789 36795 38709
494 1203 1652 5475 16812 21005 24490 28736 31487 37840 39565 50301 50448
1532 1581 1705 10606 12678 17526 28502 35833 44124 47833 49541 51702 51831
96 185 1188 2754 2775 5499 6292 6895 9799 27158 28509 39985 48544
749 1007 1624 9110 12545 20317 27165 31146 36658 40218 45870 48593 49397
1163 1355 1556 4652 6091 6978 8979 14330 25366 27509 27927 33954 51511
1168 1311 1320 2096 3187 5119 20693 29188 35325 36538 41740 44821 47836
288 1399 1422 10030 12443 15396 19379 26774 30623 40397 40494 47324 48652
570 809 1622 8966 13182 24760 25846 37786 38499 41477 47218 49514 51673
44 208 811 3742 8390 20577 24033 26195 29483 39222 40429 45529 45643
97 1161 1310 2693 19471 21117 24844 29355 37875 38827 42599 46927 51585
620 1416 1679 12977 15285 17224 20748 22381 25697 28626 33138 37912 39470
368 1367 1465 11725 13919 13945 33353 37326 38778 40727 40875 48487 51103
1427 1519 1736 6497 10328 15345 17776 24008 29435 47926 48682 48686 49250
23 1169 1460 5251 10379 24722 25285 32822 35089 37814 44950 45474 47146
32 681 1568 6384 9728 21530 22557 24432 31527 33435 36375 37151 39510
918 1286 1362 2738 2808 5037 7483 16549 20933 31061 33375 39562 50975
844 925 1507 8014 14804 15472 22057 31449 32226 32974 34809 41852 50676
1104 1753 1780 6605 22820 24244 26745 28587 30929 33797 34123 42029 43723
296 351 1799 9595 9770 15297 17910 19571 20521 35468 38937 48238 50795
638 760 1027 15495 15806 27803 29165 32046 34804 38592 38949 39457 47996
676 1548 1687 15931 17206 27071 28999 29312 30437 39081 44646 46366 48245
164 1436 1470 3335 8452 10611 14735 17314 17457 21853 32068 49268 51360
673 987 1570 3322 4946 6830 12027 22997 28126 30952 31702 32262 40857
773 1139 1404 9840 16019 16640 18064 24251 25181 42571 46539 50656 51750
726 730 1282 9539 10718 15690 27181 28022 29831 32767 40892 45045 51229
178 355 896 3493 13148 14855 15297 17187 20332 26479 36876 38772 41342
174 909 992 4685 6611 6649 9973 10846 18348 21866 29851 48524 51503
256 1273 1407 4650 6765 16547 19484 19834 20323 22294 27570 33457 40893
27 60 100 1530 9640 11387 12526 16343 17977 24156 29307 43317 51005
908 1009 1256 15318 24411 27373 28956 29096 37447 40401 45949 47505 50608
871 1022 1050 2987 11235 11367 14631 18902 19810 40712 41044 44083 50666
322 663 669 8710 10150 15826 17085 22493 31938 37858 40689 44018 49689
589 846 1413 2627 4519 7841 15480 24061 40839 41475 41591 46883 50613
963 1135 1395 1610 5107 10991 17300 20822 21073 23236 30712 39982 42668
729 792 1696 3391 4018 6677 15323 31211 32245 38603 39662 44737 48810
274 376 1003 8907 11493 11611 25418 25885 33368 36485 41225 44260 45485
1174 1245 1412 3510 9590 17010 20708 25956 28271 29603 33362 37097 42952
813 1030 1452 5147 9859 19468 34863 35407 36002 36716 40288 42835 44337
211 230 1694 5157 23173 23285 26293 27140 29110 34165 38861 40227 43477
537 933 1476 2748 5211 5376 14853 16889 18857 20875 22806 29035 29444
697 709 765 6009 27426 29923 33631 35433 36206 43172 47174 50955
833 1096 1648 4459 13016 22371 22757 23977 26422 28211 29254 43701
214 521 895 2147 3200 3525 3561 6699 7730 7845 9000 9570 11204 11446 11570 12462 13469 14396 15475 17540 18804 18944 19321 19550 20001 25062 25567 26342 26709 27146 27392 27428 30782 32176 32956 33240 34420 35150 35263 35879 36407 37210 37393 37420 38892 40202 40583 40665 41816 42558 42720 43063 43442 44348 44378 45052 47033 49514 49845 50084 51647
7599 9277 13898 16320 19617 28012 30567 42423 43056
15934 20819 25195 28421 31073 31750 33551 35982 37823
5377 13795 16639 20686 22150 32586 33922 40431 42255
3368 14716 15016 20925 23397 25910 28917 36663 40946
3478 4545 5802 12334 27955 29363 42818 48135 48995.

10. A transmission method, comprising:

performing low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 4/16;

puncturing a head of the information bits of the extended LDPC code by the puncture length L to generate a punctured LDPC code with the code length N of 69120 bits and the coding rate r of 4/16; and transmitting the generated punctured LDPC code from a transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 797 853 885 2412 8763 16966 18074 21725 21923 22276 32414 49532 51711
39 1096 1305 6276 13449 16227 24628 29368 31384 32207 45115 47748 51161
44 427 1193 4543 10898 29586 34143 40123 44170 46228 47353 48962 49856
541 736 844 4479 7200 16262 18160 24649 29159 42952 43829 47067 48307
95 1342 1783 9131 12031 12989 13202 14244 27356 29527 32789 36795 38709
494 1203 1652 5475 16812 21005 24490 28736 31487 37840 39565 50301 50448
1532 1581 1705 10606 12678 17526 28502 35833 44124 47833 49541 51702 51831
96 185 1188 2754 2775 5499 6292 6895 9799 27158 28509 39985 48544
749 1007 1624 9110 12545 20317 27165 31146 36658 40218 45870 48593 49397
1163 1355 1556 4652 6091 6978 8979 14330 25366 27509 27927 33954 51511
1168 1311 1320 2096 3187 5119 20693 29188 35325 36538 41740 44821 47836
288 1399 1422 10030 12443 15396 19379 26774 30623 40397 40494 47324 48652
570 809 1622 8966 13182 24760 25846 37786 38499 41477 47218 49514 51673
44 208 811 3742 8390 20577 24033 26195 29483 39222 40429 45529 45643
97 1161 1310 2693 19471 21117 24844 29355 37875 38827 42599 46927 51585
620 1416 1679 12977 15285 17224 20748 22381 25697 28626 33138 37912 39470
368 1367 1465 11725 13919 13945 33353 37326 38778 40727 40875 48487 51103
1427 1519 1736 6497 10328 15345 17776 24008 29435 47926 48682 48686 49250
23 1169 1460 5251 10379 24722 25285 32822 35089 37814 44950 45474 47146
32 681 1568 6384 9728 21530 22557 24432 31527 33435 36375 37151 39510
918 1286 1362 2738 2808 5037 7483 16549 20933 31061 33375 39562 50975
844 925 1507 8014 14804 15472 22057 31449 32226 32974 34809 41852 50676
1104 1753 1780 6605 22820 24244 26745 28587 30929 33797 34123 42029 43723
296 351 1799 9595 9770 15297 17910 19571 20521 35468 38937 48238 50795
638 760 1027 15495 15806 27803 29165 32046 34804 38592 38949 39457 47996
676 1548 1687 15931 17206 27071 28999 29312 30437 39081 44646 46366 48245
164 1436 1470 3335 8452 10611 14735 17314 17457 21853 32068 49268 51360
673 987 1570 3322 4946 6830 12027 22997 28126 30952 31702 32262 40857
773 1139 1404 9840 16019 16640 18064 24251 25181 42571 46539 50656 51750
726 730 1282 9539 10718 15690 27181 28022 29831 32767 40892 45045 51229
178 355 896 3493 13148 14855 15297 17187 20332 26479 36876 38772 41342
174 909 992 4685 6611 6649 9973 10846 18348 21866 29851 48524 51503
256 1273 1407 4650 6765 16547 19484 19834 20323 22294 27570 33457 40893
27 60 100 1530 9640 11387 12526 16343 17977 24156 29307 43317 51005
908 1009 1256 15318 24411 27373 28956 29096 37447 40401 45949 47505 50608
871 1022 1050 2987 11235 11367 14631 18902 19810 40712 41044 44083 50666
322 663 669 8710 10150 15826 17085 22493 31938 37858 40689 44018 49689
589 846 1413 2627 4519 7841 15480 24061 40839 41475 41591 46883 50613
963 1135 1395 1610 5107 10991 17300 20822 21073 23236 30712 39982 42668
729 792 1696 3391 4018 6677 15323 31211 32245 38603 39662 44737 48810
274 376 1003 8907 11493 11611 25418 25885 33368 36485 41225 44260 45485
1174 1245 1412 3510 9590 17010 20708 25956 28271 29603 33362 37097 42952
813 1030 1452 5147 9859 19468 34863 35407 36002 36716 40288 42835 44337
211 230 1694 5157 23173 23285 26293 27140 29110 34165 38861 40227 43477
537 933 1476 2748 5211 5376 14853 16889 18857 20875 22806 29035 29444
697 709 765 6009 27426 29923 33631 35433 36206 43172 47174 50955
833 1096 1648 4459 13016 22371 22757 23977 26422 28211 29254 43701
214 521 895 2147 3200 3525 3561 6699 7730 7845 9000 9570 11204 11446 11570 12462 13469 14396 15475 17540 18804 18944 19321 19550 20001 25062 25567 26342 26709 27146 27392 27428 30782 32176 32956 33240 34420 35150 35263 35879 36407 37210 37393 37420 38892 40202 40583 40665 41816 42558 42720 43063 43442 44348 44378 45052 47033 49514 49845 50084 51647
7599 9277 13898 16320 19617 28012 30567 42423 43056
15934 20819 25195 28421 31073 31750 33551 35982 37823
5377 13795 16639 20686 22150 32586 33922 40431 42255

3368 14716 15016 20925 23397 25910 28917 36663 40946

3478 4545 5802 12334 27955 29363 42818 48135 48995.

11. A reception device, comprising:

a decoder configured to decode a punctured low density parity check (LDPC) code obtained from data transmitted by a transmission device, wherein the transmission device:

performs LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 4/16, punctures a head of the information bits of the extended LDPC code by the puncture length L to generate the punctured LDPC code with the code length N of 69120 bits and the coding rate r of 4/16, and transmits the generated punctured LDPC code from the transmission device to the reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 797 853 885 2412 8763 16966 18074 21725 21923 22276 32414 49532 51711

39 1096 1305 6276 13449 16227 24628 29368 31384 32207 45115 47748 51161

44 427 1193 4543 10898 29586 34143 40123 44170 46228 47353 48962 49856

541 736 844 4479 7200 16262 18160 24649 29159 42952 43829 47067 48307

95 1342 1783 9131 12031 12989 13202 14244 27356 29527 32789 36795 38709

494 1203 1652 5475 16812 21005 24490 28736 31487 37840 39565 50301 50448

1532 1581 1705 10606 12678 17526 28502 35833 44124 47833 49541 51702 51831

96 185 1188 2754 2775 5499 6292 6895 9799 27158 28509 39985 48544

749 1007 1624 9110 12545 20317 27165 31146 36658 40218 45870 48593 49397

1163 1355 1556 4652 6091 6978 8979 14330 25366 27509 27927 33954 51511

1168 1311 1320 2096 3187 5119 20693 29188 35325 36538 41740 44821 47836

288 1399 1422 10030 12443 15396 19379 26774 30623 40397 40494 47324 48652

570 809 1622 8966 13182 24760 25846 37786 38499 41477 47218 49514 51673

44 208 811 3742 8390 20577 24033 26195 29483 39222 40429 45529 45643

97 1161 1310 2693 19471 21117 24844 29355 37875 38827 42599 46927 51585

620 1416 1679 12977 15285 17224 20748 22381 25697 28626 33138 37912 39470

368 1367 1465 11725 13919 13945 33353 37326 38778 40727 40875 48487 51103

1427 1519 1736 6497 10328 15345 17776 24008 29435 47926 48682 48686 49250

23 1169 1460 5251 10379 24722 25285 32822 35089 37814 44950 45474 47146

32 681 1568 6384 9728 21530 22557 24432 31527 33435 36375 37151 39510

918 1286 1362 2738 2808 5037 7483 16549 20933 31061 33375 39562 50975

844 925 1507 8014 14804 15472 22057 31449 32226 32974 34809 41852 50676

1104 1753 1780 6605 22820 24244 26745 28587 30929 33797 34123 42029 43723

296 351 1799 9595 9770 15297 17910 19571 20521 35468 38937 48238 50795

638 760 1027 15495 15806 27803 29165 32046 34804 38592 38949 39457 47996

676 1548 1687 15931 17206 27071 28999 29312 30437 39081 44646 46366 48245

164 1436 1470 3335 8452 10611 14735 17314 17457 21853 32068 49268 51360

673 987 1570 3322 4946 6830 12027 22997 28126 30952 31702 32262 40857

773 1139 1404 9840 16019 16640 18064 24251 25181 42571 46539 50656 51750

726 730 1282 9539 10718 15690 27181 28022 29831 32767 40892 45045 51229

178 355 896 3493 13148 14855 15297 17187 20332 26479 36876 38772 41342

174 909 992 4685 6611 6649 9973 10846 18348 21866 29851 48524 51503

256 1273 1407 4650 6765 16547 19484 19834 20323 22294 27570 33457 40893

27 60 100 1530 9640 11387 12526 16343 17977 24156 29307 43317 51005

908 1009 1256 15318 24411 27373 28956 29096 37447 40401 45949 47505 50608

871 1022 1050 2987 11235 11367 14631 18902 19810 40712 41044 44083 50666

322 663 669 8710 10150 15826 17085 22493 31938 37858 40689 44018 49689

589 846 1413 2627 4519 7841 15480 24061 40839 41475 41591 46883 50613

963 1135 1395 1610 5107 10991 17300 20822 21073 23236 30712 39982 42668

729 792 1696 3391 4018 6677 15323 31211 32245 38603 39662 44737 48810

274 376 1003 8907 11493 11611 25418 25885 33368 36485 41225 44260 45485

1174 1245 1412 3510 9590 17010 20708 25956 28271 29603 33362 37097 42952
813 1030 1452 5147 9859 19468 34863 35407 36002 36716 40288 42835 44337
211 230 1694 5157 23173 23285 26293 27140 29110 34165 38861 40227 43477
537 933 1476 2748 5211 5376 14853 16889 18857 20875 22806 29035 29444
697 709 765 6009 27426 29923 33631 35433 36206 43172 47174 50955
833 1096 1648 4459 13016 22371 22757 23977 26422 28211 29254 43701
214 521 895 2147 3200 3525 3561 6699 7730 7845 9000 9570 11204 11446 11570 12462 13469 14396 15475 17540 18804 18944 19321 19550 20001 25062 25567 26342 26709 27146 27392 27428 30782 32176 32956 33240 34420 35150 35263 35879 36407 37210 37393 37420 38892 40202 40583 40665 41816 42558 42720 43063 43442 44348 44378 45052 47033 49514 49845 50084 51647
7599 9277 13898 16320 19617 28012 30567 42423 43056
15934 20819 25195 28421 31073 31750 33551 35982 37823
5377 13795 16639 20686 22150 32586 33922 40431 42255
3368 14716 15016 20925 23397 25910 28917 36663 40946
3478 4545 5802 12334 27955 29363 42818 48135 48995.

12. A reception method, comprising:

decoding a punctured low density parity check (LDPC) code obtained from data transmitted by a transmission method, wherein the transmission method includes:

performing LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 4/16, puncturing a head of the information bits of the extended LDPC code by the puncture length L to generate the punctured LDPC code with the code length N of 69120 bits and the coding rate r of 4/16, and transmitting the generated punctured LDPC code from a transmission device to a reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 0, the value M1 is 1800, the A matrix and the C matrix are represented by a parity check matrix initial value table, the parity check matrix initial value table is a table representing positions of elements of 1 of the A matrix and the C matrix for every 360 columns, and the parity check matrix initial value table is 797 853 885 2412 8763 16966 18074 21725 21923 22276 32414 49532 51711
39 1096 1305 6276 13449 16227 24628 29368 31384 32207 45115 47748 51161
44 427 1193 4543 10898 29586 34143 40123 44170 46228 47353 48962 49856
541 736 844 4479 7200 16262 18160 24649 29159 42952 43829 47067 48307
95 1342 1783 9131 12031 12989 13202 14244 27356 29527 32789 36795 38709
494 1203 1652 5475 16812 21005 24490 28736 31487 37840 39565 50301 50448
1532 1581 1705 10606 12678 17526 28502 35833 44124 47833 49541 51702 51831
96 185 1188 2754 2775 5499 6292 6895 9799 27158 28509 39985 48544
749 1007 1624 9110 12545 20317 27165 31146 36658 40218 45870 48593 49397
1163 1355 1556 4652 6091 6978 8979 14330 25366 27509 27927 33954 51511
1168 1311 1320 2096 3187 5119 20693 29188 35325 36538 41740 44821 47836
288 1399 1422 10030 12443 15396 19379 26774 30623 40397 40494 47324 48652
570 809 1622 8966 13182 24760 25846 37786 38499 41477 47218 49514 51673
44 208 811 3742 8390 20577 24033 26195 29483 39222 40429 45529 45643
97 1161 1310 2693 19471 21117 24844 29355 37875 38827 42599 46927 51585
620 1416 1679 12977 15285 17224 20748 22381 25697 28626 33138 37912 39470
368 1367 1465 11725 13919 13945 33353 37326 38778 40727 40875 48487 51103
1427 1519 1736 6497 10328 15345 17776 24008 29435 47926 48682 48686 49250
23 1169 1460 5251 10379 24722 25285 32822 35089 37814 44950 45474 47146
32 681 1568 6384 9728 21530 22557 24432 31527 33435 36375 37151 39510
918 1286 1362 2738 2808 5037 7483 16549 20933 31061 33375 39562 50975
844 925 1507 8014 14804 15472 22057 31449 32226 32974 34809 41852 50676
1104 1753 1780 6605 22820 24244 26745 28587 30929 33797 34123 42029 43723
296 351 1799 9595 9770 15297 17910 19571 20521 35468 38937 48238 50795
638 760 1027 15495 15806 27803 29165 32046 34804 38592 38949 39457 47996
676 1548 1687 15931 17206 27071 28999 29312 30437 39081 44646 46366 48245
164 1436 1470 3335 8452 10611 14735 17314 17457 21853 32068 49268 51360
673 987 1570 3322 4946 6830 12027 22997 28126 30952 31702 32262 40857

773 1139 1404 9840 16019 16640 18064 24251 25181 42571 46539 50656 51750
726 730 1282 9539 10718 15690 27181 28022 29831 32767 40892 45045 51229
178 355 896 3493 13148 14855 15297 17187 20332 26479 36876 38772 41342
174 909 992 4685 6611 6649 9973 10846 18348 21866 29851 48524 51503
256 1273 1407 4650 6765 16547 19484 19834 20323 22294 27570 33457 40893
27 60 100 1530 9640 11387 12526 16343 17977 24156 29307 43317 51005
908 1009 1256 15318 24411 27373 28956 29096 37447 40401 45949 47505 50608
871 1022 1050 2987 11235 11367 14631 18902 19810 40712 41044 44083 50666
322 663 669 8710 10150 15826 17085 22493 31938 37858 40689 44018 49689
589 846 1413 2627 4519 7841 15480 24061 40839 41475 41591 46883 50613
963 1135 1395 1610 5107 10991 17300 20822 21073 23236 30712 39982 42668
729 792 1696 3391 4018 6677 15323 31211 32245 38603 39662 44737 48810
274 376 1003 8907 11493 11611 25418 25885 33368 36485 41225 44260 45485
1174 1245 1412 3510 9590 17010 20708 25956 28271 29603 33362 37097 42952
813 1030 1452 5147 9859 19468 34863 35407 36002 36716 40288 42835 44337
211 230 1694 5157 23173 23285 26293 27140 29110 34165 38861 40227 43477
537 933 1476 2748 5211 5376 14853 16889 18857 20875 22806 29035 29444
697 709 765 6009 27426 29923 33631 35433 36206 43172 47174 50955
833 1096 1648 4459 13016 22371 22757 23977 26422 28211 29254 43701
214 521 895 2147 3200 3525 3561 6699 7730 7845 9000 9570 11204 11446 11570 12462 13469 14396 15475 17540 18804 18944 19321 19550 20001 25062 25567 26342 26709 27146 27392 27428 30782 32176 32956 33240 34420 35150 35263 35879 36407 37210 37393 37420 38892 40202 40583 40665 41816 42558 42720 43063 43442 44348 44378 45052 47033 49514 49845 50084 51647
7599 9277 13898 16320 19617 28012 30567 42423 43056
15934 20819 25195 28421 31073 31750 33551 35982 37823
5377 13795 16639 20686 22150 32586 33922 40431 42255
3368 14716 15016 20925 23397 25910 28917 36663 40946
3478 4545 5802 12334 27955 29363 42818 48135 48995.

13. A transmission device, comprising:

an encoder configured to:

perform low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 5/16;

puncture a head of the information bits of the extended LDPC code by the puncture length L to generate a punctured LDPC code with the code length N of 69120 bits and the coding rate r of 5/16; and transmit the generated punctured LDPC code from the transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 3600, the A matrix and the C matrix are represented by a parity check matrix initial value table, the parity check matrix initial value table is a table representing positions of elements of 1 of the A matrix and the C matrix for every 360 columns, and the parity check matrix initial value table is 1500 1594 4158 4611 4621 9708 14082 14260 16777 17457 21985 22308 23963 24554 25344 27485 27516 28008 30174 30625 31378 31525 35873 36202 45585 47150 47845 49311
851 2755 5753 8521 10162 12036 16914 17857 18538 22342 24470 28199 33144 34233 35459 35506 38894 39300 41198 41995 42243 43310 44187 44969 46306 46719 47907 48844
803 828 7874 8667 12187 15086 16097 20436 21143 22142 27188 29052 30895 30927 30963 31563 34591 35419 36521 38142 38825 42538 43514 44432 45634 47807 47953
3442 3596 4211 4790 5276 5379 6950 8256 10939 13398 13563 13720 18074 22070 22760 26767 27057 28054 29148 33155 33760 38500 42760 44861 45653 46507 48695
1337 3179 3936 4019 4207 4915 5953 6200 7596 10085 10241 15048 16788 25083 27412 27478 28623 33014 33168 33296 34087 35922 36818 38225 40169 41762 46370
230 2417 2466 10915 19279 39243 39762 42664 45750
595 1792 2788 16000 19698 28701 38882 45250 46449
764 1619 2243 10130 25528 38421 44789 45032 48064
779 1651 3431 4707 8887 24180 36687 37770 39583
136 1352 3105 9580 25493 28929 29003 43731 44941
0 2147 3434 4402 19742 21221 37419 46590 49082
1658 1953 2935 17606 21613 29311 33878 46163 47126
804 1362 2596 15920 25368 28032 32218 37251 38385

733 3180 3549 12710 14684 32429 36039 39164 47531
807 2668 2811 23227 39984 42091 45708 46426 47788
1142 3373 3414 4219 7793 11379 15389 28832 32362
246 2670 3141 11465 24513 25038 31936 36501 45021
1365 2399 3107 4460 24713 30758 32422 38041 43379
323 578 1392 22591 26966 35332 35884 36454 38254
24 78 229 8741 17149 21008 30309 32441 38141
587 1595 3531 9258 15476 30673 33744 41847 44930
980 2136 2883 18306 22032 31618 33154 45208 48127
1518 1796 2304 7939 24330 29552 33426 39907 41568
599 681 3597 10689 10811 19776 20651 34661 46473
970 1152 2675 13311 15762 16363 26575 37047 48249
1872 1968 2620 16207 31197 33577 37990 42868 45881
1105 1351 3374 28454 28667 37692 42083 46115
1019 1816 3153 7354 14190 15535 29787 40081
114 1127 3412 17706 21953 31166 48855 49247
411 1346 2860 6474 12912 28627 30225 31396
109 1895 2803 8192 22957 30924 32515 39258
1067 1547 3218 10928 18459 24102 24958 48228
1022 2939 3593 16210 20143 22128 36148 48748
1826 2281 3110 10706 11745 27544 29705 32385
165 1794 3038 13953 15929 20587 35639 37360
122 1107 1776 7992 15442 26707 28761 39718
344 1449 2018 7930 11023 11967 18210 48998
203 2541 3360 6249 8145 10115 16796 19830 39389 39409
1333 1476 1855 4261 5127 16893 20060 23938 25433 32522
1972 3154 3539 10244 10601 12317 18404 29191 35539 41261
1621 1817 3280 15943 26444 28455 28595 29822 38852 48190
2048 2565 2660 4707 12386 15311 19315 20091 24908 37754
2825 3043 3516 9940 11806 11981 20375 20597 22471 31060
2597 2792 3444 11226 16387 17531 18473 25142 39461 42139
439 2788 3511 3684 5549 16067 23077 39829 39920 44862
1076 2271 2797 6573 12043 17816 20967 21726 23200 38056
553 2080 2948 5535 16026 22119 23794 37157 46602 46720
112 2115 3084 8090 10494 13165 29078 31417 33314 39595
2275 2449 3058 10121 12474 12563 25072 25610 39483 43489
741 2186 2270 5146 10831 17517 20875 29107 35695 41244
1693 1902 2907 6756 10924 18965 24040 33793 41089 42464
2469 2514 2769 6664 8813 8938 19741 23113 34293 45892
1761 2326 2998 17255 23220 26747 28416 37450 38574 41110
1083 1375 1867 4468 6706 6899 15494 19170 28463 28858
1394 1412 1510 7439 27005 29288 32683 34307 34607 45091
2477 2978 3539 22378 23848 24738 28734 31460 41873 45398
191 803 1500 9030 14071 26093 26432 27827 35890 47458
556 2942 3114 10130 11981 33368 34732 42472 47188 47655
425 2875 2946 16084 19184 26801 27069 27090 31317 34103
121 1674 3258 5208 13340 26019 37492 38723 40779 49200
3968 7741 12550 32061
17972 19666 20231 33590
9086 34375 41691 42567
12168 14189 15095 49129
19291 26450 29950 39068
19852 25195 35124 36192
10447 32405 36184 40786
8911 19949 27496 41273
14679 16883 20951 29727
30296 32681 34757 36501.

14. A transmission method, comprising:

performing low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 5/16;

puncturing a head of the information bits of the extended LDPC code by the puncture length L to generate a punctured LDPC code with the code length N of 69120 bits and the coding rate r of 5/16; and transmitting the generated punctured LDPC code from a transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 3600, the A matrix and the C matrix are represented by a parity check matrix initial value table, the parity check matrix initial value table is a table representing positions of elements of 1 of the A matrix and the C matrix for every 360 columns, and the parity check matrix initial value table is 1500 1594 4158 4611 4621 9708 14082 14260 16777 17457 21985 22308 23963 24554 25344 27485 27516 28008 30174 30625 31378 31525 35873 36202 45585 47150 47845 49311
851 2755 5753 8521 10162 12036 16914 17857 18538 22342 24470 28199 33144 34233 35459 35506 38894 39300 41198 41995 42243 43310 44187 44969 46306 46719 47907 48844
803 828 7874 8667 12187 15086 16097 20436 21143 22142 27188 29052 30895 30927 30963 31563 34591 35419 36521 38142 38825 42538 43514 44432 45634 47807 47953
3442 3596 4211 4790 5276 5379 6950 8256 10939 13398 13563 13720 18074 22070 22760 26767 27057 28054 29148 33155 33760 38500 42760 44861 45653 46507 48695
1337 3179 3936 4019 4207 4915 5953 6200 7596 10085 10241 15048 16788 25083 27412 27478 28623 33014 33168 33296 34087 35922 36818 38225 40169 41762 46370
230 2417 2466 10915 19279 39243 39762 42664 45750
595 1792 2788 16000 19698 28701 38882 45250 46449
764 1619 2243 10130 25528 38421 44789 45032 48064
779 1651 3431 4707 8887 24180 36687 37770 39583
136 1352 3105 9580 25493 28929 29003 43731 44941
0 2147 3434 4402 19742 21221 37419 46590 49082
1658 1953 2935 17606 21613 29311 33878 46163 47126
804 1362 2596 15920 25368 28032 32218 37251 38385
733 3180 3549 12710 14684 32429 36039 39164 47531
807 2668 2811 23227 39984 42091 45708 46426 47788
1142 3373 3414 4219 7793 11379 15389 28832 32362
246 2670 3141 11465 24513 25038 31936 36501 45021
1365 2399 3107 4460 24713 30758 32422 38041 43379
323 578 1392 22591 26966 35332 35884 36454 38254
24 78 229 8741 17149 21008 30309 32441 38141
587 1595 3531 9258 15476 30673 33744 41847 44930
980 2136 2883 18306 22032 31618 33154 45208 48127
1518 1796 2304 7939 24330 29552 33426 39907 41568
599 681 3597 10689 10811 19776 20651 34661 46473
970 1152 2675 13311 15762 16363 26575 37047 48249
1872 1968 2620 16207 31197 33577 37990 42868 45881
1105 1351 3374 28454 28667 37692 42083 46115
1019 1816 3153 7354 14190 15535 29787 40081
114 1127 3412 17706 21953 31166 48855 49247
411 1346 2860 6474 12912 28627 30225 31396
109 1895 2803 8192 22957 30924 32515 39258
1067 1547 3218 10928 18459 24102 24958 48228
1022 2939 3593 16210 20143 22128 36148 48748
1826 2281 3110 10706 11745 27544 29705 32385
165 1794 3038 13953 15929 20587 35639 37360
122 1107 1776 7992 15442 26707 28761 39718
344 1449 2018 7930 11023 11967 18210 48998
203 2541 3360 6249 8145 10115 16796 19830 39389 39409
1333 1476 1855 4261 5127 16893 20060 23938 25433 32522
1972 3154 3539 10244 10601 12317 18404 29191 35539 41261
1621 1817 3280 15943 26444 28455 28595 29822 38852 48190
2048 2565 2660 4707 12386 15311 19315 20091 24908 37754
2825 3043 3516 9940 11806 11981 20375 20597 22471 31060
2597 2792 3444 11226 16387 17531 18473 25142 39461 42139
439 2788 3511 3684 5549 16067 23077 39829 39920 44862
1076 2271 2797 6573 12043 17816 20967 21726 23200 38056
553 2080 2948 5535 16026 22119 23794 37157 46602 46720
112 2115 3084 8090 10494 13165 29078 31417 33314 39595
2275 2449 3058 10121 12474 12563 25072 25610 39483 43489
741 2186 2270 5146 10831 17517 20875 29107 35695 41244
1693 1902 2907 6756 10924 18965 24040 33793 41089 42464
2469 2514 2769 6664 8813 8938 19741 23113 34293 45892
1761 2326 2998 17255 23220 26747 28416 37450 38574 41110
1083 1375 1867 4468 6706 6899 15494 19170 28463 28858
1394 1412 1510 7439 27005 29288 32683 34307 34607 45091
2477 2978 3539 22378 23848 24738 28734 31460 41873 45398
191 803 1500 9030 14071 26093 26432 27827 35890 47458
556 2942 3114 10130 11981 33368 34732 42472 47188 47655
425 2875 2946 16084 19184 26801 27069 27090 31317 34103
121 1674 3258 5208 13340 26019 37492 38723 40779 49200
3968 7741 12550 32061
17972 19666 20231 33590
9086 34375 41691 42567
12168 14189 15095 49129
19291 26450 29950 39068
19852 25195 35124 36192
10447 32405 36184 40786
8911 19949 27496 41273
14679 16883 20951 29727
30296 32681 34757 36501.

15. A reception device, comprising:

a decoder configured to decode a punctured low density parity check (LDPC) code obtained from data transmitted by a transmission device, wherein the transmission device:

performs LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 5/16, punctures a head of the information bits of the extended LDPC code by the puncture length L to generate the punctured LDPC code with the code length N of 69120 bits and the coding rate r of 5/16, and transmits the generated punctured LDPC code from the transmission device to the reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 3600, the A matrix and the C matrix are represented by a parity check matrix initial value table, the parity check matrix initial value table is a table representing positions of elements of 1 of the A matrix and the C matrix for every 360 columns, and the parity check matrix initial value table is 1500 1594 4158 4611 4621 9708 14082 14260 16777 17457 21985 22308 23963 24554 25344 27485 27516 28008 30174 30625 31378 31525 35873 36202 45585 47150 47845 49311

851 2755 5753 8521 10162 12036 16914 17857 18538 22342 24470 28199 33144 34233 35459 35506 38894 39300 41198 41995 42243 43310 44187 44969 46306 46719 47907 48844

803 828 7874 8667 12187 15086 16097 20436 21143 22142 27188 29052 30895 30927 30963 31563 34591 35419 36521 38142 38825 42538 43514 44432 45634 47807 47953

3442 3596 4211 4790 5276 5379 6950 8256 10939 13398 13563 13720 18074 22070 22760 26767 27057 28054 29148 33155 33760 38500 42760 44861 45653 46507 48695

1337 3179 3936 4019 4207 4915 5953 6200 7596 10085 10241 15048 16788 25083 27412 27478 28623 33014 33168 33296 34087 35922 36818 38225 40169 41762 46370

230 2417 2466 10915 19279 39243 39762 42664 45750

595 1792 2788 16000 19698 28701 38882 45250 46449

764 1619 2243 10130 25528 38421 44789 45032 48064

779 1651 3431 4707 8887 24180 36687 37770 39583

136 1352 3105 9580 25493 28929 29003 43731 44941

0 2147 3434 4402 19742 21221 37419 46590 49082

1658 1953 2935 17606 21613 29311 33878 46163 47126

804 1362 2596 15920 25368 28032 32218 37251 38385

733 3180 3549 12710 14684 32429 36039 39164 47531

807 2668 2811 23227 39984 42091 45708 46426 47788

1142 3373 3414 4219 7793 11379 15389 28832 32362

246 2670 3141 11465 24513 25038 31936 36501 45021

1365 2399 3107 4460 24713 30758 32422 38041 43379

323 578 1392 22591 26966 35332 35884 36454 38254

24 78 229 8741 17149 21008 30309 32441 38141

587 1595 3531 9258 15476 30673 33744 41847 44930

980 2136 2883 18306 22032 31618 33154 45208 48127

1518 1796 2304 7939 24330 29552 33426 39907 41568

599 681 3597 10689 10811 19776 20651 34661 46473

970 1152 2675 13311 15762 16363 26575 37047 48249

1872 1968 2620 16207 31197 33577 37990 42868 45881

1105 1351 3374 28454 28667 37692 42083 46115

1019 1816 3153 7354 14190 15535 29787 40081

114 1127 3412 17706 21953 31166 48855 49247

411 1346 2860 6474 12912 28627 30225 31396

109 1895 2803 8192 22957 30924 32515 39258

1067 1547 3218 10928 18459 24102 24958 48228

1022 2939 3593 16210 20143 22128 36148 48748

1826 2281 3110 10706 11745 27544 29705 32385

165 1794 3038 13953 15929 20587 35639 37360

122 1107 1776 7992 15442 26707 28761 39718

344 1449 2018 7930 11023 11967 18210 48998

203 2541 3360 6249 8145 10115 16796 19830 39389 39409

1333 1476 1855 4261 5127 16893 20060 23938 25433 32522

1972 3154 3539 10244 10601 12317 18404 29191 35539 41261

1621 1817 3280 15943 26444 28455 28595 29822 38852 48190

2048 2565 2660 4707 12386 15311 19315 20091 24908 37754

2825 3043 3516 9940 11806 11981 20375 20597 22471 31060

2597 2792 3444 11226 16387 17531 18473 25142 39461 42139

439 2788 3511 3684 5549 16067 23077 39829 39920 44862

1076 2271 2797 6573 12043 17816 20967 21726 23200 38056

553 2080 2948 5535 16026 22119 23794 37157 46602 46720

112 2115 3084 8090 10494 13165 29078 31417 33314 39595

2275 2449 3058 10121 12474 12563 25072 25610 39483 43489

741 2186 2270 5146 10831 17517 20875 29107 35695 41244

1693 1902 2907 6756 10924 18965 24040 33793 41089 42464

2469 2514 2769 6664 8813 8938 19741 23113 34293 45892

1761 2326 2998 17255 23220 26747 28416 37450 38574 41110

1083 1375 1867 4468 6706 6899 15494 19170 28463 28858

1394 1412 1510 7439 27005 29288 32683 34307 34607 45091

2477 2978 3539 22378 23848 24738 28734 31460 41873 45398

191 803 1500 9030 14071 26093 26432 27827 35890 47458

556 2942 3114 10130 11981 33368 34732 42472 47188 47655

425 2875 2946 16084 19184 26801 27069 27090 31317 34103

121 1674 3258 5208 13340 26019 37492 38723 40779 49200
3968 7741 12550 32061
17972 19666 20231 33590
9086 34375 41691 42567
12168 14189 15095 49129
19291 26450 29950 39068
19852 25195 35124 36192
10447 32405 36184 40786
8911 19949 27496 41273
14679 16883 20951 29727
30296 32681 34757 36501.

16. A reception method, comprising:

decoding a punctured low density parity check (LDPC) code obtained from data transmitted by a transmission method, wherein the transmission method includes:

performing LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 5/16, puncturing a head of the information bits of the extended LDPC code by the puncture length L to generate the punctured LDPC code with the code length N of 69120 bits and the coding rate r of 5/16, and transmitting the generated punctured LDPC code from a transmission device to a reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 3600, the A matrix and the C matrix are represented by a parity check matrix initial value table, the parity check matrix initial value table is a table representing positions of elements of 1 of the A matrix and the C matrix for every 360 columns, and the parity check matrix initial value table is 1500 1594 4158 4611 4621 9708 14082 14260 16777 17457 21985 22308 23963 24554 25344 27485 27516 28008 30174 30625 31378 31525 35873 36202 45585 47150 47845 49311
851 2755 5753 8521 10162 12036 16914 17857 18538 22342 24470 28199 33144 34233 35459 35506 38894 39300 41198 41995 42243 43310 44187 44969 46306 46719 47907 48844
803 828 7874 8667 12187 15086 16097 20436 21143 22142 27188 29052 30895 30927 30963 31563 34591 35419 36521 38142 38825 42538 43514 44432 45634 47807 47953
3442 3596 4211 4790 5276 5379 6950 8256 10939 13398 13563 13720 18074 22070 22760 26767 27057 28054 29148 33155 33760 38500 42760 44861 45653 46507 48695
1337 3179 3936 4019 4207 4915 5953 6200 7596 10085 10241 15048 16788 25083 27412 27478 28623 33014 33168 33296 34087 35922 36818 38225 40169 41762 46370
230 2417 2466 10915 19279 39243 39762 42664 45750
595 1792 2788 16000 19698 28701 38882 45250 46449
764 1619 2243 10130 25528 38421 44789 45032 48064
779 1651 3431 4707 8887 24180 36687 37770 39583
136 1352 3105 9580 25493 28929 29003 43731 44941
0 2147 3434 4402 19742 21221 37419 46590 49082
1658 1953 2935 17606 21613 29311 33878 46163 47126
804 1362 2596 15920 25368 28032 32218 37251 38385
733 3180 3549 12710 14684 32429 36039 39164 47531
807 2668 2811 23227 39984 42091 45708 46426 47788
1142 3373 3414 4219 7793 11379 15389 28832 32362
246 2670 3141 11465 24513 25038 31936 36501 45021
1365 2399 3107 4460 24713 30758 32422 38041 43379
323 578 1392 22591 26966 35332 35884 36454 38254
24 78 229 8741 17149 21008 30309 32441 38141
587 1595 3531 9258 15476 30673 33744 41847 44930
980 2136 2883 18306 22032 31618 33154 45208 48127
1518 1796 2304 7939 24330 29552 33426 39907 41568
599 681 3597 10689 10811 19776 20651 34661 46473
970 1152 2675 13311 15762 16363 26575 37047 48249
1872 1968 2620 16207 31197 33577 37990 42868 45881
1105 1351 3374 28454 28667 37692 42083 46115
1019 1816 3153 7354 14190 15535 29787 40081
114 1127 3412 17706 21953 31166 48855 49247
411 1346 2860 6474 12912 28627 30225 31396
109 1895 2803 8192 22957 30924 32515 39258
1067 1547 3218 10928 18459 24102 24958 48228
1022 2939 3593 16210 20143 22128 36148 48748
1826 2281 3110 10706 11745 27544 29705 32385
165 1794 3038 13953 15929 20587 35639 37360
122 1107 1776 7992 15442 26707 28761 39718
344 1449 2018 7930 11023 11967 18210 48998
203 2541 3360 6249 8145 10115 16796 19830 39389 39409
1333 1476 1855 4261 5127 16893 20060 23938 25433 32522
1972 3154 3539 10244 10601 12317 18404 29191 35539 41261
1621 1817 3280 15943 26444 28455 28595 29822 38852 48190
2048 2565 2660 4707 12386 15311 19315 20091 24908 37754
2825 3043 3516 9940 11806 11981 20375 20597 22471 31060
2597 2792 3444 11226 16387 17531 18473 25142 39461 42139
439 2788 3511 3684 5549 16067 23077 39829 39920 44862
1076 2271 2797 6573 12043 17816 20967 21726 23200 38056

553 2080 2948 5535 16026 22119 23794 37157 46602 46720
112 2115 3084 8090 10494 13165 29078 31417 33314 39595
2275 2449 3058 10121 12474 12563 25072 25610 39483 43489
741 2186 2270 5146 10831 17517 20875 29107 35695 41244
1693 1902 2907 6756 10924 18965 24040 33793 41089 42464
2469 2514 2769 6664 8813 8938 19741 23113 34293 45892
1761 2326 2998 17255 23220 26747 28416 37450 38574 41110
1083 1375 1867 4468 6706 6899 15494 19170 28463 28858
1394 1412 1510 7439 27005 29288 32683 34307 34607 45091
2477 2978 3539 22378 23848 24738 28734 31460 41873 45398
191 803 1500 9030 14071 26093 26432 27827 35890 47458
556 2942 3114 10130 11981 33368 34732 42472 47188 47655
425 2875 2946 16084 19184 26801 27069 27090 31317 34103
121 1674 3258 5208 13340 26019 37492 38723 40779 49200
3968 7741 12550 32061
17972 19666 20231 33590
9086 34375 41691 42567
12168 14189 15095 49129
19291 26450 29950 39068
19852 25195 35124 36192
10447 32405 36184 40786
8911 19949 27496 41273
14679 16883 20951 29727
30296 32681 34757 36501.

17. A transmission device, comprising:

an encoder configured to:

perform low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LD PC code with a code length N of 69120 bits and a coding rate r of 6/16;

puncture a head of the information bits of the extended LDPC code by the puncture length L to generate a punctured LDPC code with the code length N of 69120 bits and the coding rate r of 6/16; and transmit the generated punctured LDPC code from the transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 3600, the A matrix and the C matrix are represented by a parity check matrix initial value table, the parity check matrix initial value table is a table representing positions of elements of 1 of the A matrix and the C matrix for every 360 columns, and the parity check matrix initial value table is 1594 1610 4443 4633 4971 5913 7301 7706 13474 16147 16681 17638 20084 20205 20247 20540 22484 27085 28185 29116 31096 33068 41272 41610 43034
1883 2386 4525 5861 6762 8505 10987 11467 13389 15284 15934 22445 22893 24837 26162 26697 29883 30925 35299 38596 38645 41614 42730 43699 44169
1048 1205 7615 12049 12746 13032 13602 14263 14911 15606 21519 26057 26528 28217 28266 29323 31302 32457 32579 34903 35105 36007 40006 43828 44649
1621 1937 3806 4192 4345 4436 4464 5013 7744 9969 10235 10276 10910 12816 16020 17524 20323 30904 31663 35163 35398 35957 39093 42657 44993
49 1822 3711 3892 4990 10239 12492 18990 19520 21406 24318 24612 25751 26767 30148 31680 32384 33296 34983 35934 38715 40286 42291 42485 42998
220 302 3574 5681 9506 24907 31216 34098 36706
26 88 1979 6254 17793 31399 31963 38968 41759
571 2797 2843 10391 18284 24224 26323 35575 43222
2778 2865 3374 13146 22196 23479 29472 40894 43961
513 2641 3267 12546 22339 22592 33324 37388 43058
89 416 2750 8737 9111 19495 26529 35507 39319
1522 1795 3155 3952 19544 28293 40910 43137 44782
68 1271 2663 22635 26043 31010 37397 42214 42940
1102 1410 2026 14095 14851 19343 23303 25716 33443
2257 2649 2734 13712 40173 42230 42240 43221 44414
714 2565 2880 4450 12908 34192 35997 36455 40728
1546 3319 3372 7492 10636 16725 26425 42426 42880
41 927 2263 6416 10637 22272 29323 34364 39763
1681 2598 3263 4337 19277 28170 31112 39274 39685
1624 2266 2712 7713 10204 19680 20781 32234 32824
1839 2578 2725 4403 4475 6187 8251 15794 34791
1372 2107 2310 8695 10370 22033 31001 38223 44215
1045 2138 3259 14898 16935 20360 28114 30232 36792

2326 3271 3510 21052 22158 24249 25709 30136 35176
347 2043 2984 10440 10461 11558 18257 42040 44932
562 1425 2428 12400 14792 16918 24373 34372 44049
959 1004 2630 14983 26147 28239 28571 33730 34758
2366 3093 3321 16340 19265 26290 28817 42082 42430
1812 2687 3030 7047 13181 15320 27308 36719 39868
118 933 1127 16601 20206 28560 42837 44651 44924
411 1346 2869 4816 6186 12098 26338 28747 28842
1985 2151 2804 7754 21167 21405 29764 35907 40584
1067 1689 3513 10225 15350 17157 22215 37316 44909
1306 1452 2564 15049 24636 29181 29918 39466 44466
558 640 2085 5522 9131 12991 24658 28599 38510
971 1333 2524 5076 14312 16292 23989 28218 37668
345 1819 2012 7598 7602 10348 11079 16828 20223
206 3490 3577 7652 9484 15485 18215 32891 36012
207 2085 2818 4223 4981 18437 18907 20797 29779
1043 1602 1711 17049 26349 37701 37805 39929 44226
528 686 2519 22288 24424 26040 27266 35523 44395
974 2063 3540 23885 24211 26226 27093 33120 34243
84 689 1292 14234 17834 34458 36109 38609 44075
656 1321 1335 9564 11031 20663 28540 33454
2798 3040 3447 10523 15178 16147 17112 23143
2785 2827 3514 3648 5406 8631 21247 36454
983 2859 3241 6313 15981 16459 29725 35759
662 1428 2716 9984 19352 21403 27521 37417
1460 1582 3397 5327 14857 27868 34040 42479
116 353 3081 9834 12252 26703 28884 30421
2275 2449 2838 9493 11608 23271 38776 39806
704 1750 2835 10462 12221 28740 29710 37673
121 2008 2529 16240 19331 23089 25481 36984
1207 1650 2956 6464 10252 30913 31894 38888
1272 2513 2764 6370 8377 8517 31368 41960
1538 1761 2999 21345 26055 30346 34230 35254
1125 1822 2953 6588 14341 16087 19369 25097
60 246 1224 19668 19837 21037 26085 26484
2023 2447 3295 7065 24779 29935 31328 32089
2977 3291 3536 20569 22895 26291 28856 38257
198 1500 1594 8474 12821 24065 24273 25489
829 2542 3457 9560 9981 11130 37448 39505
2452 3433 3465 8505 30616 36656 37451 38882
1828 2189 2401 5065 14917 17648 24809 24869
1674 1760 3256 5017 12401 34198 35372 44967
329 2242 2945 3841 11713 18179 18567 30756
1134 2993 3068 8595 13252 14014 31475 44841
671 1250 2076 18266 23182 24268 32218 33106 33153 35797
532 2267 2927 8343 13630 15565 18426 25262 27191 37728
1363 2100 2454 15244 19187 23000 25655 28410 29916 33402
251 1469 2315 13593 15859 19414 26073 29034 35496 37152
112 1736 2508 5876 14259 14532 21456 35968 37533 42515
25233 26394
5080 6930

12302 41997
27483 36076
5116 36815
11841 28243
18326 37978
22431 36141
35950 40525
41824 42674.

18. A transmission method, comprising:

performing low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 6/16;

puncturing a head of the information bits of the extended LDPC code by the puncture length L to generate a punctured LDPC code with the code length N of 69120 bits and the coding rate r of 6/16; and transmitting the generated punctured LDPC code from a transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 3600, the A matrix and the C matrix are represented by a parity check matrix initial value table, the parity check matrix initial value table is a table representing positions of elements of 1 of the A matrix and the C matrix for every 360 columns, and the parity check matrix initial value table is 1594 1610 4443 4633 4971 5913 7301 7706 13474 16147 16681 17638 20084 20205 20247 20540 22484 27085 28185 29116 31096 33068 41272 41610 43034
1883 2386 4525 5861 6762 8505 10987 11467 13389 15284 15934 22445 22893 24837 26162 26697 29883 30925 35299 38596 38645 41614 42730 43699 44169
1048 1205 7615 12049 12746 13032 13602 14263 14911 15606 21519 26057 26528 28217 28266 29323 31302 32457 32579 34903 35105 36007 40006 43828 44649
1621 1937 3806 4192 4345 4436 4464 5013 7744 9969 10235 10276 10910 12816 16020 17524 20323 30904 31663 35163 35398 35957 39093 42657 44993
49 1822 3711 3892 4990 10239 12492 18990 19520 21406 24318 24612 25751 26767 30148 31680 32384 33296 34983 35934 38715 40286 42291 42485 42998
220 302 3574 5681 9506 24907 31216 34098 36706

26 88 1979 6254 17793 31399 31963 38968 41759
571 2797 2843 10391 18284 24224 26323 35575 43222
2778 2865 3374 13146 22196 23479 29472 40894 43961
513 2641 3267 12546 22339 22592 33324 37388 43058
89 416 2750 8737 9111 19495 26529 35507 39319
1522 1795 3155 3952 19544 28293 40910 43137 44782
68 1271 2663 22635 26043 31010 37397 42214 42940
1102 1410 2026 14095 14851 19343 23303 25716 33443
2257 2649 2734 13712 40173 42230 42240 43221 44414
714 2565 2880 4450 12908 34192 35997 36455 40728
1546 3319 3372 7492 10636 16725 26425 42426 42880
41 927 2263 6416 10637 22272 29323 34364 39763
1681 2598 3263 4337 19277 28170 31112 39274 39685
1624 2266 2712 7713 10204 19680 20781 32234 32824
1839 2578 2725 4403 4475 6187 8251 15794 34791
1372 2107 2310 8695 10370 22033 31001 38223 44215
1045 2138 3259 14898 16935 20360 28114 30232 36792
2326 3271 3510 21052 22158 24249 25709 30136 35176
347 2043 2984 10440 10461 11558 18257 42040 44932
562 1425 2428 12400 14792 16918 24373 34372 44049
959 1004 2630 14983 26147 28239 28571 33730 34758
2366 3093 3321 16340 19265 26290 28817 42082 42430
1812 2687 3030 7047 13181 15320 27308 36719 39868
118 933 1127 16601 20206 28560 42837 44651 44924
411 1346 2869 4816 6186 12098 26338 28747 28842
1985 2151 2804 7754 21167 21405 29764 35907 40584
1067 1689 3513 10225 15350 17157 22215 37316 44909
1306 1452 2564 15049 24636 29181 29918 39466 44466
558 640 2085 5522 9131 12991 24658 28599 38510
971 1333 2524 5076 14312 16292 23989 28218 37668
345 1819 2012 7598 7602 10348 11079 16828 20223
206 3490 3577 7652 9484 15485 18215 32891 36012
207 2085 2818 4223 4981 18437 18907 20797 29779
1043 1602 1711 17049 26349 37701 37805 39929 44226
528 686 2519 22288 24424 26040 27266 35523 44395
974 2063 3540 23885 24211 26226 27093 33120 34243
84 689 1292 14234 17834 34458 36109 38609 44075
656 1321 1335 9564 11031 20663 28540 33454
2798 3040 3447 10523 15178 16147 17112 23143
2785 2827 3514 3648 5406 8631 21247 36454
983 2859 3241 6313 15981 16459 29725 35759
662 1428 2716 9984 19352 21403 27521 37417
1460 1582 3397 5327 14857 27868 34040 42479
116 353 3081 9834 12252 26703 28884 30421
2275 2449 2838 9493 11608 23271 38776 39806
704 1750 2835 10462 12221 28740 29710 37673
121 2008 2529 16240 19331 23089 25481 36984
1207 1650 2956 6464 10252 30913 31894 38888
1272 2513 2764 6370 8377 8517 31368 41960
1538 1761 2999 21345 26055 30346 34230 35254
1125 1822 2953 6588 14341 16087 19369 25097
60 246 1224 19668 19837 21037 26085 26484
2023 2447 3295 7065 24779 29935 31328 32089
2977 3291 3536 20569 22895 26291 28856 38257
198 1500 1594 8474 12821 24065 24273 25489
829 2542 3457 9560 9981 11130 37448 39505
2452 3433 3465 8505 30616 36656 37451 38882
1828 2189 2401 5065 14917 17648 24809 24869
1674 1760 3256 5017 12401 34198 35372 44967
329 2242 2945 3841 11713 18179 18567 30756
1134 2993 3068 8595 13252 14014 31475 44841
671 1250 2076 18266 23182 24268 32218 33106 33153 35797
532 2267 2927 8343 13630 15565 18426 25262 27191 37728
1363 2100 2454 15244 19187 23000 25655 28410 29916 33402
251 1469 2315 13593 15859 19414 26073 29034 35496 37152
112 1736 2508 5876 14259 14532 21456 35968 37533 42515
25233 26394
5080 6930
12302 41997
27483 36076
5116 36815
11841 28243
18326 37978
22431 36141
35950 40525
41824 42674.

19. A reception device, comprising:

a decoder configured to decode a punctured low density parity check (LDPC) code obtained from data transmitted by a transmission device, wherein the transmission device:

performs LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 6/16, punctures a head of the information bits of the extended LDPC code by the puncture length L to generate the punctured LDPC code with the code length N of 69120 bits and the coding rate r of 6/16, and transmits the generated punctured LDPC code from the transmission device to the reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 3600, the A matrix and the C matrix are represented by a parity check matrix initial value table, the parity check matrix initial value table is a table representing positions of elements of 1 of the A matrix and the C matrix for every 360 columns, and the parity check matrix initial value table is 1594 1610 4443 4633 4971 5913 7301 7706 13474 16147 16681 17638 20084 20205 20247 20540 22484 27085 28185 29116 31096 33068 41272 41610 43034

1883 2386 4525 5861 6762 8505 10987 11467 13389 15284 15934 22445 22893 24837 26162 26697 29883 30925 35299 38596 38645 41614 42730 43699 44169
1048 1205 7615 12049 12746 13032 13602 14263 14911 15606 21519 26057 26528 28217 28266 29323 31302 32457 32579 34903 35105 36007 40006 43828 44649
1621 1937 3806 4192 4345 4436 4464 5013 7744 9969 10235 10276 10910 12816 16020 17524 20323 30904 31663 35163 35398 35957 39093 42657 44993
49 1822 3711 3892 4990 10239 12492 18990 19520 21406 24318 24612 25751 26767 30148 31680 32384 33296 34983 35934 38715 40286 42291 42485 42998
220 302 3574 5681 9506 24907 31216 34098 36706
26 88 1979 6254 17793 31399 31963 38968 41759
571 2797 2843 10391 18284 24224 26323 35575 43222
2778 2865 3374 13146 22196 23479 29472 40894 43961
513 2641 3267 12546 22339 22592 33324 37388 43058
89 416 2750 8737 9111 19495 26529 35507 39319
1522 1795 3155 3952 19544 28293 40910 43137 44782
68 1271 2663 22635 26043 31010 37397 42214 42940
1102 1410 2026 14095 14851 19343 23303 25716 33443
2257 2649 2734 13712 40173 42230 42240 43221 44414
714 2565 2880 4450 12908 34192 35997 36455 40728
1546 3319 3372 7492 10636 16725 26425 42426 42880
41 927 2263 6416 10637 22272 29323 34364 39763
1681 2598 3263 4337 19277 28170 31112 39274 39685
1624 2266 2712 7713 10204 19680 20781 32234 32824
1839 2578 2725 4403 4475 6187 8251 15794 34791
1372 2107 2310 8695 10370 22033 31001 38223 44215
1045 2138 3259 14898 16935 20360 28114 30232 36792
2326 3271 3510 21052 22158 24249 25709 30136 35176
347 2043 2984 10440 10461 11558 18257 42040 44932
562 1425 2428 12400 14792 16918 24373 34372 44049
959 1004 2630 14983 26147 28239 28571 33730 34758
2366 3093 3321 16340 19265 26290 28817 42082 42430
1812 2687 3030 7047 13181 15320 27308 36719 39868
118 933 1127 16601 20206 28560 42837 44651 44924
411 1346 2869 4816 6186 12098 26338 28747 28842
1985 2151 2804 7754 21167 21405 29764 35907 40584
1067 1689 3513 10225 15350 17157 22215 37316 44909
1306 1452 2564 15049 24636 29181 29918 39466 44466
558 640 2085 5522 9131 12991 24658 28599 38510
971 1333 2524 5076 14312 16292 23989 28218 37668
345 1819 2012 7598 7602 10348 11079 16828 20223
206 3490 3577 7652 9484 15485 18215 32891 36012
207 2085 2818 4223 4981 18437 18907 20797 29779
1043 1602 1711 17049 26349 37701 37805 39929 44226
528 686 2519 22288 24424 26040 27266 35523 44395
974 2063 3540 23885 24211 26226 27093 33120 34243
84 689 1292 14234 17834 34458 36109 38609 44075
656 1321 1335 9564 11031 20663 28540 33454
2798 3040 3447 10523 15178 16147 17112 23143
2785 2827 3514 3648 5406 8631 21247 36454
983 2859 3241 6313 15981 16459 29725 35759
662 1428 2716 9984 19352 21403 27521 37417
1460 1582 3397 5327 14857 27868 34040 42479
116 353 3081 9834 12252 26703 28884 30421
2275 2449 2838 9493 11608 23271 38776 39806
704 1750 2835 10462 12221 28740 29710 37673
121 2008 2529 16240 19331 23089 25481 36984
1207 1650 2956 6464 10252 30913 31894 38888
1272 2513 2764 6370 8377 8517 31368 41960
1538 1761 2999 21345 26055 30346 34230 35254
1125 1822 2953 6588 14341 16087 19369 25097
60 246 1224 19668 19837 21037 26085 26484
2023 2447 3295 7065 24779 29935 31328 32089
2977 3291 3536 20569 22895 26291 28856 38257
198 1500 1594 8474 12821 24065 24273 25489
829 2542 3457 9560 9981 11130 37448 39505
2452 3433 3465 8505 30616 36656 37451 38882
1828 2189 2401 5065 14917 17648 24809 24869
1674 1760 3256 5017 12401 34198 35372 44967
329 2242 2945 3841 11713 18179 18567 30756
1134 2993 3068 8595 13252 14014 31475 44841
671 1250 2076 18266 23182 24268 32218 33106 33153 35797
532 2267 2927 8343 13630 15565 18426 25262 27191 37728
1363 2100 2454 15244 19187 23000 25655 28410 29916 33402
251 1469 2315 13593 15859 19414 26073 29034 35496 37152
112 1736 2508 5876 14259 14532 21456 35968 37533 42515
25233 26394
5080 6930
12302 41997
27483 36076
5116 36815
11841 28243
18326 37978
22431 36141
35950 40525
41824 42674.

20. A reception method, comprising:

decoding a punctured low density parity check (LDPC) code obtained from data transmitted by a transmission method, wherein the transmission method includes:

performing LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 6/16, puncturing a head of the information bits of the extended LDPC code by the puncture length L to generate the punctured LDPC code with the code length N of 69120 bits and the coding rate r of 6/16, and transmitting the generated punctured LDPC code from a transmission device to a reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 3600, the A matrix and the C matrix are represented by a parity check matrix initial value table, the parity check matrix initial value table is a table representing positions of elements of 1 of the A matrix and the C matrix for every 360 columns, and the parity check matrix initial value table is 1594 1610 4443 4633 4971 5913 7301 7706 13474 16147 16681 17638 20084 20205 20247 20540 22484 27085 28185 29116 31096 33068 41272 41610 43034
1883 2386 4525 5861 6762 8505 10987 11467 13389 15284 15934 22445 22893 24837 26162 26697 29883 30925 35299 38596 38645 41614 42730 43699 44169
1048 1205 7615 12049 12746 13032 13602 14263 14911 15606 21519 26057 26528 28217 28266 29323 31302 32457 32579 34903 35105 36007 40006 43828 44649
1621 1937 3806 4192 4345 4436 4464 5013 7744 9969 10235 10276 10910 12816 16020 17524 20323 30904 31663 35163 35398 35957 39093 42657 44993
49 1822 3711 3892 4990 10239 12492 18990 19520 21406 24318 24612 25751 26767 30148 31680 32384 33296 34983 35934 38715 40286 42291 42485 42998
220 302 3574 5681 9506 24907 31216 34098 36706
26 88 1979 6254 17793 31399 31963 38968 41759
571 2797 2843 10391 18284 24224 26323 35575 43222
2778 2865 3374 13146 22196 23479 29472 40894 43961
513 2641 3267 12546 22339 22592 33324 37388 43058
89 416 2750 8737 9111 19495 26529 35507 39319
1522 1795 3155 3952 19544 28293 40910 43137 44782
68 1271 2663 22635 26043 31010 37397 42214 42940
1102 1410 2026 14095 14851 19343 23303 25716 33443
2257 2649 2734 13712 40173 42230 42240 43221 44414
714 2565 2880 4450 12908 34192 35997 36455 40728
1546 3319 3372 7492 10636 16725 26425 42426 42880
41 927 2263 6416 10637 22272 29323 34364 39763
1681 2598 3263 4337 19277 28170 31112 39274 39685
1624 2266 2712 7713 10204 19680 20781 32234 32824
1839 2578 2725 4403 4475 6187 8251 15794 34791
1372 2107 2310 8695 10370 22033 31001 38223 44215
1045 2138 3259 14898 16935 20360 28114 30232 36792
2326 3271 3510 21052 22158 24249 25709 30136 35176
347 2043 2984 10440 10461 11558 18257 42040 44932
562 1425 2428 12400 14792 16918 24373 34372 44049
959 1004 2630 14983 26147 28239 28571 33730 34758
2366 3093 3321 16340 19265 26290 28817 42082 42430
1812 2687 3030 7047 13181 15320 27308 36719 39868
118 933 1127 16601 20206 28560 42837 44651 44924
411 1346 2869 4816 6186 12098 26338 28747 28842
1985 2151 2804 7754 21167 21405 29764 35907 40584
1067 1689 3513 10225 15350 17157 22215 37316 44909
1306 1452 2564 15049 24636 29181 29918 39466 44466
558 640 2085 5522 9131 12991 24658 28599 38510
971 1333 2524 5076 14312 16292 23989 28218 37668
345 1819 2012 7598 7602 10348 11079 16828 20223
206 3490 3577 7652 9484 15485 18215 32891 36012
207 2085 2818 4223 4981 18437 18907 20797 29779
1043 1602 1711 17049 26349 37701 37805 39929 44226
528 686 2519 22288 24424 26040 27266 35523 44395
974 2063 3540 23885 24211 26226 27093 33120 34243
84 689 1292 14234 17834 34458 36109 38609 44075
656 1321 1335 9564 11031 20663 28540 33454
2798 3040 3447 10523 15178 16147 17112 23143
2785 2827 3514 3648 5406 8631 21247 36454
983 2859 3241 6313 15981 16459 29725 35759
662 1428 2716 9984 19352 21403 27521 37417
1460 1582 3397 5327 14857 27868 34040 42479
116 353 3081 9834 12252 26703 28884 30421
2275 2449 2838 9493 11608 23271 38776 39806
704 1750 2835 10462 12221 28740 29710 37673
121 2008 2529 16240 19331 23089 25481 36984
1207 1650 2956 6464 10252 30913 31894 38888
1272 2513 2764 6370 8377 8517 31368 41960
1538 1761 2999 21345 26055 30346 34230 35254
1125 1822 2953 6588 14341 16087 19369 25097
60 246 1224 19668 19837 21037 26085 26484
2023 2447 3295 7065 24779 29935 31328 32089
2977 3291 3536 20569 22895 26291 28856 38257
198 1500 1594 8474 12821 24065 24273 25489
829 2542 3457 9560 9981 11130 37448 39505
2452 3433 3465 8505 30616 36656 37451 38882
1828 2189 2401 5065 14917 17648 24809 24869
1674 1760 3256 5017 12401 34198 35372 44967
329 2242 2945 3841 11713 18179 18567 30756
1134 2993 3068 8595 13252 14014 31475 44841
671 1250 2076 18266 23182 24268 32218 33106 33153 35797
532 2267 2927 8343 13630 15565 18426 25262 27191 37728
1363 2100 2454 15244 19187 23000 25655 28410 29916 33402
251 1469 2315 13593 15859 19414 26073 29034 35496 37152
112 1736 2508 5876 14259 14532 21456 35968 37533 42515
25233 26394
5080 6930
12302 41997
27483 36076
5116 36815
11841 28243
18326 37978
22431 36141
35950 40525
41824 42674.

21. A transmission device, comprising:

an encoder configured to:

perform low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 7/16;

puncture a head of the information bits of the extended LDPC code by the puncture length L to generate a punctured LDPC code with the code length N of 69120 bits and the coding rate r of 7/16; and transmit the generated punctured LDPC code from the transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 2160, the value M1 is 3960, the A matrix and the C matrix are represented by a parity check matrix initial value table, the parity check matrix initial value table is a table representing positions of elements of 1 of the A matrix and the C matrix for every 360 columns, and the parity check matrix initial value table is 1764 2277 5400 7275 7702 16018 16086 17361 18724 18869 19132 20243 21595 25512 26606 30134 36052 39329 41031
181 1916 4788 5993 10696 12604 13012 24557 24787 25876 26693 28545 32349 33375 35357 36872 37706 38697 40205
1627 3867 5245 5631 6206 7958 12408 14675 15078 16069 20924 24234 29887 31630 32133 34527 34618 35147 37843
1103 2230 7388 9550 10439 11627 13165 14144 18256 22833 26008 26531 28108 28741 29963 31479 31923 39255 39995
1285 2355 4577 6689 10485 12036 16455 18963 19252 23741 30895 31196 35315 36358 36604 38535 39352 40937 40994
3065 4434 5307 7286 7705 9549 9848 11017 11901 12627 17746 21303 23749 24143 25301 25977 32801 37365 38172
434 2357 3026 7873 22006 27928 31085 34076
1003 2078 2558 6023 7076 9453 23248 40783
275 2594 2879 4212 4816 24471 29358 33606
304 2655 3449 9926 16670 32754 33277 38132
657 1983 3058 14006 17331 24307 37692 38764
865 1808 3134 21758 27257 31888 37426 40019
562 1861 3800 12068 20650 30577 33391 39300
97 459 2970 5360 8808 17885 24492 36388
1655 1901 3486 3965 18266 21707 26083 39858
106 2971 3601 4603 17049 21044 24058 34168
105 2632 3687 12222 15389 17985 18580 24844
1067 1887 3012 11816 23805 27159 31152 32102
412 3506 3688 11340 12998 28025 30295 32802
884 2933 3112 19905 33377 35257 38730 39998
3709 3756 3774 7360 10333 13454 15712 24711
58 2494 2959 6474 10296 20685 26935 36360
1854 2850 3654 4678 18001 28593 35963 36270
1830 2363 2518 7949 10035 18345 29534 31920
1646 2020 2811 4203 4779 6289 30475 32063
465 1178 2986 18151 20386 25654 27386 40357
640 2615 3354 8542 14478 25967 25995 37471
1082 1285 3179 18952 26721 27915 37670 40010
1737 1976 2546 7547 20613 23824 25055 32654
741 1013 3328 9668 9749 17082 38386 40974
1268 1476 2671 11835 14049 22600 31513 40179
1045 1108 2992 14156 23244 24154 31043 31798
2421 2602 3798 15389 17884 24140 35871 38752
819 2169 2955 14408 22625 25191 35170 36437
334 922 3167 5119 13570 15530 39099 41014
1221 1589 2395 8195 17835 24255 33626 40708
860 2308 2450 5038 6315 23489 26114 32851
406 1679 3105 14968 19909 27383 37072 40206
633 1863 1959 14480 16090 18913 34193 41012
1488 1699 2837 14716 22731 26859 27454 35998
700 1266 2120 5664 24568 24724 31262 35236
900 1067 2778 5274 15361 17755 22211 33252
1025 2008 2182 7489 7536 15899 18803 24702
383 648 716 5156 6037 9277 30214 38571
389 1155 2887 6102 17079 19192 23080 32918
1471 1635 2511 4547 5272 14725 20498 21659
2171 3539 3896 9346 9694 10999 15963 34494
1994 2216 2771 20692 24115 32560 37794 40140
1080 2162 2696 21197 22485 25015 30419 31363
97 755 1419 13499 16636 31603 35313 40181
1469 1655 3110 9088 10592 17584 19236 26283
2952 3076 3849 10157 14317 15196 16053 35195
1861 3105 3862 3994 5564 6074 8451 19756
3145 3155 3597 14101 15059 15459 27355 32750
259 873 3006 18016 18676 19887 25385 34337
613 1595 3868 5572 14023 20249 31223 38780
200 3129 3397 7639 9614 11741 26530 28039
2223 2694 3117 9231 11140 21370 27439 35476
779 1905 3630 11778 26510 27390 33035 34468
137 624 2206 15239 18045 21398 23580 29951
1327 1763 3312 6477 9861 28455 34353 35567
2717 2763 3044 8185 8380 17045 28844 38259
265 1105 3295 22148 24070 27939 31377 32371
1785 2042 3249 6558 15036 15184 18135 23151
271 1032 1352 4622 18315 19571 24142 24376
2392 2686 3656 7062 22999 24868 27626 28882
2726 3295 3893 19111 21109 26599 35039 37863
1650 1757 2170 5928 12800 22404 22521 23554
474 912 2810 9299 9649 34316 36020 39568
721 3776 3815 8297 28150 29224 33574 35496
2009 2400 3282 14124 16587 22933 22980 28722
132 1845 3587 11790 22121 31459 32442 40951
142 361 1061 4265 11230 16948 17367 27128
1250 2600 3374 8456 12596 28890 34813 40879
738 1025 1617 17079 22449 25340 30369 32737
1876 2731 2841 9438 17215 23350 27295 34083
453 1144 3263 12936 18049 25084 25595 29278
2369 2850 2997 6628 14441 17901 21329 23717
1671 2580 3055 12903 14917 24143 26800 33983
1516 1907 2756 5106 13479 13748 32931

1708 3245 3727
216 2078 2179
137 316 3665
834 2278 3108
5345 33686
11281 26022
17244 34746
20829 33069
32952 37029
38235 38952
12779 36842
5081 34190
8352 9285
37937 39131
21873 26915.

22. A transmission method, comprising:

performing low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 7/16;

puncturing a head of the information bits of the extended LDPC code by the puncture length L to generate a punctured LDPC code with the code length N of 69120 bits and the coding rate r of 7/16; and transmitting the generated punctured LDPC code from a transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 2160, the value M1 is 3960, the A matrix and the C matrix are represented by a parity check matrix initial value table, the parity check matrix initial value table is a table representing positions of elements of 1 of the A matrix and the C matrix for every 360 columns, and the parity check matrix initial value table is 1764 2277 5400 7275 7702 16018 16086 17361 18724 18869 19132 20243 21595 25512 26606 30134 36052 39329 41031
181 1916 4788 5993 10696 12604 13012 24557 24787 25876 26693 28545 32349 33375 35357 36872 37706 38697 40205
1627 3867 5245 5631 6206 7958 12408 14675 15078 16069 20924 24234 29887 31630 32133 34527 34618 35147 37843
1103 2230 7388 9550 10439 11627 13165 14144 18256 22833 26008 26531 28108 28741 29963 31479 31923 39255 39995
1285 2355 4577 6689 10485 12036 16455 18963 19252 23741 30895 31196 35315 36358 36604 38535 39352 40937 40994
3065 4434 5307 7286 7705 9549 9848 11017 11901 12627 17746 21303 23749 24143 25301 25977 32801 37365 38172
434 2357 3026 7873 22006 27928 31085 34076
1003 2078 2558 6023 7076 9453 23248 40783
275 2594 2879 4212 4816 24471 29358 33606
304 2655 3449 9926 16670 32754 33277 38132
657 1983 3058 14006 17331 24307 37692 38764
865 1808 3134 21758 27257 31888 37426 40019
562 1861 3800 12068 20650 30577 33391 39300
97 459 2970 5360 8808 17885 24492 36388
1655 1901 3486 3965 18266 21707 26083 39858
106 2971 3601 4603 17049 21044 24058 34168
105 2632 3687 12222 15389 17985 18580 24844
1067 1887 3012 11816 23805 27159 31152 32102
412 3506 3688 11340 12998 28025 30295 32802
884 2933 3112 19905 33377 35257 38730 39998
3709 3756 3774 7360 10333 13454 15712 24711
58 2494 2959 6474 10296 20685 26935 36360
1854 2850 3654 4678 18001 28593 35963 36270
1830 2363 2518 7949 10035 18345 29534 31920
1646 2020 2811 4203 4779 6289 30475 32063
465 1178 2986 18151 20386 25654 27386 40357
640 2615 3354 8542 14478 25967 25995 37471
1082 1285 3179 18952 26721 27915 37670 40010
1737 1976 2546 7547 20613 23824 25055 32654
741 1013 3328 9668 9749 17082 38386 40974
1268 1476 2671 11835 14049 22600 31513 40179
1045 1108 2992 14156 23244 24154 31043 31798
2421 2602 3798 15389 17884 24140 35871 38752
819 2169 2955 14408 22625 25191 35170 36437
334 922 3167 5119 13570 15530 39099 41014
1221 1589 2395 8195 17835 24255 33626 40708
860 2308 2450 5038 6315 23489 26114 32851
406 1679 3105 14968 19909 27383 37072 40206
633 1863 1959 14480 16090 18913 34193 41012
1488 1699 2837 14716 22731 26859 27454 35998
700 1266 2120 5664 24568 24724 31262 35236
900 1067 2778 5274 15361 17755 22211 33252
1025 2008 2182 7489 7536 15899 18803 24702
383 648 716 5156 6037 9277 30214 38571
389 1155 2887 6102 17079 19192 23080 32918
1471 1635 2511 4547 5272 14725 20498 21659
2171 3539 3896 9346 9694 10999 15963 34494
1994 2216 2771 20692 24115 32560 37794 40140
1080 2162 2696 21197 22485 25015 30419 31363
97 755 1419 13499 16636 31603 35313 40181
1469 1655 3110 9088 10592 17584 19236 26283
2952 3076 3849 10157 14317 15196 16053 35195
1861 3105 3862 3994 5564 6074 8451 19756
3145 3155 3597 14101 15059 15459 27355 32750
259 873 3006 18016 18676 19887 25385 34337
613 1595 3868 5572 14023 20249 31223 38780
200 3129 3397 7639 9614 11741 26530 28039
2223 2694 3117 9231 11140 21370 27439 35476
779 1905 3630 11778 26510 27390 33035 34468
137 624 2206 15239 18045 21398 23580 29951
1327 1763 3312 6477 9861 28455 34353 35567
2717 2763 3044 8185 8380 17045 28844 38259
265 1105 3295 22148 24070 27939 31377 32371
1785 2042 3249 6558 15036 15184 18135 23151

271 1032 1352 4622 18315 19571 24142 24376
2392 2686 3656 7062 22999 24868 27626 28882
2726 3295 3893 19111 21109 26599 35039 37863
1650 1757 2170 5928 12800 22404 22521 23554
474 912 2810 9299 9649 34316 36020 39568
721 3776 3815 8297 28150 29224 33574 35496
2009 2400 3282 14124 16587 22933 22980 28722
132 1845 3587 11790 22121 31459 32442 40951
142 361 1061 4265 11230 16948 17367 27128
1250 2600 3374 8456 12596 28890 34813 40879
738 1025 1617 17079 22449 25340 30369 32737
1876 2731 2841 9438 17215 23350 27295 34083
453 1144 3263 12936 18049 25084 25595 29278
2369 2850 2997 6628 14441 17901 21329 23717
1671 2580 3055 12903 14917 24143 26800 33983
1516 1907 2756 5106 13479 13748 32931
1708 3245 3727
216 2078 2179
137 316 3665
834 2278 3108
5345 33686
11281 26022
17244 34746
20829 33069
32952 37029
38235 38952
12779 36842
5081 34190
8352 9285
37937 39131
21873 26915.

23. A reception device, comprising:

a decoder configured to decode a punctured low density parity check (LDPC) code obtained from data transmitted by a transmission device, wherein the transmission device:

performs LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 7/16, punctures a head of the information bits of the extended LDPC code by the puncture length L to generate the punctured LDPC code with the code length N of 69120 bits and the coding rate r of 7/16, and transmits the generated punctured LDPC code from the transmission device to the reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 2160, the value M1 is 3960, the A matrix and the C matrix are represented by a parity check matrix initial value table, the parity check matrix initial value table is a table representing positions of elements of 1 of the A matrix and the C matrix for every 360 columns, and the parity check matrix initial value table is 1764 2277 5400 7275 7702 16018 16086 17361 18724 18869 19132 20243 21595 25512 26606 30134 36052 39329 41031
181 1916 4788 5993 10696 12604 13012 24557 24787 25876 26693 28545 32349 33375 35357 36872 37706 38697 40205
1627 3867 5245 5631 6206 7958 12408 14675 15078 16069 20924 24234 29887 31630 32133 34527 34618 35147 37843
1103 2230 7388 9550 10439 11627 13165 14144 18256 22833 26008 26531 28108 28741 29963 31479 31923 39255 39995
1285 2355 4577 6689 10485 12036 16455 18963 19252 23741 30895 31196 35315 36358 36604 38535 39352 40937 40994
3065 4434 5307 7286 7705 9549 9848 11017 11901 12627 17746 21303 23749 24143 25301 25977 32801 37365 38172
434 2357 3026 7873 22006 27928 31085 34076
1003 2078 2558 6023 7076 9453 23248 40783
275 2594 2879 4212 4816 24471 29358 33606
304 2655 3449 9926 16670 32754 33277 38132
657 1983 3058 14006 17331 24307 37692 38764
865 1808 3134 21758 27257 31888 37426 40019
562 1861 3800 12068 20650 30577 33391 39300
97 459 2970 5360 8808 17885 24492 36388
1655 1901 3486 3965 18266 21707 26083 39858
106 2971 3601 4603 17049 21044 24058 34168
105 2632 3687 12222 15389 17985 18580 24844
1067 1887 3012 11816 23805 27159 31152 32102
412 3506 3688 11340 12998 28025 30295 32802
884 2933 3112 19905 33377 35257 38730 39998
3709 3756 3774 7360 10333 13454 15712 24711
58 2494 2959 6474 10296 20685 26935 36360
1854 2850 3654 4678 18001 28593 35963 36270
1830 2363 2518 7949 10035 18345 29534 31920
1646 2020 2811 4203 4779 6289 30475 32063
465 1178 2986 18151 20386 25654 27386 40357
640 2615 3354 8542 14478 25967 25995 37471
1082 1285 3179 18952 26721 27915 37670 40010
1737 1976 2546 7547 20613 23824 25055 32654
741 1013 3328 9668 9749 17082 38386 40974
1268 1476 2671 11835 14049 22600 31513 40179
1045 1108 2992 14156 23244 24154 31043 31798
2421 2602 3798 15389 17884 24140 35871 38752
819 2169 2955 14408 22625 25191 35170 36437
334 922 3167 5119 13570 15530 39099 41014
1221 1589 2395 8195 17835 24255 33626 40708
860 2308 2450 5038 6315 23489 26114 32851
406 1679 3105 14968 19909 27383 37072 40206
633 1863 1959 14480 16090 18913 34193 41012
1488 1699 2837 14716 22731 26859 27454 35998
700 1266 2120 5664 24568 24724 31262 35236

900 1067 2778 5274 15361 17755 22211 33252
1025 2008 2182 7489 7536 15899 18803 24702
383 648 716 5156 6037 9277 30214 38571
389 1155 2887 6102 17079 19192 23080 32918
1471 1635 2511 4547 5272 14725 20498 21659
2171 3539 3896 9346 9694 10999 15963 34494
1994 2216 2771 20692 24115 32560 37794 40140
1080 2162 2696 21197 22485 25015 30419 31363
97 755 1419 13499 16636 31603 35313 40181
1469 1655 3110 9088 10592 17584 19236 26283
2952 3076 3849 10157 14317 15196 16053 35195
1861 3105 3862 3994 5564 6074 8451 19756
3145 3155 3597 14101 15059 15459 27355 32750
259 873 3006 18016 18676 19887 25385 34337
613 1595 3868 5572 14023 20249 31223 38780
200 3129 3397 7639 9614 11741 26530 28039
2223 2694 3117 9231 11140 21370 27439 35476
779 1905 3630 11778 26510 27390 33035 34468
137 624 2206 15239 18045 21398 23580 29951
1327 1763 3312 6477 9861 28455 34353 35567
2717 2763 3044 8185 8380 17045 28844 38259
265 1105 3295 22148 24070 27939 31377 32371
1785 2042 3249 6558 15036 15184 18135 23151
271 1032 1352 4622 18315 19571 24142 24376
2392 2686 3656 7062 22999 24868 27626 28882
2726 3295 3893 19111 21109 26599 35039 37863
1650 1757 2170 5928 12800 22404 22521 23554
474 912 2810 9299 9649 34316 36020 39568
721 3776 3815 8297 28150 29224 33574 35496
2009 2400 3282 14124 16587 22933 22980 28722
132 1845 3587 11790 22121 31459 32442 40951
142 361 1061 4265 11230 16948 17367 27128
1250 2600 3374 8456 12596 28890 34813 40879
738 1025 1617 17079 22449 25340 30369 32737
1876 2731 2841 9438 17215 23350 27295 34083
453 1144 3263 12936 18049 25084 25595 29278
2369 2850 2997 6628 14441 17901 21329 23717
1671 2580 3055 12903 14917 24143 26800 33983
1516 1907 2756 5106 13479 13748 32931
1708 3245 3727
216 2078 2179
137 316 3665
834 2278 3108
5345 33686
11281 26022
17244 34746
20829 33069
32952 37029
38235 38952
12779 36842
5081 34190
8352 9285
37937 39131
21873 26915.

24. A reception method, comprising:

decoding a punctured low density parity check (LDPC) code obtained from data transmitted by a transmission method, wherein the transmission method includes:

performing LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 7/16, puncturing a head of the information bits of the extended LDPC code by the puncture length L to generate the punctured LDPC code with the code length N of 69120 bits and the coding rate r of 7/16, and transmitting the generated punctured LDPC code from a transmission device to a reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 2160, the value M1 is 3960, the A matrix and the C matrix are represented by a parity check matrix initial value table, the parity check matrix initial value table is a table representing positions of elements of 1 of the A matrix and the C matrix for every 360 columns, and the parity check matrix initial value table is 1764 2277 5400 7275 7702 16018 16086 17361 18724 18869 19132 20243 21595 25512 26606 30134 36052 39329 41031
181 1916 4788 5993 10696 12604 13012 24557 24787 25876 26693 28545 32349 33375 35357 36872 37706 38697 40205
1627 3867 5245 5631 6206 7958 12408 14675 15078 16069 20924 24234 29887 31630 32133 34527 34618 35147 37843
1103 2230 7388 9550 10439 11627 13165 14144 18256 22833 26008 26531 28108 28741 29963 31479 31923 39255 39995
1285 2355 4577 6689 10485 12036 16455 18963 19252 23741 30895 31196 35315 36358 36604 38535 39352 40937 40994
3065 4434 5307 7286 7705 9549 9848 11017 11901 12627 17746 21303 23749 24143 25301 25977 32801 37365 38172
434 2357 3026 7873 22006 27928 31085 34076
1003 2078 2558 6023 7076 9453 23248 40783
275 2594 2879 4212 4816 24471 29358 33606
304 2655 3449 9926 16670 32754 33277 38132
657 1983 3058 14006 17331 24307 37692 38764
865 1808 3134 21758 27257 31888 37426 40019
562 1861 3800 12068 20650 30577 33391 39300
97 459 2970 5360 8808 17885 24492 36388
1655 1901 3486 3965 18266 21707 26083 39858
106 2971 3601 4603 17049 21044 24058 34168
105 2632 3687 12222 15389 17985 18580 24844
1067 1887 3012 11816 23805 27159 31152 32102
412 3506 3688 11340 12998 28025 30295 32802
884 2933 3112 19905 33377 35257 38730 39998

3709 3756 3774 7360 10333 13454 15712 24711
58 2494 2959 6474 10296 20685 26935 36360
1854 2850 3654 4678 18001 28593 35963 36270
1830 2363 2518 7949 10035 18345 29534 31920
1646 2020 2811 4203 4779 6289 30475 32063
465 1178 2986 18151 20386 25654 27386 40357
640 2615 3354 8542 14478 25967 25995 37471
1082 1285 3179 18952 26721 27915 37670 40010
1737 1976 2546 7547 20613 23824 25055 32654
741 1013 3328 9668 9749 17082 38386 40974
1268 1476 2671 11835 14049 22600 31513 40179
1045 1108 2992 14156 23244 24154 31043 31798
2421 2602 3798 15389 17884 24140 35871 38752
819 2169 2955 14408 22625 25191 35170 36437
334 922 3167 5119 13570 15530 39099 41014
1221 1589 2395 8195 17835 24255 33626 40708
860 2308 2450 5038 6315 23489 26114 32851
406 1679 3105 14968 19909 27383 37072 40206
633 1863 1959 14480 16090 18913 34193 41012
1488 1699 2837 14716 22731 26859 27454 35998
700 1266 2120 5664 24568 24724 31262 35236
900 1067 2778 5274 15361 17755 22211 33252
1025 2008 2182 7489 7536 15899 18803 24702
383 648 716 5156 6037 9277 30214 38571
389 1155 2887 6102 17079 19192 23080 32918
1471 1635 2511 4547 5272 14725 20498 21659
2171 3539 3896 9346 9694 10999 15963 34494
1994 2216 2771 20692 24115 32560 37794 40140
1080 2162 2696 21197 22485 25015 30419 31363
97 755 1419 13499 16636 31603 35313 40181
1469 1655 3110 9088 10592 17584 19236 26283
2952 3076 3849 10157 14317 15196 16053 35195
1861 3105 3862 3994 5564 6074 8451 19756
3145 3155 3597 14101 15059 15459 27355 32750
259 873 3006 18016 18676 19887 25385 34337
613 1595 3868 5572 14023 20249 31223 38780
200 3129 3397 7639 9614 11741 26530 28039
2223 2694 3117 9231 11140 21370 27439 35476
779 1905 3630 11778 26510 27390 33035 34468
137 624 2206 15239 18045 21398 23580 29951
1327 1763 3312 6477 9861 28455 34353 35567
2717 2763 3044 8185 8380 17045 28844 38259
265 1105 3295 22148 24070 27939 31377 32371
1785 2042 3249 6558 15036 15184 18135 23151
271 1032 1352 4622 18315 19571 24142 24376
2392 2686 3656 7062 22999 24868 27626 28882
2726 3295 3893 19111 21109 26599 35039 37863
1650 1757 2170 5928 12800 22404 22521 23554
474 912 2810 9299 9649 34316 36020 39568
721 3776 3815 8297 28150 29224 33574 35496
2009 2400 3282 14124 16587 22933 22980 28722
132 1845 3587 11790 22121 31459 32442 40951
142 361 1061 4265 11230 16948 17367 27128
1250 2600 3374 8456 12596 28890 34813 40879
738 1025 1617 17079 22449 25340 30369 32737
1876 2731 2841 9438 17215 23350 27295 34083
453 1144 3263 12936 18049 25084 25595 29278
2369 2850 2997 6628 14441 17901 21329 23717
1671 2580 3055 12903 14917 24143 26800 33983
1516 1907 2756 5106 13479 13748 32931
1708 3245 3727
216 2078 2179
137 316 3665
834 2278 3108
5345 33686
11281 26022
17244 34746
20829 33069
32952 37029
38235 38952
12779 36842
5081 34190
8352 9285
37937 39131
21873 26915.

25. A transmission device, comprising:

an encoder configured to:

perform low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 8/16;

puncture a head of the information bits of the extended LDPC code by the puncture length L to generate a punctured LDPC code with the code length N of 69120 bits and the coding rate r of 8/16; and transmit the generated punctured LDPC code from the transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 2520, the value M1 is 5040, the A matrix and the C matrix are represented by a parity check matrix initial value table, the parity check matrix initial value table is a table representing positions of elements of 1 of the A matrix and the C matrix for every 360 columns, and the parity check matrix initial value table is 2184 2245 5483 5692 9320 18011 18064 18150 20189 23469 23662 25407 28189 35779 37071
1855 3613 5755 7904 12491 14272 19654 22065 22316 23975 24503 26458 29567 34455 35556
928 4740 6537 8736 9455 16185 18167 22537 22768 26005 32031 32179 33566 34966 35808
3986 4696 5295 8034 12188 12339 14298 19661 22499 22837 28343 29201 30056 36868 36872
1049 2606 9166 13000 17407 22535 24035 24090 26423 27147 28104 29196 34765 36183 36195
2475 2705 6586 10659 14652 15858 18555 22635 25610 26796 32144 33131 35581 37072
1339 1594 5556 5731 5735 7423 7924 8287 10173 21406 26174 26965 30831 35028
2095 2692 4542 11957 16923 21339 22995 35510

753 3913 4481 24115 25745 28475 29334 34983
531 2404 4091 6823 7730 13085 21741 25943
764 2602 5000 5777 6649 28284 28457 30648
173 2884 3453 7716 16017 26720 33781 34558
804 3989 4026 10353 16302 20995 22614 29946
1369 1438 4721 11804 19454 24989 29745 33895
2413 3865 4900 9605 12227 19796 34068 35639
2280 3614 3994 5794 8725 17288 29042 32667
189 729 2807 18569 20422 29775 33106 35601
13 1942 3075 5647 16437 28792 33944 36951
2322 2774 4133 14911 23058 26276 35482 36145
1156 1915 1988 13753 20275 22750 28129 28615
1027 3254 3826 12792 25306 33398 34900 36579
1000 3662 3934 12247 28784 30051 30448 34971
2208 4777 4895 7995 15270 34546 35050 35465
865 1301 2776 5447 7236 25204 28825 33009
931 2280 3123 18312 20000 26379 29091 35547
161 313 1976 10118 19510 24067 25236 29200
495 2033 3478 18349 21388 27692 27945 29298
40 123 466 8627 14489 23804 25266 29217
1919 2239 5036 9020 10230 13401 26202 31868
2984 2990 4559 13817 15317 17982 24664 30694
4263 4578 4900 18514 19432 21056 22195 25540
486 2865 4044 10378 16367 19558 31611 37057
773 785 4692 13690 15318 17028 26614 28889
1128 2525 4918 13514 14018 21695 28403 28447
1378 2785 3945 19557 24360 26125 32618 35109
1622 2734 4728 21208 22587 28908 32086 34795
1490 2885 4429 7668 12440 13368 15096 30591
157 4782 5028 7007 8693 14921 17912 24354
1887 2821 4004 5990 7023 11617 23891 31527
2659 3026 3929 8247 18589 18766 25496 30000
1493 4505 4919 10166 15487 19375 20018 37009
1459 2038 4184 13922 16641 25405 27889 36692
2552 3118 4424 10018 10774 20992 21805 22999
1575 3751 4248 12315 13683 16910 20849 27503
169 1552 4011 8140 13348 21198 22677 22961
485 1610 2021 6883 8078 10259 10833 36872
717 3562 4705 8210 14216 16365 30074 30100
284 2060 2603 5600 6111 16526 16904 25280
1464 2306 2405 15402 22597 31453 33154 36507
793 858 958 19518 21177 22969 27465 34316
2755 4039 4916 13740 21014 22548 23393 27868
2346 2859 3724 5804 11163 13257 16059 16537
3034 3827 4257 10753 10848 16863 17910 30215
699 2077 3036 14789 28159 29959 32060 35741
842 1479 1651 8903 20126 29843 30172 36359
60 216 2154 13804 29952 30425 30451 33882
1561 2138 3179 7117 10997 17696 18819 29502
1929 2926 4119 6462 9997 17945 19143 35222
1408 3721 4733 6077 8220 23897 24532 32454
758 1062 3265 22844 25290 26795 30309 32198
723 974 2366 11325 11639 20444 30190 33000
3057 3184 4157 6124 10032 14829 22920 27535
1908 2681 3314 10175 15746 19286 30891 31312
337 3329 4284 16428 26550 26938 27394 29675
601 626 4671 7188 18716 20787 25752 31716
2736 3729 3853 14610 18790 21261 31327
1514 1926 2616 7216 7346 13375 15951
385 2731 2776 17442 17618 18488 26842
2847 3447 4837 7730 21494 25421 27060
4167 4675 4950 18125 19852 24594 31885
2100 2258 2839 6788 12190 20838 22037
598 1160 2512 9977 27667 31266 35818
726 918 4356 25915 26856 35644 35900
603 4023 4286 21322 24461 26414 31230
1378 1712 2601 6187 19972 21466 33990
2477 3873 5026 6147 11847 28736 31098
458 983 3395 5246 16300 16685 26054
1591 4194 4296 8941 12584 26579 36950
956 1266 1722 21007 23498 27878 29947
1791 2382 3477 27827
753 1172 3171 21799
577 1793 4156 14329
1221 1909 2872 23737
3201 3437 3627 24180
1422 2384 2680 17127
350 2057 3244 29775
1494 3096 4085 12712
1925 2736 3505 20471
167 1300 1330 30100
2178 4141 4741 6802
169 2635 2776 7608
1061 3955 4667 23473
185 995 4044 24130
1792 2284 4178 30200
3947 4503 4756 34653
1198 4107 4470 5969
9656
8810
34388
35438
20498
24839
23256
9966
25861
11305
7639
21600
13763
25619.

26. A transmission method, comprising:

performing low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 8/16;

puncturing a head of the information bits of the extended LDPC code by the puncture length L to generate a punctured LDPC code with the code length N of 69120 bits and the coding rate r of 8/16; and transmitting the generated punctured LDPC code from a transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 2520, the value M1 is 5040, the A matrix and the C matrix are represented by a parity check matrix initial value table, the parity check matrix initial value table is a table representing positions of elements of 1 of the A matrix and the C matrix for every 360 columns, and the parity check matrix initial value table is 2184 2245 5483 5692 9320 18011 18064 18150 20189 23469 23662 25407 28189 35779 37071
1855 3613 5755 7904 12491 14272 19654 22065 22316 23975 24503 26458 29567 34455 35556
928 4740 6537 8736 9455 16185 18167 22537 22768 26005 32031 32179 33566 34966 35808
3986 4696 5295 8034 12188 12339 14298 19661 22499 22837 28343 29201 30056 36868 36872
1049 2606 9166 13000 17407 22535 24035 24090 26423 27147 28104 29196 34765 36183 36195
2475 2705 6586 10659 14652 15858 18555 22635 25610 26796 32144 33131 35581 37072
1339 1594 5556 5731 5735 7423 7924 8287 10173 21406 26174 26965 30831 35028
2095 2692 4542 11957 16923 21339 22995 35510
753 3913 4481 24115 25745 28475 29334 34983
531 2404 4091 6823 7730 13085 21741 25943
764 2602 5000 5777 6649 28284 28457 30648
173 2884 3453 7716 16017 26720 33781 34558
804 3989 4026 10353 16302 20995 22614 29946
1369 1438 4721 11804 19454 24989 29745 33895
2413 3865 4900 9605 12227 19796 34068 35639
2280 3614 3994 5794 8725 17288 29042 32667
189 729 2807 18569 20422 29775 33106 35601
13 1942 3075 5647 16437 28792 33944 36951
2322 2774 4133 14911 23058 26276 35482 36145
1156 1915 1988 13753 20275 22750 28129 28615
1027 3254 3826 12792 25306 33398 34900 36579
1000 3662 3934 12247 28784 30051 30448 34971
2208 4777 4895 7995 15270 34546 35050 35465
865 1301 2776 5447 7236 25204 28825 33009
931 2280 3123 18312 20000 26379 29091 35547
161 313 1976 10118 19510 24067 25236 29200
495 2033 3478 18349 21388 27692 27945 29298
40 123 466 8627 14489 23804 25266 29217
1919 2239 5036 9020 10230 13401 26202 31868
2984 2990 4559 13817 15317 17982 24664 30694
4263 4578 4900 18514 19432 21056 22195 25540
486 2865 4044 10378 16367 19558 31611 37057
773 785 4692 13690 15318 17028 26614 28889
1128 2525 4918 13514 14018 21695 28403 28447
1378 2785 3945 19557 24360 26125 32618 35109
1622 2734 4728 21208 22587 28908 32086 34795
1490 2885 4429 7668 12440 13368 15096 30591
157 4782 5028 7007 8693 14921 17912 24354
1887 2821 4004 5990 7023 11617 23891 31527
2659 3026 3929 8247 18589 18766 25496 30000
1493 4505 4919 10166 15487 19375 20018 37009
1459 2038 4184 13922 16641 25405 27889 36692
2552 3118 4424 10018 10774 20992 21805 22999
1575 3751 4248 12315 13683 16910 20849 27503
169 1552 4011 8140 13348 21198 22677 22961
485 1610 2021 6883 8078 10259 10833 36872
717 3562 4705 8210 14216 16365 30074 30100
284 2060 2603 5600 6111 16526 16904 25280
1464 2306 2405 15402 22597 31453 33154 36507
793 858 958 19518 21177 22969 27465 34316
2755 4039 4916 13740 21014 22548 23393 27868
2346 2859 3724 5804 11163 13257 16059 16537
3034 3827 4257 10753 10848 16863 17910 30215
699 2077 3036 14789 28159 29959 32060 35741
842 1479 1651 8903 20126 29843 30172 36359
60 216 2154 13804 29952 30425 30451 33882
1561 2138 3179 7117 10997 17696 18819 29502
1929 2926 4119 6462 9997 17945 19143 35222
1408 3721 4733 6077 8220 23897 24532 32454
758 1062 3265 22844 25290 26795 30309 32198
723 974 2366 11325 11639 20444 30190 33000
3057 3184 4157 6124 10032 14829 22920 27535
1908 2681 3314 10175 15746 19286 30891 31312
337 3329 4284 16428 26550 26938 27394 29675
601 626 4671 7188 18716 20787 25752 31716
2736 3729 3853 14610 18790 21261 31327
1514 1926 2616 7216 7346 13375 15951
385 2731 2776 17442 17618 18488 26842
2847 3447 4837 7730 21494 25421 27060
4167 4675 4950 18125 19852 24594 31885
2100 2258 2839 6788 12190 20838 22037
598 1160 2512 9977 27667 31266 35818
726 918 4356 25915 26856 35644 35900
603 4023 4286 21322 24461 26414 31230
1378 1712 2601 6187 19972 21466 33990
2477 3873 5026 6147 11847 28736 31098
458 983 3395 5246 16300 16685 26054
1591 4194 4296 8941 12584 26579 36950
956 1266 1722 21007 23498 27878 29947
1791 2382 3477 27827
753 1172 3171 21799
577 1793 4156 14329
1221 1909 2872 23737
3201 3437 3627 24180
1422 2384 2680 17127
350 2057 3244 29775
1494 3096 4085 12712
1925 2736 3505 20471
167 1300 1330 30100
2178 4141 4741 6802
169 2635 2776 7608
1061 3955 4667 23473
185 995 4044 24130
1792 2284 4178 30200
3947 4503 4756 34653
1198 4107 4470 5969
9656
8810
34388
35438
20498
24839
23256
9966
25861
11305
7639
21600
13763
25619.

27. A reception device, comprising:

a decoder configured to decode a punctured low density parity check (LDPC) code obtained from data transmitted by a transmission device, wherein the transmission device:

performs LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 8/16, punctures a head of the information bits of the extended LDPC code by the puncture length L to generate the punctured LDPC code with the code length N of 69120 bits and the coding rate r of 8/16, and transmits the generated punctured LDPC code from the transmission device to the reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 2520, the value M1 is 5040, the A matrix and the C matrix are represented by a parity check matrix initial value table, the parity check matrix initial value table is a table representing positions of elements of 1 of the A matrix and the C matrix for every 360 columns, and the parity check matrix initial value table is 2184 2245 5483 5692 9320 18011 18064 18150 20189 23469 23662 25407 28189 35779 37071
1855 3613 5755 7904 12491 14272 19654 22065 22316 23975 24503 26458 29567 34455 35556
928 4740 6537 8736 9455 16185 18167 22537 22768 26005 32031 32179 33566 34966 35808
3986 4696 5295 8034 12188 12339 14298 19661 22499 22837 28343 29201 30056 36868 36872
1049 2606 9166 13000 17407 22535 24035 24090 26423 27147 28104 29196 34765 36183 36195
2475 2705 6586 10659 14652 15858 18555 22635 25610 26796 32144 33131 35581 37072
1339 1594 5556 5731 5735 7423 7924 8287 10173 21406 26174 26965 30831 35028
2095 2692 4542 11957 16923 21339 22995 35510
753 3913 4481 24115 25745 28475 29334 34983
531 2404 4091 6823 7730 13085 21741 25943
764 2602 5000 5777 6649 28284 28457 30648
173 2884 3453 7716 16017 26720 33781 34558
804 3989 4026 10353 16302 20995 22614 29946
1369 1438 4721 11804 19454 24989 29745 33895
2413 3865 4900 9605 12227 19796 34068 35639
2280 3614 3994 5794 8725 17288 29042 32667
189 729 2807 18569 20422 29775 33106 35601
13 1942 3075 5647 16437 28792 33944 36951
2322 2774 4133 14911 23058 26276 35482 36145
1156 1915 1988 13753 20275 22750 28129 28615
1027 3254 3826 12792 25306 33398 34900 36579
1000 3662 3934 12247 28784 30051 30448 34971
2208 4777 4895 7995 15270 34546 35050 35465
865 1301 2776 5447 7236 25204 28825 33009
931 2280 3123 18312 20000 26379 29091 35547
161 313 1976 10118 19510 24067 25236 29200
495 2033 3478 18349 21388 27692 27945 29298
40 123 466 8627 14489 23804 25266 29217
1919 2239 5036 9020 10230 13401 26202 31868
2984 2990 4559 13817 15317 17982 24664 30694
4263 4578 4900 18514 19432 21056 22195 25540
486 2865 4044 10378 16367 19558 31611 37057
773 785 4692 13690 15318 17028 26614 28889
1128 2525 4918 13514 14018 21695 28403 28447
1378 2785 3945 19557 24360 26125 32618 35109
1622 2734 4728 21208 22587 28908 32086 34795
1490 2885 4429 7668 12440 13368 15096 30591
157 4782 5028 7007 8693 14921 17912 24354
1887 2821 4004 5990 7023 11617 23891 31527
2659 3026 3929 8247 18589 18766 25496 30000
1493 4505 4919 10166 15487 19375 20018 37009
1459 2038 4184 13922 16641 25405 27889 36692
2552 3118 4424 10018 10774 20992 21805 22999
1575 3751 4248 12315 13683 16910 20849 27503
169 1552 4011 8140 13348 21198 22677 22961
485 1610 2021 6883 8078 10259 10833 36872
717 3562 4705 8210 14216 16365 30074 30100
284 2060 2603 5600 6111 16526 16904 25280
1464 2306 2405 15402 22597 31453 33154 36507
793 858 958 19518 21177 22969 27465 34316
2755 4039 4916 13740 21014 22548 23393 27868
2346 2859 3724 5804 11163 13257 16059 16537
3034 3827 4257 10753 10848 16863 17910 30215
699 2077 3036 14789 28159 29959 32060 35741
842 1479 1651 8903 20126 29843 30172 36359
60 216 2154 13804 29952 30425 30451 33882
1561 2138 3179 7117 10997 17696 18819 29502
1929 2926 4119 6462 9997 17945 19143 35222
1408 3721 4733 6077 8220 23897 24532 32454
758 1062 3265 22844 25290 26795 30309 32198
723 974 2366 11325 11639 20444 30190 33000
3057 3184 4157 6124 10032 14829 22920 27535
1908 2681 3314 10175 15746 19286 30891 31312
337 3329 4284 16428 26550 26938 27394 29675
601 626 4671 7188 18716 20787 25752 31716
2736 3729 3853 14610 18790 21261 31327
1514 1926 2616 7216 7346 13375 15951
385 2731 2776 17442 17618 18488 26842
2847 3447 4837 7730 21494 25421 27060
4167 4675 4950 18125 19852 24594 31885
2100 2258 2839 6788 12190 20838 22037
598 1160 2512 9977 27667 31266 35818
726 918 4356 25915 26856 35644 35900
603 4023 4286 21322 24461 26414 31230
1378 1712 2601 6187 19972 21466 33990
2477 3873 5026 6147 11847 28736 31098
458 983 3395 5246 16300 16685 26054
1591 4194 4296 8941 12584 26579 36950
956 1266 1722 21007 23498 27878 29947
1791 2382 3477 27827
753 1172 3171 21799
577 1793 4156 14329
1221 1909 2872 23737
3201 3437 3627 24180
1422 2384 2680 17127

350 2057 3244 29775
1494 3096 4085 12712
1925 2736 3505 20471
167 1300 1330 30100
2178 4141 4741 6802
169 2635 2776 7608
1061 3955 4667 23473
185 995 4044 24130
1792 2284 4178 30200
3947 4503 4756 34653
1198 4107 4470 5969
9656
8810
34388
35438
20498
24839
23256
9966
25861
11305
7639
21600
13763
25619.

28. A reception method, comprising:

decoding a punctured low density parity check (LDPC) code obtained from data transmitted by a transmission method, wherein the transmission method includes:

performing LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 8/16, puncturing a head of the information bits of the extended LDPC code by the puncture length L to generate the punctured LDPC code with the code length N of 69120 bits and the coding rate r of 8/16, and transmitting the generated punctured LDPC code from a transmission device to a reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 2520, the value M1 is 5040, the A matrix and the C matrix are represented by a parity check matrix initial value table, the parity check matrix initial value table is a table representing positions of elements of 1 of the A matrix and the C matrix for every 360 columns, and the parity check matrix initial value table is 2184 2245 5483 5692 9320 18011 18064 18150 20189 23469 23662 25407 28189 35779 37071
1855 3613 5755 7904 12491 14272 19654 22065 22316 23975 24503 26458 29567 34455 35556
928 4740 6537 8736 9455 16185 18167 22537 22768 26005 32031 32179 33566 34966 35808
3986 4696 5295 8034 12188 12339 14298 19661 22499 22837 28343 29201 30056 36868 36872
1049 2606 9166 13000 17407 22535 24035 24090 26423 27147 28104 29196 34765 36183 36195
2475 2705 6586 10659 14652 15858 18555 22635 25610 26796 32144 33131 35581 37072
1339 1594 5556 5731 5735 7423 7924 8287 10173 21406 26174 26965 30831 35028
2095 2692 4542 11957 16923 21339 22995 35510
753 3913 4481 24115 25745 28475 29334 34983
531 2404 4091 6823 7730 13085 21741 25943
764 2602 5000 5777 6649 28284 28457 30648
173 2884 3453 7716 16017 26720 33781 34558
804 3989 4026 10353 16302 20995 22614 29946
1369 1438 4721 11804 19454 24989 29745 33895
2413 3865 4900 9605 12227 19796 34068 35639
2280 3614 3994 5794 8725 17288 29042 32667
189 729 2807 18569 20422 29775 33106 35601
13 1942 3075 5647 16437 28792 33944 36951
2322 2774 4133 14911 23058 26276 35482 36145
1156 1915 1988 13753 20275 22750 28129 28615
1027 3254 3826 12792 25306 33398 34900 36579
1000 3662 3934 12247 28784 30051 30448 34971
2208 4777 4895 7995 15270 34546 35050 35465
865 1301 2776 5447 7236 25204 28825 33009
931 2280 3123 18312 20000 26379 29091 35547
161 313 1976 10118 19510 24067 25236 29200
495 2033 3478 18349 21388 27692 27945 29298
40 123 466 8627 14489 23804 25266 29217
1919 2239 5036 9020 10230 13401 26202 31868
2984 2990 4559 13817 15317 17982 24664 30694
4263 4578 4900 18514 19432 21056 22195 25540
486 2865 4044 10378 16367 19558 31611 37057
773 785 4692 13690 15318 17028 26614 28889
1128 2525 4918 13514 14018 21695 28403 28447
1378 2785 3945 19557 24360 26125 32618 35109
1622 2734 4728 21208 22587 28908 32086 34795
1490 2885 4429 7668 12440 13368 15096 30591
157 4782 5028 7007 8693 14921 17912 24354
1887 2821 4004 5990 7023 11617 23891 31527
2659 3026 3929 8247 18589 18766 25496 30000
1493 4505 4919 10166 15487 19375 20018 37009
1459 2038 4184 13922 16641 25405 27889 36692
2552 3118 4424 10018 10774 20992 21805 22999
1575 3751 4248 12315 13683 16910 20849 27503
169 1552 4011 8140 13348 21198 22677 22961
485 1610 2021 6883 8078 10259 10833 36872
717 3562 4705 8210 14216 16365 30074 30100
284 2060 2603 5600 6111 16526 16904 25280
1464 2306 2405 15402 22597 31453 33154 36507
793 858 958 19518 21177 22969 27465 34316
2755 4039 4916 13740 21014 22548 23393 27868
2346 2859 3724 5804 11163 13257 16059 16537
3034 3827 4257 10753 10848 16863 17910 30215
699 2077 3036 14789 28159 29959 32060 35741

842 1479 1651 8903 20126 29843 30172 36359
60 216 2154 13804 29952 30425 30451 33882
1561 2138 3179 7117 10997 17696 18819 29502
1929 2926 4119 6462 9997 17945 19143 35222
1408 3721 4733 6077 8220 23897 24532 32454
758 1062 3265 22844 25290 26795 30309 32198
723 974 2366 11325 11639 20444 30190 33000
3057 3184 4157 6124 10032 14829 22920 27535
1908 2681 3314 10175 15746 19286 30891 31312
337 3329 4284 16428 26550 26938 27394 29675
601 626 4671 7188 18716 20787 25752 31716
2736 3729 3853 14610 18790 21261 31327
1514 1926 2616 7216 7346 13375 15951
385 2731 2776 17442 17618 18488 26842
2847 3447 4837 7730 21494 25421 27060
4167 4675 4950 18125 19852 24594 31885
2100 2258 2839 6788 12190 20838 22037
598 1160 2512 9977 27667 31266 35818
726 918 4356 25915 26856 35644 35900
603 4023 4286 21322 24461 26414 31230
1378 1712 2601 6187 19972 21466 33990
2477 3873 5026 6147 11847 28736 31098
458 983 3395 5246 16300 16685 26054
1591 4194 4296 8941 12584 26579 36950
956 1266 1722 21007 23498 27878 29947
1791 2382 3477 27827
753 1172 3171 21799
577 1793 4156 14329
1221 1909 2872 23737
3201 3437 3627 24180
1422 2384 2680 17127
350 2057 3244 29775
1494 3096 4085 12712
1925 2736 3505 20471
167 1300 1330 30100
2178 4141 4741 6802
169 2635 2776 7608
1061 3955 4667 23473
185 995 4044 24130
1792 2284 4178 30200
3947 4503 4756 34653
1198 4107 4470 5969
9656
8810
34388
35438
20498
24839
23256
9966
25861
11305
7639
21600
13763
25619.

29. A transmission device, comprising:

an encoder configured to:

perform low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 9/16;

puncture a head of the information bits of the extended LDPC code by the puncture length L to generate a punctured LDPC code with the code length N of 69120 bits and the coding rate r of 9/16; and transmit the generated punctured LDPC code from the transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 9000, the A matrix and the C matrix are represented by a parity check matrix initial value table, the parity check matrix initial value table is a table representing positions of elements of 1 of the A matrix and the C matrix for every 360 columns, and the parity check matrix initial value table is 3681 3750 3985 4255 8583 9468 12078 12353 15700 16492 17127 18174 18264 22392 23070 25263 29195 32034
804 4119 5315 5489 8261 9514 10099 10268 14359 16861 21050 21439 23880 24274 26637 30518 30944 31195
3684 4224 4412 7772 8017 10100 12529 15888 16518 18089 19685 28054 28297 28345 28897 29827 30402 31794
2013 2073 4993 6278 6716 10271 13971 14141 14727 17892 21649 22734 24394 25979 26485 30156 30617 31322
671 4057 4827 6795 8726 11791 15912 16773 16823 21296 24678 28589 29419 30212 30976 31701 32035
2831 3625 4812 9421 10678 11313 11919 13859 24185 26543
105 197 4569 12767 18835 20708 21307 21922 29762 30542
1939 3334 7927 12368 22520 24007 25355 26414 27639 30526
935 4228 7324 10281 10930 14811 20832 21012 24721 31868
451 1279 6541 9174 9524 23917 24447 24765 27400 30105
596 3093 7695 12690 12805 20513 26844 26874 27238 30238
3165 4948 8257 13864 15261 19334 23340 27303 29834 30592
4311 6608 8867 12314 17011 19562 29621 29653 29867 31831
246 1043 4063 9880 12133 14403 17673 21772 26756 28865

3800 4310 7891 9005 17892 22752 29776 30960 31922
169 3202 6707 9267 19608 21494 24264 27783 30896
2756 3526 5061 14144 15208 17722 19974 23683 25622
5640 6672 8062 10253 14587 17029 23586 29354 30935
1780 6399 7013 13407 14129 26025 27047 27302 28430
3867 8295 8448 11173 12961 16355 23417 30645 30840
114 2303 5658 10578 12954 19396 23278 26133 29150
4205 6484 8154 9468 9855 17738 25225 28855 29327
4064 5671 6785 11073 12684 17900 18543 24915 25278
4591 6432 6812 9172 9497 10443 11612 15805 26385
3429 5317 5699 11875 12763 19252 24194 28715 31645
2334 5348 8140 15322 16398 18377 22674 23119 27452
5806 8178 8750 18695 19361 20500 21337 23747 26594
868 5108 7470 12695 12827 13362 17150 30388 32036
1401 3377 6069 13887 15223 16423 20548 26114 31525
2388 2511 6647 15288 20979 21546 22893 25768 26293
5918 7740 8309 16069 17648 21533 21638 30421 30592
4531 6710 7575 10870 14321 15801 22289 27422 29206
282 2349 2823 16122 18235 22889 30845 31790 32028
1028 3364 7170 9696 10463 13676 21633 22408 22987
4747 5376 7037 11344 18790 18904 23562 26963 29547
2666 4221 8779 12684 15548 16845 19631 27773 32000
3277 3636 6417 15359 20686 23258 23607 28911 31760
1394 1613 4705 10030 14240 20469 21907 25971 28392
2428 3334 6308 9823 14969 16081 20361 21680 27204
870 4539 5033 11210 11227 12757 13164 16363 18278
519 8424 8966 11266 12282 15631 17138 25283 27009
562 4648 7031 9367 9769 17258 17524 18469 23544
2607 4017 4276 12525 16477 21617 28004 29179 31638
1311 1705 6279 19425 20643 21524 21927 26759 30022
2440 5160 8827 19724 20470 21579 22088 25426 26076
247 1718 3238 15685 16926 26381 27070 28504 31522
1646 3308 3325 12196 13145 18495 22879 25613 31074
2777 6991 7582 12852 15441 16518 19845 27107 31491
24 1098 6964 10014
3834 7138 8104 27290
2467 2695 6985 23538
597 1655 2786 26365
3412 3568 3869 22313
1378 3631 7350 30759
396 2426 3965 30636
294 5276 6622 28723
889 5479 5831 13814
1355 5011 7082 24636
1737 5683 7638 12279
4248 4328 7871 13506
1867 5466 7068 23531
1400 5020 7410 9775
2727 3409 6324 21177
4027 4240 7262 16737
1442 7380 7650 24201
601 6169 6278 26698
1070 3198 6038 11626
616 3835 8339 28168
4424 5809 6656 26638
3857 4561 4879 27896
2696 2722 4665 17776
643 2333 3072 10579
232 4876 4956 18710
3486 3535 6104 29906
774 5073 6030 23656
4617 6194 7445 31653
4163 5489 8227 28295
3675 3991 4940 18635
496 2003 4758 20333
1062 2059 4493 25301
1380 7374 8642 28926
1294 1639 8662 30961
5866 6147 7653 11713
5458 7184 7361 20695
2463 4602 6018 16857
320 4682 8140 19724
4410 6923 8975 26037
306 1921 7301 11104
57 1768 5604 17338
2839 3153 5912 28608
1091 6051 7495 31918
1681 2099 2259 16924
4490 5186 6994 25446
3188 4252 6208 25437
1342 5660 7305 21071
1048 3204 7421 15675
2197 3412 5125 22484
5721 6143 6479 22800
2531 4216 4794 17691
628 3665 5783 26756
2660 5527 7289 14552
3432 4895 6255 20101
288 2324 2375 27024
3898 7386 8459 10265
301 4717 4972 10844
1895 7065 8334 22255
331 1779 7214 22726
3202 4096 7467 27090
27017
29554
30755
30289
14496
29460
27770
9663
12310
11707

30095
30852
20107
23269
22090
12537
23969
13527
10911
20907
15272
23822
31661
13732
21787.

30. A transmission method, comprising:

performing low density parity check (LDPC) coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 9/16;

puncturing a head of the information bits of the extended LDPC code by the puncture length L to generate a punctured LDPC code with the code length N of 69120 bits and the coding rate r of 9/16; and transmitting the generated punctured LDPC code from a transmission device to a reception device, wherein the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 9000, the A matrix and the C matrix are represented by a parity check matrix initial value table, the parity check matrix initial value table is a table representing positions of elements of 1 of the A matrix and the C matrix for every 360 columns, and the parity check matrix initial value table is 3681 3750 3985 4255 8583 9468 12078 12353 15700 16492 17127 18174 18264 22392 23070 25263 29195 32034
804 4119 5315 5489 8261 9514 10099 10268 14359 16861 21050 21439 23880 24274 26637 30518 30944 31195
3684 4224 4412 7772 8017 10100 12529 15888 16518 18089 19685 28054 28297 28345 28897 29827 30402 31794
2013 2073 4993 6278 6716 10271 13971 14141 14727 17892 21649 22734 24394 25979 26485 30156 30617 31322
671 4057 4827 6795 8726 11791 15912 16773 16823 21296 24678 28589 29419 30212 30976 31701 32035
2831 3625 4812 9421 10678 11313 11919 13859 24185 26543
105 197 4569 12767 18835 20708 21307 21922 29762 30542
1939 3334 7927 12368 22520 24007 25355 26414 27639 30526
935 4228 7324 10281 10930 14811 20832 21012 24721 31868
451 1279 6541 9174 9524 23917 24447 24765 27400 30105
596 3093 7695 12690 12805 20513 26844 26874 27238 30238
3165 4948 8257 13864 15261 19334 23340 27303 29834 30592
4311 6608 8867 12314 17011 19562 29621 29653 29867 31831
246 1043 4063 9880 12133 14403 17673 21772 26756 28865
3800 4310 7891 9005 17892 22752 29776 30960 31922
169 3202 6707 9267 19608 21494 24264 27783 30896
2756 3526 5061 14144 15208 17722 19974 23683 25622
5640 6672 8062 10253 14587 17029 23586 29354 30935
1780 6399 7013 13407 14129 26025 27047 27302 28430
3867 8295 8448 11173 12961 16355 23417 30645 30840
114 2303 5658 10578 12954 19396 23278 26133 29150
4205 6484 8154 9468 9855 17738 25225 28855 29327
4064 5671 6785 11073 12684 17900 18543 24915 25278
4591 6432 6812 9172 9497 10443 11612 15805 26385
3429 5317 5699 11875 12763 19252 24194 28715 31645
2334 5348 8140 15322 16398 18377 22674 23119 27452
5806 8178 8750 18695 19361 20500 21337 23747 26594
868 5108 7470 12695 12827 13362 17150 30388 32036
1401 3377 6069 13887 15223 16423 20548 26114 31525
2388 2511 6647 15288 20979 21546 22893 25768 26293
5918 7740 8309 16069 17648 21533 21638 30421 30592
4531 6710 7575 10870 14321 15801 22289 27422 29206
282 2349 2823 16122 18235 22889 30845 31790 32028
1028 3364 7170 9696 10463 13676 21633 22408 22987
4747 5376 7037 11344 18790 18904 23562 26963 29547
2666 4221 8779 12684 15548 16845 19631 27773 32000
3277 3636 6417 15359 20686 23258 23607 28911 31760
1394 1613 4705 10030 14240 20469 21907 25971 28392
2428 3334 6308 9823 14969 16081 20361 21680 27204
870 4539 5033 11210 11227 12757 13164 16363 18278
519 8424 8966 11266 12282 15631 17138 25283 27009
562 4648 7031 9367 9769 17258 17524 18469 23544
2607 4017 4276 12525 16477 21617 28004 29179 31638
1311 1705 6279 19425 20643 21524 21927 26759 30022
2440 5160 8827 19724 20470 21579 22088 25426 26076
247 1718 3238 15685 16926 26381 27070 28504 31522
1646 3308 3325 12196 13145 18495 22879 25613 31074
2777 6991 7582 12852 15441 16518 19845 27107 31491
24 1098 6964 10014
3834 7138 8104 27290
2467 2695 6985 23538
597 1655 2786 26365
3412 3568 3869 22313
1378 3631 7350 30759
396 2426 3965 30636
294 5276 6622 28723
889 5479 5831 13814
1355 5011 7082 24636

1737 5683 7638 12279
4248 4328 7871 13506
1867 5466 7068 23531
1400 5020 7410 9775
2727 3409 6324 21177
4027 4240 7262 16737
1442 7380 7650 24201
601 6169 6278 26698
1070 3198 6038 11626
616 3835 8339 28168
4424 5809 6656 26638
3857 4561 4879 27896
2696 2722 4665 17776
643 2333 3072 10579
232 4876 4956 18710
3486 3535 6104 29906
774 5073 6030 23656
4617 6194 7445 31653
4163 5489 8227 28295
3675 3991 4940 18635
496 2003 4758 20333
1062 2059 4493 25301
1380 7374 8642 28926
1294 1639 8662 30961
5866 6147 7653 11713
5458 7184 7361 20695
2463 4602 6018 16857
320 4682 8140 19724
4410 6923 8975 26037
306 1921 7301 11104
57 1768 5604 17338
2839 3153 5912 28608
1091 6051 7495 31918
1681 2099 2259 16924
4490 5186 6994 25446
3188 4252 6208 25437
1342 5660 7305 21071
1048 3204 7421 15675
2197 3412 5125 22484
5721 6143 6479 22800
2531 4216 4794 17691
628 3665 5783 26756
2660 5527 7289 14552
3432 4895 6255 20101
288 2324 2375 27024
3898 7386 8459 10265
301 4717 4972 10844
1895 7065 8334 22255
331 1779 7214 22726
3202 4096 7467 27090
27017
29554
30755
30289
14496
29460
27770
9663
12310
11707
30095
30852
20107
23269
22090
12537
23969
13527
10911
20907
15272
23822
31661
13732
21787.

31. A reception device, comprising:

a decoder configured to decode a punctured low density parity check (LDPC) code obtained from data transmitted by a transmission device, wherein the transmission device:

performs LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 9/16, punctures a head of the information bits of the extended LDPC code by the puncture length L to generate the punctured LDPC code with the code length N of 69120 bits and the coding rate r of 9/16, and transmits the generated punctured LDPC code from the transmission device to the reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 9000, the A matrix and the C matrix are represented by a parity check matrix initial value table, the parity check matrix initial value table is a table representing positions of elements of 1 of the A matrix and the C matrix for every 360 columns, and the parity check matrix initial value table is 3681 3750 3985 4255 8583 9468 12078 12353 15700 16492 17127 18174 18264 22392 23070 25263 29195 32034
804 4119 5315 5489 8261 9514 10099 10268 14359 16861 21050 21439 23880 24274 26637 30518 30944 31195
3684 4224 4412 7772 8017 10100 12529 15888 16518 18089 19685 28054 28297 28345 28897 29827 30402 31794
2013 2073 4993 6278 6716 10271 13971 14141 14727 17892 21649 22734 24394 25979 26485 30156 30617 31322

671 4057 4827 6795 8726 11791 15912 16773 16823 21296 24678 28589 29419 30212 30976 31701 32035
2831 3625 4812 9421 10678 11313 11919 13859 24185 26543
105 197 4569 12767 18835 20708 21307 21922 29762 30542
1939 3334 7927 12368 22520 24007 25355 26414 27639 30526
935 4228 7324 10281 10930 14811 20832 21012 24721 31868
451 1279 6541 9174 9524 23917 24447 24765 27400 30105
596 3093 7695 12690 12805 20513 26844 26874 27238 30238
3165 4948 8257 13864 15261 19334 23340 27303 29834 30592
4311 6608 8867 12314 17011 19562 29621 29653 29867 31831
246 1043 4063 9880 12133 14403 17673 21772 26756 28865
3800 4310 7891 9005 17892 22752 29776 30960 31922
169 3202 6707 9267 19608 21494 24264 27783 30896
2756 3526 5061 14144 15208 17722 19974 23683 25622
5640 6672 8062 10253 14587 17029 23586 29354 30935
1780 6399 7013 13407 14129 26025 27047 27302 28430
3867 8295 8448 11173 12961 16355 23417 30645 30840
114 2303 5658 10578 12954 19396 23278 26133 29150
4205 6484 8154 9468 9855 17738 25225 28855 29327
4064 5671 6785 11073 12684 17900 18543 24915 25278
4591 6432 6812 9172 9497 10443 11612 15805 26385
3429 5317 5699 11875 12763 19252 24194 28715 31645
2334 5348 8140 15322 16398 18377 22674 23119 27452
5806 8178 8750 18695 19361 20500 21337 23747 26594
868 5108 7470 12695 12827 13362 17150 30388 32036
1401 3377 6069 13887 15223 16423 20548 26114 31525
2388 2511 6647 15288 20979 21546 22893 25768 26293
5918 7740 8309 16069 17648 21533 21638 30421 30592
4531 6710 7575 10870 14321 15801 22289 27422 29206
282 2349 2823 16122 18235 22889 30845 31790 32028
1028 3364 7170 9696 10463 13676 21633 22408 22987
4747 5376 7037 11344 18790 18904 23562 26963 29547
2666 4221 8779 12684 15548 16845 19631 27773 32000
3277 3636 6417 15359 20686 23258 23607 28911 31760
1394 1613 4705 10030 14240 20469 21907 25971 28392
2428 3334 6308 9823 14969 16081 20361 21680 27204
870 4539 5033 11210 11227 12757 13164 16363 18278
519 8424 8966 11266 12282 15631 17138 25283 27009
562 4648 7031 9367 9769 17258 17524 18469 23544
2607 4017 4276 12525 16477 21617 28004 29179 31638
1311 1705 6279 19425 20643 21524 21927 26759 30022
2440 5160 8827 19724 20470 21579 22088 25426 26076
247 1718 3238 15685 16926 26381 27070 28504 31522
1646 3308 3325 12196 13145 18495 22879 25613 31074
2777 6991 7582 12852 15441 16518 19845 27107 31491
24 1098 6964 10014
3834 7138 8104 27290
2467 2695 6985 23538
597 1655 2786 26365
3412 3568 3869 22313
1378 3631 7350 30759
396 2426 3965 30636
294 5276 6622 28723
889 5479 5831 13814
1355 5011 7082 24636
1737 5683 7638 12279
4248 4328 7871 13506
1867 5466 7068 23531
1400 5020 7410 9775
2727 3409 6324 21177
4027 4240 7262 16737
1442 7380 7650 24201
601 6169 6278 26698
1070 3198 6038 11626
616 3835 8339 28168
4424 5809 6656 26638
3857 4561 4879 27896
2696 2722 4665 17776
643 2333 3072 10579
232 4876 4956 18710
3486 3535 6104 29906
774 5073 6030 23656
4617 6194 7445 31653
4163 5489 8227 28295
3675 3991 4940 18635
496 2003 4758 20333
1062 2059 4493 25301
1380 7374 8642 28926
1294 1639 8662 30961
5866 6147 7653 11713
5458 7184 7361 20695
2463 4602 6018 16857
320 4682 8140 19724
4410 6923 8975 26037
306 1921 7301 11104
57 1768 5604 17338
2839 3153 5912 28608
1091 6051 7495 31918
1681 2099 2259 16924
4490 5186 6994 25446
3188 4252 6208 25437
1342 5660 7305 21071
1048 3204 7421 15675
2197 3412 5125 22484
5721 6143 6479 22800
2531 4216 4794 17691
628 3665 5783 26756
2660 5527 7289 14552
3432 4895 6255 20101
288 2324 2375 27024
3898 7386 8459 10265
301 4717 4972 10844
1895 7065 8334 22255
331 1779 7214 22726
3202 4096 7467 27090
27017
29554
30755
30289
14496
29460
27770
9663
12310
11707
30095
30852
20107
23269
22090
12537
23969
13527
10911
20907

15272
23822
31661
13732
21787.

32. A reception method, comprising:

decoding a punctured low density parity check (LDPC) code obtained from data transmitted by a transmission method, wherein the transmission method includes:

performing LDPC coding for information bits with an information length K=N×r to generate an extended LDPC code having parity bits with a parity length M=N+L−K, wherein the LDPC coding is performed based on an extended parity check matrix having rows and columns, and the rows and the columns of the extended parity check matrix are extended by a puncture length L with respect to a parity check matrix of an LDPC code with a code length N of 69120 bits and a coding rate r of 9/16, puncturing a head of the information bits of the extended LDPC code by the puncture length L to generate the punctured LDPC code with the code length N of 69120 bits and the coding rate r of 9/16, and transmitting the generated punctured LDPC code from a transmission device to a reception device, the extended parity check matrix includes an A matrix of M1 rows and K columns expressed by a value M1 and the information length K=N×r, wherein the A matrix is an upper left matrix of the extended parity check matrix, a B matrix of M1 rows and M1 columns, wherein the B matrix has a step structure adjacent to right of the A matrix, a Z matrix of M1 rows and N+L−K−M1 columns, wherein the Z matrix is a zero matrix adjacent to right of the B matrix, a C matrix of N+L−K−M1 rows and K+M1 columns, wherein the C matrix is adjacent to below the A matrix and the B matrix, and a D matrix of N+L−K−M1 rows and N+L−K−M1 columns, wherein the D matrix is an identity matrix adjacent to right of the C matrix, the puncture length L is 1800, the value M1 is 9000, the A matrix and the C matrix are represented by a parity check matrix initial value table, the parity check matrix initial value table is a table representing positions of elements of 1 of the A matrix and the C matrix for every 360 columns, and the parity check matrix initial value table is 3681 3750 3985 4255 8583 9468 12078 12353 15700 16492 17127 18174 18264 22392 23070 25263 29195 32034
804 4119 5315 5489 8261 9514 10099 10268 14359 16861 21050 21439 23880 24274 26637 30518 30944 31195
3684 4224 4412 7772 8017 10100 12529 15888 16518 18089 19685 28054 28297 28345 28897 29827 30402 31794
2013 2073 4993 6278 6716 10271 13971 14141 14727 17892 21649 22734 24394 25979 26485 30156 30617 31322
671 4057 4827 6795 8726 11791 15912 16773 16823 21296 24678 28589 29419 30212 30976 31701 32035
2831 3625 4812 9421 10678 11313 11919 13859 24185 26543
105 197 4569 12767 18835 20708 21307 21922 29762 30542
1939 3334 7927 12368 22520 24007 25355 26414 27639 30526
935 4228 7324 10281 10930 14811 20832 21012 24721 31868
451 1279 6541 9174 9524 23917 24447 24765 27400 30105
596 3093 7695 12690 12805 20513 26844 26874 27238 30238
3165 4948 8257 13864 15261 19334 23340 27303 29834 30592
4311 6608 8867 12314 17011 19562 29621 29653 29867 31831
246 1043 4063 9880 12133 14403 17673 21772 26756 28865
3800 4310 7891 9005 17892 22752 29776 30960 31922
169 3202 6707 9267 19608 21494 24264 27783 30896
2756 3526 5061 14144 15208 17722 19974 23683 25622
5640 6672 8062 10253 14587 17029 23586 29354 30935
1780 6399 7013 13407 14129 26025 27047 27302 28430
3867 8295 8448 11173 12961 16355 23417 30645 30840
114 2303 5658 10578 12954 19396 23278 26133 29150
4205 6484 8154 9468 9855 17738 25225 28855 29327
4064 5671 6785 11073 12684 17900 18543 24915 25278
4591 6432 6812 9172 9497 10443 11612 15805 26385
3429 5317 5699 11875 12763 19252 24194 28715 31645
2334 5348 8140 15322 16398 18377 22674 23119 27452
5806 8178 8750 18695 19361 20500 21337 23747 26594
868 5108 7470 12695 12827 13362 17150 30388 32036
1401 3377 6069 13887 15223 16423 20548 26114 31525
2388 2511 6647 15288 20979 21546 22893 25768 26293
5918 7740 8309 16069 17648 21533 21638 30421 30592
4531 6710 7575 10870 14321 15801 22289 27422 29206
282 2349 2823 16122 18235 22889 30845 31790 32028
1028 3364 7170 9696 10463 13676 21633 22408 22987
4747 5376 7037 11344 18790 18904 23562 26963 29547
2666 4221 8779 12684 15548 16845 19631 27773 32000
3277 3636 6417 15359 20686 23258 23607 28911 31760
1394 1613 4705 10030 14240 20469 21907 25971 28392
2428 3334 6308 9823 14969 16081 20361 21680 27204
870 4539 5033 11210 11227 12757 13164 16363 18278
519 8424 8966 11266 12282 15631 17138 25283 27009
562 4648 7031 9367 9769 17258 17524 18469 23544
2607 4017 4276 12525 16477 21617 28004 29179 31638
1311 1705 6279 19425 20643 21524 21927 26759 30022
2440 5160 8827 19724 20470 21579 22088 25426 26076
247 1718 3238 15685 16926 26381 27070 28504 31522
1646 3308 3325 12196 13145 18495 22879 25613 31074
2777 6991 7582 12852 15441 16518 19845 27107 31491
24 1098 6964 10014
3834 7138 8104 27290
2467 2695 6985 23538
597 1655 2786 26365
3412 3568 3869 22313
1378 3631 7350 30759
396 2426 3965 30636
294 5276 6622 28723
889 5479 5831 13814
1355 5011 7082 24636
1737 5683 7638 12279
4248 4328 7871 13506
1867 5466 7068 23531
1400 5020 7410 9775
2727 3409 6324 21177

4027 4240 7262 16737
1442 7380 7650 24201
601 6169 6278 26698
1070 3198 6038 11626
616 3835 8339 28168
4424 5809 6656 26638
3857 4561 4879 27896
2696 2722 4665 17776
643 2333 3072 10579
232 4876 4956 18710
3486 3535 6104 29906
774 5073 6030 23656
4617 6194 7445 31653
4163 5489 8227 28295
3675 3991 4940 18635
496 2003 4758 20333
1062 2059 4493 25301
1380 7374 8642 28926
1294 1639 8662 30961
5866 6147 7653 11713
5458 7184 7361 20695
2463 4602 6018 16857
320 4682 8140 19724
4410 6923 8975 26037
306 1921 7301 11104
57 1768 5604 17338
2839 3153 5912 28608
1091 6051 7495 31918
1681 2099 2259 16924
4490 5186 6994 25446
3188 4252 6208 25437
1342 5660 7305 21071
1048 3204 7421 15675
2197 3412 5125 22484
5721 6143 6479 22800
2531 4216 4794 17691

628 3665 5783 26756
2660 5527 7289 14552
3432 4895 6255 20101
288 2324 2375 27024
3898 7386 8459 10265
301 4717 4972 10844
1895 7065 8334 22255
331 1779 7214 22726
3202 4096 7467 27090
27017
29554
30755
30289
14496
29460
27770
9663
12310
11707
30095
30852
20107
23269
22090
12537
23969
13527
10911
20907
15272
23822
31661
13732
21787.

* * * * *